US011551596B2

(12) United States Patent
Kimura et al.

(10) Patent No.: US 11,551,596 B2
(45) Date of Patent: Jan. 10, 2023

(54) METHOD FOR DRIVING DISPLAY DEVICE

(71) Applicant: Semiconductor Energy Laboratory Co., Ltd., Atsugi (JP)

(72) Inventors: Hajime Kimura, Atsugi (JP); Atsushi Umezaki, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/145,435

(22) Filed: Jan. 11, 2021

(65) Prior Publication Data
US 2021/0134201 A1 May 6, 2021

Related U.S. Application Data

(63) Continuation of application No. 15/594,792, filed on May 15, 2017, now Pat. No. 10,896,633, which is a (Continued)

(30) Foreign Application Priority Data

Jan. 22, 2009 (JP) ................. 2009-011634

(51) Int. Cl.
*G11C 19/00* (2006.01)
*G09G 3/14* (2006.01)
(Continued)

(52) U.S. Cl.
CPC .............. *G09G 3/14* (2013.01); *G02F 1/133* (2013.01); *G06F 3/038* (2013.01); *G09G 3/3677* (2013.01);
(Continued)

(58) Field of Classification Search
None
See application file for complete search history.

(56) References Cited

U.S. PATENT DOCUMENTS 4,393,380 A 7/1983 Hosokawa et al.
5,002,367 A 3/1991 Nicholas
(Continued)

FOREIGN PATENT DOCUMENTS

EP 0317011 A 5/1989
EP 1684310 A 7/2006
(Continued)

OTHER PUBLICATIONS

US 8,618,855 B2, 12/2013, Umezaki (withdrawn)
(Continued)

*Primary Examiner* — Tuan T Lam
(74) *Attorney, Agent, or Firm* — Fish & Richardson P.C.

(57) ABSTRACT

To suppress degradation of a transistor. A method for driving a liquid crystal display device has a first period and a second period. In the first period, a first transistor and a second transistor are alternately turned on and off repeatedly, and a third transistor and a fourth transistor are turned off. In the second period, the first transistor and the second transistor are turned off, and the third transistor and the fourth transistor are alternately turned on and off repeatedly. Accordingly, the time during which the transistor is on can be reduced, so that degradation of characteristics of the transistor can be suppressed.

12 Claims, 46 Drawing Sheets

Related U.S. Application Data continuation of application No. 12/652,995, filed on Jan. 6, 2010, now Pat. No. 9,741,309.

(51) Int. Cl.
| | |
|---|---|
| *G11C 19/28* | (2006.01) |
| *H01L 27/12* | (2006.01) |
| *G09G 3/36* | (2006.01) |
| *G02F 1/133* | (2006.01) |
| *G06F 3/038* | (2013.01) |
| *G09G 3/3291* | (2016.01) |
| *G09G 3/20* | (2006.01) |

(52) U.S. Cl.
CPC ........... *G09G 3/3688* (2013.01); *G11C 19/28* (2013.01); *H01L 27/124* (2013.01); *G09G 3/20* (2013.01); *G09G 3/3291* (2013.01); *G09G 3/36* (2013.01); *G09G 3/3614* (2013.01); *G09G 3/3674* (2013.01); *G09G 2300/0426* (2013.01); *G09G 2310/0286* (2013.01); *G09G 2320/043* (2013.01)

(56) References Cited

U.S. PATENT DOCUMENTS

| | | | |
|---|---|---|---|
| 5,457,420 A | 10/1995 | Asada | |
| 5,616,935 A | 4/1997 | Koyama et al. | |
| 5,666,288 A | 9/1997 | Jones et al. | |
| 6,218,219 B1 | 4/2001 | Yamazaki et al. | |
| 6,731,260 B2 | 5/2004 | Jinno et al. | |
| 6,750,924 B2 | 6/2004 | Murade | |
| 6,809,419 B2 | 10/2004 | Minami et al. | |
| 6,872,978 B2 | 3/2005 | Zhang et al. | |
| 6,906,385 B2 | 6/2005 | Moon et al. | |
| 6,979,839 B2 | 12/2005 | Murade | |
| 6,999,150 B2 | 2/2006 | Murade | |
| 7,038,653 B2 | 5/2006 | Moon | |
| 7,113,245 B2 | 9/2006 | Murade | |
| 7,199,472 B2 | 4/2007 | Minami et al. | |
| 7,443,944 B2 | 10/2008 | Tobita et al. | |
| 7,456,810 B2 | 11/2008 | Kimura | |
| 7,486,269 B2 | 2/2009 | Moon | |
| 7,492,853 B2 | 2/2009 | Tobita | |
| 7,505,020 B2 | 3/2009 | Yamamoto et al. | |
| 7,528,820 B2 | 5/2009 | Yoon et al. | |
| 7,535,027 B2 | 5/2009 | Moon et al. | |
| 7,576,723 B2 | 8/2009 | Lee et al. | |
| 7,586,162 B1 | 9/2009 | Kelly | |
| 7,633,477 B2 | 12/2009 | Jang et al. | |
| 7,687,808 B2 | 3/2010 | Umezaki | |
| 7,692,617 B2 | 4/2010 | Kim et al. | |
| 7,808,471 B2 | 10/2010 | Shin | |
| 7,812,658 B2 | 10/2010 | Rim | |
| 7,859,510 B2 | 12/2010 | Umezaki | |
| 7,936,332 B2 | 5/2011 | Lee et al. | |
| 7,964,876 B2 | 6/2011 | Umezaki | |
| 7,978,274 B2 | 7/2011 | Umezaki et al. | |
| 8,008,690 B2 | 8/2011 | Moon et al. | |
| 8,054,279 B2 | 11/2011 | Umezaki et al. | |
| 8,063,859 B2 | 11/2011 | Kimura | |
| 8,094,142 B2 | 1/2012 | Park | |
| 8,228,480 B2 | 7/2012 | Nakagawa | |
| 8,305,306 B2 | 11/2012 | Kimura | |
| 8,330,492 B2 | 12/2012 | Umezaki | |
| 8,456,396 B2 | 6/2013 | Umezaki | |
| 8,462,100 B2 | 6/2013 | Umezaki | |
| 8,520,159 B2 | 8/2013 | Umezaki et al. | |
| 8,531,376 B2 | 9/2013 | Shimoda | |
| 8,564,523 B2 | 10/2013 | Moon | |
| 8,598,591 B2 | 12/2013 | Umezaki | |
| 8,610,179 B2 | 12/2013 | Moon et al. | |
| 8,643,586 B2 | 2/2014 | Umezaki | |
| 8,686,979 B2 | 4/2014 | Park | |
| 8,742,811 B2 | 6/2014 | Umezaki | |
| 8,743,044 B2 | 6/2014 | Umezaki et al. | |
| 8,902,144 B2 | 12/2014 | Umezaki | |
| 8,902,145 B2 | 12/2014 | Umezaki et al. | |
| 8,902,374 B2 | 12/2014 | Umezaki | |
| 8,908,115 B2 | 12/2014 | Umezaki et al. | |
| 8,941,314 B2 | 1/2015 | Kimura | |
| 9,070,593 B2 | 6/2015 | Umezaki | |
| 9,153,341 B2 | 10/2015 | Umezaki | |
| 9,171,870 B2 | 10/2015 | Kimura | |
| 9,184,183 B2 | 11/2015 | Umezaki | |
| 9,214,473 B2 | 12/2015 | Umezaki | |
| 9,263,468 B2 | 2/2016 | Umezaki et al. | |
| 9,310,657 B2 | 4/2016 | Kim et al. | |
| 9,335,599 B2 | 5/2016 | Umezaki | |
| 9,406,699 B2 | 8/2016 | Umezaki | |
| 9,536,903 B2 | 1/2017 | Umezaki et al. | |
| 9,576,544 B2 | 2/2017 | Park | |
| 9,606,408 B2 | 3/2017 | Umezaki et al. | |
| 9,646,714 B2 | 5/2017 | Umezaki | |
| 9,684,215 B2 | 6/2017 | Umezaki | |
| 9,874,794 B2 | 1/2018 | Kim et al. | |
| 10,025,149 B2 | 7/2018 | Kim et al. | |
| 10,325,932 B2 | 6/2019 | Umezaki | |
| 2001/0038127 A1 | 11/2001 | Yamazaki et al. | |
| 2002/0185684 A1 | 12/2002 | Campbell et al. | |
| 2003/0184512 A1 | 10/2003 | Hayashi et al. | |
| 2003/0189542 A1 | 10/2003 | Lee et al. | |
| 2003/0218920 A1* | 11/2003 | Harari | H01L 29/40114 257/E29.302 |
| 2004/0046729 A1 | 3/2004 | Moon | |
| 2004/0090412 A1 | 5/2004 | Jeon et al. | |
| 2004/0169628 A1 | 9/2004 | Jinno et al. | |
| 2005/0052443 A1 | 3/2005 | Yamamoto et al. | |
| 2005/0243051 A1 | 11/2005 | Kudo et al. | |
| 2005/0263025 A1 | 12/2005 | Blees | |
| 2006/0001637 A1 | 1/2006 | Pak et al. | |
| 2006/0012729 A1 | 1/2006 | Tanaka et al. | |
| 2006/0017681 A1 | 1/2006 | Jang et al. | |
| 2006/0038242 A1 | 2/2006 | Hsu et al. | |
| 2006/0038257 A1 | 2/2006 | Anzai | |
| 2006/0061562 A1 | 3/2006 | Park et al. | |
| 2006/0146978 A1 | 7/2006 | Jang | |
| 2006/0164376 A1 | 7/2006 | Moon | |
| 2006/0214890 A1 | 9/2006 | Morishige et al. | |
| 2006/0290390 A1 | 12/2006 | Jang et al. | |
| 2006/0292880 A1 | 12/2006 | Son et al. | |
| 2007/0029922 A1 | 2/2007 | Ahn | |
| 2007/0037384 A1 | 2/2007 | Su et al. | |
| 2007/0075954 A1 | 4/2007 | Oh et al. | |
| 2007/0104307 A1 | 5/2007 | Kim et al. | |
| 2007/0296660 A1 | 12/2007 | Kimura et al. | |
| 2008/0007296 A1 | 1/2008 | Umezaki | |
| 2008/0018572 A1 | 1/2008 | Shin et al. | |
| 2008/0062112 A1 | 3/2008 | Umezaki | |
| 2008/0079001 A1 | 4/2008 | Umezaki et al. | |
| 2008/0079685 A1 | 4/2008 | Umezaki et al. | |
| 2008/0203387 A1 | 8/2008 | Kang et al. | |
| 2008/0231617 A1 | 9/2008 | Miyake et al. | |
| 2008/0246716 A1 | 10/2008 | Miyake et al. | |
| 2009/0046041 A1* | 2/2009 | Tanikame | H01L 27/3265 345/76 |
| 2009/0224245 A1 | 9/2009 | Umezaki | |
| 2010/0026619 A1 | 2/2010 | Umezaki | |
| 2010/0033455 A1 | 2/2010 | Kwak et al. | |
| 2010/0065837 A1 | 3/2010 | Omura et al. | |
| 2010/0072493 A1* | 3/2010 | Miyamoto | H01L 27/124 257/88 |
| 2010/0078666 A1* | 4/2010 | Mochiku | H01L 27/124 257/E33.053 |
| 2010/0150302 A1 | 6/2010 | Tsai et al. | |
| 2011/0074743 A1 | 3/2011 | Son et al. | |
| 2012/0044132 A1 | 2/2012 | Koga et al. | |
| 2012/0049184 A1 | 3/2012 | Umezaki et al. | |
| 2012/0056860 A1 | 3/2012 | Umezaki et al. | |
| 2013/0107154 A1 | 5/2013 | Umezaki | |
| 2013/0264566 A1 | 10/2013 | Umezaki | |
| 2016/0013261 A1 | 1/2016 | Kimura | |
| 2016/0111452 A1 | 4/2016 | Umezaki | |
| 2016/0141309 A1 | 5/2016 | Umezaki et al. | |

(56) References Cited

U.S. PATENT DOCUMENTS

| | | |
|---|---|---|
| 2017/0176794 A1 | 6/2017 | Umezaki et al. |
| 2017/0249918 A1 | 8/2017 | Kimura et al. |
| 2017/0285431 A1 | 10/2017 | Umezaki |
| 2017/0309345 A1 | 10/2017 | Umezaki |
| 2019/0348442 A1 | 11/2019 | Umezaki |

FOREIGN PATENT DOCUMENTS

| | | | |
|---|---|---|---|
| EP | 1870877 A | 12/2007 | |
| EP | 1895545 A | 3/2008 | |
| EP | 1906414 A | 4/2008 | |
| JP | 58-125847 A | 7/1983 | |
| JP | 01-166020 A | 6/1989 | |
| JP | 05-055392 A | 3/1993 | |
| JP | 05-090427 A | 4/1993 | |
| JP | 06-069210 A | 3/1994 | |
| JP | 2002-040486 A | 2/2002 | |
| JP | 2002-108247 A | 4/2002 | |
| JP | 2003-223138 A | 8/2003 | |
| JP | 2003-255853 A | 9/2003 | |
| JP | 2004-103226 A | 4/2004 | |
| JP | 2004-111796 A | 4/2004 | |
| JP | 2005-050502 A | 2/2005 | |
| JP | 2005-352455 A | 12/2005 | |
| JP | 2006-024350 A | 1/2006 | |
| JP | 2006-059959 A | 3/2006 | |
| JP | 2006-189762 A | 7/2006 | |
| JP | 2006-351165 A | 12/2006 | |
| JP | 2007-004167 A | 1/2007 | |
| JP | 2007-102162 A | 4/2007 | |
| JP | 2007-151092 A | 6/2007 | |
| JP | 2007-207413 A | 8/2007 | |
| JP | 2007-250052 A | 9/2007 | |
| JP | 2008-003602 A | 1/2008 | |
| JP | 2008-009393 A | 1/2008 | |
| JP | 2008-083692 A | 4/2008 | |
| JP | 2008-089874 A | 4/2008 | |
| JP | 2008-089915 A | 4/2008 | |
| JP | 2008-097774 A | 4/2008 | |
| JP | 2008-107807 A | 5/2008 | |
| JP | 2008-130139 A | 6/2008 | |
| JP | 2008-140522 A | 6/2008 | |
| JP | 2008-251094 A | 10/2008 | |
| JP | 2010-152347 A | 7/2010 | |
| JP | 2011-181122 A | 9/2011 | |
| KR | 1999-0037027 A | 5/1999 | |
| KR | 2004-0078422 A | 9/2004 | |
| KR | 2006-0009601 A | 2/2006 | |
| KR | 2006-0010117 A | 2/2006 | |
| KR | 2006-0028522 A | 3/2006 | |
| KR | 2007-0002784 A | 1/2007 | |
| KR | 2007-0042484 A | 4/2007 | |
| KR | 2007-0093912 A | 9/2007 | |
| KR | 2007-0115792 A | 12/2007 | |
| KR | 2008-0021557 A | 3/2008 | |
| KR | 2008-0026391 A | 3/2008 | |
| KR | 2008-0029796 A | 4/2008 | |
| KR | 2008-0029807 A | 4/2008 | |
| KR | 2008-0098487 A | 11/2008 | |
| KR | 2008-0104726 A | 12/2008 | |
| KR | 2010-0026391 A | 3/2010 | |
| WO | WO-2007/080813 | 7/2007 | |
| WO | WO-2008/050501 | 5/2008 | |
| WO | WO-2010/061723 | 6/2010 | |

OTHER PUBLICATIONS

Jang.Y et al., "Integrated Gate Driver Circuit Using a-Si TFT with Dual Pull-down Structure.", IDW'04 : Proceedings of the 11th International Display Workshops, Dec. 8, 2004, pp. 333-336.

Korean Office Action (Application No. 2010-0005501) dated Jul. 29, 2016.

Choi.C et al., "Solution-Processed Indium-Zinc Oxide Transparent Thin-Film Transistors", Electrochemical and Solid-State Letters, 2008, vol. 11, No. 1, pp. H7-H9, The Electrochemical Society.

\* cited by examiner

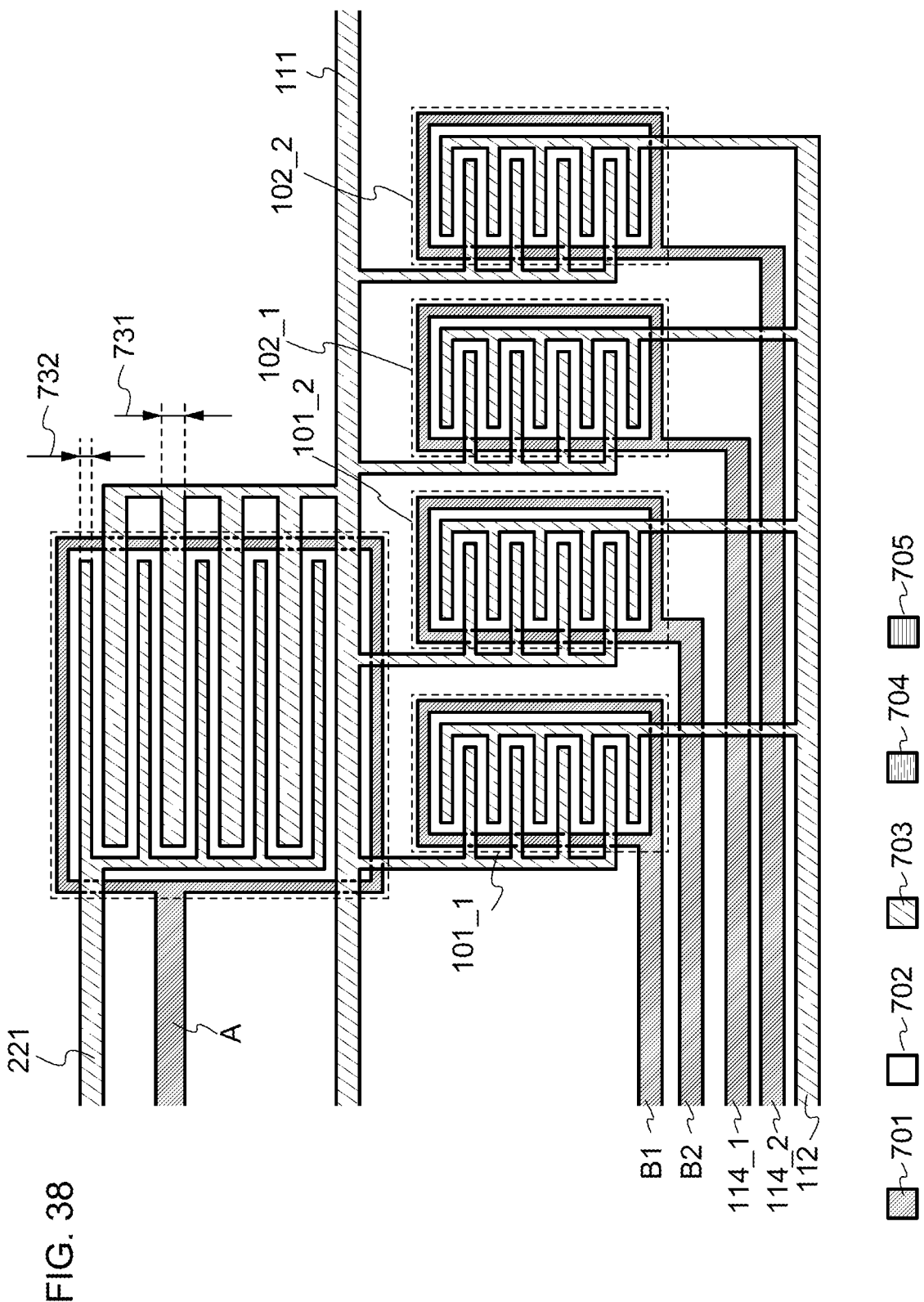

METHOD FOR DRIVING DISPLAY DEVICE

CROSS-REFERENCE TO RELATED APPLICATIONS

This application is a continuation of U.S. application Ser. No. 15/594,792, filed May 15, 2017, now allowed, which is a continuation of U.S. application Ser. No. 12/652,995, filed Jan. 6, 2010, now U.S. Pat. No. 9,741,309, which claims the benefit of a foreign priority application filed in Japan as Serial No. 2009-011634 on Jan. 22, 2009, all of which are incorporated by reference.

BACKGROUND OF THE INVENTION

1. Field of the Invention

The present invention relates to a semiconductor device, a display device, a liquid crystal display device, a method for driving these devices, and a method for manufacturing these devices. The present invention particularly relates to a semiconductor device, a display device, and a liquid crystal display device which include a driver circuit formed over the same substrate as a pixel portion, and a method for driving these devices. Further, the present invention relates to an electronic device including the semiconductor device, the display device, or the liquid crystal display device.

2. Description of the Related Art

In recent years, with the increase of large display devices such as liquid crystal televisions, display devices have been actively developed. In particular, a technique for forming a driver circuit such as a gate driver over the same substrate as a pixel portion by using transistors including a non-single-crystal semiconductor has been actively developed because the technique greatly contributes to reduction in cost and improvement in reliability.

In a transistor including a non-single-crystal semiconductor, degradation such as increase in threshold voltage or reduction in mobility occurs. As such degradation of the transistor progresses, it becomes difficult to operate a driver circuit and incapable of displaying images. Patent Documents 1 and 2, and Non-patent Document 1 each disclose a shift register in which degradation of transistors can be suppressed. In these documents, two transistors are used for suppressing degradation of characteristics of transistors. The two transistors are connected between an output terminal of a flip flop and a wiring to which VSS (also referred to as negative power supply) is supplied. Moreover, one transistor and the other transistor are alternately turned on. Accordingly, the time during which the transistor is on is reduced, so that degradation of characteristics of the transistors can be suppressed.

REFERENCE

Patent Document

Patent Document 1: Japanese Published Patent Application No. 2005-050502
Patent Document 2: Japanese Published Patent Application No. 2006-024350

Non-Patent Document

Non Patent Document 1: Yong Ho Jang et al., "Integrated Gate Driver Circuit Using a-Si TFT with Dual Pull-down Structure", Proceedings of The 11th International Display Workshops 2004, pp. 333-336

In a conventional device, the time during which a transistor is on is approximately half of one frame period. In addition, the channel width of a transistor needs to be made larger in order to operate a shift register even when characteristics of the transistor deteriorate. When the channel width of a transistor is larger, a gate and a source or a drain of the transistor are likely to be short-circuited. Moreover, when the channel width of a transistor is larger, parasitic capacitance of transistors included in the shift register may be increased. When parasitic capacitance of the transistors included in the shift register is increased, a circuit with high current supply capability needs to be used as a circuit for applying a signal, a voltage, or the like to the shift register.

SUMMARY OF THE INVENTION

In view of the foregoing problems, an object of one embodiment of the present invention is as follows: to reduce the time during which a transistor is on, to suppress degradation of characteristics of a transistor, to reduce the channel width of a transistor, to reduce the layout area, to reduce the frame of a display device, to realize higher definition of a display device, to increase the yield, to reduce costs, to reduce distortion or delay of a signal, to reduce power consumption, to decrease the current supply capability of an external circuit, or to reduce the size of an external circuit or the size of a display device including the external circuit. Note that the description of these objects does not deny the existence of other objects. Further, one embodiment of the present invention is not necessary to achieve all the above objects.

One embodiment of the present invention is a method for driving a liquid crystal display device as follows. The liquid crystal display device includes a driver circuit including a first switch electrically connected between a first wiring and a second wiring, a second switch electrically connected between the first wiring and the second wiring, a third switch electrically connected between the first wiring and the second wiring, and a fourth switch electrically connected between the first wiring and the second wiring; and a pixel including a liquid crystal element. The method for driving the liquid crystal display device has a first period during which the first switch and the second switch are brought out of conduction, and a second period during which the third switch and the fourth switch are brought out of conduction.

In one embodiment of the present invention, the first period and the second period may be alternately repeated.

In one embodiment of the present invention, the first period and the second period may be approximately equal in length.

One embodiment of the present invention is a method for driving a liquid crystal display device as follows. The liquid crystal display device includes a driver circuit including a first switch electrically connected between a first wiring and a second wiring, a second switch electrically connected between the first wiring and the second wiring, a third switch electrically connected between the first wiring and the second wiring, and a fourth switch electrically connected between the first wiring and the second wiring; and a pixel including a liquid crystal element. The method for driving the liquid crystal display device has a first period and a second period. The first period includes a first sub-period during which the first switch, the second switch, the third switch, and the fourth switch are brought out of conduction; a second sub-period during which the first switch is brought into conduction, and the second switch, the third switch, and the fourth switch are brought out of conduction; and a third sub-period during which the second switch is brought into conduction, and the first switch, the third switch, and the fourth switch are brought out of conduction. The second period includes a fourth sub-period during which the first switch, the second switch, the third switch, and the fourth switch are brought out of conduction; a fifth sub-period during which the third switch is brought into conduction, and the first switch, the second switch, and the fourth switch are brought out of conduction; and a sixth sub-period during which the fourth switch is brought into conduction, and the first switch, the second switch, and the third switch are brought out of conduction.

In one embodiment of the present invention, the first period and the second period may be alternately repeated In one embodiment of the present invention, the first period and the second period may be approximately equal in length.

In one embodiment of the present invention, the first sub-period and the second sub-period may be alternately repeated, and the fourth sub-period and the fifth sub-period may be alternately repeated.

In one embodiment of the present invention, the first sub-period, the second sub-period, the third sub-period, the fourth sub-period, the fifth sub-period, and the sixth sub-period may be approximately equal in length.

Note that a variety of switches can be used as the switch. For example, an electrical switch or a mechanical switch can be used. That is, any element can be used as long as it can control a current flow, without limitation on a certain element. For example, a transistor (e.g., a bipolar transistor or a MOS transistor), or a diode (e.g., a PN diode, a PIN diode, a Schottky diode, an MIM (metal insulator metal) diode, an MIS (metal insulator semiconductor) diode, or a diode-connected transistor) can be used as the switch. Alternatively, a logic circuit in which such elements are combined can be used as the switch.

An example of a mechanical switch is a switch formed using a MEMS (micro electro mechanical system) technology, such as a digital micromirror device (DMD). Such a switch includes an electrode which can be moved mechanically, and operates by controlling conduction and non-conduction in accordance with movement of the electrode.

Note that a CMOS switch may be used as the switch by using both an n-channel transistor and a p-channel transistor.

Note that when it is explicitly described that "A and B are connected", the case where A and B are electrically connected, the case where A and B are functionally connected, and the case where A and B are directly connected are included therein. Here, each of A and B is an object (e.g., a device, an element, a circuit, a wiring, an electrode, a terminal, a conductive fin, or a layer). Accordingly, another element may be provided between elements having a connection relation illustrated in drawings and texts, without limitation on a predetermined connection relation, for example, the connection relation illustrated in the drawings and the texts.

For example, in the case where A and B are electrically connected, one or more elements which enable electrical connection between A and B (e.g., a switch, a transistor, a capacitor, an inductor, a resistor, and/or a diode) may be connected between A and B. In the case where A and B are functionally connected, one or more circuits which enable functional connection between A and B (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a dc-dc converter, a step-up dc-dc converter, or a step-down d-dc converter) or a level shifter circuit for changing a potential level of a signal; a voltage source; a current source; a switching circuit; an amplifier circuit such as a circuit which can increase signal amplitude, the amount of current, or the like, an operational amplifier, a differential amplifier circuit, a source follower circuit, or a buffer circuit; a signal generation circuit; a memory circuit; and/or a control circuit) may be connected between A and B. For example, in the case where a signal output from A is transmitted to B even when another circuit is provided between A and B, A and B are functionally connected.

Note that when it is explicitly described that "A and B are electrically connected", the case where A and B are electrically connected (i.e., the case where A and B are connected with another element or another circuit therebetween), the case where A and B are functionally connected (i.e., the case where A and B are functionally connected with another circuit therebetween), and the case where A and B are directly connected (i.e., the case where A and B are connected without another element or another circuit therebetween) are included therein. That is, when it is explicitly described that "A and B are electrically connected", the description is the same as the case where it is explicitly only described that "A and B are connected".

Note that a display element, a display device which is a device including a display element, a light-emitting element, and a light-emitting device which is a device including a light-emitting element can employ a variety of modes and include a variety of elements. For example, a display element, a display device, a light-emitting element, and a light-emitting device can include a display medium whose contrast, luminance, reflectivity, transmittance, or the like changes by electromagnetic action, such as an EL (electroluminescence) element (e.g., an EL element containing organic and inorganic materials, an organic EL element, or an inorganic EL element), an LED (e.g., a white LED, a red LED, a green LED, or a blue LED), a transistor (a transistor which emits light depending on the amount of current), an electron emitter, a liquid crystal element, electronic ink, an electrophoretic element, a grating light valve (GLV), a plasma display panel (PDP), a digital micromirror device (DMD), a piezoelectric ceramic display, or a carbon nanotube. Note that display devices using an EL element include an EL display; display devices using an electron emitter include a field emission display (FED) and an SED (surface-conduction electron-emitter display) flat panel display; display devices using a liquid crystal element include a liquid crystal display (e.g., a transmissive liquid crystal display, a transflective liquid crystal display, a reflective liquid crystal display, a direct-view liquid crystal display, or a projection liquid crystal display); and display devices using electronic ink or an electrophoretic element include electronic paper in their respective categories.

A liquid crystal element is an element that controls transmission or non-transmission of light by an optical modulation action of liquid crystal, and includes a pair of electrodes and liquid crystal. The optical modulation action of liquid crystal is controlled by an electric field (including a lateral electric field, a vertical electric field, and a diagonal electric field) applied to the liquid crystal. The following liquid crystal can be used for a liquid crystal element: nematic liquid crystal, cholesteric liquid crystal, smectic liquid crystal, discotic liquid crystal, thermotropic liquid crystal, lyotropic liquid crystal, low molecular liquid crystal, high molecular liquid crystal, polymer dispersed liquid crystal (PDLC), ferroelectric liquid crystal, anti-ferroelectric liquid crystal, main chain type liquid crystal, side chain type polymer liquid crystal, plasma addressed liquid crystal (PALC), and banana-shaped liquid crystal. Moreover, the following methods can be used for driving the liquid crystal, for example: a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an OCB (optically compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a guest-host mode, and a blue phase mode. Note that various kinds of liquid crystal elements and driving methods can be used without limitation on those described above.

As a transistor, a variety of transistors can be used. There is no limitation on the type of transistors. For example, a thin film transistor (TFT) including a non-single-crystal semiconductor film typified by a film made of amorphous silicon, polycrystalline silicon, microcrystalline (also referred to as microcrystal, nanocrystal, or semi-amorphous) silicon, or the like can be used.

Note that by using a catalyst (e.g., nickel) in the case of forming polycrystalline silicon, crystallinity can be further improved and a transistor having excellent electrical characteristics can be formed. Further, by using a catalyst (e.g., nickel) in the case of forming microcrystalline silicon, crystallinity can be further improved and a transistor having excellent electric characteristics can be formed. Note that it is possible to form polycrystalline silicon and microcrystalline silicon without using a catalyst (e.g., nickel).

The crystallinity of silicon is preferably enhanced to polycrystallinity or microcrystallinity in the entire panel, but not limited thereto. The crystallinity of silicon may be improved only in part of the panel.

Moreover, a transistor can be formed by using a semiconductor substrate, an SOI substrate, or the like.

In addition, a transistor including a compound semiconductor or an oxide semiconductor, such as ZnO, a-InGaZnO, SiGe, GaAs, IZO, ITO, SnO, TiO, or AlZnSnO (AZTO) and a thin film transistor or the like obtained by thinning such a compound semiconductor or oxide semiconductor can be used. Note that such a compound semiconductor or oxide semiconductor can be used for not only a channel portion of a transistor but also for other applications. For example, such a compound semiconductor or oxide semiconductor can be used for a resistor, a pixel electrode, or a light-transmitting electrode. Further, since such an element can be formed at the same time as the transistor, the costs can be reduced.

A transistor or the like formed by an inkjet method or a printing method can also be used.

Further, a transistor or the like including an organic semiconductor or a carbon nanotube can be used. Accordingly, such a transistor can be formed using a flexible substrate. A semiconductor device using such a substrate can resist a shock.

In addition, various types of transistors can be used. For example, a MOS transistor, a junction transistor, a bipolar transistor, or the like can be employed.

Further, a MOS transistor, a bipolar transistor, and/or the like may be formed over one substrate.

Furthermore, various transistors other than the above transistors can be used.

A transistor can be formed using various types of substrates. The type of a substrate is not limited to a certain type. As the substrate, a single crystalline substrate (e.g., a silicon substrate), an SOI substrate, a glass substrate, a quartz substrate, a plastic substrate, a metal substrate, a stainless steel substrate, a substrate including a stainless steel foil, or a flexible substrate can be used, for example. Examples of the glass substrate are barium borosilicate glass and aluminoborosilicate glass. Examples of the flexible substrate are flexible synthetic resin such as plastics typified by polyethylene terephthalate (PET), polyethylene naphthalate (PEN), and polyethersulfone (PES), and acrylic. Alternatively, an attachment film (formed using polypropylene, polyester, vinyl, polyvinyl fluoride, polyvinyl chloride, or the like), paper including a fibrous material, a base material film (polyester, polyamide, polyimide, an inorganic vapor deposition film, paper, or the like), or the like can be used. Alternatively, the transistor may be formed using one substrate, and then, the transistor may be transferred to another substrate. As a substrate to which the transistor is transferred, a single crystal substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used. A skin (e.g., epidermis or corium) or hypodermal tissue of an animal such as a human being can be used as a substrate to which the transistor is transferred. Alternatively, the transistor may be formed using one substrate and the substrate may be thinned by polishing. As a substrate to be polished, a single crystal substrate, an SOI substrate, a glass substrate, a quartz substrate, a plastic substrate, a stainless steel substrate, a substrate including a stainless steel foil, or the like can be used. By using such a substrate, a transistor with excellent properties or low power consumption can be formed, a device with high durability or high heat resistance can be provided, or reduction in weight or thickness can be achieved.

Note that the structure of a transistor can be a variety of structures, without limitation on a certain structure. For example, a multi-gate structure having two or more gate electrodes can be used.

As another example, a structure where gate electrodes are formed above and below a channel can be used. Note that when the gate electrodes are formed above and below the channel, a structure where a plurality of transistors are connected m parallel is provided.

A structure where a gate electrode is formed above a channel region, a structure where a gate electrode is formed below a channel region, a staggered structure, an inverted staggered structure, a structure where a channel region is divided into a plurality of regions, or a structure where channel regions are connected in parallel or in series can be used. Moreover, a structure where a source electrode or a drain electrode overlaps with a channel region (or part thereof) can be used.

Note that a variety of transistors can be used, and the transistor can be formed using a variety of substrates. Accordingly, all the circuits which are necessary to realize a predetermined function can be formed using one substrate. For example, all the circuits which are necessary to realize the predetermined function can be formed using a glass substrate, a plastic substrate, a single crystal substrate, an SOI substrate, or any other substrate. Alternatively, some of the circuits which are necessary to realize the predetermined function can be formed using one substrate and some of the circuits which are necessary to realize the predetermined function can be formed using another substrate. That is, not all the circuits which are necessary to realize the predetermined function need to be formed using one substrate. For example, some of the circuits which are necessary to realize the predetermined function can be formed by transistors using a glass substrate, some of the circuits which are necessary to realize the predetermined function can be formed using a single crystal substrate, and an IC chip including transistors formed using the single crystal substrate can be connected to the glass substrate by COG (chip on glass) so that the IC chip is provided over the glass substrate. Alternatively, the IC chip can be connected to the glass substrate by TAB (tape automated bonding) or a printed wiring board.

Note that a transistor is an element having at least three terminals of a gate, a drain, and a source. The transistor has a channel region between a drain region and a source region, and current can flow through the drain region, the channel region, and the source region. Here, since the source and the drain of the transistor change depending on the structure, the operating condition, and the like of the transistor, it is difficult to define which is a source or a drain. Thus, a region which serves as a source or a drain is not referred to as a source or a drain in some cases. In such a case, one of the source and the drain may be referred to as a first terminal and the other of the source and the drain may be referred to as a second terminal, for example. Alternatively, one of the source and the drain may be referred to as a first electrode and the other of the source and the drain may be referred to as a second electrode. Further alternatively, one of the source and the drain may be referred to as a first region and the other of the source and the drain may be referred to as a second region.

Note that a transistor may be an element having at least three terminals of a base, an emitter, and a collector. In this case also, the emitter and the collector may be referred to as a first terminal and a second terminal, for example.

Note that when it is explicitly described that B is formed on or over A, it does not necessarily mean that B is formed in direct contact with A. The description includes the case where A and B are not in direct contact with each other, that is, the case where another object is placed between A and B. Here, each of A and B is an object (e.g., a device, an element, a circuit, a wiring, an electrode, a terminal, a conductive film, or a layer).

Accordingly, for example, when it is explicitly described that a layer B is formed on (or over) a layer A, it includes both the case where the layer B is formed in direct contact with the layer A; and the case where another layer (e.g., a layer C or a layer D) is formed in direct contact with the layer A, and the layer B is formed in direct contact with the layer C or the layer D. Note that another layer (e.g., the layer C or the layer D) may be a single layer or a plurality of layers.

Similarly, when it is explicitly described that B is formed above A, it does not necessarily mean that B is formed in direct contact with A, and another object may be placed between A and B. Accordingly, the case where a layer B is formed above a layer A includes the case where the layer B is formed in direct contact with the layer A and the case where another layer (e.g., a layer C and a layer D) is formed in direct contact with the layer A and the layer B is formed in direct contact with the layer C or the layer D. Note that another layer (e.g., the layer C or the layer D) may be a single layer or a plurality of layers.

Note that when it is explicitly described that B is formed over, on, or above A, it includes the case where B is formed obliquely over/above A.

Note that the same can be said when it is explicitly described that B is formed below or under A.

Explicit singular forms preferably mean singular forms. However, embodiments of the present invention are not limited thereto, and such singular forms can include plural forms. Similarly, explicit plural forms preferably mean plural forms. However, embodiments of the present invention are not limited thereto, and such plural forms can include singular forms.

Note that the size, the thickness of layers, or regions in diagrams are sometimes exaggerated for simplicity. Therefore, embodiments of the present invention are not limited to such scales.

Note that a diagram schematically illustrates an ideal example, and embodiments of the present invention are not limited to the shape or the value illustrated in the diagram. For example, the following can be included: variation in shape due to a manufacturing technique or dimensional deviation; or variation in signal, voltage, or current due to noise or difference in timing.

Technical terms are used in order to describe a specific embodiment or the like in many cases, and there are no limitations on terms.

Terms which are not defined (including terms used for science and technology, such as technical terms and academic parlance) can be used as the terms which have a meaning equivalent to a general meaning that an ordinary person skilled in the art understands. It is preferable that the term defined by dictionaries or the like be construed as a consistent meaning with the background of related art.

The terms such as first, second, and third are used for distinguishing various elements, members, regions, layers, and areas from others. Therefore, the terms such as first, second, and third do not limit the number of elements, members, regions, layers, areas, or the like. Further, for example, "first" can be replaced with "second", "third", or the like.

Terms for describing spatial arrangement, such as "over", "above", "under", "below", "laterally", "right", "left", "obliquely", "back", and "front", are often used for briefly showing, with reference to a diagram, a relation between an element and another element or between some characteristics and other characteristics. Note that embodiments of the present invention are not limited thereto, and such terms for describing spatial arrangement can indicate not only the direction illustrated in a diagram but also another direction. For example, when it is explicitly described that "B is over A", it does not necessarily mean that B is placed over A, and can include the case where B is placed under A because a device in a diagram can be inverted or rotated by 180°. Accordingly, "over" can refer to the direction described by "under" in addition to the direction described by "over". Note that embodiments of the present invention are not limited thereto, and "over" can refer to other directions described by "laterally", "right", "left", "obliquely", "back", and "front" in addition to the directions described by "over" and "under" because a device in a diagram can be rotated in a variety of directions.

One embodiment of the present invention includes a first transistor, a second transistor, a third transistor, and a fourth transistor. A first terminal of the first transistor is connected to a first wiring, a second terminal of the first transistor is connected to a second wiring, and a gate of the first transistor is connected to a third wiring. A first terminal of the second transistor is connected to the first wiring, a second terminal of the second transistor is connected to the second wiring, and a gate of the second transistor is connected to a fourth wiring. A first terminal of the thud transistor is connected to the first wiring, a second terminal of the third transistor is connected to the second wiring, and a gate of the third transistor is connected to a fifth wiring. A first terminal of the fourth transistor is connected to the first wiring, a second terminal of the fourth transistor is connected to the second wiring, and a gate of the fourth transistor is connected to a sixth wiring.

One embodiment of the present invention includes a first transistor, a second transistor, a third transistor, a fourth transistor, and a fifth transistor. A first terminal of the first transistor is connected to a first wiring, a second terminal of the first transistor is connected to a second wiring, and a gate of the first transistor is connected to a third wiring. A first terminal of the second transistor is connected to the first wiring, a second terminal of the second transistor is connected to the second wiring, and a gate of the second transistor is connected to a fourth wiring. A first terminal of the third transistor is connected to the first wiring, a second terminal of the third transistor is connected to the second wiring, and a gate of the third transistor is connected to a fifth wiring. A first terminal of the fourth transistor is connected to the first wiring, a second terminal of the fourth transistor is connected to the second wiring, and a gate of the fourth transistor is connected to a sixth wiring. A first terminal of the fifth transistor is connected to a seventh wiring, a second terminal of the fifth transistor is connected to the second wiring, and a gate of the fifth transistor is connected to an eighth wiring.

One embodiment of the present invention has a first period and a second period. In the first period, a first transistor and a second transistor are alternately turned on and off repeatedly, and a third transistor and a fourth transistor are off. In the second period, the first transistor and the second transistor are off, and the third transistor and the fourth transistor are alternately turned on and off repeatedly.

One embodiment of the present invention has a first period, a second period, a third period, and a fourth period. In the first period, a first wiring and a second wiring are brought into conduction through a first path. In the second period, the first wiring and the second wiring are brought into conduction through a second path. In the third period, the first wiring and the second wiring are brought into conduction through a third path. In the fourth period, the first wiring and the second wiring are brought into conduction through a fourth path.

According to one embodiment of the present invention, the time during which a transistor is on can be reduced; degradation of characteristics of a transistor can be suppressed; the channel width of a transistor can be reduced; the layout area can be reduced; the frame of a display device can be reduced; higher definition of a display device can be realized; the yield can be increased; costs can be reduced; distortion or delay of a signal can be reduced; power consumption can be reduced; the current supply capability of an external circuit can be decreased; or the size of an external circuit or the size of a display device including the external circuit can be reduced.

BRIEF DESCRIPTION OF THE DRAWINGS

In the accompanying drawings.

FIG. 38 is a layout view of a shift register;

DETAILED DESCRIPTION OF THE INVENTION

Figure 1A:
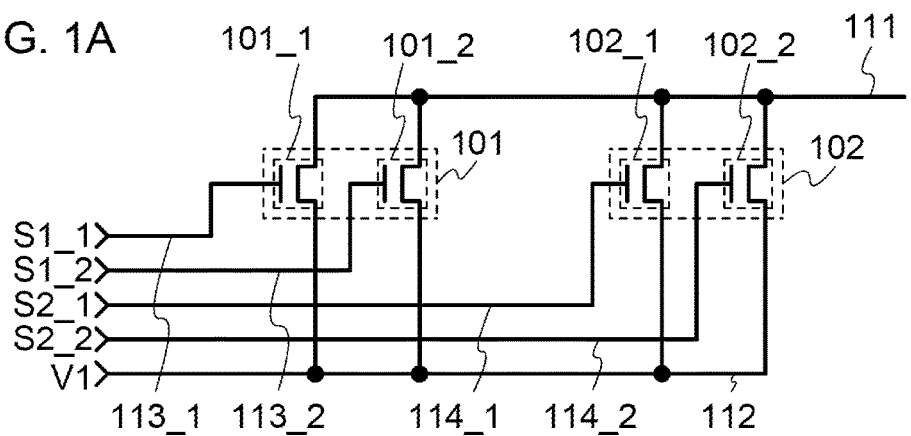
FIG. 1A is a circuit diagram of a semiconductor device.

Embodiments of the present invention will be described below with reference to the accompanying drawings. Note that the embodiments can be implemented in various modes, and it is easily understood by those skilled in the at that modes and details can be variously changed without departing from the spirit and the scope of the present invention. Therefore, the present invention is not construed as being limited to the description of the following embodiments. Note that in the structures described below, reference numerals denoting the same components are used in common in different drawings, and detailed description of the same portions or portions having similar functions is not repeated.

Note that what is described (or part thereof) in one embodiment can be applied to, combined with, or exchanged with another content in the same embodiment and/or what is described (or part thereof) in another embodiment or other embodiments.

Note that in each embodiment, what is described in the embodiment is a content described with reference to a variety of diagrams or a content described with texts disclosed in this specification.

In addition, by combining a diagram (or part thereof) described in one embodiment with another part of the diagram, a different diagram (or part thereof) described in the same embodiment, and/or a diagram (or part thereof) described in one or a plurality of different embodiments, much more diagrams can be formed.

Embodiment 1

In this embodiment, an example of a semiconductor device will be described. The semiconductor device in this embodiment can be used for, for example, a shift register, a gate driver, a source driver, or a display device. Note that the semiconductor device in this embodiment can also be referred to as a driver circuit.

First, a basic circuit which can be used for the semiconductor device in this embodiment is described with reference to FIG. 41A. The circuit in FIG. 41A includes a plurality of circuits: a circuit 101 and a circuit 102. The circuit 101 includes a plurality of switches: a switch 11_1 and a switch 11_2. The circuit 102 includes a plurality of switches: a switch 12_1 and a switch 12_2. The switches 11_1, 11_2, 12_1, and 12_2 are connected between a wiring 111 and a wiring 112. Note that the circuit in FIG. 41A can also be referred to as a semiconductor device or a driver circuit.

The switches 11_1, 11_2, 12_1, and 12_2 have a function of controlling a conduction state between the wirings 111 and 112. Accordingly, as illustrated in FIG. 41B, there are a plurality of paths 121_1, 121_2, 122_1, and 122_2 between the wirings 111 and 112. Note that this embodiment is not limited thereto, and when N switches (N is a natural number) are connected between the wirings 111 and 112, there can be N paths between the wirings 111 and 112.

Note that the term "a path between a wiring A (e.g., the wiring 111) and a wiring B (e.g., the wiring 112)" includes the case where the wiring A is connected to the wiring B through a switch. However, this embodiment is not limited thereto, and a variety of elements (e.g., a transistor, a diode, a resistor, or a capacitor) or a variety of circuits (e.g., a buffer circuit, an inverter circuit, or a shift register) other than a switch can be connected between the wirings A and B. Accordingly, an element such as a resistor or a transistor can be connected in series or in parallel with the switch 11_1, for example.

As an example, a signal OUT is output from the wiring 111. The signal OUT is a digital signal having H level and L level in many cases, and can function as an output signal. Thus, the wiring 111 can function as a signal line. In particular, the wiring 111 can be arranged so as to extend to a pixel portion. Moreover, the wiring 111 can be connected to a pixel. Alternatively, the wiring 111 can be connected to a gate of a transistor (e.g., a selection transistor or a switching transistor) included in a pixel. Accordingly, the signal OUT can function as a selection signal, a transfer signal, a start signal, a reset signal, a gate signal, or a scan signal. The wiring 111 can function as a gate line, a scan line, or an output signal line. As an example, a voltage V1 is applied to the wiring 112. The voltage V1 often has a value which is approximately equal to that of an L-level signal, and can function as a ground voltage, a power supply voltage, an earth voltage, a reference voltage, a negative power supply voltage, or the like. Thus, the wiring 112 can function as a power supply line. Note that this embodiment is not limited thereto, and a signal can be input to the wiring 112 so that the wiring 112 can function as a signal line.

Note that the term "approximately" is used in consideration of various kinds of variation such as variation due to noise, variation due to process variation, variation due to a step for manufacturing an element, and/or measurement deviation.

As an example, it is assumed that a potential of an L-level signal is denoted by V1; a potential of an H-level signal is denoted by V2; and V2>V1 is satisfied. Accordingly, "voltage V2" has a value which is approximately equal to that of the H-level signal. Note that this embodiment is not limited thereto, and a potential of the L-level signal can be lower than V1 or higher than V1. Moreover, a potential of the H-level signal can be lower than V2 or higher than V2.

Note that a voltage often refers to a potential difference between a given potential and a reference potential (e.g., a ground potential). Accordingly, voltage, potential, and potential difference can also be referred to as potential, voltage, and voltage difference, respectively.

Figure 41A:
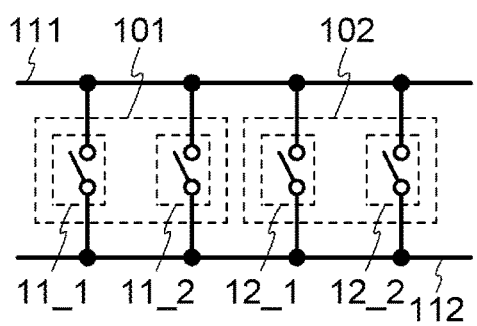
FIG. 41A is a circuit diagram of a semiconductor device.
Figure 41B:
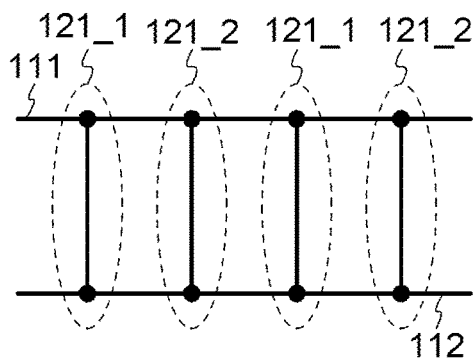
FIGS. 41B to 41H are schematic diagrams illustrating operation of the semiconductor device.

Next, operation of the circuit in FIG. 41A is described with reference to a timing chart in FIG. 42. The timing chart in FIG. 42 includes a plurality of periods, and each period has a plurality of sub-periods. For example, the timing chart in FIG. 42 includes a plurality of periods (hereinafter a period is also referred to as a frame period) of a period A and a period B. The period A has a plurality of sub-periods (hereinafter a sub-period is also referred to as one gate selection period) of a period A0, a period A1, and a period A2. The period B has a plurality of sub-periods of a period B0, a period B1, and a period B2.

Figure 42:
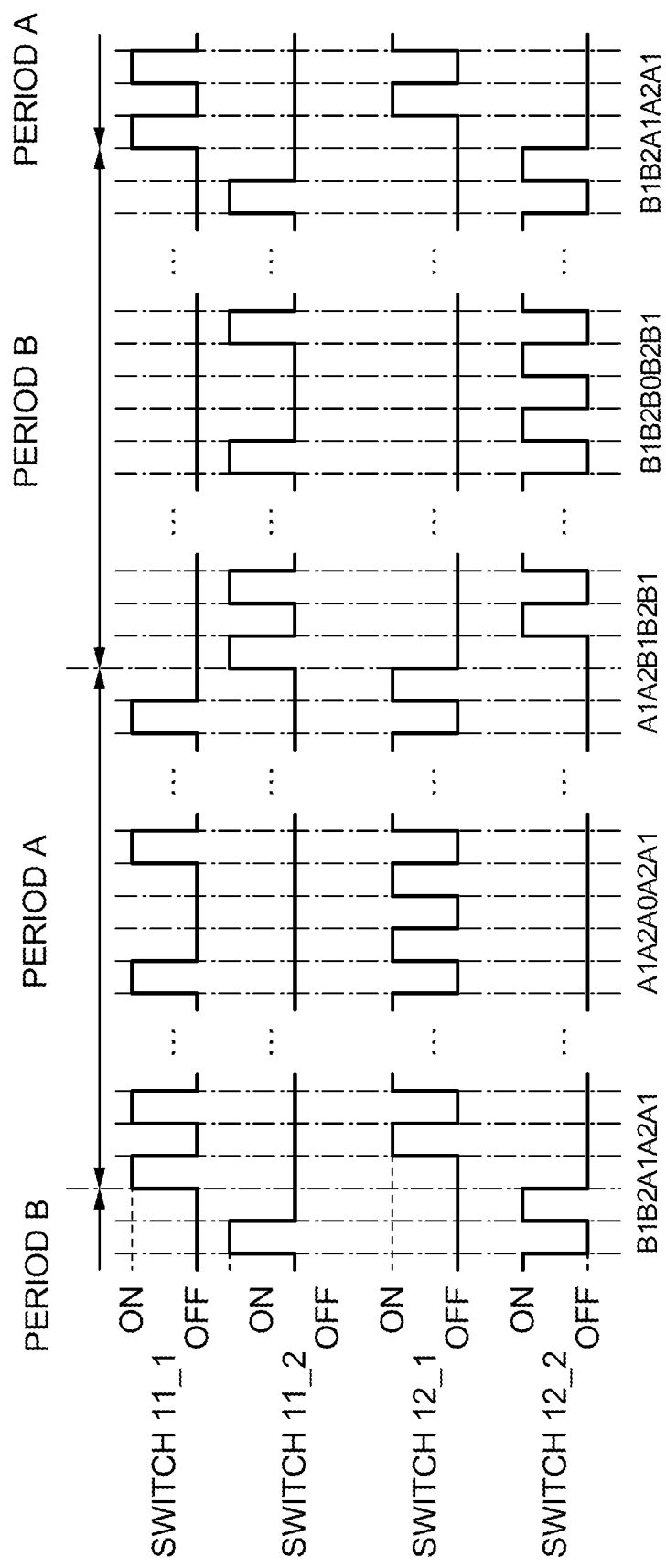
FIG. 42 is a timing chart for illustrating operation of a semiconductor device.

In the example of the timing chart in FIG. 42, the period A and the period B are alternately placed. Note that this embodiment is not limited thereto, and the period A and the period B can be placed in various orders. Further, in the timing chart, another period other than the periods A and B can be provided. Alternatively, one of the period A and the period B can be eliminated.

In the period A, after the period A1 and the period A2 are repeated, the period A0 is placed. Then, the period A1 and the period A2 are repeated again in the period A. Note that this embodiment is not limited thereto, and the period A, the period A1, and the period A2 can be placed in various orders. Further, in the period A, the period B0, the period B1, the period B2, and/or another period can be placed. Alternatively, any of the period A0, the period A1, and the period A2 can be eliminated. Moreover, the period A0 can be placed next to the period A1 or next to the period A2, placed at the beginning of the period A, or placed next to another period.

In the period B, after the period B1 and the period B2 are repeated, the period B0 is placed. Then, the period B1 and the period B2 are repeated again in the period B. Note that this embodiment is not limited thereto, and the period B0, the period B1, and the period B2 can be placed in various orders. Further, in the period B, the period A0, the period A1, the period A2, and/or another period can be placed. Alternatively, any of the period B0, the period B1, and the period B2 can be eliminated. Moreover, the period B0 can be placed next to the period B1 or next to the period B2, placed at the beginning of the period B, or placed next to another period.

First, operation in the period A is described. In the period A, the switch 11_1 and the switch 12_1 are alternately turned on and off in each sub-period, and the switches 11_2 and 12_2 are off. On and off of the switches 11_1 and 12_1 are opposite to each other in many cases. Note that this embodiment is not limited thereto, and both the switch 11_1 and the switch 12_1 can be off or on. Alternatively, the switch 11_2 and/or the switch 12_2 can be on.

Figure 41C:
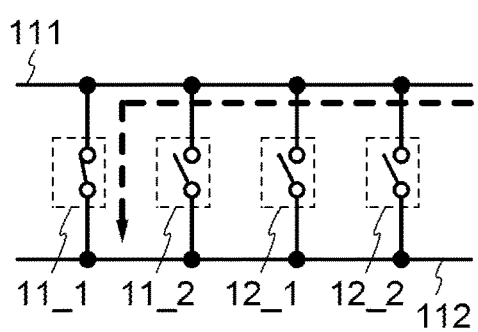
Figure 41D:
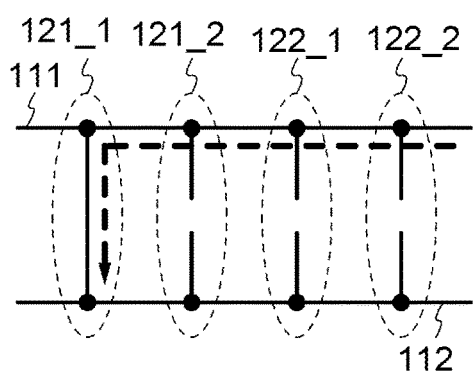

In the period A1 of the period A, the switch 11_1 is on, and the switches 11_2, 12_1, and 12_2 are off as illustrated in FIG. 41C. Accordingly, as illustrated in FIG. 41D, the path 121_1 is brought into conduction, and the paths 121_2, 122_1, and 122_2 are brought out of conduction. Thus, the wirings 111 and 112 are brought into conduction through the switch 11_1, so that a voltage (e.g., the voltage V1) or a signal applied to the wiring 112 is applied to the wiring 111 through the switch 11_1. That is, the wirings 111 and 112 are brought into conduction through the path 121_1, so that a voltage (e.g., the voltage V1) or a signal applied to the wiring 112 is applied to the wiring 111 through the path 121_1.

Figure 41E:
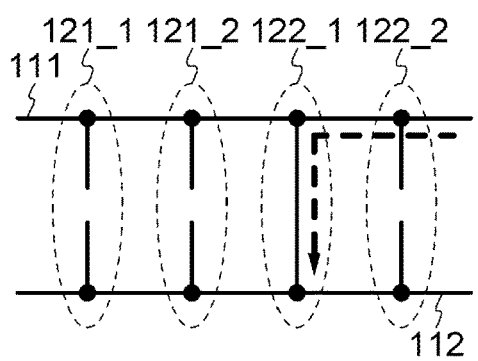

In the period A2 of the period A, the switch 12_1 is on, and the switches 11_1, 11_2, and 12_2 are off. Accordingly, as illustrated in FIG. 41E, the path 122_1 is brought into conduction, and the paths 121_1, 121_2, and 122_2 are brought out of conduction. Thus, the wirings 111 and 112 are brought into conduction through the switch 12_1, so that a voltage (e.g., the voltage V1) or a signal applied to the wiring 112 is applied to the wiring 111 through the switch 12_1. That is, the wirings 111 and 112 are brought into conduction through the path 122_1, so that a voltage (e.g., the voltage V1) or a signal applied to the wiring 112 is applied to the wiring 111 through the path 122_1.

Figure 41F:
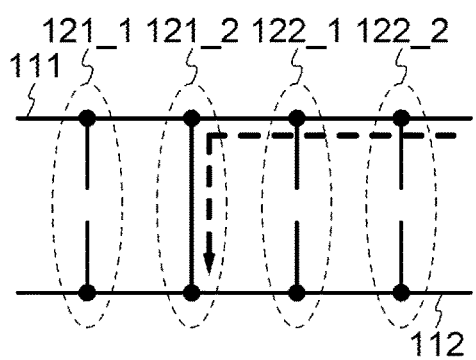
Figure 41G:
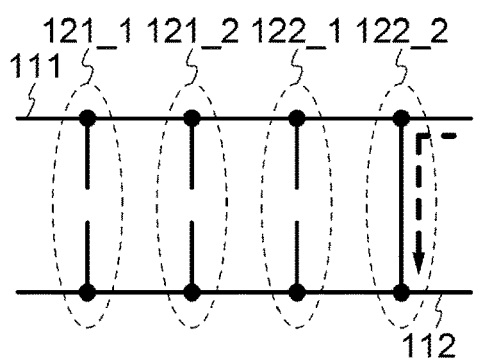
Figure 41H:
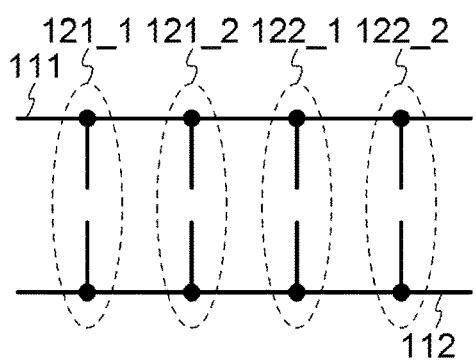

In the period A0 of the period A, the switches 11_1, 11_2, 12_1, and 12_2 are off. Accordingly, as illustrated in FIG. 41H, the paths 121_1, 121_2, 122_1, and 122_2 are brought out of conduction. Thus, the wirings 111 and 112 are brought out of conduction, so that a voltage (e.g., the voltage V1) or a signal applied to the wiring 112 is not applied to the wiring 111.

Next, operation in the period B is described. In the period B, the switches 11_1 and 12_1 are off, and the switches 11_2 and 12_2 are alternately turned on and off in each sub-period in many cases. Note that this embodiment is not limited thereto, and both the switch 11_2 and the switch 12_2 can be off or on. Alternatively, the switch 11_1 and/or the switch 12_1 can be on.

In the period B1 of the period B, the switch 11_2 is on, and the switches 11_1, 12_1, and 12_2 are off. Accordingly, as illustrated in FIG. 41F, the path 121_2 is brought into conduction, and the paths 121_1, 122_1, and 122_2 are brought out of conduction. Thus, the wirings 111 and 112 are brought into conduction through the switch 11_2, so that a voltage (e.g., the voltage V1) or a signal applied to the wiring 112 is applied to the wiring 111 through the switch 11_2. That is, the wirings 111 and 112 are brought into conduction through the path 121_2, so that a voltage (e.g., the voltage V1) or a signal applied to the wiring 112 is applied to the wiring 111 through the path 121_2.

In the period B2 of the period B, the switch 12_2 is on, and the switches 11_1, 11_2, and 12_1 are off. Accordingly, as illustrated in FIG. 41G, the path 122_2 is brought into conduction, and the paths 121_1, 121_2, and 122_1 are brought out of conduction. Thus, the wirings 111 and 112 are brought into conduction through the switch 12_2, so that a voltage (e.g., the voltage V1) or a signal applied to the wiring 112 is applied to the wiring 111 through the switch 12_2. That is, the wirings 111 and 112 are brought into conduction through the path 122_2, so that a voltage (e.g., the voltage V1) or a signal applied to the wiring 112 is applied to the wiring 111 through the path 122_2.

In the period B0 of the period B, the switches 11_1, 11_2, 12_1, and 12_2 are off. Accordingly, as illustrated in FIG. 41H, the paths 121_1, 121_2, 122_1, and 122_2 are brought out of conduction. Thus, the wirings 111 and 112 are brought out of conduction, so that a voltage (e.g., the voltage V1) or a signal applied to the wiring 112 is not applied to the wiring 111.

By thus switching periods during which each switch is on, the time during which the switch is on can be reduced. Thus, degradation of an element used as a switch, a circuit, or the like can be suppressed.

In the period A0 and the period B0, the voltage V2 or an H-level signal (e.g., an H-level clock signal) is input to the wiring 111 in many cases. Note that this embodiment is not limited thereto, and the wiring 111 can be set in a floating state without a voltage, a signal, or the like input to the wiring 111.

The time when the period A0 starts in the period A (or a period from the start time of the period A to the start time of the period A0) is approximately equal to the time when the period B0 starts in the period B (or a period from the start time of the period B to the start time of the period B0) in many cases. Note that this embodiment is not limited thereto.

Note that the term "period" can also be referred to as step or operation. For example, "first period" and "second period" can also be referred to as first step and second step.

Note that the configuration of the switches is not limited to that in FIG. 41A as long as the operation can be performed as illustrated in FIGS. 41B to 41H.

Among the switches 11_1, 11_2, 12_1, and 12_2, two or more switches (i.e., two, three, or four switches) can be turned on at the same time. For example, the switches 11_1 and 12_1 can be turned on at the same time.

Figure 43A:
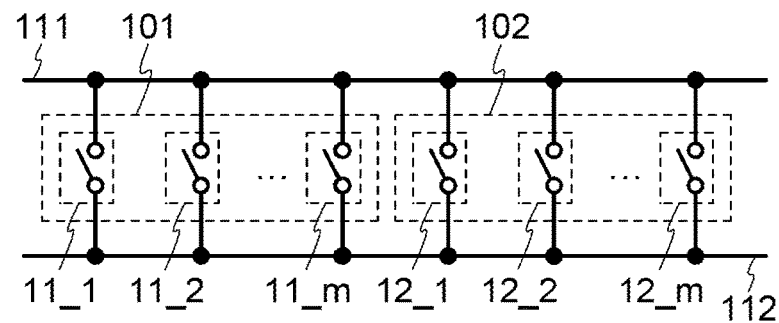
FIGS. 43A to 43E are circuit diagrams each illustrating a semiconductor device.
Figure 43B:
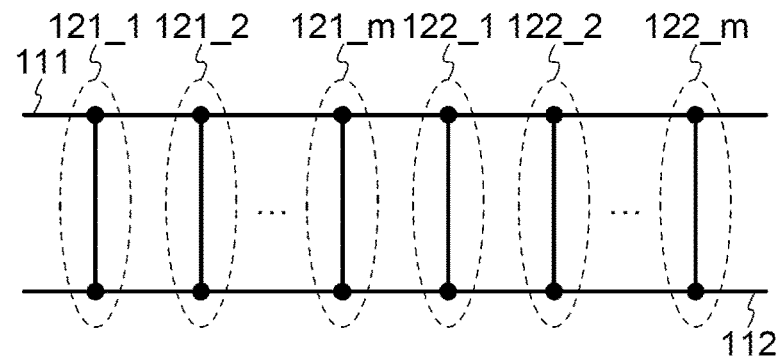

Note that the circuit 101 and/or the circuit 102 can include three or more switches. For example, as illustrated in FIG. 43A, the circuit 101 can include a plurality of switches 11_1 to 11_$m$ ($m$ is a natural number) and the circuit 102 can include a plurality of switches 12_1 to 12_$m$. Each of the switches 11_1 to 11_$m$ corresponds to the switch 11_1 or the switch 11_2, and has a function similar to that of the switch 11_1 or the switch 11_2. Each of the switches 12_1 to 12_$m$ corresponds to the switch 12_1 or the switch 12_2, and has a function similar to that of the switch 12_1 or the switch 12_2. The switches 11_1 to 11_$m$ and the switches 12_1 to 12_$m$ are connected between the wiring 111 and the wiring 112. Accordingly, as illustrated in FIG. 43B, there are a plurality of paths 121_1 to 121_$m$ and a plurality of paths 122_1 to 122_$m$ between the wirings 111 and 112. Note that this embodiment is not limited thereto, and the circuit 101 and/or the circuit 102 can include one switch. Further, the number of switches included in the circuit 101 can be different from the number of switches included in the circuit 102.

Figure 44:
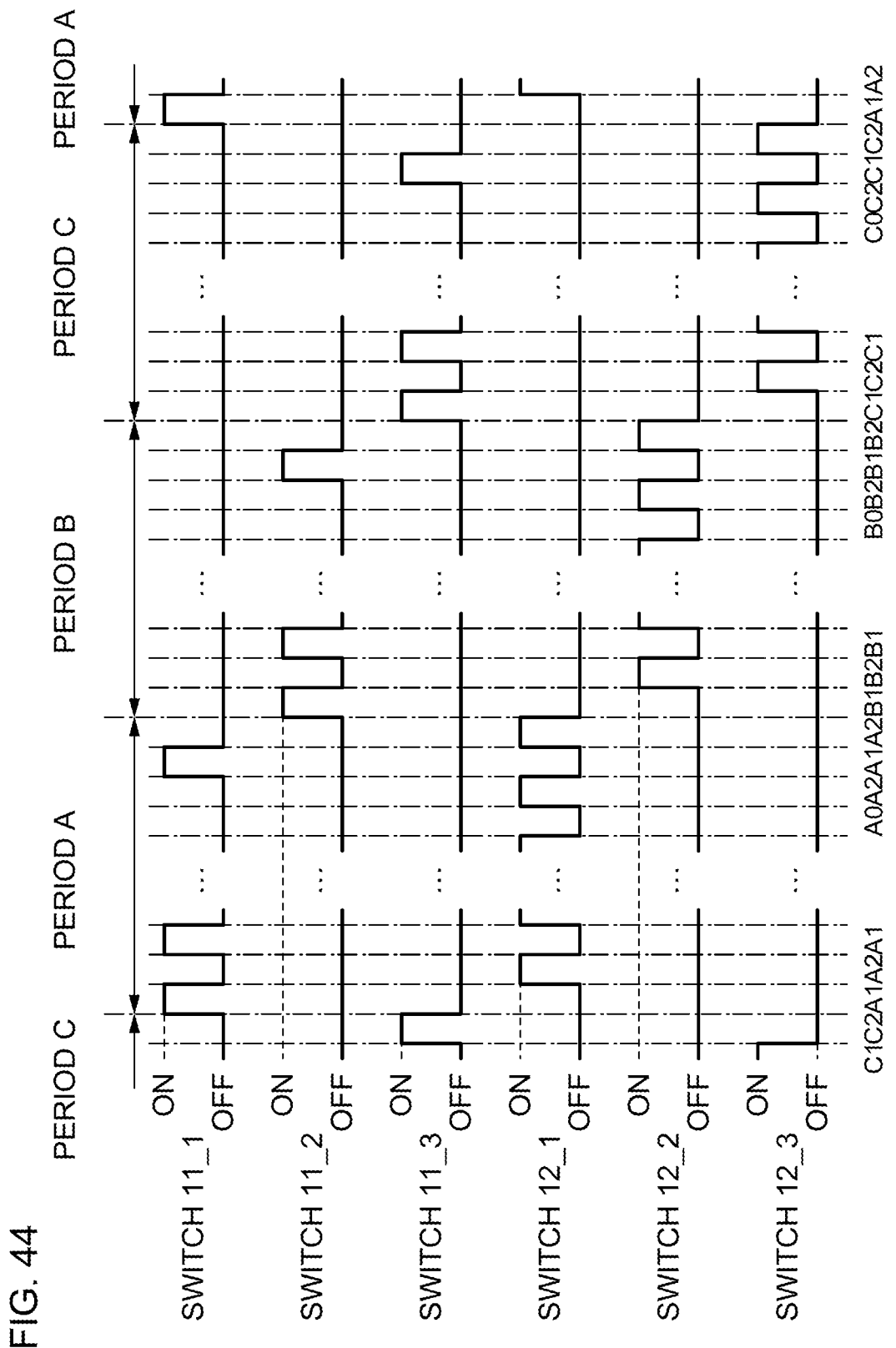
FIG. 44 is a timing chart for illustrating operation of a semiconductor device.

FIG. 44 illustrates an example of a timing chart which can be used for the circuit in FIG. 43A. The timing chart in FIG. 44 is an example of the case where $m=3$. Accordingly, the circuit 101 can include a plurality of switches 11_1 to 11_3, and the circuit 102 can include a plurality of switches 12_1 to 12_3. The timing chart in FIG. 44 illustrates a plurality of periods of the period A, the period B, and a period C. Like the period A or the period B, the period C has a plurality of sub-periods of a period C0, a period C1, and a period C2. In the example of the timing chart in FIG. 44, the period A, the period B, and the period C are placed in order. Note that this embodiment is not limited thereto, and the period A, the period B, and the period C can be placed in various orders. Further, in the timing chart, another period other than the periods A, B, and C can be provided, or one of the periods A, B, and C can be eliminated. In the period C, after the period C1 and the period C2 are repeated, the period C0 is placed. Then, the period C1 and the period C2 are repeated again in the period C. Note that this embodiment is not limited thereto, and the period C0, the period C1, and the period C2 can be placed in various orders. Further, in the period C, the period A0, the period A1, the period A2, the period B0, the period B1, the period B2, and/or another period can be placed. Alternatively, any of the period C0, the period C1, and the period C2 can be eliminated. Moreover, the period C0 can be placed next to the period C1, the period C2, or another period.

In the periods A and B, the switches 11_3 and 12_3 are off. Accordingly, a path 121_3 and a path 122_3 are brought out of conduction. Note that this embodiment is not limited thereto, and the switch 11_3 and/or the switch 12_3 can be on.

In the period C, the switch 11_3 and the switch 12_3 are alternately turned on and off in each sub-period, and the switches 11_1, 11_2, 12_1, and 12_2 are off. On and off of the switches 11_3 and 12_3 are opposite to each other in many cases. Note that this embodiment is not limited thereto, and both the switch 11_3 and the switch 12_3 can be on or off. Further, the switch 11_1, the switch 11_2, the switch 12_1, and/or the switch 12_2 can be on.

In the period C1 of the period C, the switch 11_3 is on, and the switches 11_1, 11_2, 12_1, 12_2, and 12_3 are off. Accordingly, the path 121_3 is brought into conduction, and the paths 121_1, 121_2, 122_1, 122_2, and 122_3 are brought out of conduction. Thus, the wirings 111 and 112 are brought into conduction through the switch 11_3, so that a voltage (e.g., the voltage V1) or a signal applied to the wiring 112 is applied to the wiring 111 through the switch 11_3. That is, the wirings 111 and 112 are brought into conduction through the path 121_3, so that a voltage (e.g., the voltage V1) or a signal applied to the wiring 112 is applied to the wiring 111 through the path 121_3.

In the period C2 of the period C, the switch 12_3 is on, and the switches 11_1, 11_2, 11_3, 12_1, and 12_2 are off. Accordingly, the path 122_3 is brought into conduction, and the paths 121_1, 121_2, 121_3, 122_1, and 122_2 are brought out of conduction. Thus, the wirings 111 and 112 are brought into conduction through the switch 12_3, so that a voltage (e.g., the voltage V1) or a signal applied to the wiring 112 is applied to the wiring 111 through the switch 12_3. That is, the wirings 111 and 112 are brought into conduction through the path 122_3, so that a voltage (e.g., the voltage V1) or a signal applied to the wiring 112 is applied to the wiring 111 through the path 122_3.

In the period C0 of the period C, the switches 11_1, 11_2, 11_3, 12_1, 12_2, and 12_3 are off. Accordingly, the paths 121_1, 121_2, 121_3, 122_1, 122_2, and 122_3 are brought out of conduction. Thus, the wirings 111 and 112 are brought out of conduction, so that a voltage (e.g., the voltage V1) or a signal applied to the wiring 112 is not applied to the wiring 111.

Note that in FIG. 43A, the time during which the switch is on can be reduced as $m$ becomes larger. Accordingly, degradation of an element used as a switch, a circuit, or the like can be suppressed. However, when $m$ is too large, the circuit size becomes too large. Thus, it is preferable that $m \leq 6$. It is more preferable that $m \leq 4$. It is further preferable that $m=2$ or $m=3$.

Figure 43C:
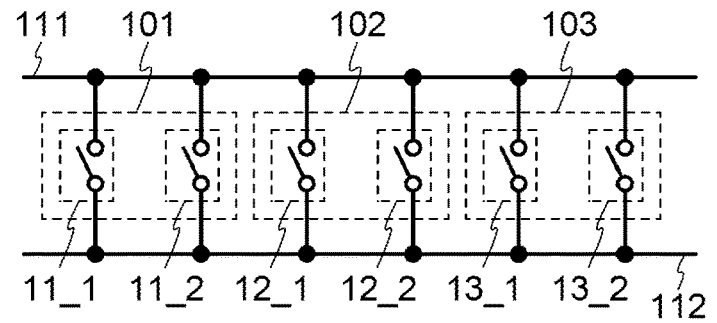
Figure 43D:
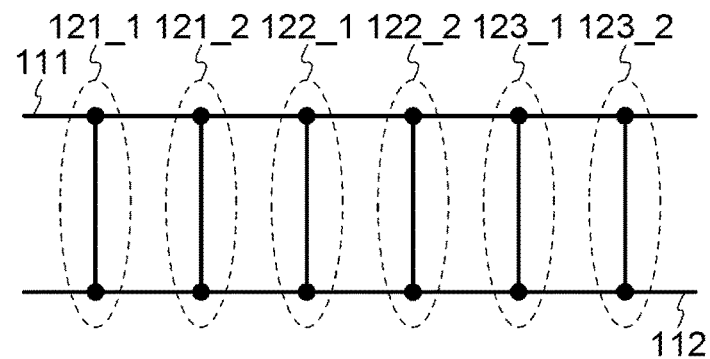

The circuit in FIG. 41A can include a plurality of circuits corresponding to the circuit 101 or the circuit 102. FIG. 43C illustrates an example of the case where a circuit includes a plurality of circuits 101, 102, and 103. The circuit 103 includes a plurality of switches: a switch 13_1 and a switch 13_2. The circuit 103 corresponds to the circuit 101 or the circuit 102; the switch 13_1 corresponds to the switch 11_1 or the switch 12_1; and the switch 13_2 corresponds to the switch 11_2 or the switch 12_2. The switches 13_1 and 13_2 are connected between the wiring 111 and the wiring 112. Accordingly, as illustrated in FIG. 43D, there are a path 123_1 and a path 123_2 in addition to the paths 121_1, 121_2, 122_1, and 122_2 between the wirings 111 and 112. Note that this embodiment is not limited thereto, and the circuit can include one circuit corresponding to the circuit 101 or the circuit 102, or four or more circuits corresponding to the circuit 101 or the circuit 102.

Figure 45:
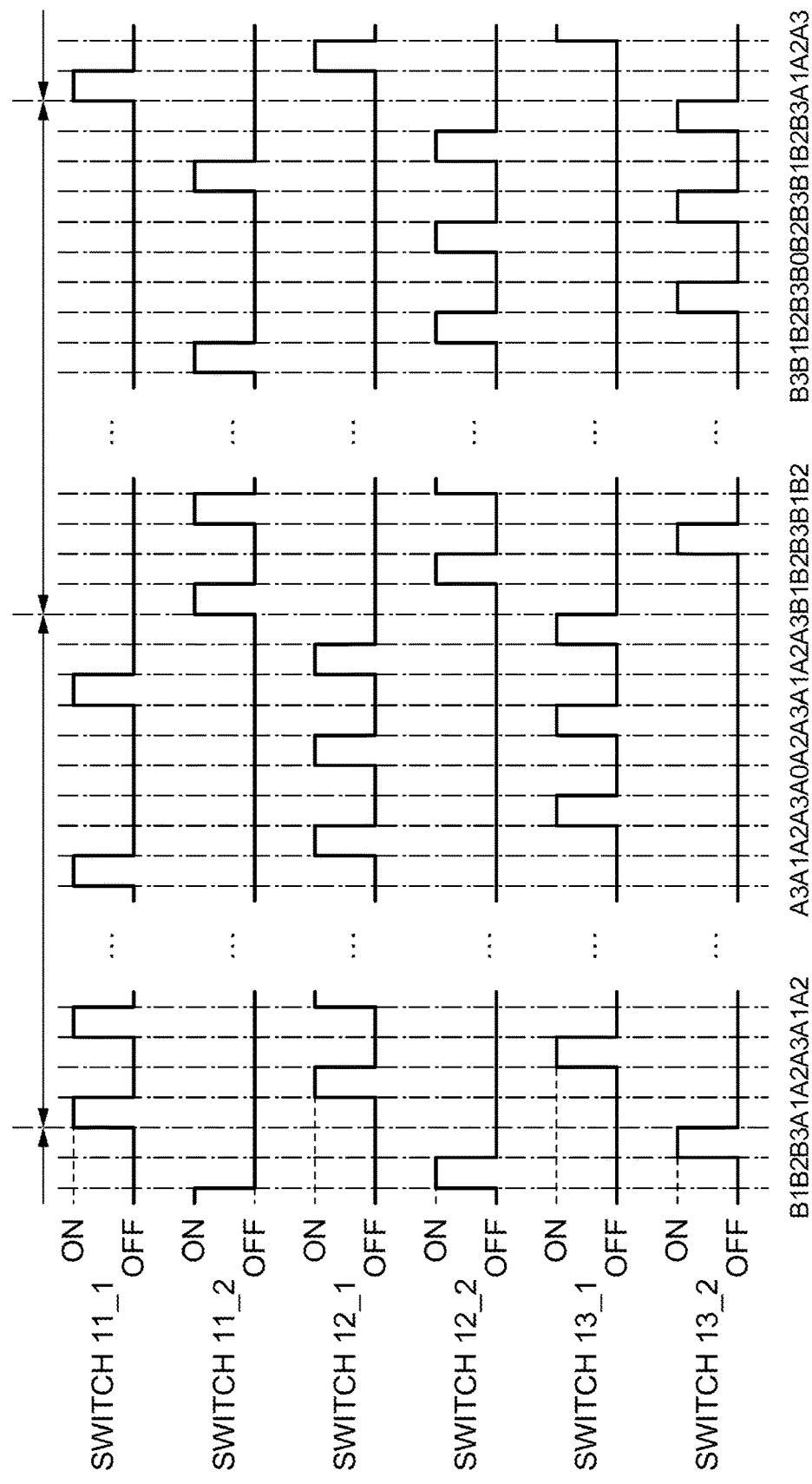
FIG. 45 is a timing chart for illustrating operation of a semiconductor device.

FIG. 45 illustrates an example of a timing chart which can be used for the circuit in FIG. 43C. In the timing chart in FIG. 45, the period A has a plurality of sub-periods of periods A0 to A3 and the period B has a plurality of sub-periods of periods B0 to B3. In the period A, after the periods A1 to A3 are repeated, the period A0 is placed. Then, the periods A1 to A3 are repeated again in the period A. Similarly, in the period B, after the periods B1 to B3 are repeated, the period B0 is placed. Then, the periods B1 to B3 are repeated again in the period B. Note that this embodiment is not limited thereto, and the periods A0 to A3 can be placed in various orders in the period A. Moreover, the periods B0 to B3 can be placed in various orders in the period B. Further, in the period A, any of the periods B0 to B3 or another period can be placed. In the period B, any of the periods A0 to A3 or another period can be placed. Alternatively, in the period A, any of the periods A0 to A3 can be eliminated. In the period B, any of the periods B0 to B3 can be eliminated. Furthermore, in the period A, the period A0 can be placed next to any of the periods A1 to A3, or next to another period. In the period B, the period B0 can be placed next to any of the periods B1 to B3, or next to another period.

In the period A, the switches 11_1, 12_1, and 13_1 are turned on in order, and the switches 11_2, 12_2, and 13_2 are off. Note that this embodiment is not limited thereto, and the switches 11_1, 12_1, and 13_1 can be turned on in various orders. Alternatively, the switches 11_1, 12_1, and 13_1 can be off or on. Further, the switch 11_2, the switch 12_2, and/or the switch 13_2 can be on.

In the periods A0, A1, and A2 of the period A, the switches 13_1 and 13_2 are off. Accordingly, the paths 123_1 and 123_2 are brought out of conduction. Note that this embodiment is not limited thereto, and the switch 13_1 and/or the switch 13_2 can be on.

In the period A3 of the period A, the switch 13_1 is on, and the switches 11_1, 11_2, 12_1, 12_2, and 13_2 are off. Accordingly, the path 123_1 is brought into conduction, and the paths 121_1, 121_2, 122_1, 122_2, and 123_2 are brought out of conduction. Thus, the wirings 111 and 112 are brought into conduction through the switch 13_1, so that a voltage (e.g., the voltage V1) or a signal applied to the wiring 112 is applied to the wiring 111 through the switch 13_1. That is, the wirings 111 and 112 are brought into conduction through the path 123_1, so that a voltage (e.g., the voltage V1) or a signal applied to the wiring 112 is applied to the wiring 111 through the path 123_1.

In the period B, the switches 11_2, 12_2, and 13_2 are turned on in order, and the switches 11_1, 12_1, and 13_1 are off. Note that this embodiment is not limited thereto, and the switches 11_2, 12_2, and 13_2 can be turned on in various orders. Alternatively, the switches 11_2, 12_2, and 13_2 can be off or on. Further, the switch 11_1, the switch 12_1, and/or the switch 13_1 can be on.

In the periods B0, B1, and B2 of the period B, the switches 13_1 and 13_2 are off. Accordingly, the paths 121_3 and 122_3 are brought out of conduction. Note that this embodiment is not limited thereto, and the switch 13_1 and/or the switch 13_2 can be on.

In the period B3 of the period B, the switch 13_2 is on, and the switches 11_1, 11_2, 12_1, 12_2, and 13_1 are off. Accordingly, the path 123_2 is brought into conduction, and the paths 121_1, 121_2, 122_1, 122_2, and 123_1 are brought out of conduction. Thus, the wirings 111 and 112 are brought into conduction through the switch 132, so that a voltage (e.g., the voltage V1) or a signal applied to the wiring 112 is applied to the wiring 111 through the switch 13_2. That is, the wirings 111 and 112 are brought into conduction through the path 123_2, so that a voltage (e.g., the voltage V1) or a signal applied to the wiring 112 is applied to the wiring 111 through the path 123_2.

Note that as the number of circuits corresponding to the circuit 101 or the circuit 102 increases in FIG. 43C, the time during which the switch is on can be reduced. Accordingly, degradation of an element used as a switch, a circuit, or the like can be suppressed. However, when the number of circuits corresponding to the circuit 101 or the circuit 102 is too large, the number of switches is increased, so that the circuit size becomes too large. Thus, the number of circuits corresponding to the circuit 101 or the circuit 102 is preferably equal to or less than 6, more preferably equal to or less than 4, and further preferably 3 or 2. Note that this embodiment is not limited thereto, and the number of circuits corresponding to the circuit 101 or the circuit 102 can be 1, or 6 or more.

In FIG. 43C, each of the plurality of circuits corresponding to the circuit 101 or the circuit 102 can include three or more switches which are connected between the wirings 111 and 112, as in FIG. 43A.

Figure 43E:
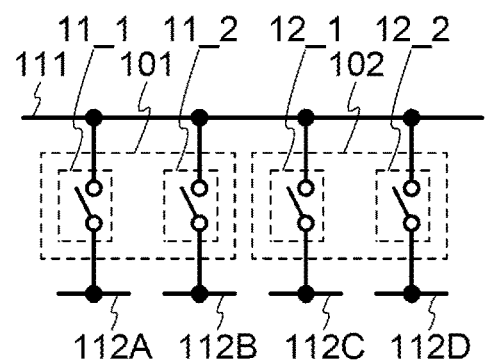

Note that a wiring can be divided into a plurality of wirings. To the plurality of wirings, the same signal, voltage, or the like can be input or different signals, voltages, or the like can be input. Moreover, the plurality of wirings can be connected to the same wiring, element, or the like or alternatively can be connected to different wirings, elements, or the like. FIG. 43E illustrates an example of a configuration in which the wiring 112 is divided into a plurality of wirings 112A to 112D. The switches 11_1, 11_2, 12_1, and 12_2 are connected between the respective wirings 112A to 112D and the wiring 111. The wirings 112A to 112D correspond to the wiring 112. Accordingly, the voltage V1 can be applied to the wirings 112A to 112D, and the wirings 112A to 112D can function as power supply lines. Note that this embodiment is not limited thereto, and different voltages or different signals can be input to the wirings 112A to 112D. Any of the wirings 112A to 112D can be used in common. Alternatively, each of the wirings 112A to 112D can be also used as another wiring.

As in FIG. 43E, the wiring 112 can be divided into a plurality of wirings in FIGS. 43A and 43C. Moreover, a switch can be connected between the wiring 111 and each of the plurality of wirings.

Next, an example of the case of using a transistor as a switch will be described with reference to FIG. 1A. FIG. 1A illustrates a configuration of the case where transistors 101_1, 101_2, 102_1, and 102_2 are used as the switches 11_1, 11_2, 12_1, and 12_2 in FIG. 41A, respectively. Note that this embodiment is not limited thereto, and a transistor can be used as the switch in the contents illustrated in FIGS. 41A to 41H, FIG. 42, FIGS. 43A to 43E, FIG. 44, and FIG. 45 or in configurations obtained by combining the contents. For example, in FIGS. 43A, 43C, and 43E, a transistor can be used as the switch.

Note that the transistors 101_1, 101_2, 102_1, and 102_2 are n-channel transistors. An n-channel transistor is turned on when the potential difference (Vgs) between a gate and a source exceeds the threshold voltage (Vth). Note that this embodiment is not limited thereto, and the transistor 101_1, the transistor 101_2, the transistor 102_1, and/or the transistor 102_2 can be a p-channel transistor. A p-channel transistor is turned on when the potential difference (Vgs) between a gate and a source is lower than the threshold voltage (Vth). Moreover, a CMOS switch can be used as the switch.

The connection relation in a semiconductor device of FIG. 1A will be described. First terminals of the transistors 101_1, 101_2, 102_1, and 102_2 are connected to the wiring 112. Second terminals of the transistors 101_1, 101_2,

102_1, and 102_2 are connected to the wiring 111. Gates of the transistors 101_1, 101_2, 102_1, and 102_2 are connected to wirings 113_1, 113_2, 114_1, and 114_2, respectively. Note that this embodiment is not limited thereto, and various other connection structures can be employed.

As an example, signals S1_1 and S1_2 are input to the wirings 113_1 and 113_2, respectively. The signals S1_1 and S1_2 are often digital signals and can function as clock signals. As an example, signals S2_1 and S2_2 are input to the wirings 114_1 and 114_2, respectively. The signal S2_1 is an inverted signal of the signal S1_1 or a signal whose phase is shifted by 180° from the signal S1_1 in many cases, and can function as an inverted clock signal. Similarly, the signal S2_2 is an inverted signal of the signal S1_2 or a signal whose phase is shifted by 180° from the signal S1_2 in many cases, and can function as an inverted clock signal. Note that this embodiment is not limited thereto, and various other signals, currents, or voltages can be input to the wirings 111, 112, 113_1, 113_2, 114_1, and 114_2.

The signals S1_1 and S1_2 are repeatedly brought into an active state and a non-active state per given period (e.g., per frame or per operation period) in many cases. Moreover, the states of the signals S1_1 and S1_2 are often opposite to each other between an active state and a non-active state. Similarly, the signals S2_1 and S2_2 are repeatedly brought into an active state and a non-active state per given period (e.g., per frame or per operation period) in many cases. Moreover, the states of the signals S2_1 and S2_2 are often opposite to each other between an active state and a non-active state. For example, in a k-th frame (k is a natural number), when the signals S1_1 and S2_1 are in an active state, the signals S1_2 and S2_2 are brought into a non-active state. Then, in a (k+1)-th frame, when the signals S1_1 and S2_1 are brought into a non-active state, the signals S1_2 and S2_2 are brought into an active state. Note that this embodiment is not limited thereto, and the signals S1_1 and S1_2 can be brought into the same state (an active state or a non-active state). Similarly, the signals S2_1 and S2_2 can be brought into the same state (an active state or a non-active state). Alternatively, the signals S1_1, S1_2, S2_1, and S2_2 can be repeatedly brought into an active state and a non-active state per a plurality of frames, each time power is applied to the semiconductor device, or at random.

Note that the term "a signal is brought into an active state" refers to a state where the signal can be set at the H level or the L level. The term "a signal is brought into a non-active state" indicates that the signal has a given value (e.g., the H level or the L level). Here, as an example, a signal is set at the L level when it is described that the signal is brought into a non-active state. Note that this embodiment is not limited thereto. For example, a signal can have a given value when the signal is brought into an active state.

The wirings 113_1, 113_2, 114_1, and 114_2 can function as signal lines or clock signal lines. Note that this embodiment is not limited thereto, and when a voltage is applied to the wirings 113_1, 113_2, 114_1, and 114_2, these wirings can function as power supply lines.

Note that a multi-phase clock signal can be input to the semiconductor device. For example, an n-phase clock signal (n is a natural number) can be input to the semiconductor device. The n-phase clock signal is n clock signals whose phases are shifted from each other. An example of the n-phase clock signal is n clock signals whose phases are shifted by a 1/n period. Note that this embodiment is not limited thereto.

In the case where the signals S1_1, S1_2, S2_1, and S2_2 are in an active state, the time during which the signals are at the L level is preferably approximately equal to the time during which the signals are at the H level in order to simplify a circuit for generating signals. Note that this embodiment is not limited thereto, and the time during which the signals are at the L level can be longer or shorter than the time during which the signals are at the H level.

Note that a balance indicates that the duty ratio is approximately 50%, that is, the time during which the signal is at the H level is approximately equal to the time during which the signal is at the L level. An imbalance refers to a state of not being balanced, that is, an imbalance indicates that the time during which the signal is at the H level is not equal to the time during which the signal is at the L level.

Figure 1B:
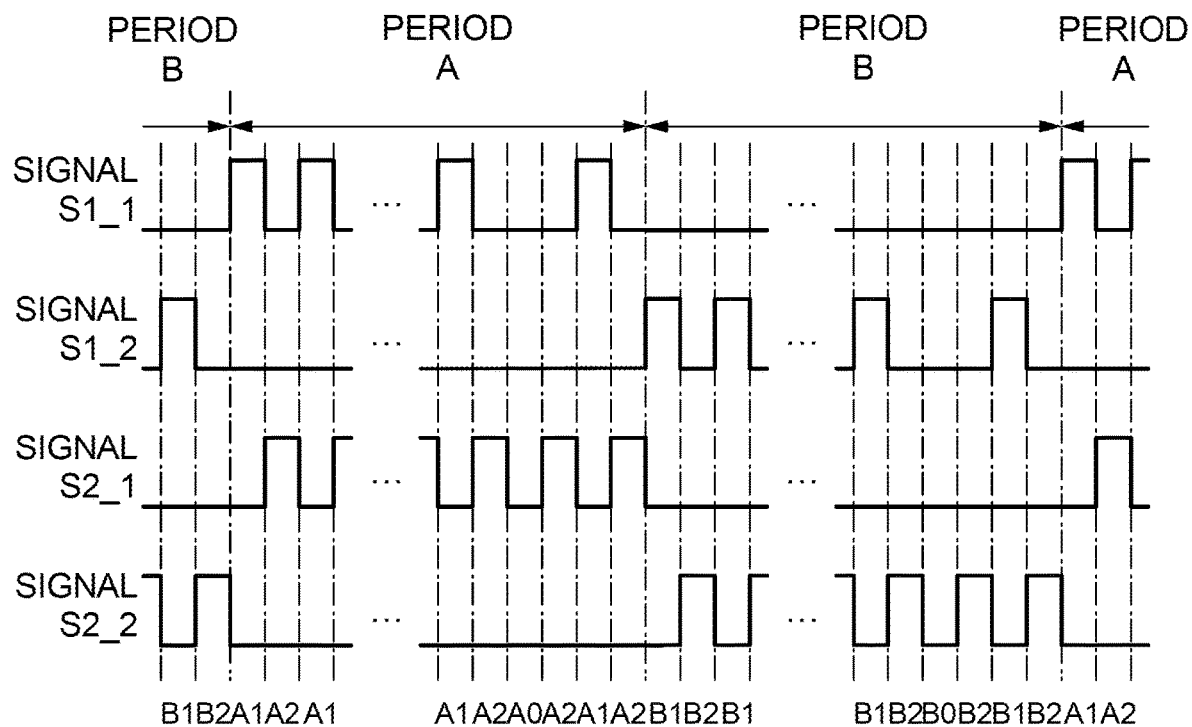
FIG. 1B is a timing chart illustrating operation of the semiconductor device.

Next, operation of the semiconductor device in FIG. 1A will be described with reference to a timing chart in FIG. 1B. The timing chart in FIG. 1B corresponds to the timing chart in FIG. 42. Note that the description of the same operation as that in FIG. 41A is omitted.

First, operation in the period A is described. In the period A, the signals S1_1 and S2_1 are brought into an active state, and the signals S1_2 and S2_2 are brought into a non-active state. Accordingly, the signals S1_1 and S2_1 are repeatedly set at the H level and the L level per sub-period, and the signals S1_2 and S2_2 are set at the L level. The levels of the signals S1_1 and S2_1 are opposite to each other between the H level and the L level in many cases. Note that this embodiment is not limited thereto, and both the signal S1_1 and the signal S2_1 can beset at the H level or the L level. Alternatively, the signal S1_2 and/or the signal S2_2 can be set at the H level.

Figure 2A:
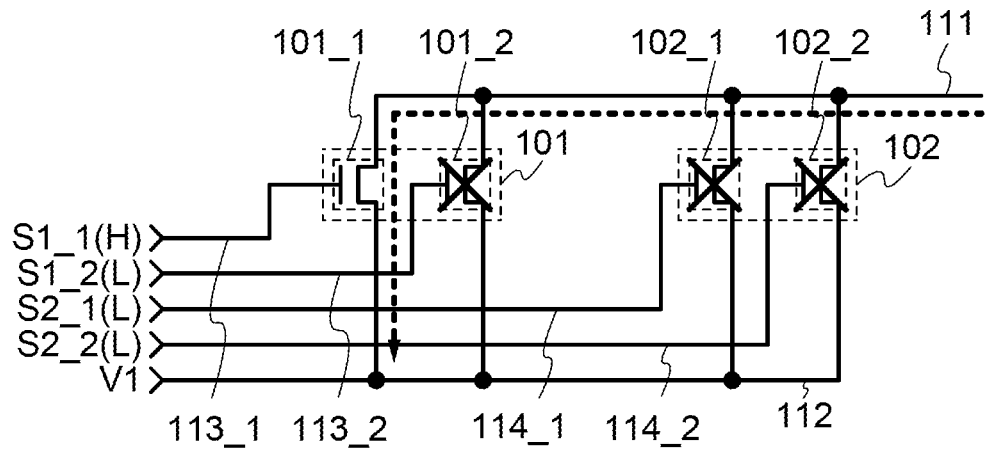
FIGS. 2A to 2C are schematic diagrams illustrating operation of a semiconductor device.

In the period A1 of the period A, the signal S1 is set at the H level, and the signals S1_2, S2_1, and S2_2 are set at the L level. Accordingly, as illustrated in FIG. 2A, the transistor 101_1 is turned on and the transistors 101_2, 102_1, and 102_2 are turned off. Thus, the wirings 111 and 112 are brought into conduction through the transistor 101_1, so that the voltage V1 is applied from the wiring 112 to the wiring 111 through the transistor 101_1.

Figure 2B:
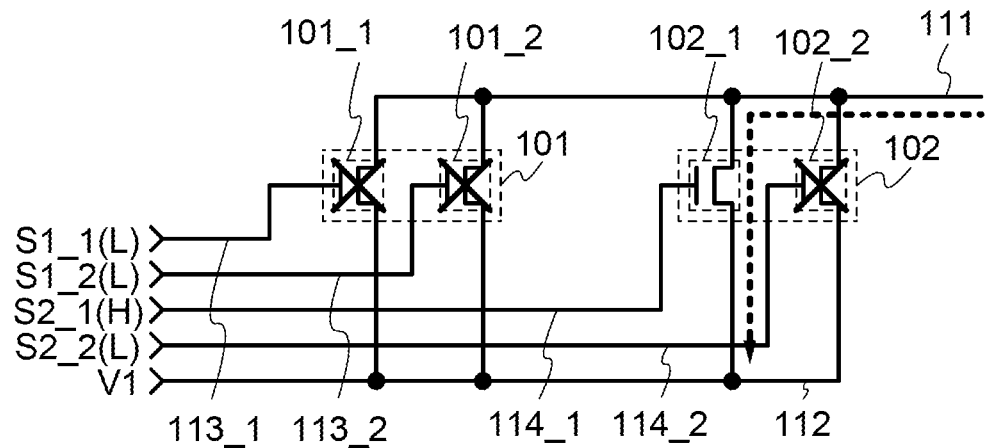

In the period A2 of the period A, the signal S2_1 is set at the H level, and the signals S1_1, S1_2, and S2_2 are set at the L level. Accordingly, as illustrated in FIG. 2B, the transistor 102_1 is turned on and the transistors 101_1, 101_2, and 102_2 are turned off. Thus, the wirings 111 and 112 are brought into conduction through the transistor 102_1, so that the voltage V1 is applied from the wiring 112 to the wiring 111 through the transistor 102_1.

Figure 2C:
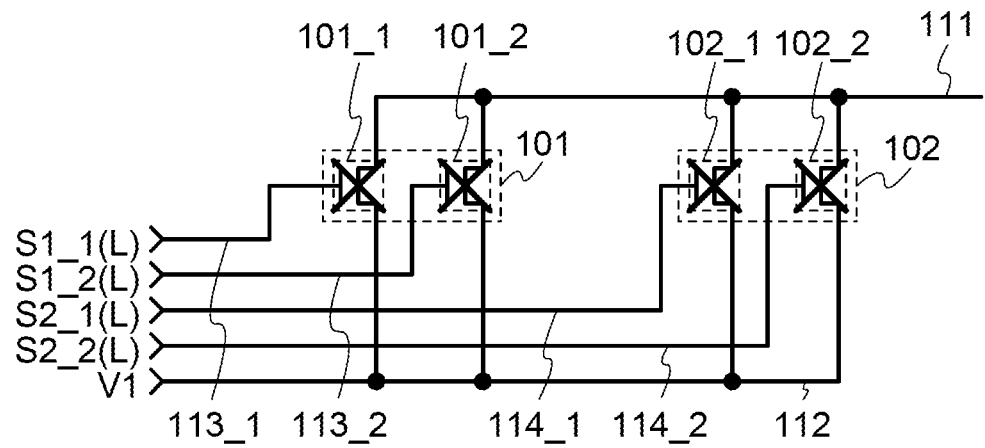

In the period A0 of the period A, the signals S1_1, S1_2, S2_1, and S2_2 are set at the L level. Accordingly, as illustrated in FIG. 2C, the transistors 101_1, 101_2, 102_1, and 102_2 are turned off. Thus, the wirings 111 and 112 are brought out of conduction.

Next, operation in the period B is described. In the period B, the signals S1_2 and S2_2 are brought into an active state, and the signals S1_1 and S2_1 are brought into a non-active state. Accordingly, the signals S1_2 and S2_2 are repeatedly set at the H level and the L level per sub-period, and the signals S1_1 and S2_1 are set at the L level. The levels of the signals S1_2 and S2_2 are often opposite to each other between the H level and the L level. Note that this embodiment is not limited thereto, and both the signal S1_2 and the signal S2_2 can be set at the L level or the H level. Alternatively, the signal S1_1 and/or the signal S2_1 can be set at the H level.

Figure 3A:
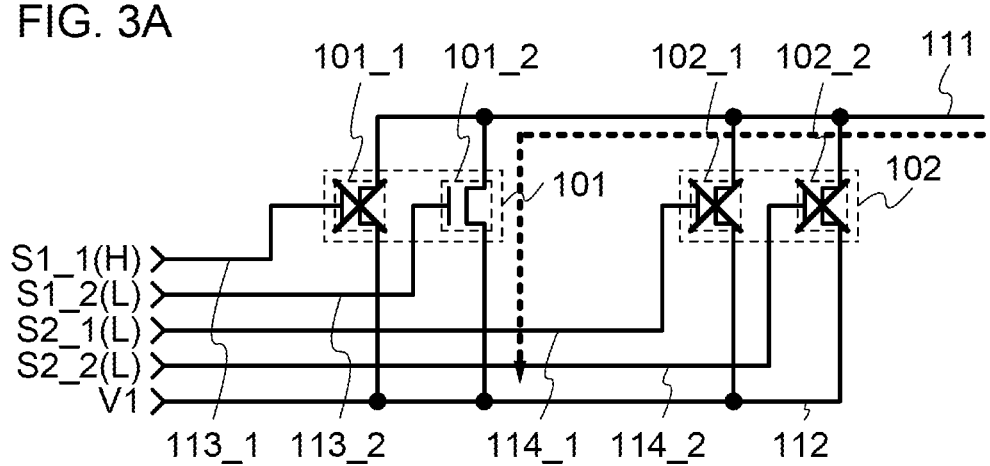
FIGS. 3A and 3B are schematic diagrams illustrating operation of a semiconductor device.

In the period B1 of the period B, the signal S1_2 is set at the H level, and the signals S1_1, S2_1, and S2_2 are set at the L level. Accordingly, as illustrated in FIG. 3A, the transistor 101_2 is turned on and the transistors 101_1, 102_1, and 102_2 are turned off. Thus, the wirings 111 and 112 are brought into conduction through the transistor 101_2, so that the voltage V1 is applied from the wiring 112 to the wiring 111 through the transistor 101_2.

Figure 3B:
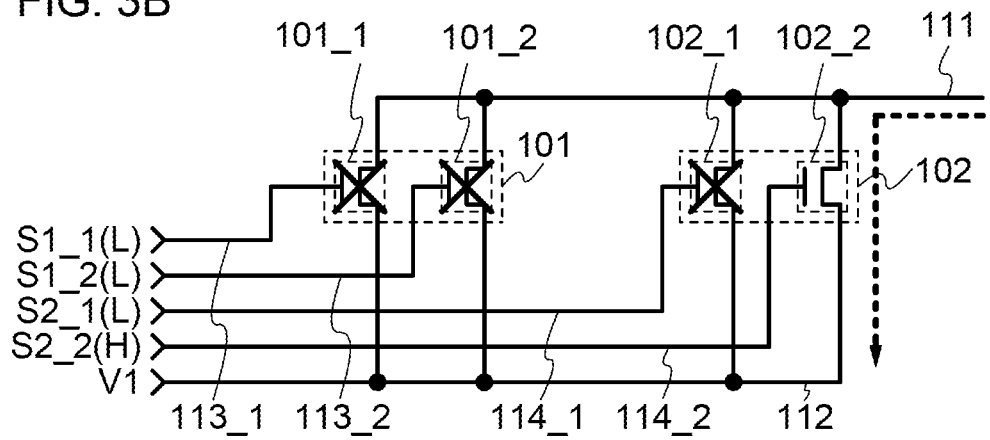

In the period B2 of the period B, the signal S2_2 is set at the H level, and the signals S1_1, S1_2, and S2_1 are set at the L level. Accordingly, as illustrated in FIG. 3B, the transistor 102_2 is turned on and the transistors 101_1, 101_2, and 102_1 are turned off. Thus, the wirings 111 and 112 are brought into conduction through the transistor 102_2, so that the voltage V1 is applied from the wiring 112 to the wiring 111 through the transistor 102_2.

In the period B0 of the period B, the signals S1_1, S1_2, S2_1, and S2_2 are set at the L level. Accordingly, as illustrated in FIG. 2C, the transistors 101_1, 101_2, 102_1, and 102_2 are turned off. Thus, the wirings 111 and 112 are brought out of conduction.

As described above, the time during which a transistor is on can be reduced in the semiconductor device in this embodiment. Accordingly, degradation of characteristics of the transistor can be suppressed. Thus, when a shift register, a gate driver, a display device, or the like includes the semiconductor device in this embodiment, the lifetime thereof can be increased.

In the semiconductor device in this embodiment, all the transistors can be n-channel transistors or p-channel transistors. Accordingly, reduction in the number of steps, improvement in yield, improvement in reliability, or reduction in cost can be realized more efficiently as compared to the case of using a CMOS circuit. In particular, when all the transistors including those in a pixel portion and the like are n-channel transistors, a non-single-crystal semiconductor, an amorphous semiconductor, a microcrystalline semiconductor, an organic semiconductor, an oxide semiconductor, or the like can be used for a semiconductor layer of the transistor. Although a transistor using such a semiconductor is likely to deteriorate, deterioration of the transistor can be suppressed in the semiconductor device in this embodiment.

It is not necessary to increase the channel width of a transistor so that a semiconductor device is operated even when characteristics of the transistor deteriorate. Accordingly, the channel width of the transistor can be reduced. This is because degradation of the transistor can be suppressed in the semiconductor device in this embodiment.

Note that the potential of the L level of the signal S1_1, the signal S1_2, the signal S2_1, and/or S2_2 can be lower than V1. In that case, a reverse bias is applied to a transistor when the signal is set at the L level. Accordingly, deterioration of the transistor can be moderated. Note that this embodiment is not limited thereto, and the potential of the L level of the signal S1_1, the signal S1_2, the signal S2_1, and/or S2_2 can be higher than V1.

Note that the potential of the H level of the signal S1_1, the signal S1_2, the signal S2_1, and/or S2_2 can be lower than V2. In that case, Vgs of a transistor is decreased when the signal is set at the H level and the transistor is turned on. Accordingly, deterioration of the transistor can be suppressed. Note that this embodiment is not limited thereto, and the potential of the H level of the signal S1_1, the signal S1_2, the signal S2_1, and/or S2_2 can be higher than V2.

It is preferable that the channel width of the transistor 101_1 be approximately equal to the channel width of the transistor 101_2. Similarly, it is preferable that the channel width of the transistor 102_1 be approximately equal to the channel width of the transistor 102_2. By making the transistors have approximately the same size in such a manner, the transistors can have approximately the same current supply capability. Accordingly, when a plurality of transistors are switched to be used, waveforms of signals can be approximately the same. Further, the degree of degradation of characteristics of the transistors can be approximately the same. Note that this embodiment is not limited thereto, and the channel width of the transistor 101_1 can be different from the channel width of the transistor 101_2. Alternatively, the channel width of the transistor 102_1 can be different from the channel width of the transistor 102_2.

Note that the channel width of a transistor can also be referred to as a W/L ratio of a transistor (W represents the channel width and L represents the channel length).

Figure 4A:
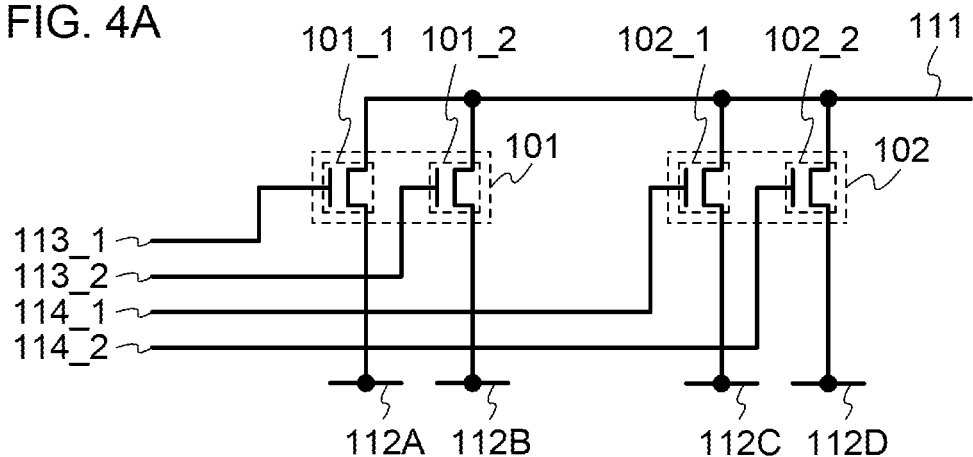
FIGS. 4A to 4C are circuit diagrams each illustrating a semiconductor device.

As illustrated in FIG. 4A, the wiring 112 can be divided into a plurality of wirings 112A to 112D as in FIG. 43E. The first terminals of the transistors 101_1, 101_2, 102_1, and 102_2 are connected to the wiring 112A, 112B, 112C, and 112D, respectively.

Figure 3C:
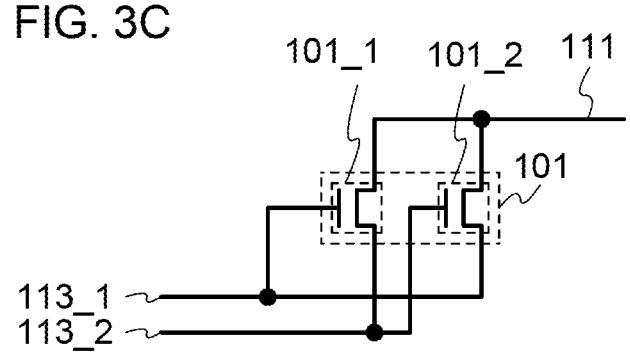
FIG. 3C is a circuit diagram of a semiconductor device.
Figure 4B:
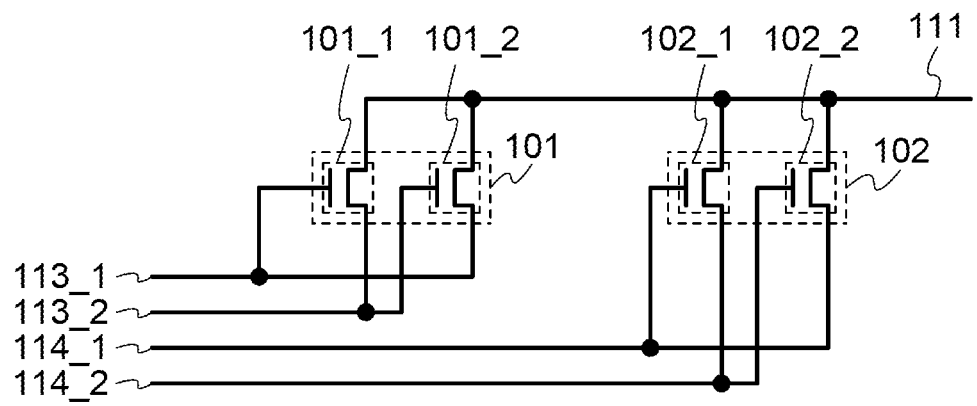
Figure 4C:
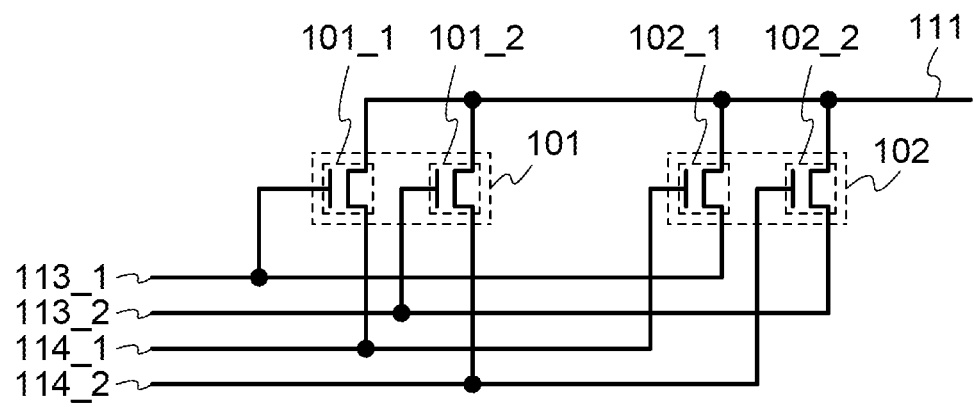

As illustrated in FIG. 3C, the first terminals of the transistors 101_1 and 101_2 can be connected to the wirings 113_2 and 113_1, respectively. Alternatively, as illustrated in FIG. 4B, the first terminals of the transistors 101_1, 101_2, 102_1, and 102_2 can be connected to the wirings 113_2, 113_1, 114_2, and 114_1, respectively. In such a case, in a period during which the transistor is turned off by a non-active signal, an active signal is input to the first terminal of the transistor. Accordingly, the period includes a period during which an L-level signal is input to the gate of the transistor and an H-level signal is input to the first terminal of the transistor. Thus, a reverse bias is applied to the transistor, so that deterioration of the transistor can be suppressed. Note that this embodiment is not limited thereto, and a similar effect can be obtained even when the first terminals of the transistors 101_1, 101_2, 102_1, and 102_2 are connected to the wirings 114_2, 114_1, 113_2, and 113_1, respectively. Alternatively, as illustrated in FIG. 4C, the first terminals of the transistors 101_1, 101_2, 102_1, and 102_2 can be connected to the wirings 114_1, 114_2, 113_1, and 113_2, respectively.

Figure 5A:
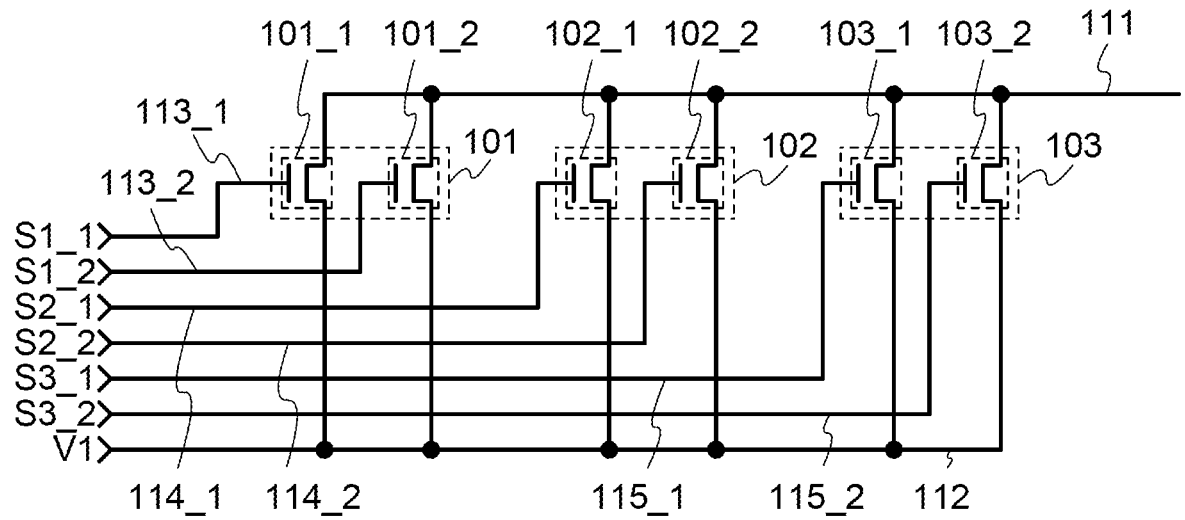
FIGS. 5A and 5B are circuit diagrams each illustrating a semiconductor device.

FIG. 5A illustrates a configuration of the case where transistors are used as the switches in FIG. 43C. Transistors 103_1 and 103_2 are used as the switches 13_1 and 13_2, respectively. The transistor 103_1 corresponds to the transistor 101_1 or the transistor 102_1. The transistor 103_2 corresponds to the transistor 101_2 or the transistor 102_2. First terminals of the transistors 103_1 and 103_2 are connected to the wiring 112. Second terminals of the transistors 103_1 and 103_2 are connected to the wiring 111. A gate of the transistor 103_1 is connected to a wiring 115_1. A gate of the transistor 103_2 is connected to a wiring 115_2. Signals S3_1 and S3_2 are input to the wirings 115_1 and 115_2, respectively. The signals S3_1 and S3_2 are often digital signals and can function as clock signals.

Note that the description of FIG. 43C can be applied to FIG. 5A.

In FIG. 3C and FIGS. 4A to 4C, the semiconductor device can include a plurality of circuits corresponding to the circuit 101 or the circuit 102 as in FIG. 5A.

Figure 5B:
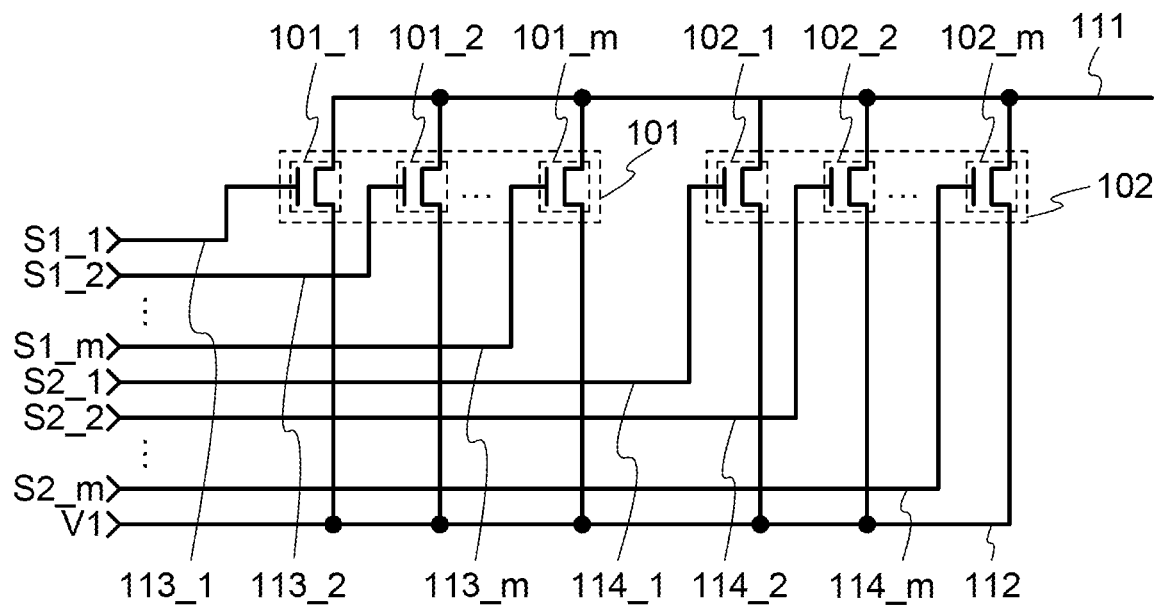

FIG. 5B illustrates a configuration of the case where transistors are used as the switches in FIG. 43A. Transistors 101_1 to 101_m are used as the switches 11_1 to 11_m. Transistors 102_1 to 102_m are used as the switches 12_1 to 12_m. First terminals of the transistors 101_1 to 101_m are connected to the wiring 112. Second terminals of the transistors 101_1 to 101_m are connected to the wiring 111. Gates of the transistors 101_1 to 101_m are connected to wirings 113_1 to 113_m, respectively. First terminals of the transistors 102_1 to 102_m are connected to the wiring 112. Second terminals of the transistors 102_1 to 102_m are connected to the wiring 111. Gates of the transistors 102_1 to 101_m are connected to wirings 114_1 to 114_m, respectively. Signals S1_1 to S1_m are input to the wirings 113_1 to 113_m, respectively. Signals S2_1 to S2_m are input to the wirings 114_1 to 114_m, respectively. The signals S1_1 to S1_m are sequentially brought into an active state per given period (e.g., per frame). Similarly, the signals S2_1 to S2_m are sequentially brought into an active state per given period (e.g., per frame). Accordingly, a period during which the signal is in an active state can be reduced. In other words, the time during which a transistor is on can be reduced. so that degradation of the transistor can be suppressed.

Note that the description of FIG. 43A can be applied to FIG. 5B.

In FIG. 3C and FIGS. 4A to 4C, each of the circuits 101 and 102 can include a plurality of transistors as in FIG. 5B. Moreover, in also FIG. 5A, each of the circuits corresponding to the circuit 101 or the circuit 102 can include a plurality of transistors.

Figure 6A:
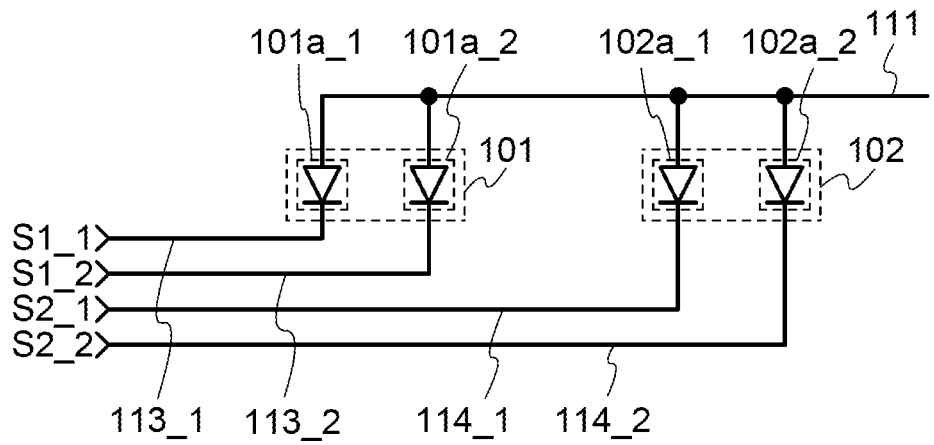
FIGS. 6A to 6C are circuit diagrams each illustrating a semiconductor device.

As illustrated in FIG. 6A, the transistor 101_1 can be replaced with a diode 101a_1 of which one terminal (hereinafter also referred to as an anode) is connected to the wiring 111 and the other terminal (hereinafter also referred to as a cathode) is connected to the wiring 113_1. The transistor 101_2 can be replaced with a diode 101a_2 of which one terminal is connected to the wiring 111 and the other terminal is connected to the wiring 113_2. The transistor 102_1 can be replaced with a diode 102a_1 of which one terminal is connected to the wiring 111 and the other terminal is connected to the wiring 114_1. The transistor 102_2 can be replaced with a diode 102a_2 of which one terminal is connected to the wiring 111 and the other terminal is connected to the wiring 114_2.

Figure 6B:
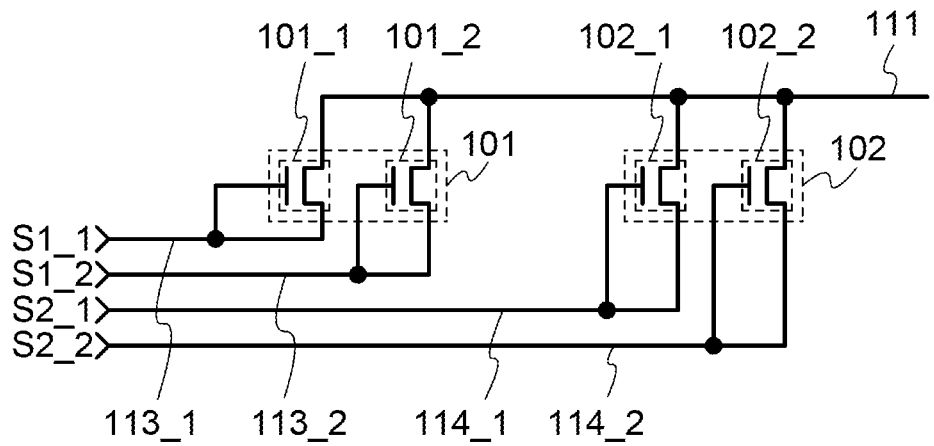

As illustrated in FIG. 6B, each of the transistors 101_1, 101_2, 102_1, and 102_2 can be diode-connected. In this case, the first terminals of the transistors 101_1, 101_2, 102_1, and 102_2 are connected to the wirings 113_1, 113_2, 114_1, and 114_2, respectively. The second terminals and the gates of the transistors 101_1, 101_2, 102_1, and 102_2 are connected to the wiring 111. Note that this embodiment is not limited thereto, and the gates of the transistors 101_1, 101_2, 102_1, and 102_2 can be connected to the wirings 113_1, 113_2, 114_1, and 114_2, respectively.

In FIG. 3C, FIGS. 4A to 4C, and FIGS. 5A and 5B, the transistors (e.g., the transistors 101_1, 101_2, 102_1, and 102_2) can be replaced with diodes as in FIGS. 6A and 6B. Alternatively, the transistor can be diode-connected by connecting the gate of the transistor to the first terminal or the second terminal.

Figure 6C:
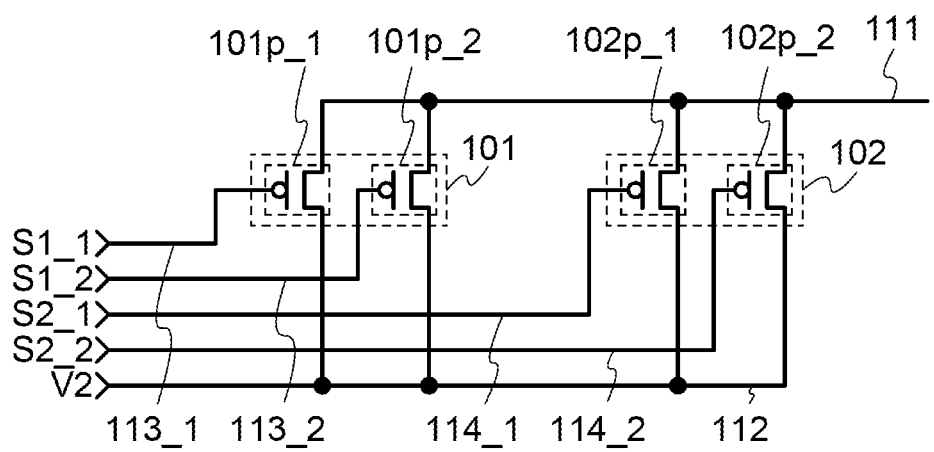

As illustrated in FIG. 6C, a p-channel transistor can be used as the transistor. Transistors 101p_1, 101p_2, 102p_1, and 102p_2 correspond to the transistors 101_1, 101_2, 102_1, and 102_2, respectively and are p-channel transistors. In the case of using p-channel transistors, the voltage V2 is applied to the wiring 112, and the signals S1_1, S1_2, S2_1, and S2_2 are often inverted from those illustrated in the timing chart of FIG. 1B.

In FIG. 3C, FIGS. 4A to 4C, FIGS. 5A and 5B, and FIGS. 6A and 6B, a p-channel transistor can be used as the transistor as in FIG. 6C.

Embodiment 2

In this embodiment, an example of a semiconductor device will be described. The semiconductor device in this embodiment can include the semiconductor device in Embodiment 1. The semiconductor device in this embodiment can be used for, for example, a flip flop, a shift register, a gate driver, a source driver, or a display device. Note that the semiconductor device in this embodiment can also be referred to as a flip flop or a driver circuit.

Figure 7A:
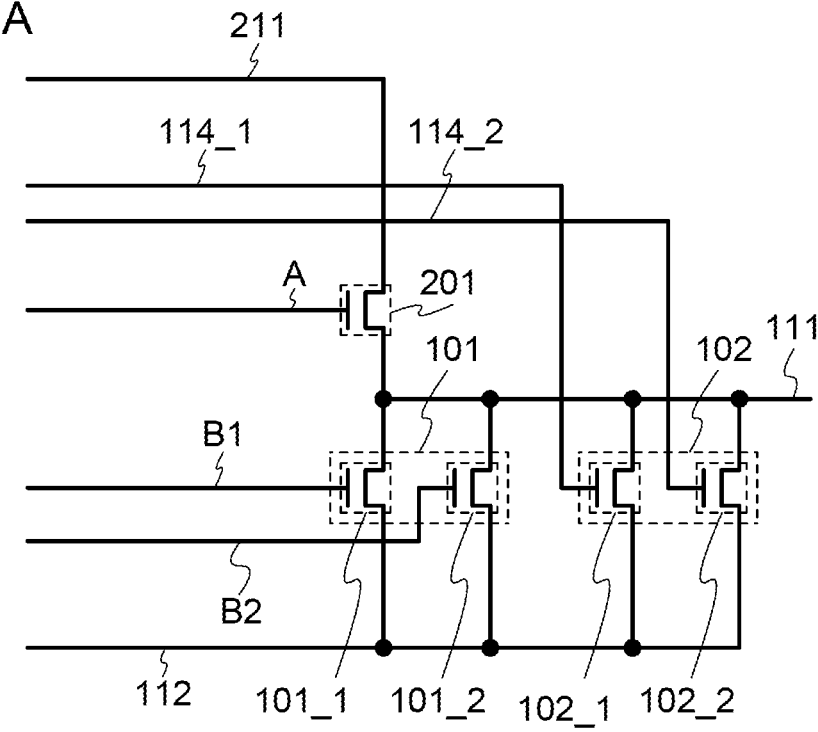
FIGS. 7A and 7B are circuit diagrams each illustrating a semiconductor device.

First, an example of the semiconductor device in this embodiment is described with reference to FIG. 7A. The semiconductor device in FIG. 7A includes the circuit 101, the circuit 102, and a transistor 201. The circuit 101 includes a plurality of transistors: the transistor 101_1 and the transistor 101_2. The circuit 102 includes a plurality of transistors: the transistor 102_1 and the transistor 102_2.

Note that the transistor 201 preferably has the same polarity as the transistors 101_1, 101_2, 102_1, and 102_2, and is often an n-channel transistor. Note that this embodiment is not limited thereto, and the transistor 201 can be a p-channel transistor.

Next, the connection relation in the semiconductor device of FIG. 7A will be described. A first terminal of the transistor 201 is connected to a wiring 211. A second terminal of the transistor 201 is connected to the wiring 111. The first terminal of the transistor 101_1 is connected to the wiring 112. The second terminal of the transistor 101_1 is connected to the wiring 111. The first terminal of the transistor 101_2 is connected to the wiring 112. The second terminal of the transistor 101_2 is connected to the wiring 111. The first terminal of the transistor 102_1 is connected to the wiring 112. The second terminal of the transistor 102_1 is connected to the wiring 111. The gate of the transistor 102_1 is connected to the wiring 114_1. The first terminal of the transistor 102_2 is connected to the wiring 112. The second terminal of the transistor 102_2 is connected to the wiring 111. The gate of the transistor 102_2 is connected to the wiring 114_2. Note that this embodiment is not limited thereto, and various other connection structures can be employed.

Note that a gate of the transistor 201 is denoted by a node A. The gate of the transistor 101_1 is denoted by a node B1. The gate of the transistor 101_2 is denoted by a node B2. Note that the node A, the node B1, and the node B2 can also be referred to as wirings.

Next, an example of a signal or voltage which is input to or output from each wiring is described. The signal OUT is output from the wiring 111. A signal CK is input to the wiring 211. The signal CK corresponds to the signal S1 and can function as a clock signal. The voltage V1 is input to the wiring 112. Note that this embodiment is not limited thereto, and various other signals, voltages, or currents can be input to these wirings.

The wiring 211 can function as a signal line or a clock signal line. Note that this embodiment is not limited thereto, and the wiring 211 can function as various other wirings.

Next, a function of the transistor 201 is described. The transistor 201 has a function of controlling the timing when the signal OUT is set at the H level by controlling, in accordance with the potential of the node A, the timing when the H-level signal CK is supplied to the wiring 111, and the transistor 201 can function as a pull-up transistor or a bootstrap transistor. For example, the transistor 201 is turned on in the period A0 described in Embodiment 1. Then, the H-level signal CK is supplied to the wiring 111. Note that this embodiment is not limited thereto, and the transistor 201 can have a variety of other functions.

Figure 7B:
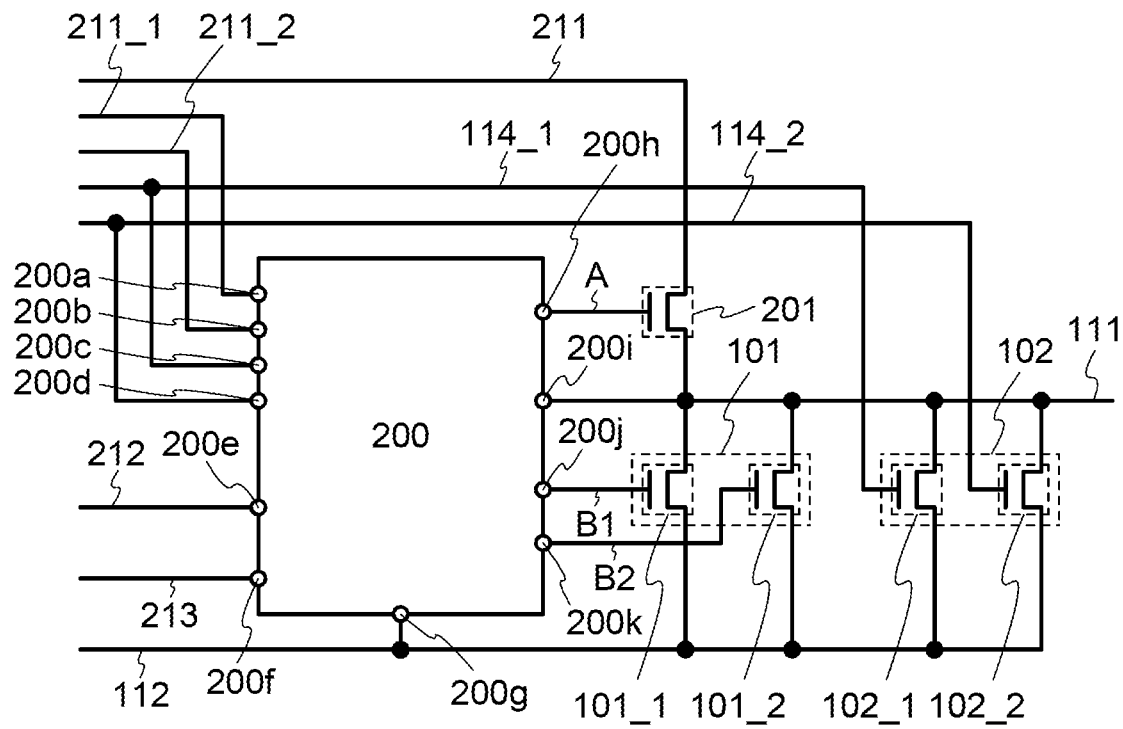

As illustrated in FIG. 7B, the semiconductor device can include a circuit 200. A variety of configurations can be used for the circuit 200, and the circuit 200 includes one or a plurality of transistors. The polarity of one or the plurality of transistors is the same as that of the transistors 101_1, 101_2, 102_1, 102_2, and 201. Note that this embodiment is not limited thereto. For example, the circuit 200 can include an n-channel transistor and a p-channel transistor. That is, the circuit 200 can be a CMOS circuit. The circuit 200 includes a plurality of terminals 200a to 200k. The terminal 200a, the terminal 200b, the terminal 200c, the terminal 200d, the terminal 200e, the terminal 200f, the terminal 200g, the terminal 200h, the terminal 200i, the terminal 200j, and the terminal 200k are connected to a wiring 211_1, a wiring 211_2, the wiring 114_1, the wiring 114_2, a wiring 212, a wiring 213, the wiring 112, the node A, the wiring 111, the node B1, and the node B2, respectively. Note that this embodiment is not limited thereto, and the circuit 200 can include a variety of other terminals, or any of the terminals 200a to 200k can be eliminated. Moreover, each terminal of the circuit 200 can be connected to a variety of other wirings or nodes.

A signal CK_1 and a signal CK_2 are input to the wiring 211_1 and the wiring 211_2, respectively. The signals CK_1 and CK_2 correspond to the signals S1_1 and S1_2, respectively and can function as clock signals. A signal CKB_1 and a signal CKB_2 are input to the wiring 114_1 and the wiring 114_2, respectively. The signals CKB_1 and CKB_2 correspond to the signals S2_1 and S2_2, respectively and can function as inverted clock signals. A signal SP is input to the wiring 212. The signal SP is often a digital signal and can function as a start signal. Alternatively, the signal SP can function as a transfer signal, an output signal, a selection signal, or the like of another stage (e.g., the previous stage). A signal RE is input to the wiring 213. The signal RE is often a digital signal and can function as a reset signal. Alternatively, the signal RE can function as a transfer signal, an output signal, a selection signal, or the like of another stage (e.g., the next stage). Note that this embodiment is not limited thereto, and various other signals, voltages, or currents can be input to these wirings.

The wirings 211_1 and 211_2 can function as a signal line or a clock signal line. The wirings 212 and 213 can function as a signal line, a gate line, a scan line, or the like. Note that this embodiment is not limited thereto, and these wirings can function as various other wirings.

The circuit 200 has a function of controlling the potential of the node A, the signal OUT, the potential of the node B1, and/or the potential of the node B2 in accordance with the signal CK_1, the signal CK_2, the signal CKB_1, the signal CKB_2, the signal SP, the signal RE, the voltage V1, the potential of the node A, the signal OUT, the potential of the node B1, and/or the potential of the node B2. The circuit 200 can function as a control circuit. Note that this embodiment is not limited thereto, and the circuit 200 can have a variety of other functions.

Figure 8A:
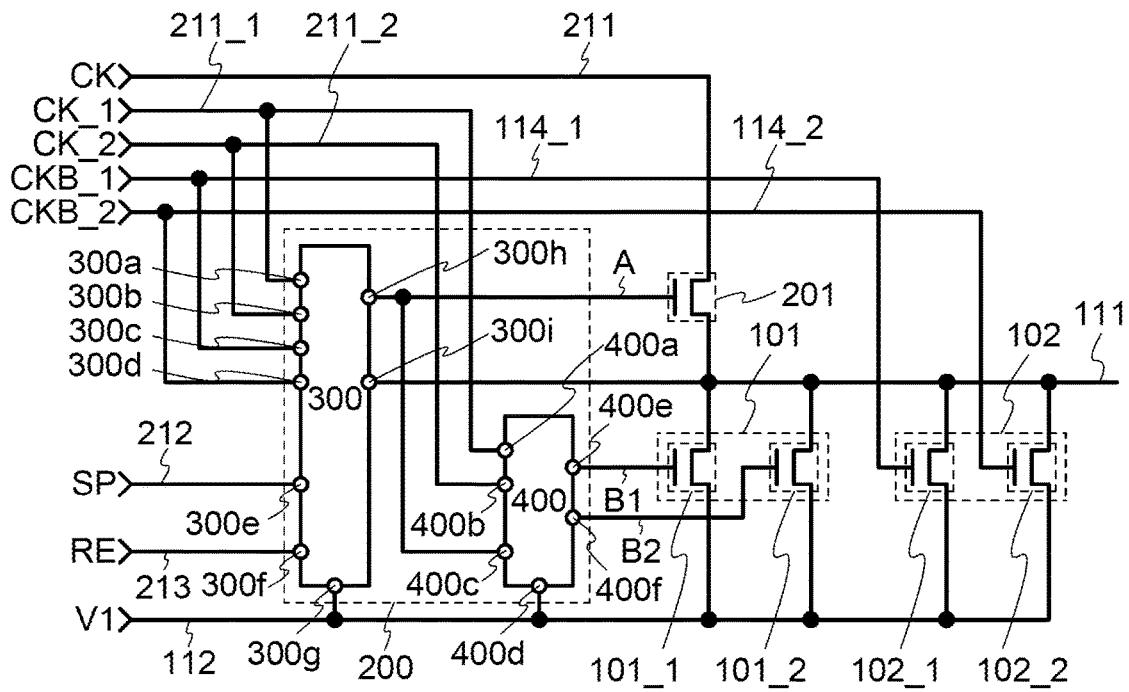
FIG. 8A is a circuit diagram of a semiconductor device.
Figure 20A:
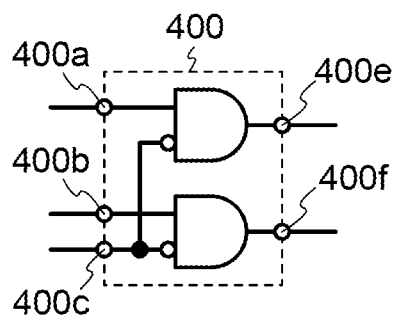
FIGS. 20A and 20B are circuit diagrams each illustrating a semiconductor device.
Figure 20B:
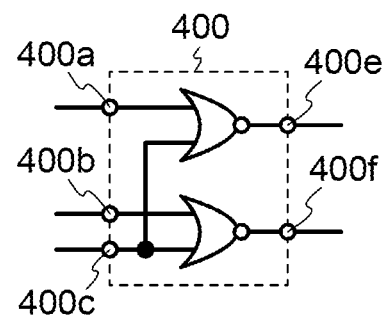

As illustrated in FIG. 8A, the semiconductor device can include a circuit 300 and a circuit 400. A variety of configurations can be used for the circuits 300 and 400. For example, the circuit 400 can include a logic circuit for controlling a potential of the gate of the transistor 101_1 and a logic circuit for controlling a potential of the gate of the transistor 101_2. Examples of these logic circuits are a logic circuit illustrated in FIG. 20A, in which an AND gate with two inputs and a NOT gate are combined, and a NOR gate with two inputs illustrated in FIG. 20B. Note that this embodiment is not limited thereto, and a variety of other circuits can be used as the circuit 400.

Each of the circuits 300 and 400 includes one or a plurality of transistors. The polarity of one or the plurality of transistors is the same as that of the transistors 101_1, 101_2, 102_1, 102_2, and 201. Note that this embodiment is not limited thereto. For example, the circuit 300 and/or the circuit 400 can include an n-channel transistor and a p-channel transistor. That is, the circuit 300 and/or the circuit 400 can be a CMOS circuit.

The circuit 300 includes a plurality of terminals 300a to 300i. The circuit 400 includes a plurality of terminals 400a to 400f. The terminal 300a, the terminal 300b, the terminal 300c, the terminal 300d, the terminal 300e, the terminal 300f, the terminal 300g, the terminal 300h, and the terminal 300i are connected to the wiring 211_1, the wiring 211_2, the wiring 114_1, the wiring 114_2, the wiring 212, the wiring 213, the wiring 112, the gate of the transistor 101_1, and the wiring 111, respectively. The terminal 400a, the terminal 400b, the terminal 400c, the terminal 400d, the terminal 400e, and the terminal 400f are connected to the wiring 211_1, the wiring 211_2, the gate of the transistor 201, the wiring 112, the gate of the transistor 101_1, and the gate of the transistor 101_2, respectively. Note that this embodiment is not limited thereto, and the circuit 300 and/or the circuit 400 can include a variety of other terminals, or any of the terminals 300a to 300i or any of the terminals 400a to 400f can be eliminated. Moreover, each terminal of the circuit 300 and/or the circuit 400 can be connected to a variety of other wirings or nodes.

The circuit 300 has a function of controlling the potential of the node A and/or the potential of the wiring 111 in accordance with the signal CK_1, the signal CK_2, the signal CKB_1, the signal CKB_2, the signal SP, the signal RE, the voltage V1, the potential of the node A, and/or the signal OUT. The circuit 300 can function as a control circuit. The circuit 400 has a function of controlling the potential of the node B1 and/or the potential of the node B2 in accordance with the signal CK_1, the signal CK_2, the potential of the node A, the voltage V1, the potential of the node B1, and/or the potential of the node B2. The circuit 400 can function as a control circuit. Note that this embodiment is not limited thereto, and the circuits 300 and 400 can have a variety of other functions.

Figure 8B:
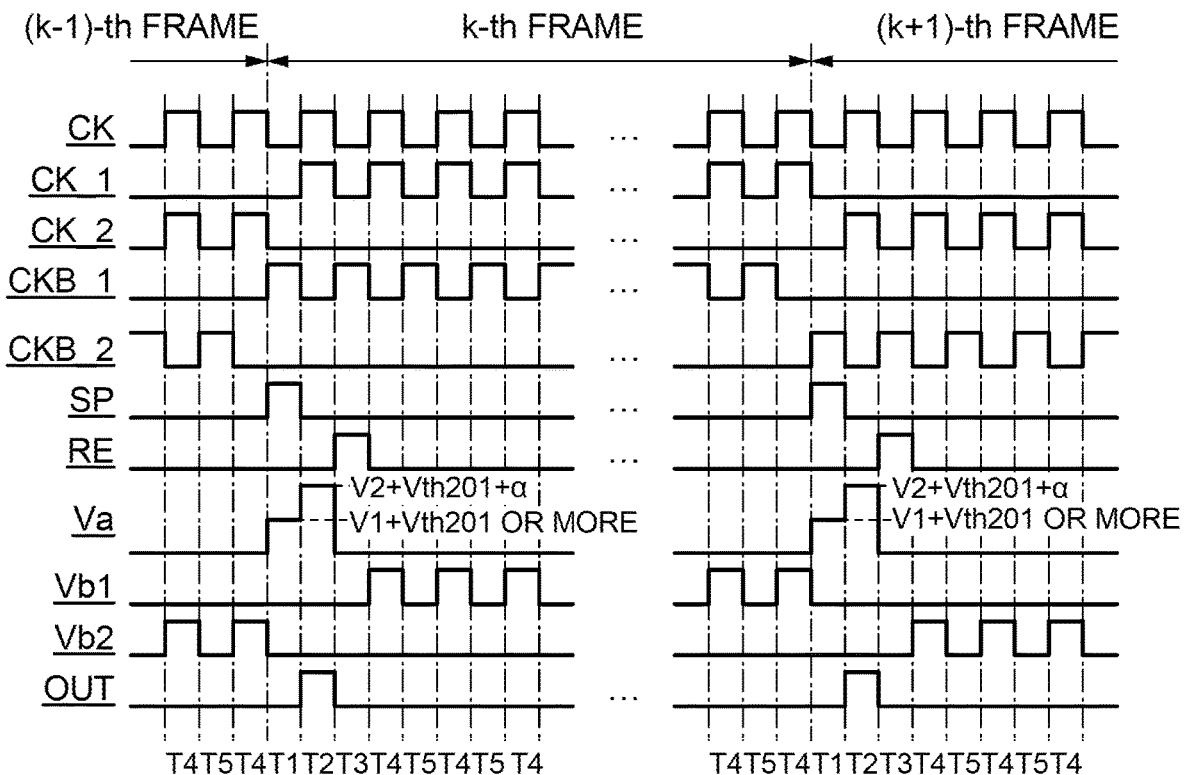
FIG. 8B is a timing chart illustrating operation of the semiconductor device.
Figure 9A:
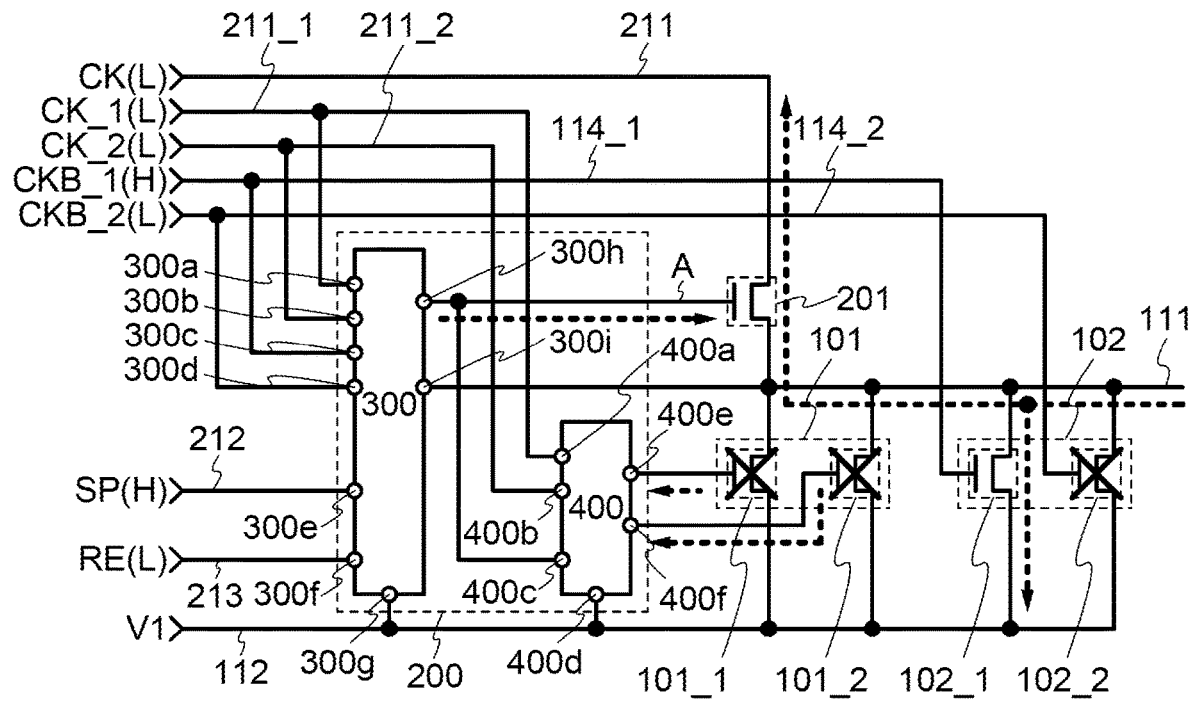
FIGS. 9A and 9B are schematic diagrams illustrating operation of a semiconductor device.
Figure 9B:
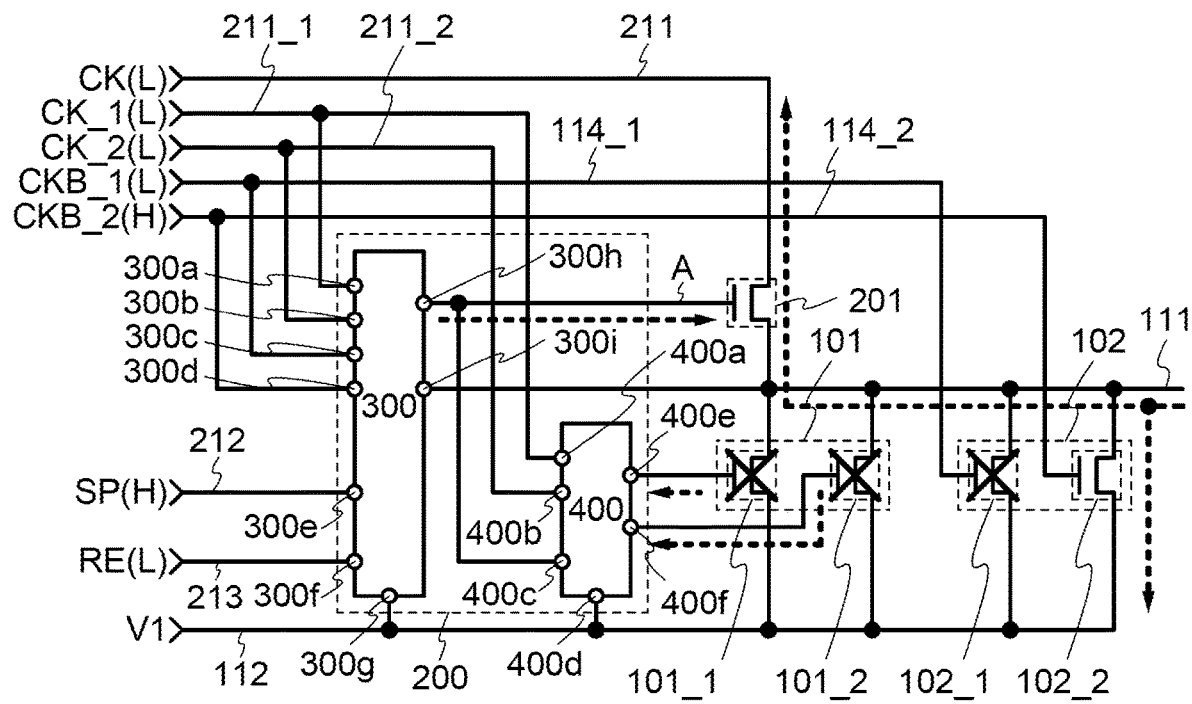
Figure 10A:
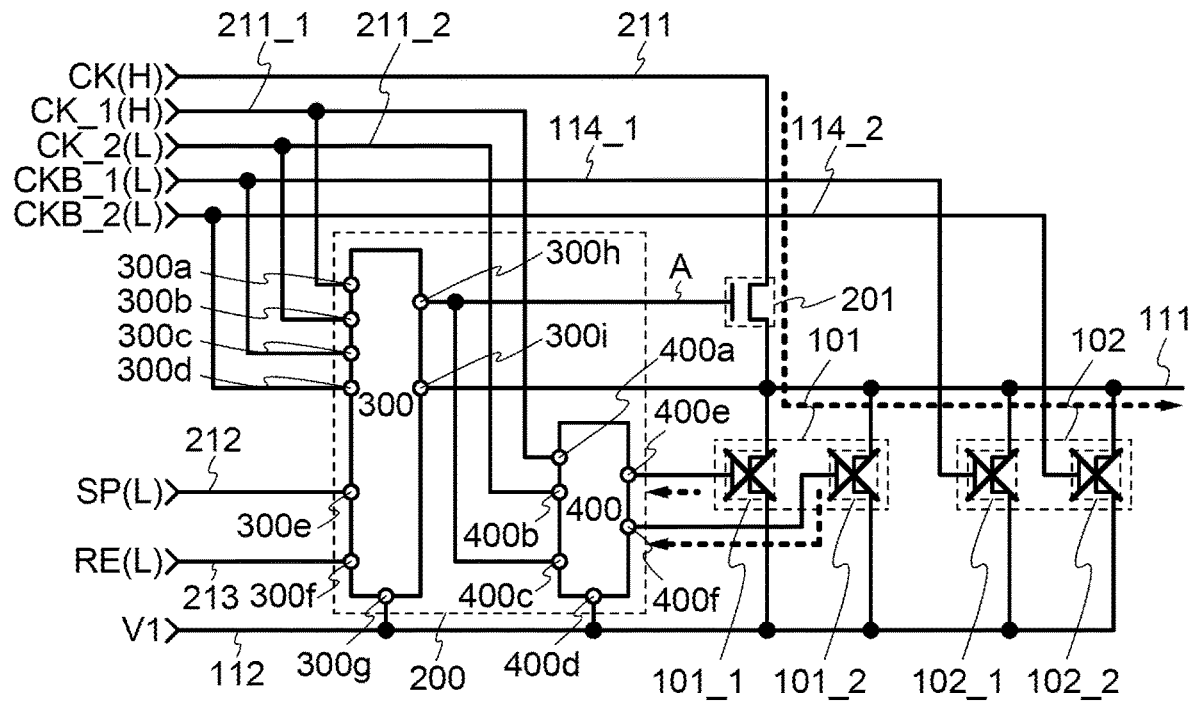
FIGS. 10A and 10B are schematic diagrams illustrating operation of a semiconductor device.
Figure 10B:
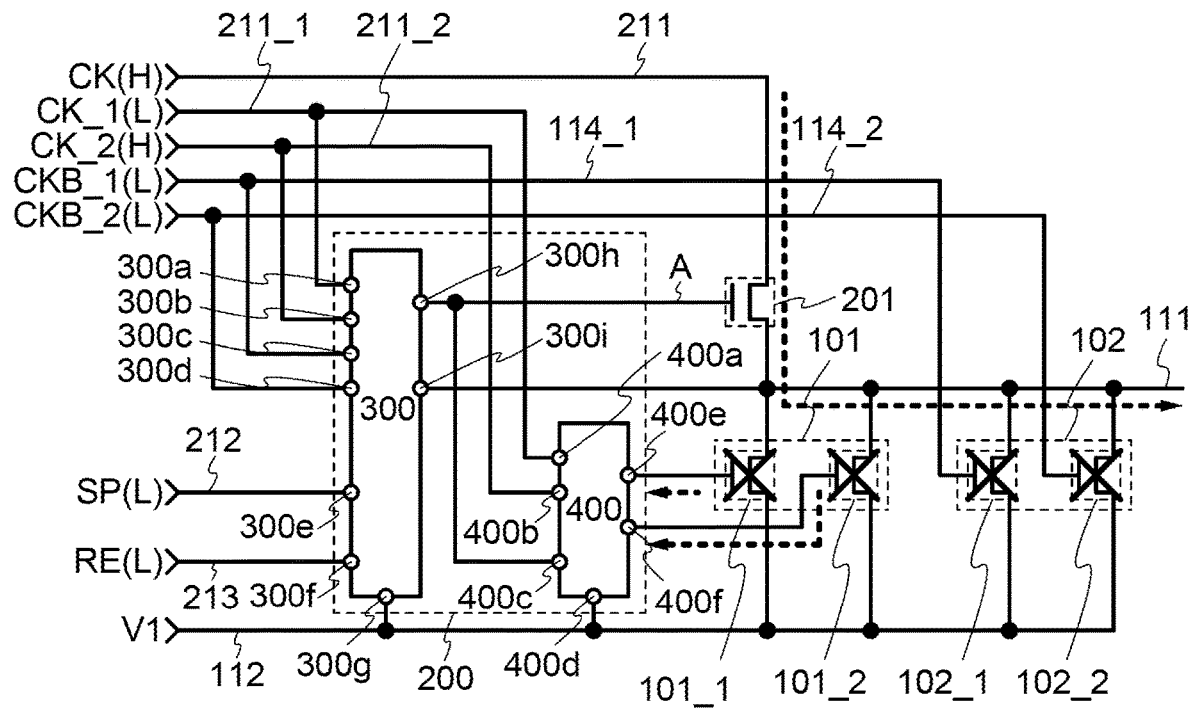
Figure 11A:
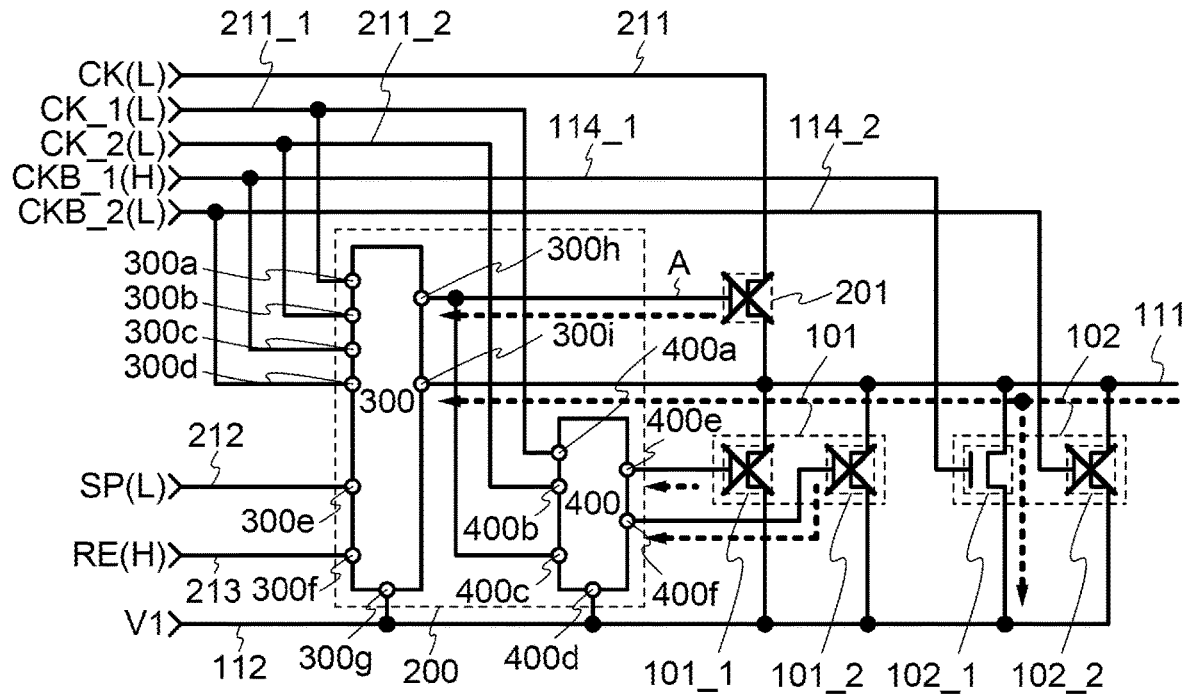
FIGS. 11A and 11B are schematic diagrams illustrating operation of a semiconductor device.
Figure 11B:
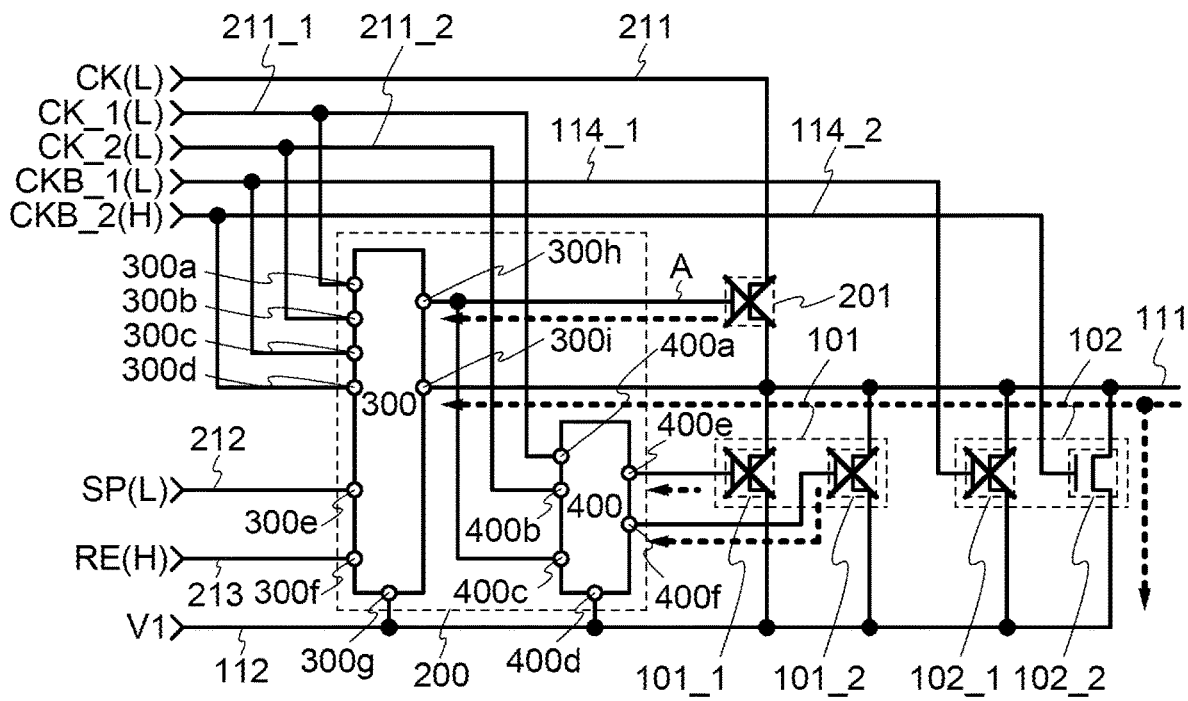
Figure 12A:
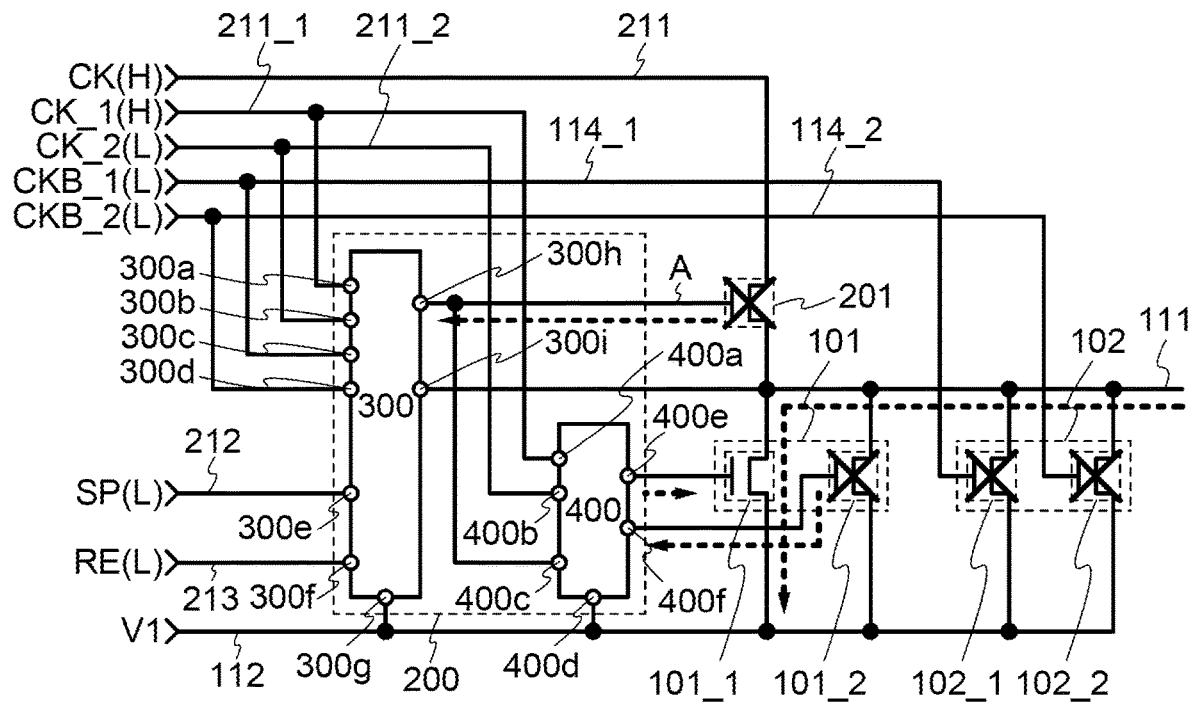
FIGS. 12A and 12B are schematic diagrams illustrating operation of a semiconductor device.
Figure 12B:
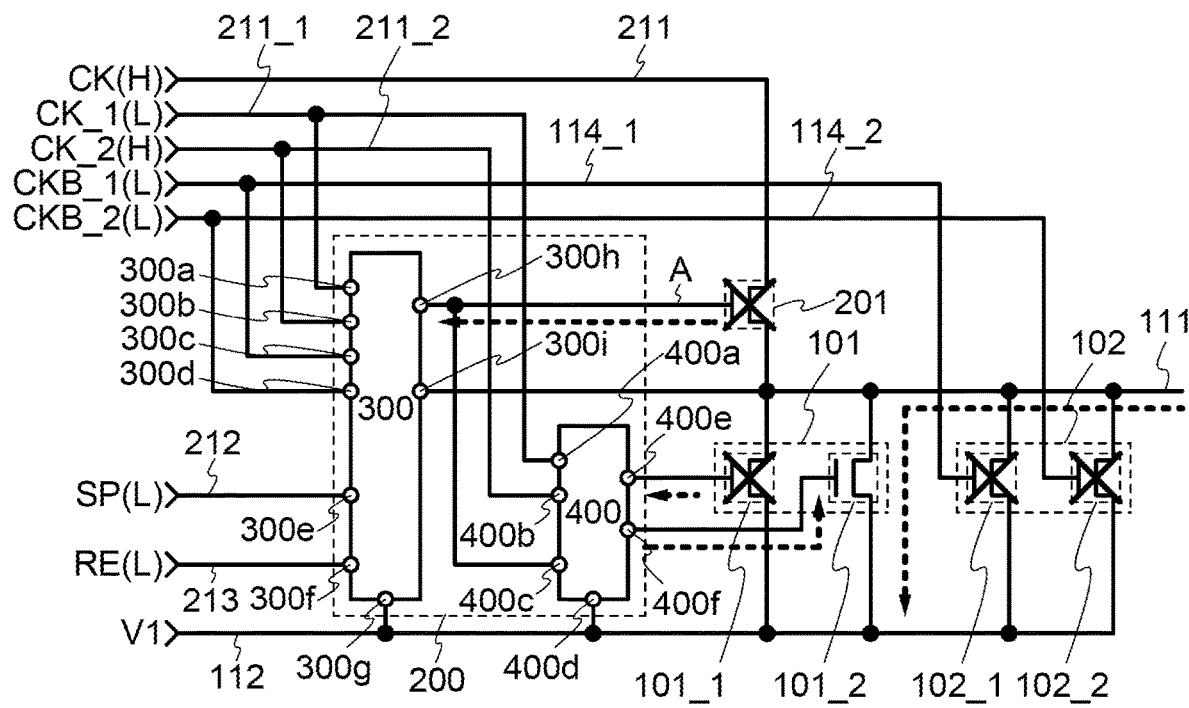
Figure 13A:
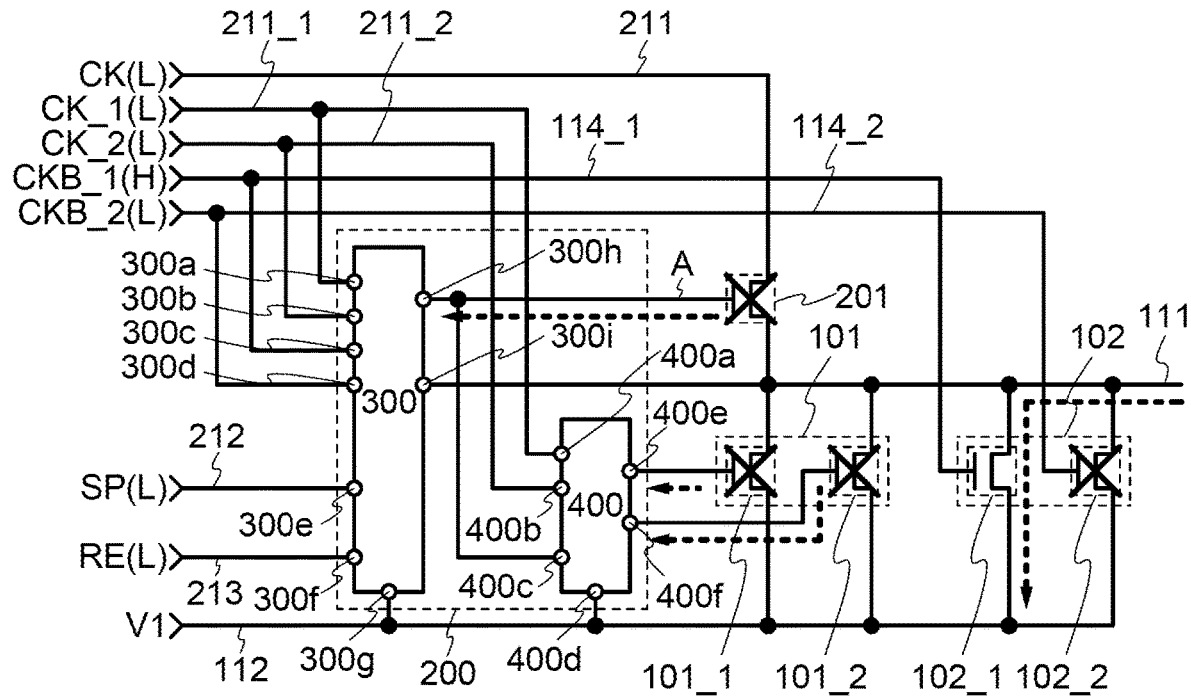
FIGS. 13A and 13B are schematic diagrams illustrating operation of a semiconductor device.
Figure 13B:
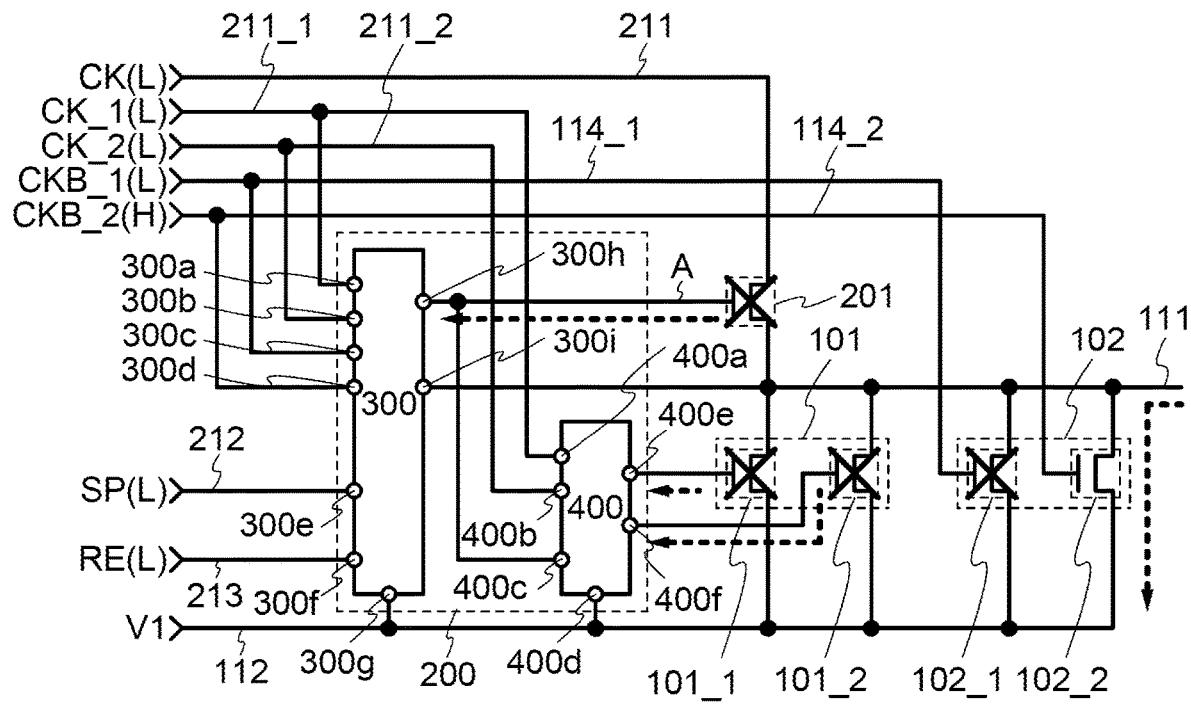

Next, operation of the semiconductor device in this embodiment will be described. Here, as an example, operation of the semiconductor device in FIG. 8A is described with reference to FIG. 8B, FIGS. 9A and 9B, FIGS. 10A and 10B, FIGS. 11A and 11B, FIGS. 12A and 12B, and FIGS. 13A and 13B. FIG. 8B illustrates the signal CK, the signal CK_1, the signal CK_2, the signal CKB_1, the signal CKB_2, the signal SP, the signal RE, the potential (Va) of the node A, the potential (Vb1) of the node B1, the potential (Vb2) of the node B2, and the signal OUT. One operation period (or one frame period) in a timing chart of FIG. 8B has a period T1, a period T2, a period T3, a period T4, and a period T5. FIG. 9A, FIG. 10A, FIG. 11A, FIG. 12A, and FIG. 13A schematically illustrate operation of the semiconductor device in the periods T1, T2, T3, T4, and T5 in a k-th frame, respectively. FIG. 9B, FIG. 10B, FIG. 11B, FIG. 12B, and FIG. 13B schematically illustrate operation of the semiconductor device in the periods T1, T2, T3, T4, and T5 in a (k+1)-th frame, respectively. Note that the description of the same operation as that of the semiconductor device in FIG. 1A is omitted. Further, the description of the operation of the semiconductor device in FIG. 8A can be applied to operation of the semiconductor device in FIGS. 7A and 7B.

First, in the period T1 of the k-th frame, the signal CKB_1 is set at the H level and the signal CKB_2 is set at the L level, so that the transistor 102_1 is turned on and the transistor 102_2 is turned off. At the same time, the signals CK_1 and CK_2 are set at the L level, so that the circuit 400 reduces the potentials of the nodes B1 and B2. For example, the circuit 400 supplies an L-level signal or the voltage V1 to the nodes B1 and B2. Alternatively, the circuit 400 reduces the potentials of the nodes B1 and B2 by capacitive coupling. Accordingly, the transistors 101_1 and 101_2 are turned off. Thus, the wirings 112 and 111 are brought into conduction through the transistor 102_1 as in FIG. 2B, so that the voltage V1 is applied from the wiring 112 to the wiring 111 through the transistor 102_1. At this time, the signal SP is set at the H level, so that the circuit 300 increases the potential of the node A. For example, the circuit 300 supplies an H-level signal or the voltage V2 to the node A. Then, the transistor 201 is turned on when the potential of the node A is increased to the sum (V1+Vth201) of the L-level potential (V1) of the signal CK and the threshold voltage (Vth201) of the transistor 201. Accordingly, the wirings 211 and 111 are brought into conduction through the transistor 201, so that the L-level signal CK is supplied from the wiring 211 to the wiring 111 through the transistor 201. After that, the potential of the node A continues to be increased. Then, when the potential of the node A becomes a given potential (at least (V1+Vth201) or more), the circuit 300 stops supplying the signal, the voltage, or the like to the node A. Accordingly, the node A enters into a floating state while holding the potential at that time. Thus, the signal OUT is set at the L level.

In the period T1 of the k-th frame, the circuit 300 can apply an L-level signal, the voltage V1, or the like to the wiring 111. Note that this embodiment is not limited thereto, and it is possible that the circuit 300 does not supply the signal, the voltage, or the like to the wiring 111.

Operation of the period T1 in the (k+1)-th frame is different from that of the period T1 in the k-th frame in that the signal CKB_1 is set at the L level and the signal CKB_2 is set at the H level, and thus, the transistor 102_1 is turned off and the transistor 102_2 is turned on.

Next, in the period T2 of the k-th frame, the signal CKB_1 is set at the L level and the signal CKB_2 remains at the L level, so that the transistor 102_1 is turned off and the transistor 102_2 remains off. At the same time, the signal CK_1 is set at the H level and the signal CK_2 remains at the L level; however, since the potential of the node A remains high, the circuit 400 keeps the potentials of the nodes B1 and B2 low. For example, the circuit 400 continues to supply an L-level signal or the voltage V1 to the nodes B1 and B2. Alternatively, the circuit 400 makes the nodes B1 and B2 enter into a floating state without supplying the signal, the voltage, or the like to the nodes B1 and B2. Accordingly, the transistors 101_1 and the 101_2 remain off. Thus, the wirings 112 and 111 are brought out of conduction as in FIG. 2C. At this time, the circuit 300 does not supply a signal, a voltage, or the like to the node A in many cases. In other words, the node A remains in a floating state, and thus holds the potential ((V1+Vth201) or more) in the period T1. Accordingly, the transistor 201 remains on, so that the wirings 211 and 111 remain in a conduction state. At this time, the signal CK is increased from the L level to the H level, so that the potential of the wiring 111 starts to be increased. Since the node A remains in a floating state, the potential of the node A is increased by parasitic capacitance between the gate and the second terminal of the transistor 201. This is so-called bootstrap operation. Thus, the potential of the node A is increased to (V2+Vth201+α) (α is a positive number). Then, the potential of the wiring 111 is increased to the potential (V2) of the H-level signal CK. The signal OUT is set at the H level in such a manner.

Operation of the period T2 in the (k+1)-th frame is different from that of the period T2 in the k-th frame in that the signal CK_1 remains at the L level and the signal CK_2 is set at the H level. Note that also in this case, the potential of the node A remains high, so that the circuit 400 keeps the potentials of the nodes B1 and B2 low.

Next, in the period T3 of the k-th frame, the signal CKB_1 is set at the H level and the signal CKB_2 remains at the L level, so that the transistor 102_1 is turned on and the transistor 102_2 remains off. At the same time, the signal CK_1 is set at the L level and the signal CK_2 remains at the L level, so that the circuit 400 keeps the potentials of the nodes B1 and B2 low. For example, the circuit 400 continues to supply an L-level signal or the voltage V1 to the nodes B1 and B2. Alternatively, the circuit 400 makes the nodes B1 and B2 enter into a floating state without supplying the signal, the voltage, or the like to the nodes B1 and B2. Accordingly, the transistors 101_1 and the 101_2 remain off. Thus, the wirings 112 and 111 are brought into conduction through the transistor 102_1 as in FIG. 2B, so that the voltage V1 is applied from the wiring 112 to the wiring 111 through the transistor 102_1. At this time, the signal RE is set at the H level, so that the circuit 400 reduces the potential of the node A. For example, the circuit 400 supplies an L-level signal or the voltage V1 to the node A. Accordingly, the transistor 201 is turned off, whereby the wirings 211 and 111 are brought out of conduction. The signal OUT is set at the L level in such a manner.

In the period T3 of the k-th frame, the circuit 300 can apply an L-level signal, the voltage V1, or the like to the wiring 111.

Operation of the period T3 in the (k+1)-th frame is different from that of the period T3 in the k-th frame in that the signal CKB_1 remains at the L level and the signal CKB_2 is set at the H level, and thus, the transistor 102_1 remains off and the transistor 102_2 is turned on.

Next, in the period T4 of the k-th frame, the signal CKB_1 is set at the L level and the signal CKB_2 remains at the L level, so that the transistor 102_1 is turned off and the transistor 102_2 remains off. At the same time, the signal CK_1 is set at the H level and the signal CK_2 remains at the L level, so that the circuit 400 increases the potential of the node B1. For example, the circuit 400 supplies an H-level signal or the voltage V2 to the node B1. Alternatively, the circuit 400 increases the potential of the node B1 by capacitive coupling. Moreover, the circuit 400 keeps the potential of the node B2 low. For example, the circuit 400 supplies an L-level signal or the voltage V1 to the node B2. Alternatively, the circuit 400 makes the node B2 enter into a floating state without supplying the signal, the voltage, or the like to the node B2. Accordingly, the transistor 101_1 is turned on, and the transistor 101_2 remains off. Thus, the wirings 112 and 111 are brought into conduction through the transistor 101_1 as in FIG. 2A, so that the voltage V1 is applied from the wiring 112 to the wiring 111 through the transistor 101_1. At this time, the circuit 300 keeps the potential of the node A to be V1. For example, the circuit 300 supplies an L-level signal or the voltage V1 to the node A. Alternatively, the circuit 300 makes the node A enter into a floating state by supplying no signal, voltage, or the like to the node A. Accordingly, the transistor 201 remains off, so that the wirings 211 and 111 remain in a non-conduction state. The signal OUT remains at the L level in such a manner.

In the period T4 of the k-th frame, the circuit 300 can supply an L-level signal or the voltage V1 to the wiring 111. Note that this embodiment is not limited thereto, and it is possible that the circuit 300 does not supply the signal, the voltage, or the like to the wiring 111.

Operation of the period T4 in the (k+1)-th frame is different from that of the period T4 in the k-th frame in that the signal CK_1 remains at the L level and the signal CK_2 is set at the H level; and in that the circuit 400 keeps the potential of the node B1 low and increases the potential of the node B2, and thus, the transistor 101_1 remains off and the transistor 101_2 is turned on.

Next, in the period T5 of the k-th frame, the signal CKB_1 is set at the H level and the signal CKB_2 remains at the L level, so that the transistor 102_1 is turned on and the transistor 102_2 remains off. At the same time, the signal CK_1 is set at the L level and the signal CK_2 remains at the L level, so that the circuit 400 reduces the potential of the node B1. For example, the circuit 400 supplies an L-level signal or the voltage V1 to the node B1. Alternatively, the circuit 400 reduces the potential of the node B1 by capacitive coupling. Moreover, the circuit 400 keeps the potential of the node B2 low. For example, the circuit 400 supplies an L-level signal or the voltage V1 to the node B2. Alternatively, the circuit 400 makes the node B2 enter into a floating state without supplying the signal, the voltage, or the like to the node B2. Accordingly, the transistor 101_1 is turned off, and the transistor 101_2 remains off. Thus, the wirings 111 and 112 are brought into conduction through the transistor 102_1 as in FIG. 2B, so that the voltage V1 is applied from the wiring 112 to the wiring 111 through the transistor 102_1. At this time, the circuit 300 keeps the potential of the node A to be V1. For example, the circuit 300 supplies an L-level signal or the voltage V1 to the node A. Alternatively, the circuit 300 makes the node A enter into a floating state by supplying no signal, voltage, or the like to the node A. Accordingly, the transistor 201 remains off, so that the wirings 211 and 111 remain in a non-conduction state. The signal OUT remains at the L level in such a manner.

In the period T5 of the k-th frame, the circuit 300 can supply an L-level signal or the voltage V1 to the wiring 111. Note that this embodiment is not limited thereto, and it is possible that the circuit 300 does not supply the signal, the voltage, or the like to the wiring 111.

Operation of the period T5 in the (k+1)-th frame is different from that of the period T5 in the k-th frame in that the signal CKB_1 remains at the L level and the signal CKB_2 is set at the H level, and thus, the transistor 102_1 is turned off and the transistor 102_2 is turned on.

As described above, in the semiconductor device of this embodiment, the time during which the transistor is on can be shorter by repeating the operation in the k-th frame and the operation in the (k+1)-th frame. Accordingly, degradation of characteristics of the transistor can be suppressed. Thus, when a shift register, a gate driver, a display device, or the like includes the semiconductor device in this embodiment, the lifetime thereof can be increased.

In the semiconductor device in this embodiment, all the transistors can be n-channel transistors or p-channel transistors. Accordingly, reduction in the number of steps, improvement in yield, improvement in reliability, or reduction in cost can be realized more efficiently as compared to the case of using a CMOS circuit. In particular, when all the transistors including those in a pixel portion and the like are n-channel transistors, a non-single-crystal semiconductor, an amorphous semiconductor, a microcrystalline semiconductor, an organic semiconductor, an oxide semiconductor, or the like can be used for a semiconductor layer of the transistor. Although a transistor using such a semiconductor is likely to deteriorate, deterioration of the transistor can be suppressed in the semiconductor device in this embodiment.

It is not necessary to increase the channel width of a transistor so that a semiconductor device is operated even when characteristics of the transistor deteriorate. Accordingly, the channel width of the transistor can be reduced. This is because degradation of the transistor can be suppressed in the semiconductor device in this embodiment.

Note that in FIG. 8B, the period T2 can be referred to as a selection period, and the other periods (the periods T1, T3, T4, and T5) can be referred to as non-selection periods. Alternatively, the periods T1, T2, T3, T4, and T5 can be referred to as a set period, an output period, a reset period, a first non-selection period, and a second non-selection period, respectively.

Figure 14A:
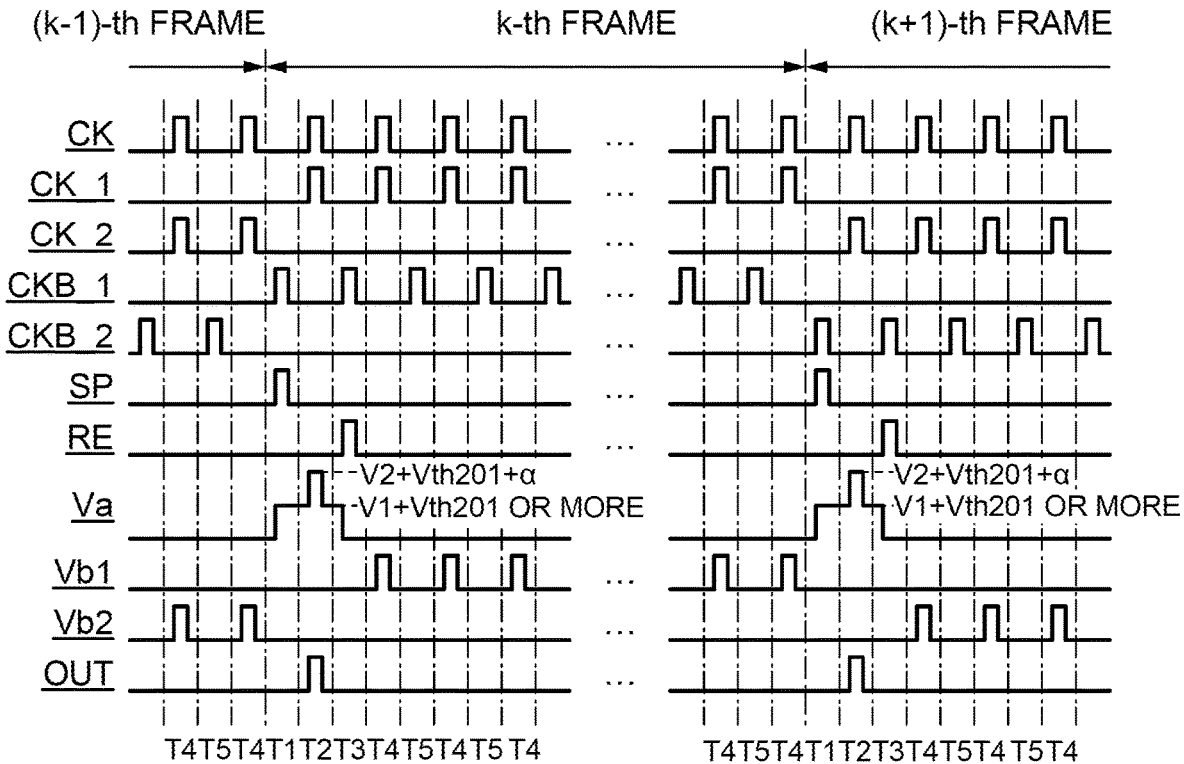
FIGS. 14A and 14B are timing charts each illustrating operation of a semiconductor device.

As illustrated in FIG. 14A, the time during which the signal CK, the signal CK_1, the signal CK_2, the signal CKB_1, and the signal CKB_2 are at the H level can be shorter than the time during which these signals are at the L level. Accordingly, in the period T2, the potential of the node A remains high when the signal CK is set at the L level, whereby the transistor 201 remains on. Thus, the wirings 211 and 111 remain in a conduction state through the transistor 201, so that the L-level signal CK is supplied from the wiring 211 to the wiring 111 through the transistor 201. Since the channel width of the transistor 201 is often large, the potential of the wiring 111 is immediately reduced to V1. Therefore, the fall time of the signal OUT can be shorter. Note that this embodiment is not limited thereto, and the time during which the signal CK, the signal CK_1, the signal CK_2, the signal CKB_1, and the signal CKB_2 are at the H level can be longer than the time during which these signals are at the L level.

Figure 14B:
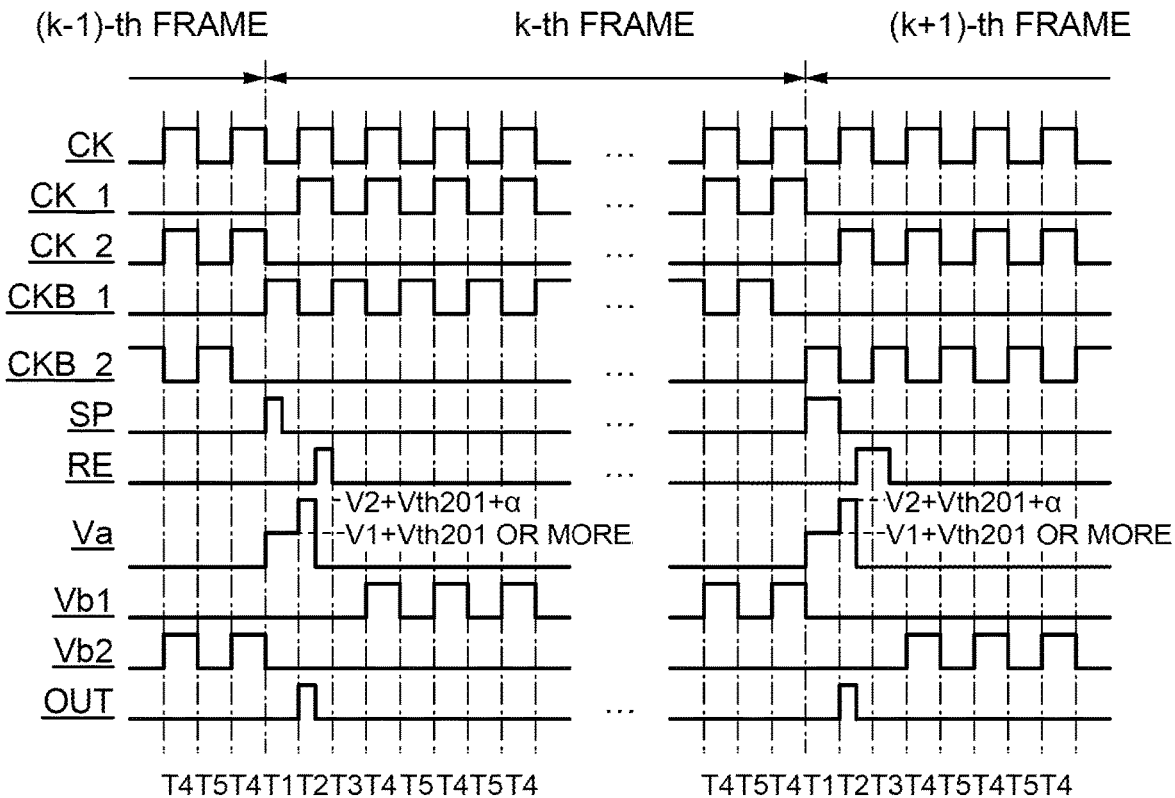

As illustrated in FIG. 14B, by supplying the voltage V1 or an L-level signal to the node A and the wiring during the period T2, the signal OUT can be set at the L level. Accordingly, the driving frequency can be lower, so that power consumption can be reduced.

Figure 15A:
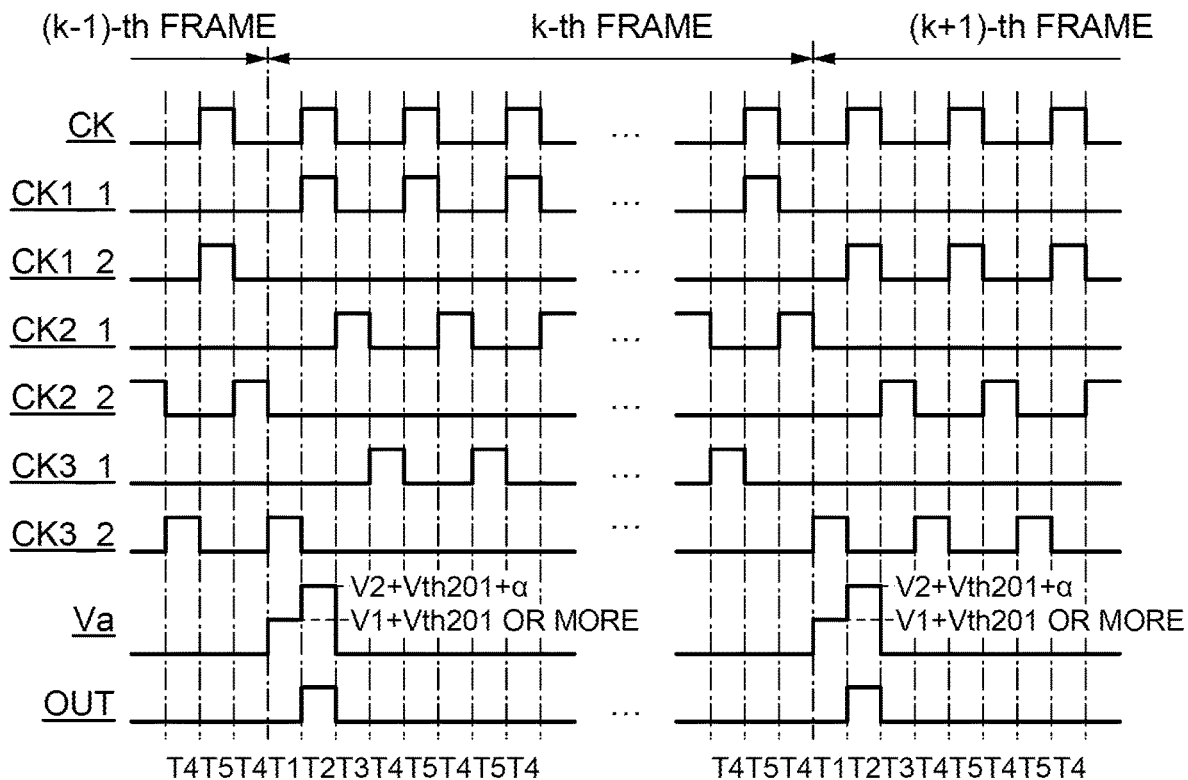
FIGS. 15A and 15B are timing charts each illustrating operation of a semiconductor device.

When the semiconductor device includes a plurality of circuits corresponding to the circuit 101 or the circuit 102 as in FIG. 5A, a multi-phase clock signal can be input to the semiconductor device. FIG. 15A illustrates an example of a timing chart in the case where a three-phase clock signal is input to the semiconductor device. Note that this embodiment is not limited thereto.

Figure 15B:
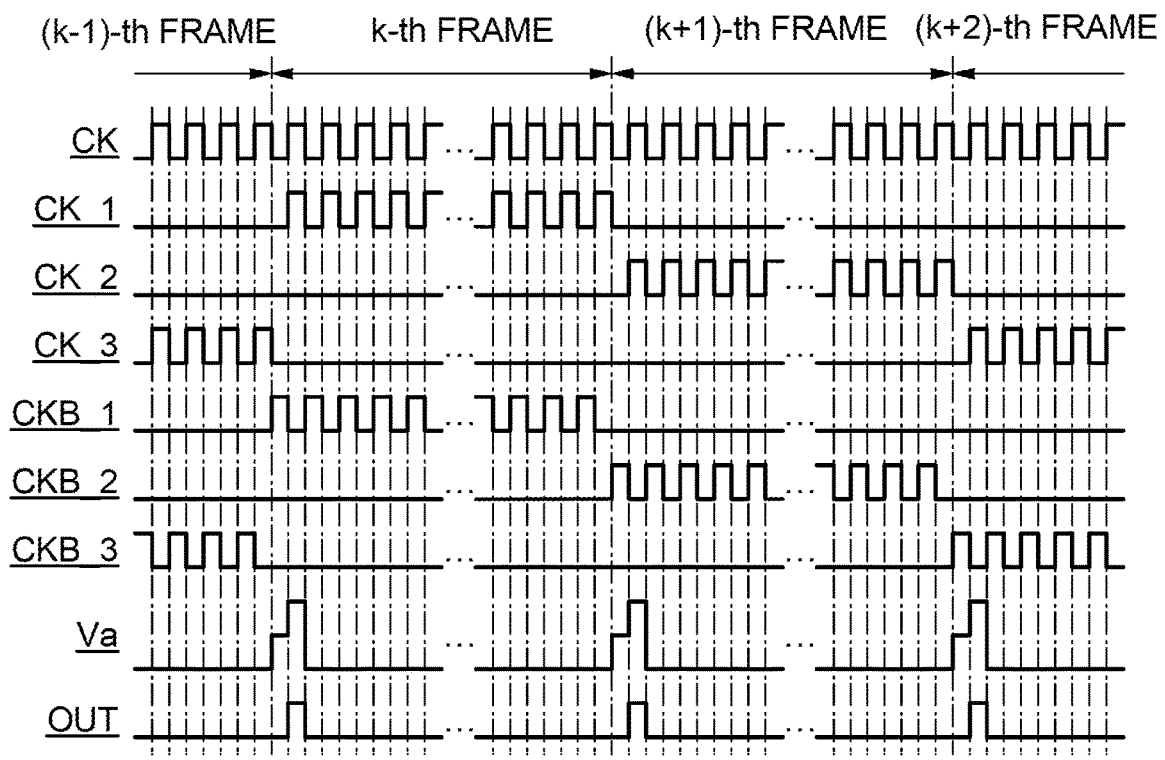

As in FIG. 5B, the circuit 101 or the circuit 102 can include a plurality of transistors. FIG. 15B illustrates an example of a timing chart in the case where the circuit 101 or the circuit 102 includes three transistors. Note that this embodiment is not limited thereto.

Note that the channel width of the transistor 201 is preferably larger than that of the transistors 101_1, 101_2, 102_1, and 102_2. Accordingly, the on resistance of the transistor 201 is reduced, so that the rise time or fall time of the signal OUT can be reduced. Note that this embodiment is not limited thereto, and the channel width of the transistor 201 can be smaller than that of the transistors 101_1, 101_2, 102_1, and 102_2.

In the transistor 201, parasitic capacitance between the gate and the second terminal is preferably larger than parasitic capacitance between the gate and the first terminal. This is because the potential of the node A is likely to be increased by bootstrap operation in the period T2. Accordingly, as for the area where a conductive layer serving as the gate overlaps with a conductive layer serving as a source or a drain, the area on the second terminal side is preferably larger than that on the first terminal side. Note that this embodiment is not limited thereto.

As described in Embodiment 1, a wiring can be divided into a plurality of wirings. To the plurality of wirings, the same signal, voltage, or the like can be input or different signals, voltages, or the like can be input. Moreover, the plurality of wirings can be connected to the same wiring, element, or the like or alternatively can be connected to the different wirings, elements, or the like. As an example, FIG. 16A illustrates a configuration in the case where the wiring 112 is divided into the plurality of wirings 112A to 112D.

Figure 16A:
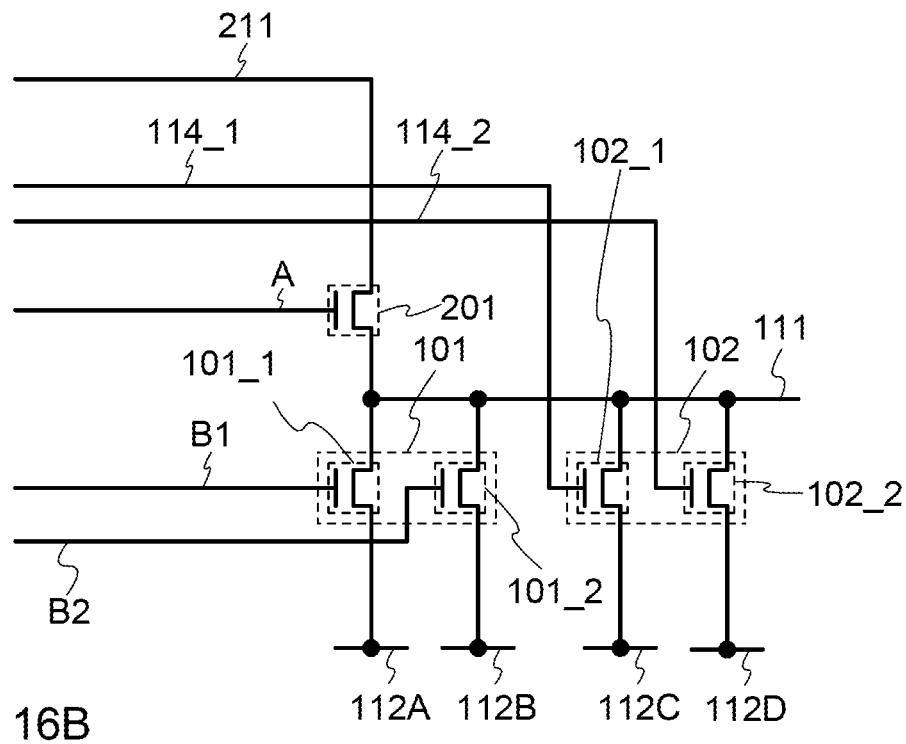
FIGS. 16A and 16B are circuit diagrams each illustrating a semiconductor device.

Note that in FIG. 7B and FIG. 8A, a wiring can be divided into a plurality of wirings as in FIG. 16A. Not only the wiring 112 but also the wiring 114_1, the wiring 114_2, the wiring 211, the wiring 211_1, the wiring 211_2, the wiring 212, and/or the wiring 213 can be divided into a plurality of wirings.

Figure 16B:
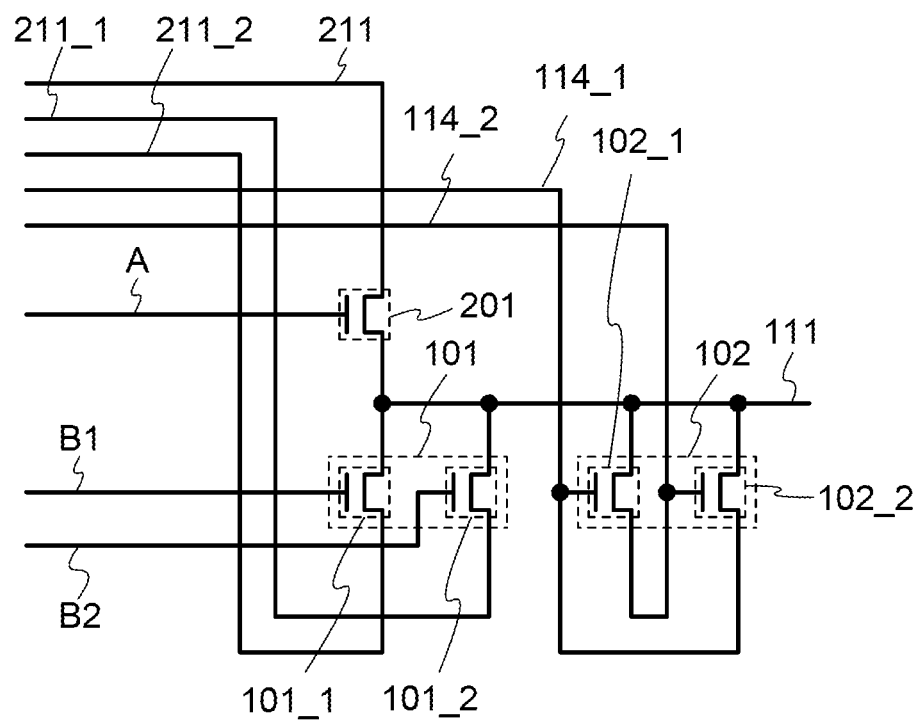

As illustrated in FIG. 16B, the first terminals of the transistors 101_1 and 101_2 can be connected to the wirings 211_1 and 211_2, respectively. The first terminals of the transistors 102_1 and 102_2 can be connected to the wirings 114_1 and 114_2, respectively. Accordingly, a reverse bias can be applied to the transistors 101_1, 101_2, 102_1, and 102_2 as in FIG. 4B, whereby deterioration of these transistors can be suppressed. Note that this embodiment is not limited thereto, and the first terminals of the transistors 101_1, 101_2, 102_1, and 102_2 can be connected to a variety of wirings or a variety of nodes. For example, the first terminals of the transistors 101_1 and 101_2 can be connected to the nodes B2 and B1, respectively.

In FIG. 7B and FIG. 8A, the first terminals of the transistors 101_1 and 101_2 can be connected to the wirings 211_1 and 211_2, respectively, as in FIG. 16B. The first terminals of the transistors 102_1 and 102_2 can be connected to the wirings 114_1 and 114_2, respectively.

Figure 17A:
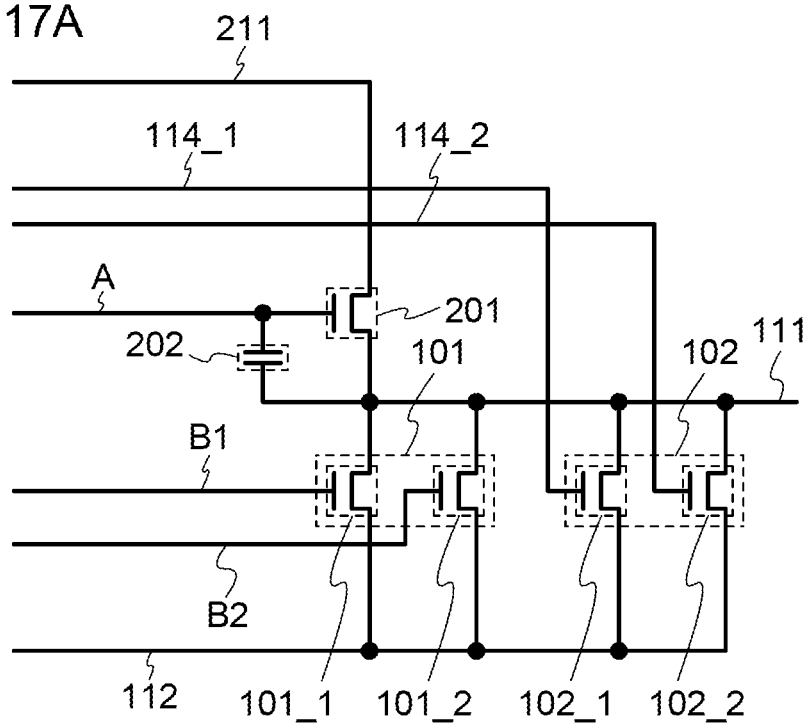
FIGS. 17A and 17B are circuit diagrams each illustrating a semiconductor device.

As illustrated in FIG. 17A, a capacitor 202 can be additionally connected between the gate and the second terminal of the transistor 201. Accordingly, the potential of the node A can be higher at the time of the bootstrap operation in the period T2. Thus, Vgs of the transistor 201 is increased, so that the rise time or fall time of the signal OUT can be shorter. Note that this embodiment is not limited thereto, and a transistor serving as a MOS capacitor can be used for the capacitor 202. In that case, in order to increase the capacitance value of the transistor used as the MOS capacitor, it is preferable that a gate of the transistor be connected to the node A and a first terminal or a second terminal of the transistor be connected to the wiring 111.

In FIG. 7B, FIG. 8A, and FIGS. 16A and 16B, the capacitor 202 can be additionally connected between the gate and the second terminal of the transistor 201 as in FIG. 17A.

Figure 17B:
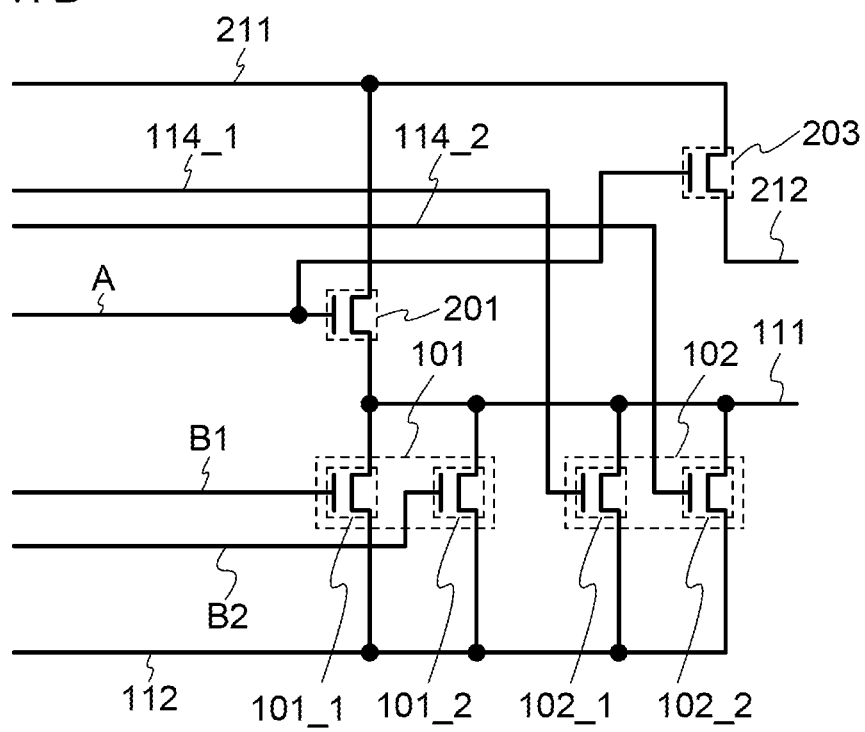

Note that it is possible to obtain two output signals. For example, one output signal can function as a transfer signal to a flip flop at another stage (e.g., the next stage), and the other output signal can function as a signal output to a pixel. For example, as illustrated in FIG. 17B, a transistor 203 can be additionally provided. The transistor 203 has a function similar to that of the transistor 201 and is often an n-channel transistor. A first terminal of the transistor 203 is connected to the wiring 211. A second terminal of the transistor 203 is connected to the wiring 212. A gate of the transistor 203 is connected to the gate of the transistor 201.

Note that this embodiment is not limited thereto, and the transistor 203 can be a p-channel transistor. Alternatively, the first terminal of the transistor 203 and the first terminal of the transistor 201 can be connected to different wirings. The gate of the transistor 203 and the gate of the transistor 201 can be connected to different wirings.

Figure 18:
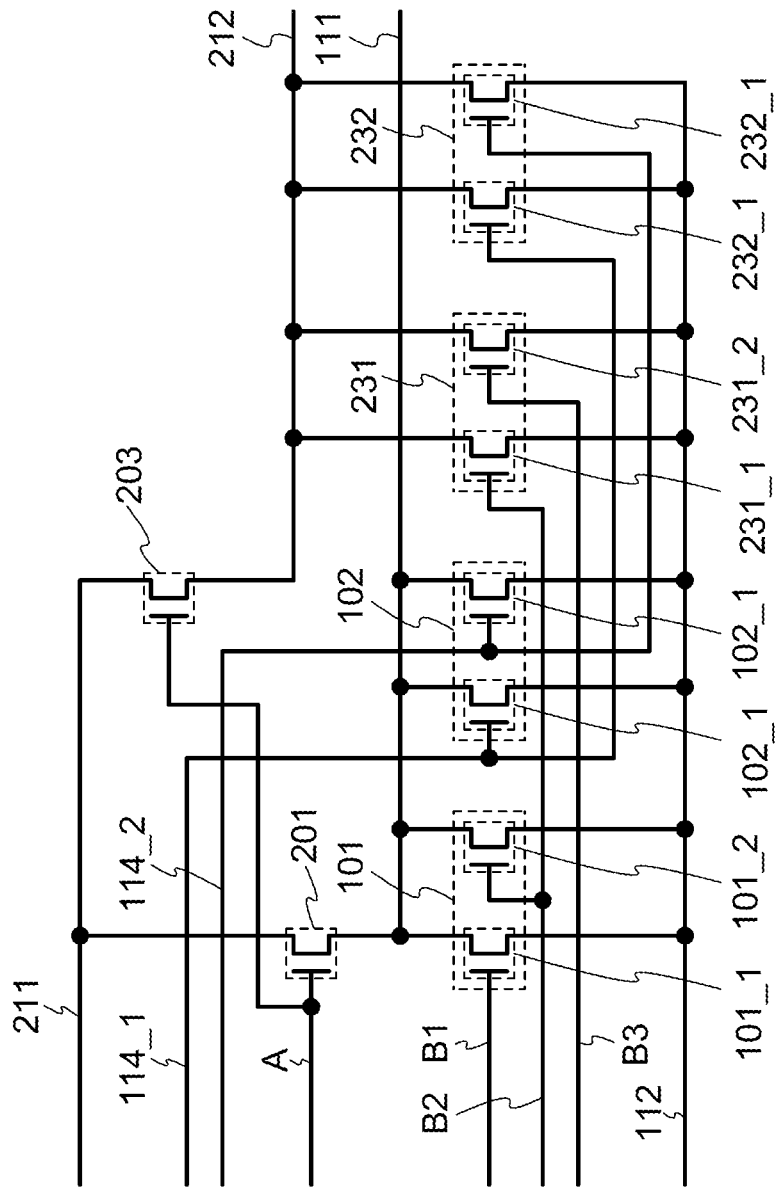
FIG. 18 is a circuit diagram of a semiconductor device.

As illustrated in FIG. 18, a circuit 231 and a circuit 232 can be additionally provided in addition to the transistor 203. The circuit 231 has a function similar to that of the circuit 101, and the circuit 232 has a function similar to that of the circuit 102. The circuit 231 includes a plurality of transistors: a transistor 231_1 and a transistor 231_2. The circuit 232 includes a plurality of transistors: a transistor 232_1 and a transistor 232_2. The transistors 231_1, 231_2, 232_1, and 232_2 correspond to the transistors 101_1, 101_2, 102_1, and 102_2, respectively and are n-channel transistors. First terminals of the transistors 231_1, 231_2, 232_1, and 232_2 are connected to the wiring 112. Second terminals of the transistors 231_1, 231_2, 232_1, and 232_2 are connected to the wiring 212. Gates of the transistors 231_1, 231_2, 232_1, and 232_2 are connected to the node B2, a node B3, the wiring 114_1, and the wiring 114_2, respectively. Note that this embodiment is not limited thereto, and the transistors 231_1, 231_2, 232_1, and 232_2 can be p-channel transistors. Alternatively, the first terminals or the second terminals of the transistor 231_1, the transistor 231_2, the transistor 232_1, and/or the transistor 232_2 can be connected to different wirings from each other.

In FIG. 17B and FIG. 18, in the case where an output signal from the wiring 111 is a signal supplied to a pixel and an output signal from the wiring 212 is a transfer signal, the channel width of the transistor 203 is preferably smaller than that of the transistor 201. This is because the wiring 111 is connected to a gate line, the pixel, or the like, so that the load of the wiring 111 is often larger than the load of the wiring 212. Note that this embodiment is not limited thereto, and in the case where the signal output from the wiring 111 is a transfer signal and the signal output from the wiring 212 is a signal output to a pixel, the channel width of the transistor 203 can be larger than that of the transistor 201.

In FIG. 17B and FIG. 18, in the case where the output signal from the wiring 111 is a signal supplied to a pixel and the output signal from the wiring 212 is a transfer signal, the channel width of the transistors 231_1, 231_2, 232_1, and 232_2 is preferably smaller than that of the transistors 101_1, 101_2, 102_1, and 102_2. This is because the wiring 111 is connected to a gate line, the pixel, or the like, so that the load of the wiring 111 is often larger than the load of the wiring 212. Note that this embodiment is not limited thereto, and the channel width of the transistors 231_1, 231_2, 232_1, and 232_2 can be larger than that of the transistors 101_1, 101_2, 102_1, and 102_2.

In FIG. 17B and FIG. 18, a capacitor can be connected between the gate and the second terminal of the transistor 203.

In FIG. 7B, FIG. 8A, FIGS. 16A and 16B, and FIG. 17A, the transistor 203, the circuit 231, and/or the circuit 232 can be additionally provided as in FIG. 17B and FIG. 18.

Figure 19A:
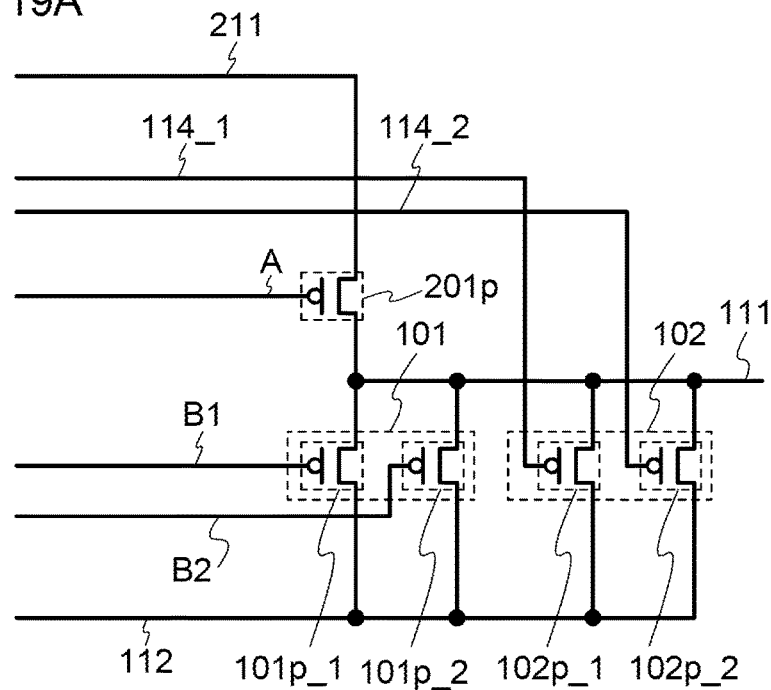
FIG. 19A is a circuit diagram of a semiconductor device.
Figure 19B:
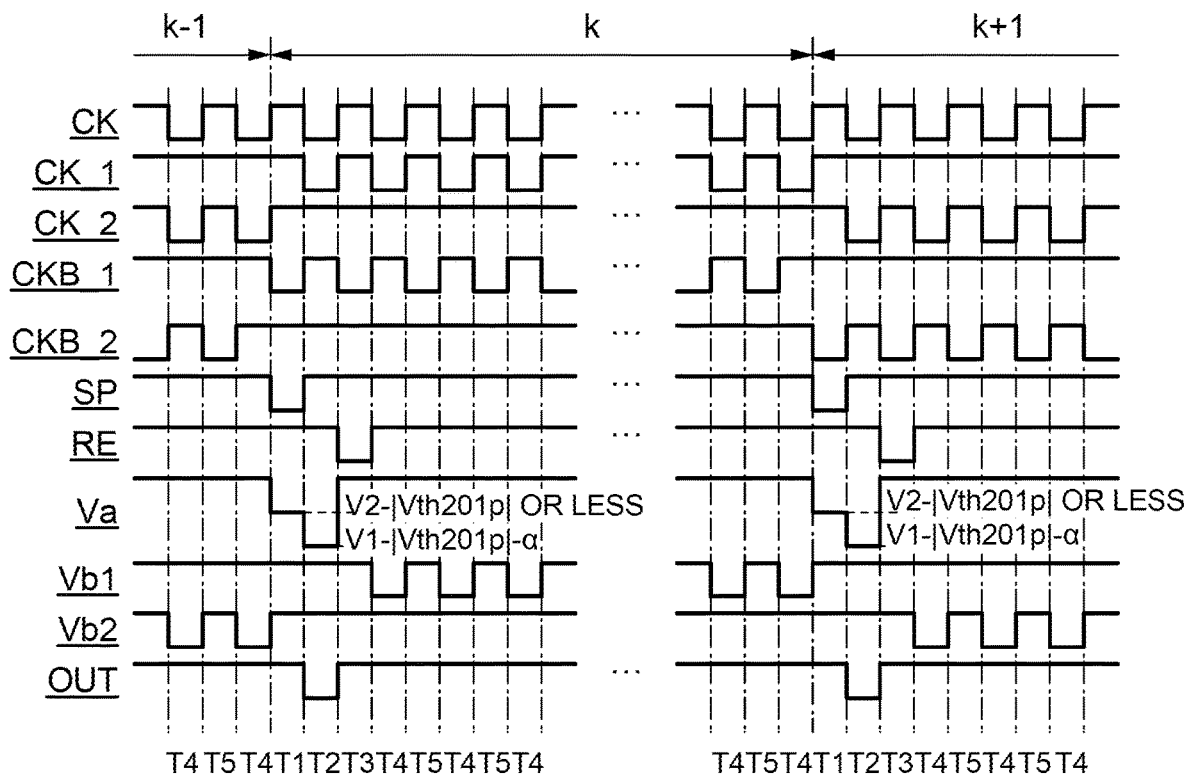
FIG. 19B is a timing chart illustrating operation of the semiconductor device.

As illustrated in FIG. 19A, a p-channel transistor can be used as the transistor. The transistors 101p_1, 101p_2, 102p_1, and 102p_2 and a transistor 201p correspond to the transistors 101_1, 101_2, 102_1, 102_2, and 201, respectively and are p-channel transistors. In the case of using p-channel transistors, as illustrated in FIG. 19B, the voltage V2 is applied to the wiring 112, and the signals CK, CK_1, CK_2, CKB_1, and CKB_2; the potentials Va, Vb1, and Vb2; and the signal OUT are often inverted from those illustrated in the timing chart of FIG. 8B.

In FIG. 7B, FIG. 8A, FIGS. 16A and 16B, FIGS. 17A and 17B, and FIG. 18, a p-channel transistor can be used as the transistor as in FIG. 19A.

Embodiment 3

In this embodiment, an example of the circuit 300 described in Embodiment 2 will be described. Note that the circuit 300 can be referred to as a semiconductor device, a driver circuit, or a gate driver. The contents described in Embodiments 1 and 2 are not repeated. Further, the contents described in Embodiments 1 and 2 can be freely combined with a content described in this embodiment.

First, an example of the circuit 300 is described with reference to FIG. 21A. The circuit 300 includes a transistor 301, a transistor 302, a transistor 303, a transistor 304_1, a transistor 304_2, a transistor 305_1, and a transistor 305_2. Note that this embodiment is not limited thereto, and the circuit 300 can include a variety of other components. Alternatively, any of the transistors in the circuit 300 can be omitted.

Note that the transistors 301, 302, 303, 304_1, 304_2, 305_1, and 305_2 preferably have the same polarity as the transistor 201, and are n-channel transistors. Note that this embodiment is not limited thereto, and the transistors 301, 302, 303, 304_1, 304_2, 305_1, and 305_2 can be p-channel transistors.

Next, an example of the connection relation in the circuit 300 will be described. A first terminal of the transistor 301 is connected to the wiring 212. A second terminal of the transistor 301 is connected to the node A. A gate of the transistor 301 is connected to the wiring 212. A first terminal of the transistor 302 is connected to the wiring 112. A second terminal of the transistor 302 is connected to the node A. A gate of the transistor 302 is connected to the wiring 213. A first terminal of the transistor 303 is connected to the wiring 112. A second terminal of the transistor 303 is connected to the wiring 111. A gate of the transistor 303 is connected to the wiring 213. First terminals of the transistors 304_1 and 304_2 are connected to the wiring 212. Second terminals of the transistors 304_1 and 304_2 are connected to the node A. Gates of the transistors 304_1 and 304_2 are connected to the wirings 114_1 and 1142, respectively. First terminals of the transistors 305_1 and 305_2 are connected to the node A. Second terminals of the transistors 305_1 and 305_2 are connected to the wiring 111. Gates of the transistors 305_1 and 305_2 are connected to the wirings 211_1 and 221_2, respectively. Note that this embodiment is not limited thereto, and various other connection structures can be employed.

Next, an example of a function of each transistor is described. The transistor 301 has a function of controlling the timing when an H-level signal is supplied to the node A by controlling, in accordance with the signal SP, a conduction state of the wiring 212 and the node A. The transistor 301 can function as a diode. The transistor 302 has a function of controlling the timing when the voltage V1 is applied to the node A by controlling, in accordance with the signal RE, a conduction state of the wiring 112 and the node A. The transistor 302 can function as a switch. The transistor 303 has a function of controlling the timing when the voltage V1 is applied to the wiring 111 by controlling, in accordance with the signal RE, a conduction state of the wiring 112 and the wiring 111. The transistor 303 can function as a switch. The transistor 304_1 has a function of controlling the timing when the signal SP is supplied to the node A by controlling, in accordance with the signal CKB_1, a conduction state of the wiring 212 and the node A. The transistor 304_1 can function as a switch. The transistor 304_2 has a function of controlling the timing when the signal SP is supplied to the node A by controlling, in accordance with the signal CKB_2, a conduction state of the wiring 212 and the node A. The transistor 304_2 can function as a switch. The transistor 305_1 has a function of controlling a conduction state of the node A and the wiring 111 in accordance with the signal CK_1, and can function as a switch. The transistor 305_2 has a function of controlling a conduction state of the node A and the wiring 111 in accordance with the signal CK_2, and can function as a switch. Note that this embodiment is not limited thereto, and these transistors can have a variety of other functions.

Figure 21A:
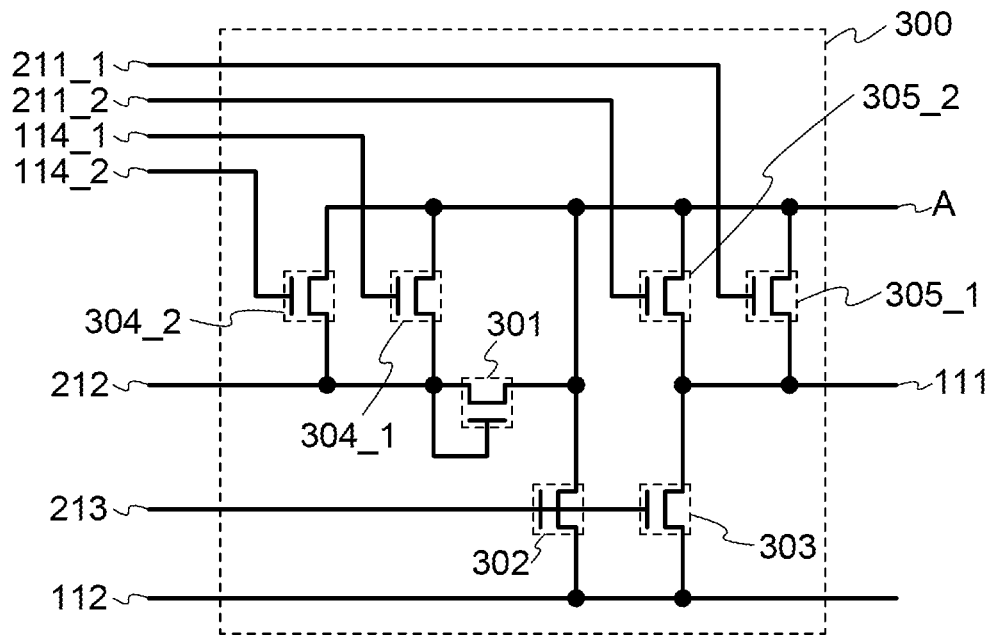
FIGS. 21A and 21B are circuit diagrams each illustrating a semiconductor device.

Next, operation of the semiconductor device in FIG. 21A is described with reference to the timing chart in FIG. 8B.

First, in the period T1 of the k-th frame, the signal SP is set at the H level, so that the transistor 301 is turned on. At the same time, the signal CKB_1 is set at the H level and the signal CKB_2 is set at the L level, so that the transistor 304_1 is turned on and the transistor 304_2 is turned off. Accordingly, the wiring 212 and the node A are brought into conduction, whereby the signal SP is supplied from the wiring 212 to the node A. Then, the potential of the node A starts to be increased. At this time, the signals CK_1 and CK_2 are set at the L level, so that the transistors 305_1 and 305_2 are turned off. Accordingly, the node A and the wiring 111 are brought out of conduction. Moreover, since the signal RE is at the L level, the transistors 302 and 303 are turned off. Thus, the wiring 112 and the node A are brought out of conduction, and the wiring 112 and the wiring 111 are brought out of conduction. After that, the transistor 301 is turned off when the potential of the node A becomes a value (V2−Vth301) obtained by subtracting the threshold voltage (Vth301) of the transistor 301 from the potential (V2) of the H-level signal SP. Similarly, the transistor 304_1 is turned off when the potential of the node A becomes a value (V2−Vth304_1) obtained by subtracting the threshold voltage (Vth304_1) of the transistor 304_1 from the potential (V2) of the H-level signal CKB_1. Here, the transistors 301 and 304_1 are tuned off when the potential of the node A becomes (V2−Vth301). Accordingly, the wiring 212 and the node A are brought out of conduction. Then, the node A enters into a floating state, and thus keeps the potential to be (V2−Vth301).

Operation of the period T1 in the (k+1)-th frame is different from that of the period T1 in the k-th frame in that the signal CKB_1 is set at the L level and the signal CKB_2 is set at the H level, and thus, the transistor 304_1 is tuned off and the transistor 304_2 is turned on.

First, in the period T2 of the k-th frame, the signal SP is set at the L level, so that the transistor 301 remains off. At the same time, the signal CKB_1 is set at the L level and the signal CKB_2 remains at the L level, so that the transistors 304_1 and 304_2 remain off. Accordingly, the wiring 212 and the node A remain in a non-conduction state. At this time, the signal CK_1 is set at the H level, and the signal CK_2 remains at the L level. However, the potential of the node A becomes (V2+Vth201+β) (β is a positive number), so that the transistors 305_1 and 305_2 remain off. Accordingly, the node A and the wiring 111 remain in a non-conduction state. Moreover, since the signal RE remains at the L level, the transistors 302 and 303 remain off. Thus, the wiring 112 and the node A remain in a non-conduction state, and the wiring 112 and the wiring 111 remain in a non-conduction state.

Operation of the period T2 in the (k+1)-th frame is different from that of the period T2 in the k-th frame in that the signal CKB_1 remains at the L level and the signal CKB_2 is set at the H level. However, also in this case, since the potential of the node A becomes (V2+Vth201+β), the transistors 305_1 and 305_2 remain off.

Next, in the period T3 of the k-th frame, the signal SP remains at the L level, so that the transistor 301 remains off. The signal CKB_1 is set at the H level and the signal CKB_2 remains at the L level, so that the transistor 304_1 is turned on and the transistor 304_2 remains off. Accordingly, the wiring 212 and the node A are brought into conduction, whereby the L-level signal SP is supplied from the wiring 212 to the node A. At this time, the signal CK_1 is set at the L level, and the signal CK_2 remains at the L level, so that the transistors 305_1 and 305_2 remain off. Accordingly, the node A and the wiring 111 remain in a non-conduction state. Moreover, since the signal RE is set at the H level, the transistors 302 and 303 are turned on. Thus, the wiring 112 and the node A are brought into conduction, and the wiring 112 and the wiring 111 are brought into conduction. Then, the voltage V1 is applied from the wiring 112 to the node A and the wiring 111.

Operation of the period T3 in the (k+1)-th frame is different from that of the period T3 in the k-th frame in that the signal CKB_1 is set at the L level and the signal CKB_2 is set at the H level, and thus, the transistor 304_1 is turned off and the transistor 304_2 is turned on.

Next, in the period T4 of the k-th frame, the signal SP remains at the L level, so that the transistor 301 remains off. At the same time, the signal CKB_1 is set at the L level and the signal CKB_2 remains at the L level, so that the transistor 304_1 is turned off and the transistor 304_2 remains off. Accordingly, the wiring 212 and the node A remain in a non-conduction state. At this time, the signal CK_1 is set at the H level and the signal CK_2 remains at the L level, whereby the transistor 305_1 is turned on and the transistor 305_2 remains off. Thus, the node A and the wiring 111 are brought into conduction. Moreover, since the signal RE is set at the L level, the transistors 302 and 303 are turned off. Accordingly, the wiring 112 and the node A are brought out of conduction, and the wiring 112 and the wiring 111 are brought out of conduction.

Operation of the period T4 in the (k+1)-th frame is different from that of the period T4 in the k-th frame in that the signal CK_1 remains at the L level and the signal CK_2 is set at the H level, and thus, the transistor 305_1 remains off and the transistor 305_2 is turned on.

Next, in the period T5 of the k-th frame, the signal SP remains at the L level, so that the transistor 301 remains off. The signal CKB_1 is set at the H level and the signal CKB_2 remains at the L level, so that the transistor 304_1 is turned on and the transistor 304_2 remains off. Accordingly, the wiring 212 and the node A are brought into conduction, whereby the L-level signal SP is supplied to the node A. At this time, the signal CK_1 is set at the L level, and the signal CK_2 remains at the L level, so that the transistor 305_1 is turned off and the transistor 305_2 remains off. Accordingly, the node A and the wiring 111 are brought out of conduction. Moreover, sine the signal RE remains at the L level, the transistors 302 and 303 remain off. Thus, the wiring 112 and the node A are brought out of conduction, and the wiring 112 and the wiring 111 remain in a non-conduction state.

Operation of the period T5 in the (k+1)-th frame is different from that of the period T5 in the k-th frame in that the signal CKB_1 remains at the L level and the signal CKB_2 is set at the H level, and thus, the transistor 305_1 remains off and the transistor 305_2 is turned on.

As described above, in the semiconductor device of this embodiment, the time during which the transistor is on can be shorter by repeating the operation m the k-th frame and the operation in the (k+1)-th frame. Accordingly, degradation of characteristics of the transistor can be suppressed. Thus, when a shift register, a gate driver, a display device, or the like includes the semiconductor device in this embodiment, the lifetime thereof can be increased.

In particular, each of the transistors 304_1, 304_2, 305_1, and 305_2 has a period during which the transistor remains off and a period during which on and off are repeated. Accordingly, the time during which the transistor is on can be shorter, whereby degradation of characteristics of the transistor can be suppressed.

In the semiconductor device in this embodiment, all the transistors can be n-channel transistors or p-channel transistors. Accordingly, reduction in the number of steps, improvement in yield, improvement in reliability, or reduction in cost can be realized more efficiently as compared to the case of using a CMOS circuit. In particular, when all the transistors including those in a pixel portion and the like are n-channel transistors, a non-single-crystal semiconductor, an amorphous semiconductor, a microcrystalline semiconductor, an organic semiconductor, an oxide semiconductor, or the like can be used for a semiconductor layer of the transistor. Although a transistor using such a semiconductor is likely to deteriorate, deterioration of the transistor can be suppressed in the semiconductor device in this embodiment.

It is not necessary to increase the channel width of a transistor so that a semiconductor device is operated even when characteristics of the transistor deteriorate. Accordingly, the channel width of the transistor can be reduced. This is because degradation of the transistor can be suppressed in the semiconductor device in this embodiment.

It is preferable that the channel width of the transistor 304_1 be approximately equal to the channel width of the transistor 304_2. Alternatively, it is preferable that the channel width of the transistor 305_1 be approximately equal to the channel width of the transistor 305_2. This is because the transistors 304_1 and 304_2 have similar functions, and the transistors 305_1 and 305_2 have similar functions. Note that this embodiment is not limited thereto, and the channel width of the transistor 304_1 can be larger or smaller than the channel width of the transistor 304_2. Alternatively, the channel width of the transistor 305_1 can be larger or smaller than the channel width of the transistor 305_2.

The channel width of the transistor 303 is preferably larger than that of the transistor 302. This is because the load of the wiring 111 is often larger than the load of the node A. Note that this embodiment is not limited thereto, and the channel width of the transistor 303 can be smaller than that of the transistor 302.

Figure 21B:
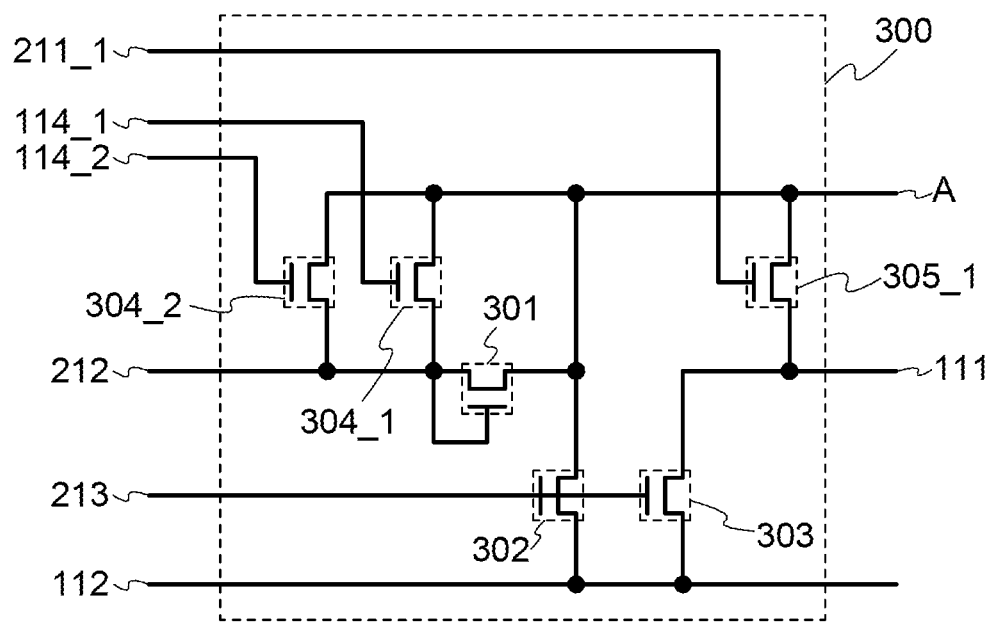

Note that some of the transistors included in the circuit 300 can be eliminated. For example, one of the transistor 305_1 and the transistor 305_2 can be eliminated. In that case, the signal CK can be input to the gate of the other of the transistor 305_1 and the transistor 305_2. FIG. 21B illustrates a configuration in the case where the transistor 305_2 is eliminated. Note that this embodiment is not limited thereto, and it is possible to eliminate any other transistor. For example, both the transistor 305_1 and the transistor 305_2 can be eliminated. Alternatively, one of the transistor 304_1 and the transistor 304_2 can be eliminated. In that case, the signal CKB can be input to the gate of the other of the transistor 304_1 and the transistor 304_2. Alternatively, both the transistor 304_1 and the transistor 304_2 can be omitted. Further alternatively, the transistor 302 or the transistor 303 can be omitted.

Figure 22A:
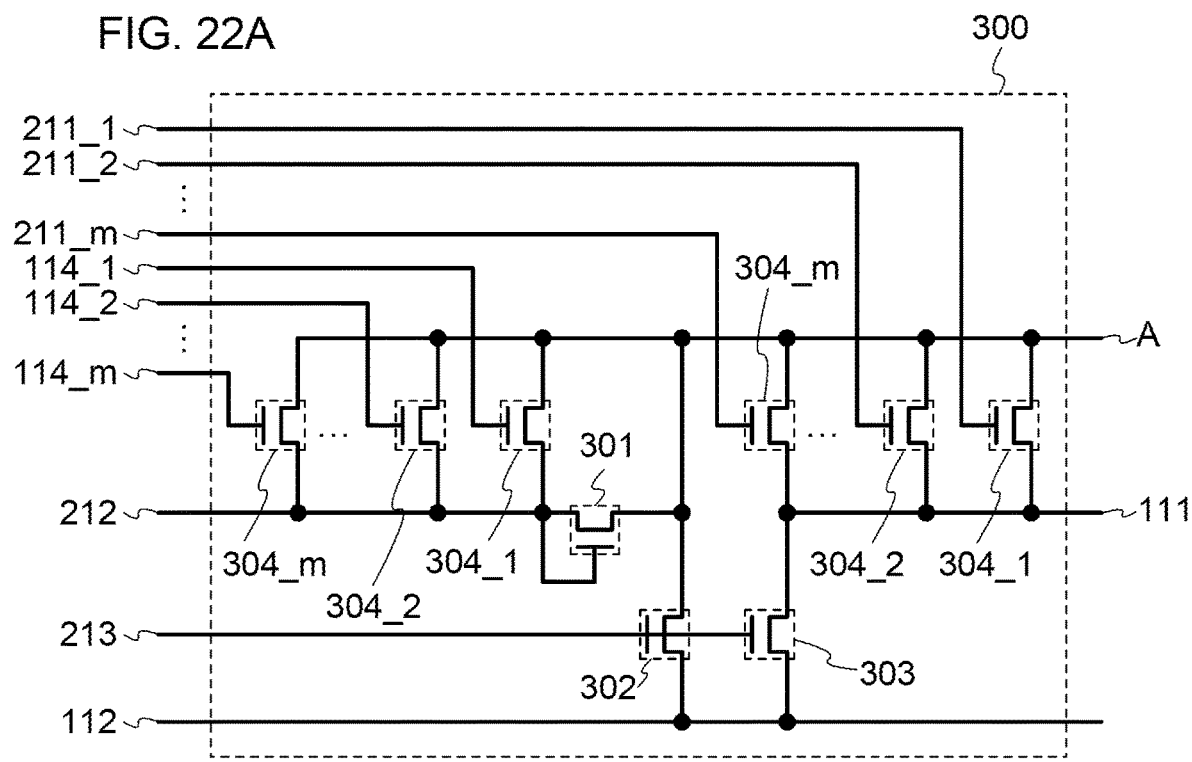
FIGS. 22A and 22B are circuit diagrams each illustrating a semiconductor device.

In the case where the circuit 101 and the circuit 102 each include m transistors as in FIG. 5B of Embodiment 1, the circuit 300 can include a plurality of transistors 304_1 to 304_m and a plurality of transistors 305_1 to 305_m as illustrated in FIG. 22A. Each of the transistors 304_1 to 304_m corresponds to the transistor 304_1 or the transistor 304_2. Each of the transistors 305_1 to 305_m corresponds to the transistor 305_1 or the transistor 305_2.

In FIG. 21B, the circuit 300 can include a plurality of transistors 304_1 to 304_m and a plurality of transistors 305_1 to 305_m as in FIG. 22A.

Figure 22B:
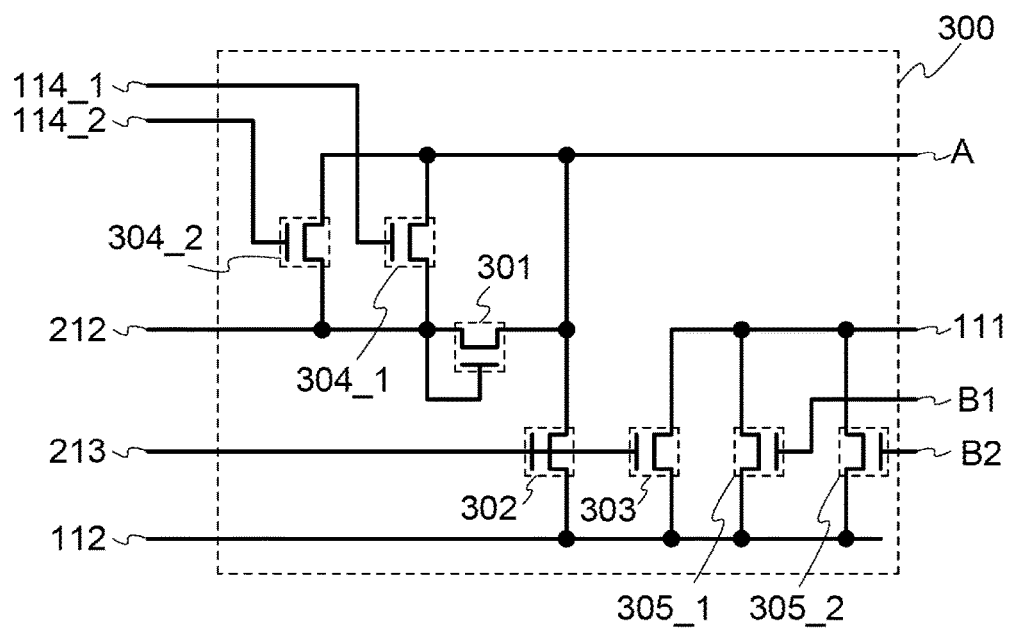

As illustrated in FIG. 22B, the first terminals of the transistors 305_1 and 305_2 can be connected to the wiring 112, and the gates of the transistors 305_1 and 305_2 can be connected to the nodes B1 and B2, respectively. Note that this embodiment is not limited thereto, and the first terminals of the transistors 305_1 and 305_2 can be connected to the wirings 114_2 and 114_1, respectively. Alternatively, the first terminals of the transistors 305_1 and 305_2 can be connected to the wirings 211_2 and 211_1, respectively. Further alternatively, the first terminals of the transistors 305_1 and 305_2 can be connected to the nodes B2 and B1, respectively.

In FIG. 21B and FIG. 22A, as in FIG. 22B, the first terminals of the transistors 305_1 and 305_2 can be connected to the wiring 112, and the gates of the transistors 305_1 and 305_2 can be connected to the nodes B1 and B2, respectively.

Figure 23A:
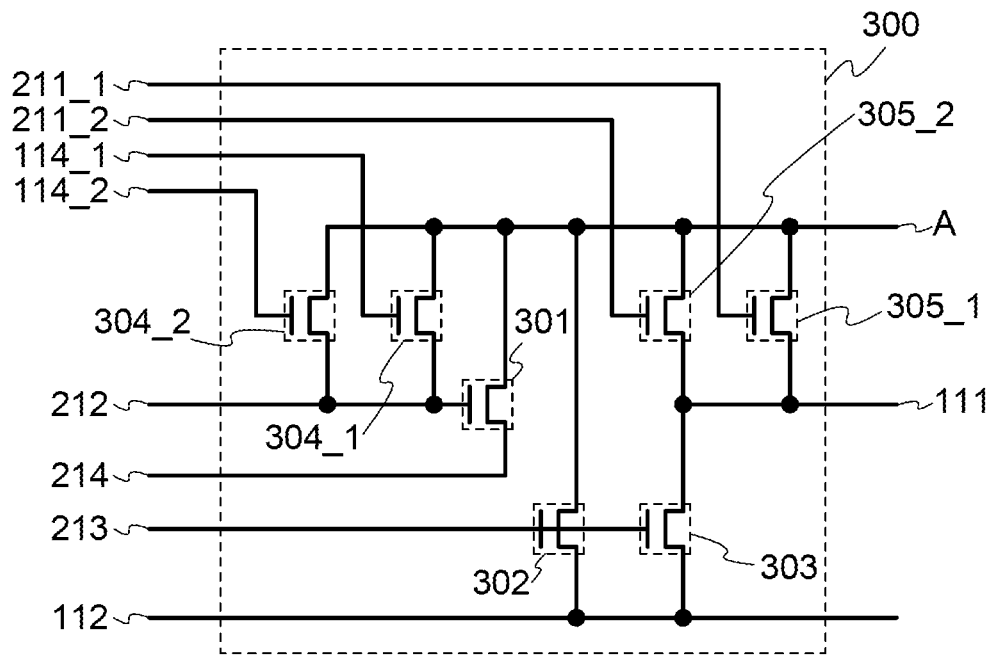
FIGS. 23A and 23B are circuit diagrams each illustrating a semiconductor device.

As illustrated in FIG. 23A, the first terminal of the transistor 301 can be connected to a wiring 214. The voltage V2 is applied to the wiring 214, and the wiring 214 can function as a power supply line. Note that this embodiment is not limited thereto, and a signal which is set at the H level in the period T1 can be input to the wiring 214.

In FIG. 21B and FIGS. 22A and 22B, the first terminal of the transistor 301 can be connected to the wiring 214 as in FIG. 23A.

Figure 23B:
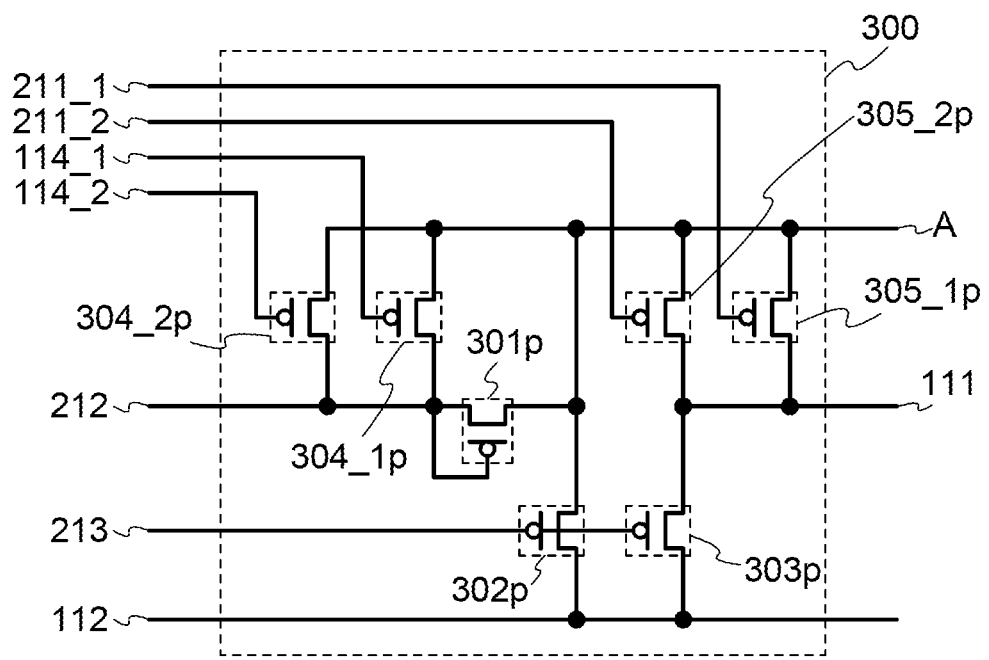

As illustrated in FIG. 23B, a p-channel transistor can be used as the transistor. Transistors 301p, 302p, 303p, 304_1p, 304_2p, 305_1p, and 305_2p correspond to the transistors 301, 302, 303, 304_1, 304_2, 305_1, and 305_2, respectively and are p-channel transistors. In the case of using p-channel transistors, as illustrated in FIG. 19B, the voltage V2 is applied to the wiring 112, and the signals CK, CK_1, CK_2, CKB_1, and CKB_2, the potential Va, and the signal OUT are often inverted from those in the timing chart of FIG. 8B.

In FIG. 21B, FIGS. 22A and 22B, and FIG. 23A, a p-channel transistor can be used as the transistor as in FIG. 23B.

Embodiment 4

In this embodiment, an example of the circuit 400 described in Embodiment 2 will be described. Note that the circuit 400 can be referred to as a semiconductor device, a driver circuit, or a gate driver. The contents described in Embodiments 1 and 2 are not repeated. Further, the contents described in Embodiments 1 to 3 can be freely combined with a content described in this embodiment.

First, an example of the circuit 400 is described with reference to FIG. 24A. The circuit 400 includes a transistor 401_1, a transistor 401_2, a transistor 402_1, a transistor 402_2, a capacitor 403_1, and a capacitor 403_2. Note that this embodiment is not limited thereto, and the circuit 400 can include a variety of other components. Alternatively, any of the transistors or capacitors in the circuit 400 can be omitted.

Note that the transistors 401_1, 401_2, 402_1, and 402_2 preferably have the same polarity as the transistor 201, and are n-channel transistors. Note that this embodiment is not limited thereto, and the transistors 401_1, 401_2, 402_1, and 402_2 can be p-channel transistors.

Next, an example of the connection relation in the circuit 400 will be described. A first terminal of the transistor 401_1 is connected to the wiring 112. A second terminal of the transistor 401_1 is connected to the node B1. A gate of the transistor 401_2 is connected to the node A. A first terminal of the transistor 401_2 is connected to the wiring 112. A second terminal of the transistor 401_2 is connected to the node B2. A gate of the transistor 401_2 is connected to the node A. A first terminal of the transistor 402_1 is connected to the wiring 112. A second terminal of the transistor 402_1 is connected to the node B1. A gate of the transistor 402_1 is connected to the wiring 211_2. A first terminal of the transistor 402_2 is connected to the wiring 112. A second terminal of the transistor 402_2 is connected to the node B2. A gate of the transistor 402_2 is connected to the wiring 211_1. One electrode of the capacitor 403_1 is connected to the wiring 211_1. The other electrode of the capacitor 403_1 is connected to the node B1. One electrode of the capacitor 403_2 is connected to the wiring 211_2. The other electrode of the capacitor 403_2 is connected to the node B2. Note that this embodiment is not limited thereto, and various other connection structures can be employed.

Next, an example of a function of each transistor and each capacitor is described. The transistor 401_1 has a function of controlling the timing when the voltage V1 is applied to the node B1 by controlling, in accordance with the potential of the node A, a conduction state of the wiring 112 and the node B1. The transistor 401 can function as a switch. The transistor 401_2 has a function of controlling the timing when the voltage V1 is applied to the node B2 by controlling, in accordance with the potential of the node A, a conduction state of the wiring 112 and the node B2. The transistor 401_2 can function as a switch. The transistor 402_1 has a function of controlling the timing when the voltage V1 is applied to the node B1 by controlling, in accordance with the signal CK_2, a conduction state of the wiring 112 and the node B1. The transistor 402_1 can function as a switch. The transistor 402_2 has a function of controlling the timing when the voltage V1 is applied to the node B2 by controlling, in accordance with the signal CK_1, a conduction state of the wiring 112 and the node B2. The transistor 402_2 can function as a switch. The capacitor 403_1 has a function of controlling the potential of the node B1 in accordance with the signal CK_1. The capacitor 403_2 has a function of controlling the potential of the node B2 in accordance with the signal CK_2. Note that this embodiment is not limited thereto, and these transistors and capacitors can have a variety of other functions.

Figure 24A:
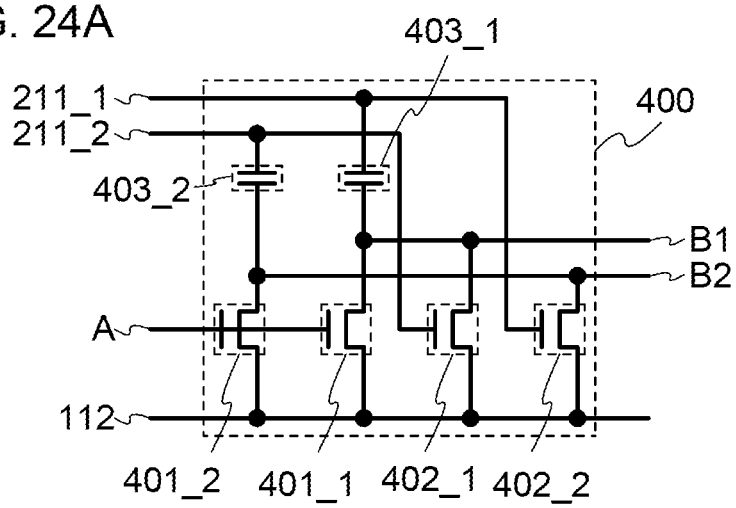
FIGS. 24A to 24C are circuit diagrams each illustrating a semiconductor device.

Next, operation of the semiconductor device in FIG. 24A is described with reference to the timing chart in FIG. 8B.

First, in the period T1 of the k-th frame, the potential of the node A is set high (e.g., (V2−Vth301)), so that the transistors 401_1 and 401_2 are turned on. At this time, the signal CK_1 is set at the L level, and the signal CK_2 is set at the L level, so that the transistors 402_1 and 402_2 are turned off. Accordingly, the wiring 112 and the node B1 are brought into conduction, and the wiring 112 and the node B2 are brought into conduction. Then, the voltage V1 is applied from the wiring 112 to the node B1, and the voltage V1 is applied from the wiring 112 to the node B2.

Next, in the period T2 of the k-th frame, the potential of the node A remains high (e.g., (V2−Vth201+α)), so that the transistors 401_1 and 401_2 remain on. At this time, the signal CK_1 is set at the H level, and the signal CK_2 remains at the L level, whereby the transistor 402_1 remains off and the transistor 402_2 is turned on. Accordingly, the wiring 112 and the node B1 remain in a conduction state, and the wiring 112 and the node B2 remain in a conduction state. Then, the voltage V1 is applied from the wiring 112 to the node B1, and the voltage V1 is applied from the wiring 112 to the node B2.

Operation of the period T2 in the (k+1)-th frame is different from that of the period T2 in the k-th frame in that the signal CK_1 remains at the L level and the signal CK_2 is set at the H level, and thus, the transistor 402_1 is turned on and the transistor 402_2 is turned off.

Next, in the period T3 of the k-th frame, the potential of the node A becomes V1, so that the transistors 401_1 and 401_2 are turned off. At this time, the signal CK_1 is set at the L level, and the signal CK_2 remains at the L level, whereby the transistor 402_1 remains off and the transistor 402_2 is turned off. Accordingly, the wiring 112 and the node B1 are brought out of conduction, and the wiring 112 and the node B2 are brought out of conduction. Here, the potential difference between the L-level signal CK_1 (the potential of the wiring 211_1) and V1 (the potential of the node B1) is held in the capacitor 403_1. Moreover, the potential difference between the L-level signal CK_2 (the potential of the wiring 211_2) and V1 (the potential of the node B2) is held in the capacitor 403_2.

Next, in the period T4 of the k-th frame, the potential of the node A remains at V1, so that the transistors 401_1 and 401_2 remain off. At this time, the signal CK_1 is set at the H level, and the signal CK_2 remains at the L level, whereby the transistor 402_1 remains off and the transistor 402_2 is turned on. Accordingly, the wiring 112 and the node B1 are brought out of conduction, and the wiring 112 and the node B2 are brought into conduction. Then, the voltage V1 is applied from the wiring 112 to the node B2. Thus, the node B1 enters into a floating state. Accordingly, when the signal CK_1 is changed from the L level to the H level, the potential of the node B1 is increased by capacitive coupling of the capacitor 403_1.

Operation of the period T4 in the (k+1)-th frame is different from that of the period T4 in the k-th frame in that the signal CK_1 remains at the L level and the signal CK_2 is set at the H level, and thus, the transistor 402_1 is turned on and the transistor 402_2 remains off. Accordingly, the wiring 112 and the node B1 are brought into conduction, and the wiring 112 and the node B2 are brought out of conduction. Then, the voltage V1 is applied from the wiring 112 to the node B1. Thus, the node B2 enters into a floating state. Accordingly, when the signal CK_2 is changed from the L level to the H level, the potential of the node B2 is increased by capacitive coupling of the capacitor 403_2.

Next, in the period T5 of the k-th frame, the potential of the node A remains at V1, so that the transistors 401_1 and 401_2 remain off. At this time, the signal CK_1 is set at the L level, and the signal CK_2 remains at the L level, whereby the transistor 402_1 remains off and the transistor 402_2 is turned off. Accordingly, the wiring 112 and the node B are brought out of conduction, and the wiring 112 and the node B2 are brought out of conduction. Thus, the nodes B1 and B2 enter into a floating state. Accordingly, when the signal CK_1 is changed from the H level to the L level, the potential of the node B1 is reduced by capacitive coupling of the capacitor 403_1. Note that the signal CK_1 remains at the L level, so that the potential of the node B1 remains at V1.

Operation of the period T5 in the (k+1)-th frame is different from that of the period T5 in the k-th frame in that the signal CK_1 remains at the L level and the signal CK_2 is set at the L level, and thus, the potential of the node B2 is reduced by capacitive coupling of the capacitor 403_2; and in that the potential of the node B1 remains at V1.

As described above, in the semiconductor device of this embodiment, the time during which the transistor is on can be shorter by repeating the operation in the k-th frame and the operation in the (k+1)-th frame. Accordingly, degradation of characteristics of the transistor can be suppressed. Thus, when a shift register, a gate driver, a display device, or the like includes the semiconductor device in this embodiment, the lifetime thereof can be increased.

In the semiconductor device in this embodiment, all the transistors can be n-channel transistors or p-channel transistors. Accordingly, reduction in the number of steps, improvement in yield, improvement in reliability, or reduction in cost can be realized more efficiently as compared to the case of using a CMOS circuit. In particular, when all the transistors including those in a pixel portion and the like are n-channel transistors, a non-single-crystal semiconductor, an amorphous semiconductor, a microcrystalline semiconductor, an organic semiconductor, an oxide semiconductor, or the like can be used for a semiconductor layer of the transistor. Although a transistor using such a semiconductor is likely to deteriorate, deterioration of the transistor can be suppressed in the semiconductor device in this embodiment.

It is not necessary to increase the channel width of a transistor so that a semiconductor device is operated even when characteristics of the transistor deteriorate. Accordingly, the channel width of the transistor can be reduced. This is because degradation of the transistor can be suppressed in the semiconductor device in this embodiment.

Note that it is preferable that the channel width of the transistor 401_1 be approximately equal to the channel width of the transistor 401_2. Alternatively, it is preferable that the channel width of the transistor 402_1 be approximately equal to the channel width of the transistor 402_2. Further, it is preferable that the capacitance value of the capacitor 403_1 or the area where one electrode of the capacitor 403_1 overlaps with the other electrode thereof be approximately equal to the capacitance value of the capacitor 403_2 or the area where one electrode of the capacitor 403_2 overlaps with the other electrode thereof. This is because the transistors 401_1 and 401_2 have similar functions; the transistors 402_1 and 402_2 have similar functions; and the capacitors 403_1 and 403_2 have similar functions.

The channel width of the transistor 401_1 is preferably larger than the channel width of the transistor 402_1. Alternatively, the channel width of the transistor 401_2 is preferably larger than the channel width of the transistor 402_2. Note that this embodiment is not limited thereto, and the channel width of the transistor 401_1 can be smaller than the channel width of the transistor 402_1. Alternatively, the channel width of the transistor 401_2 can be smaller than the channel width of the transistor 402_2.

Figure 24B:
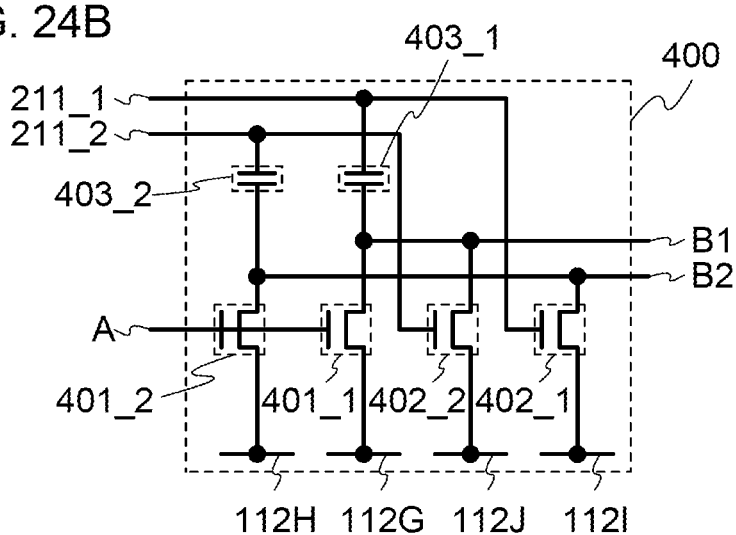

As illustrated in FIG. 24B, the wiring 112 can be divided into a plurality of wirings 112G to 112J. The first terminals of the transistors 401_1, 401_2, 402_1, and 402_2 are connected to the wirings 112G, 112H, 112I, and 112J, respectively. The wirings 112G to 112J correspond to the wiring 112. Accordingly, the voltage V1 can be applied to the wirings 112G to 112J, and the wirings 112G to 112J can function as power supply lines. Note that this embodiment is not limited thereto, and a signal can be input to the wirings 112G to 112J. In that case, the wirings 112G to 112J can function as signal lines. Alternatively, different signals or different voltages can be input to the wirings 112G to 112J.

Figure 24C:
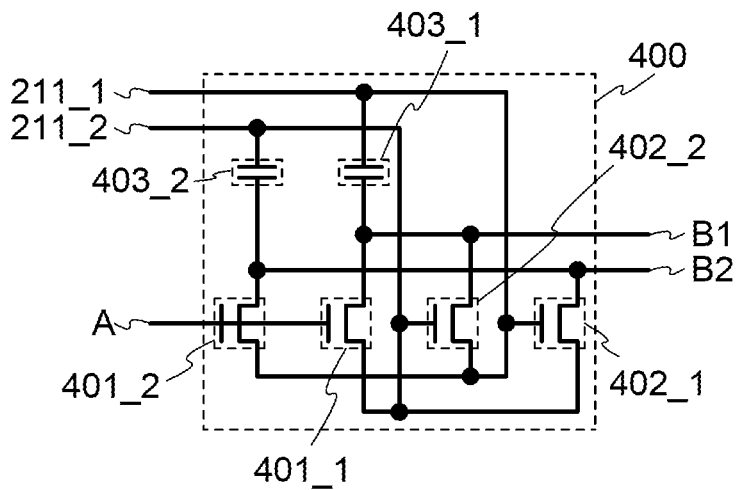

As illustrated in FIG. 24C, the first terminals of the transistors 401_1 and 402_1 can be connected to the wiring 211_2, and the first terminals of the transistors 401_2 and 402_2 can be connected to the wiring 211_1. Accordingly, when the transistor is turned off, a clock signal is input to the first terminal of the transistor. Thus, a reverse bias can be applied to the transistor, so that deterioration of the transistor can be suppressed. Note that this embodiment is not limited thereto, and the first terminals of the transistors 401_1 and 402_1 can be connected to the wiring 114_2, and the first terminals of the transistors 401_2 and 402_2 can be connected to the wiring 114_1. In this case also, a reverse bias can be applied to the transistor, so that deterioration of the transistor can be suppressed. Alternatively, the first terminals of the transistors 401_1 and 401_2 can be connected to the wiring 112.

Figure 25A:
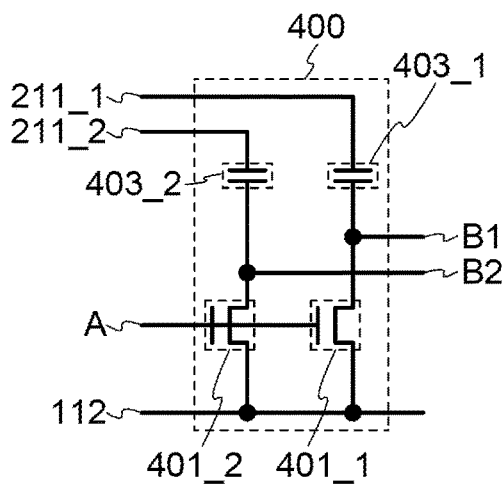
FIGS. 25A to 25D are circuit diagrams each illustrating a semiconductor device.

Note that as illustrated in FIG. 25A, it is possible to eliminate the transistors 402_1 and 402_2.

In FIGS. 24B and 24C, it is possible to eliminate the transistors 402_1 and 402_2 as in FIG. 25A.

Figure 25B:
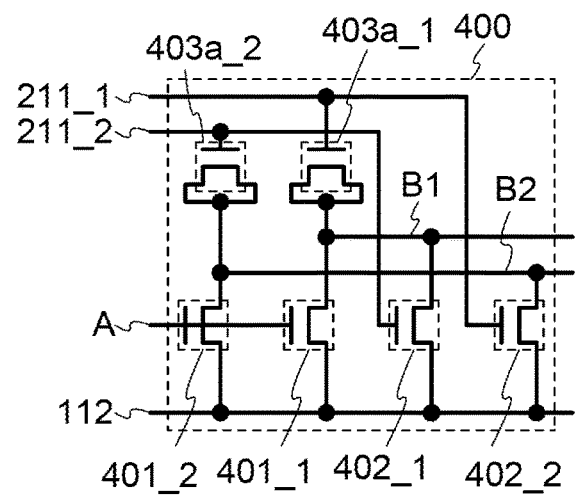

As illustrated in FIG. 25B, a MOS capacitor can be used as the capacitor. Transistors 403a_1 and 403a_2 are often n-channel transistors and function as MOS capacitors. A first terminal and a second terminal of the transistor 403a_1 are connected to the node B1. A gate of the transistor 403a_1 is connected to the wiring 211_1. A first terminal and a second terminal of the transistor 403a_2 are connected to the node B2. A gate of the transistor 403a_2 is connected to the wiring 211_2. Accordingly, a channel region can be easily formed in the transistors 403a_1 and 403a_2, so that the capacitance value can be increased.

In FIGS. 24B and 24C and FIG. 25A, a MOS capacitor can be used as the capacitor as in FIG. 25B.

Figure 25C:
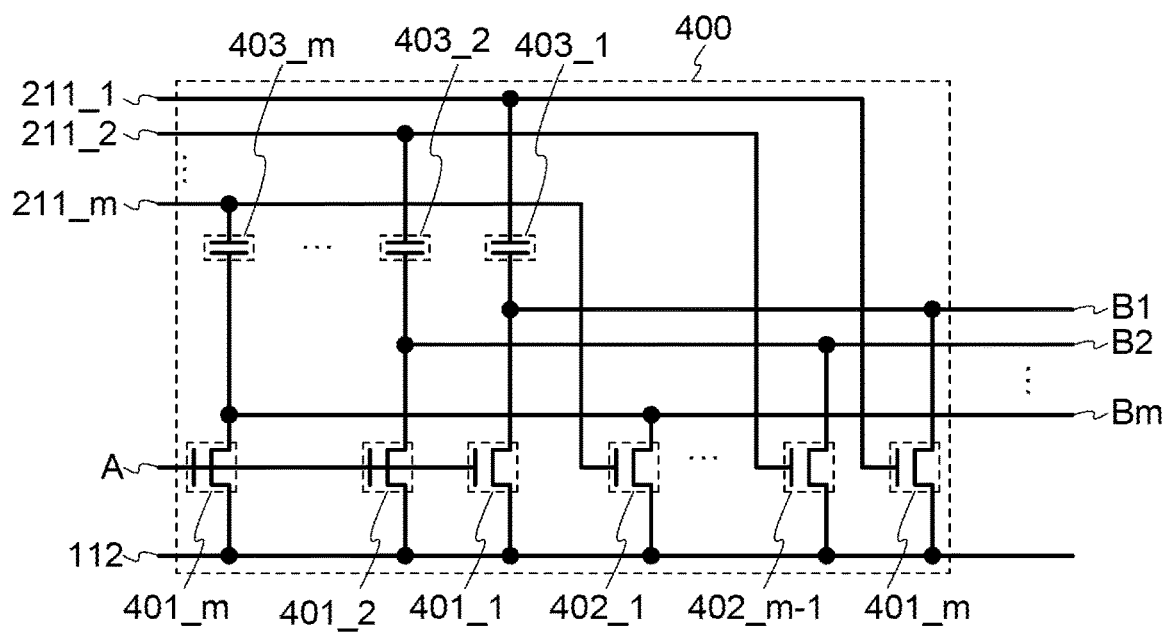

In the case where the circuit 101 and the circuit 102 each include m transistors as in FIG. 5B of Embodiment 1, a semiconductor device can include a plurality of transistors 401_1 to 401_m, a plurality of transistors 402_1 to 402_m, and a plurality of capacitors 403_1 to 403_m as illustrated in FIG. 25C. Note that this embodiment is not limited thereto, and the transistors 402_1 to 402_m can be omitted.

In FIGS. 24B and 24C and FIGS. 25A and 25B, the semiconductor device can include a plurality of transistors 401_1 to 401_m, a plurality of transistors 402_1 to 402_m, and a plurality of capacitors 403_1 to 403_m as in FIG. 25C.

Figure 25D:
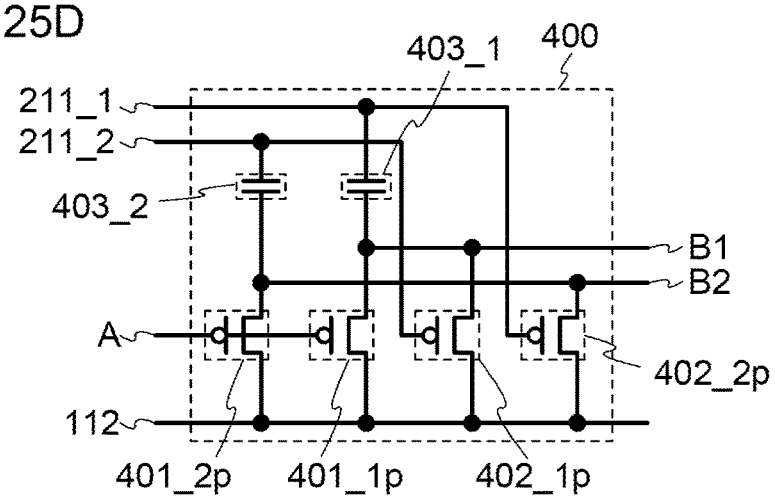

As illustrated in FIG. 25D, a p-channel transistor can be used as the transistor. Transistors 401_1p, 401_2p, 402_1p, and 402_2p correspond to the transistors 401_1, 401_2, 402_1, and 402_2, respectively and are p-channel transistors. In the case of using p-channel transistors, as illustrated in FIG. 19B, the voltage V2 is applied to the wiring 112, and the signals CK, CK_1, CK_2, CKB_1, and CKB_2, the potential Va, and the signal OUT are often inverted from those in the timing chart of FIG. 8B.

In FIGS. 24B and 24C and FIGS. 25A to 25C, a p-channel transistor can be used as the transistor as in FIG. 25D.

Embodiment 5

In this embodiment, an example of a shift register will be described. A shift register in this embodiment can include any of the semiconductor devices in Embodiments 1 to 3. Note that the shift register can be referred to as a semiconductor device or a gate driver. The contents described in Embodiments 1 to 4 are not repeated. Further, the contents described in Embodiments 1 to 4 can be freely combined with a content described in this embodiment.

First, an example of the shift register is described with reference to FIG. 26. The shift register includes a plurality of flip flops 501_1 to 501_N (N is a natural number).

Note that each of the flip flops 501_1 to 501_N corresponds to any of the semiconductor devices described in Embodiments 1 to 4. As an example, FIG. 26 illustrates the case where the semiconductor device in FIG. 7A is used for the flip flops 501_1 to 501_N. Note that this embodiment is not limited thereto, and other semiconductor devices or circuits described in Embodiments 1 to 4 or various other semiconductor devices or circuits can be used for the flip flops 501_1 to 501_N.

Next, the connection relation in the shift register will be described. The shift register is connected to wirings 511_1 to 511_N, a wiring 512, a wiring 512_1, a wiring 512_2, a wiring 513, a wiring 513_1, a wiring 513_2, a wiring 514, a wiring 515, and a wiring 516. Moreover, in the flip flop 501_i (i is any one of 1 to N), the wiring 111, the wiring 211, the wiring 211_1, the wiring 211_2, the wiring 114_1, the wiring 114_2, the wiring 112, the wiring 212, and the wiring 213 are connected to the wiring 511_i, the wiring 512, the wiring 512_1, the wiring 512_2, the wiring 513_1, the wiring 513_2, the wiring 514, the wiring 511_i−1, and the wiring 511_i+1, respectively. Here, in flip flops of odd-numbered stages and flip flops of even-numbered stages, the wirings 211, 211_1, 211_2, 114_1, and 114_2 are often connected to different portions. For example, in a flip flop of an i-th stage (i is any one of 1 to N), the wiring 211, the wiring 211_1, the wiring 211_2, the wiring 114_1, and the wiring 114_2 are connected to the wiring 512, the wiring 512_1, the wiring 512_2, the wiring 513_1, and the wiring 513_2, respectively. In that case, in a flip flop of an (i+1)th stage or a flip flop of an (i−1)th stage, the wiring 211, the wiring 211_1, the wiring 211_2, the wiring 114_1, and the wiring 114_2 are connected to the wiring 513, the wiring 513_1, the wiring 513_2, the wiring 512_1, and the wiring 512_2, respectively.

In the flip flop 501_1, the wiring 212 is often connected to the wiring 515. Moreover, in the flip flop 501_N, the wiring 213 is often connected to the wiring 516.

Next, an example of a signal or voltage which is input to or output from each wiring is described. As an example, signals GOUT_1 to GOUT_N are output from the wirings 511_1 to 511_N, respectively. The signals GOUT_1 to GOUT_N are outputs signals from the flip flops 501_1 to 501_N, respectively. Moreover, the signals GOUT_1 to GOUT_N correspond to the signal OUT, and can function as an output signal, a selection signal, a transfer signal, a start signal, a reset signal, a gate signal, or a scan signal. As an example, signals GCK, GCK_1, and GCK_2 are input to the wirings 512, 512_1, and 512_2, respectively. The signals GCK corresponds to the signal CK or the signal CKB, and can function as a clock signal. The signal GCK_1 corresponds to the signal CK_1 or the signal CKB_1, and can function as a clock signal. The signal GCK_2 corresponds to the signal CK_2 or the signal CKB_2, and can function as a clock signal. As an example, signals GCKB, GCKB_1, and GCKB_2 are input to the wirings 513, 513_1, and 513_2, respectively. The signal GCKB corresponds to the signal CK or the signal CKB, and can function as an inverted clock signal. The signal GCKB_1 corresponds to the signal CK_1 or the signal CKB_1, and can function as an inverted clock signal. The signal GCKB_2 corresponds to the signal CK_2 or the signal CKB_2, and can function as an inverted clock signal. As an example, the voltage V1 is applied to the wiring 514. As an example, a signal GSP is input to the wiring 515. The signal GSP corresponds to the signal SP, and can function as a start signal or a vertical synchronization signal. As an example, a signal GRE is input to the wiring 516. The signal GRE corresponds to the signal RE, and can function as a reset signal. Note that this embodiment is not limited thereto, and various other signals, voltages, or currents can be input to these wirings.

The wirings 511_1 to 511_N can function as a signal line, a gate line, a scan line, or an output signal line. The wirings 512, 512_1, and 512_2 can function as a signal line or a clock signal line. The wirings 513, 513_1, and 513_2 can function as a signal line or a clock signal line. The wiring 514 can function as a power supply line or a ground line. The wiring 515 can function as a signal line. The wiring 516 can function as a signal line. Note that this embodiment is not limited thereto, and these wirings can function as various other wirings.

Signals, voltages, or the like are input from a circuit 520 to the wirings 512, 512_1, 512_2, 513, 513_1, 513_2, 514, 515, and 516. The circuit 520 has a function of controlling the shift register by supplying a signal, a voltage, or the like to the shift register, and can function as a control circuit, a controller, or the like.

As an example, the circuit 520 includes a circuit 521 and a circuit 522. The circuit 521 has a function of generating a power supply voltage such as a positive power supply voltage, a negative power supply voltage, a ground voltage, or a reference voltage and can function as a power supply circuit or a regulator. The circuit 522 has a function of generating a variety of signals such as a clock signal, an inverted clock signal, a start signal, a reset signal, and/or a video signal and can unction as a timing generator. Note that this embodiment is not limited thereto, and the circuit 520 can include a variety of circuits or elements in addition to the circuits 521 and 522. For example, the circuit 520 can include an oscillator, a level shift circuit, an inverter circuit, a buffer circuit, a DA conversion circuit, an AD conversion circuit, an operational amplifier, a shift register, a look-up table, a coil, a transistor, a capacitor, a resistor, and/or a divider.

Figure 26:
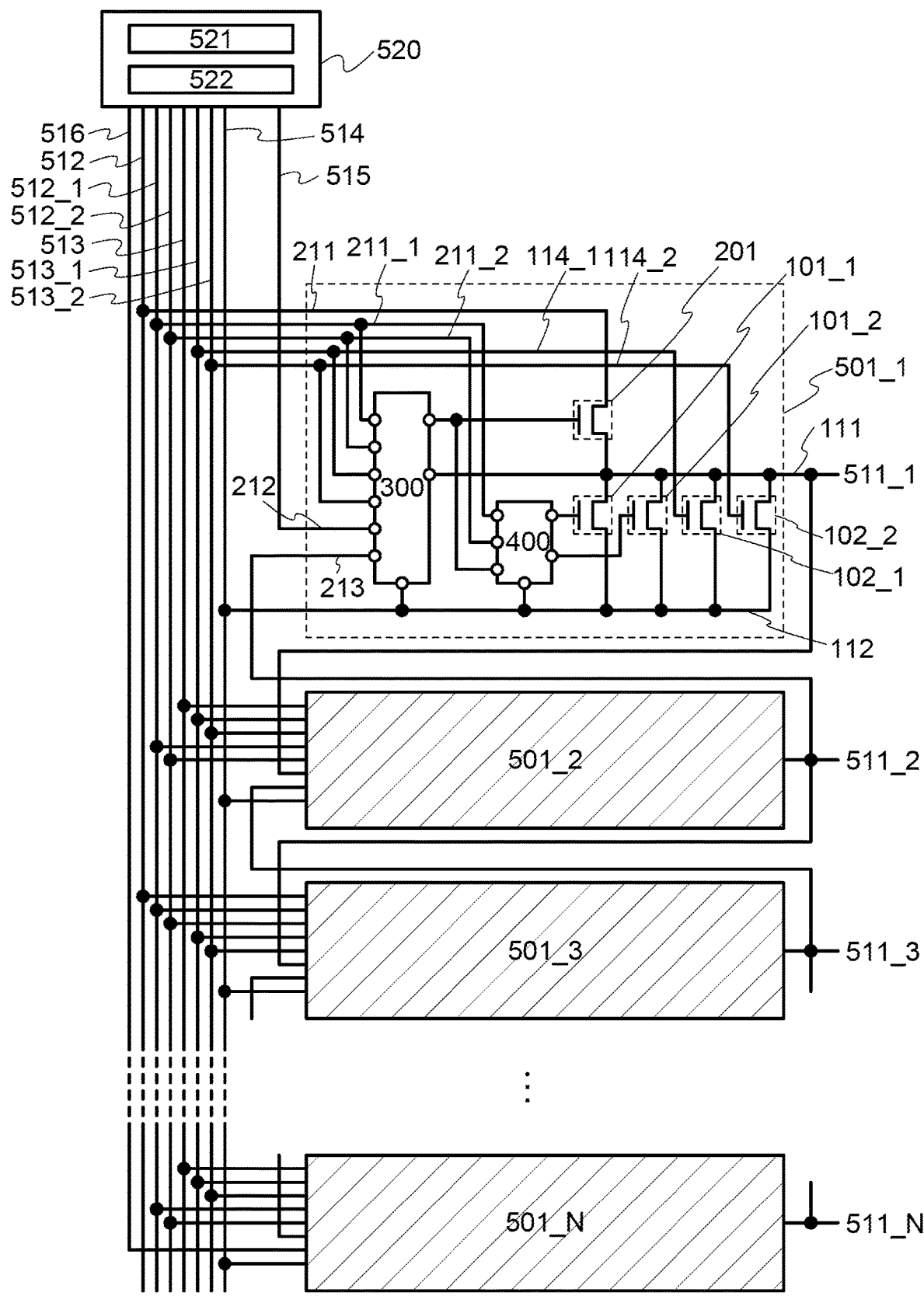
FIG. 26 is a circuit diagram illustrating a shift register.
Figure 27:
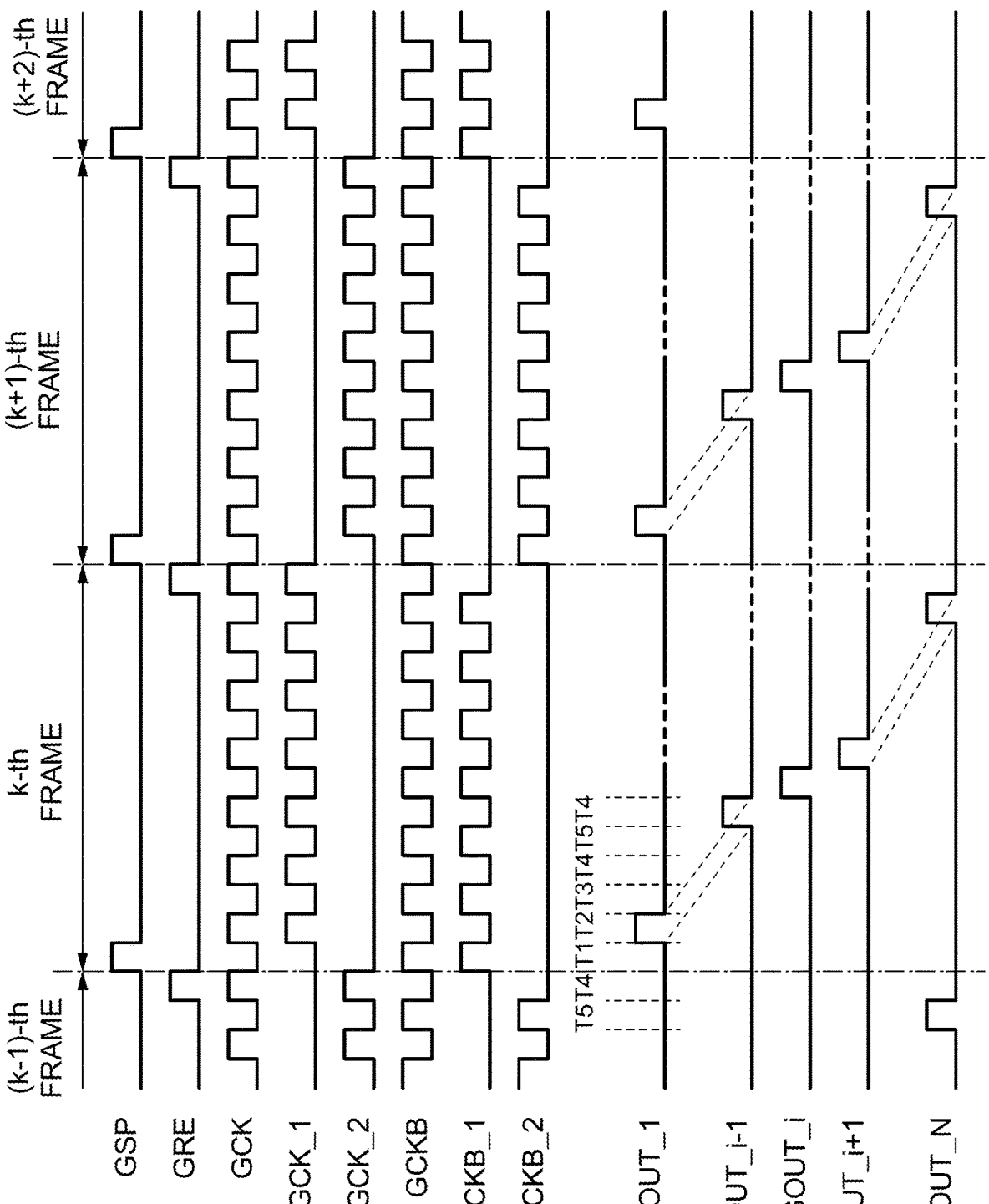
FIG. 27 is a timing chart illustrating operation of a shift register.

Next, operation of the shift register in FIG. 26 is described with reference to a timing chart in FIG. 27. FIG. 27 is an example of a timing chart for illustrating operation of the shift register. FIG. 27 illustrates an example of the signals GSP, GRE, GCK, GCK_1, GCK_2, GCKB, GCKB_1, GCKB_2, GOUT_1, GOUT_i−1, GOUT_i, GOUT_i+1, and GOUT_N. Note that the description of the same operation as that of any of the semiconductor devices in Embodiments 1 to 4 is omitted.

Operation of the flip flop 501_$i$ is described. First, the signal GOUT_i−1 is set at the H level. Accordingly, the flip flop 501_$i$ starts operation in the period T1, and the signal GOUT_i is set at the L level. After that, the signal GCK and the signal GCKB are inverted. Accordingly, the flip flop 501_$i$ starts operation in the period T2, and the signal GOUT_i is set at the H level. The signal GOUT_i is input to the flip flop 501_$i$−1 as a reset signal and input to the flop 501_$i$+1 as a start signal. Thus, the flip flop 501_$i$−1 starts operation in the period T3, and the flip flop 501_$i$+1 starts the operation in the period T1. After that, the signal GCK and the signal GCKB are inverted again. Then, the flip flop 501_$i$+1 starts the operation in the period T2, and the signal GOUT_i+1 is set at the H level. The signal GOUT_i+1 is input to the flip flop 501_$i$ as a reset signal. Thus, the flip flop 501_$i$ starts the operation in the period T3, and the signal GOUT_i is set at the L level. After that, until the signal GOUT_i−1 is set at the H level again, the flip flop 501_$i$ repeat operation in the period T4 and operation in the period T5 every time the signal GCK and the signal GCKB are inverted.

In the flip flop 501_1, instead of an output signal of a flip flop of the previous stage, the signal GSP is input from the circuit 520 through the wiring 515. Accordingly, when the signal GSP is set at the H level, the flip flop 501_1 starts the operation in the period T1.

In the flip flop 501_N, instead of an output signal of a flip flop of the next stage, the signal GRE is input from the circuit 520 through the wiring 516. Accordingly, when the signal GRE is set at the H level, the flip flop 501_N starts the operation in the period T3.

The above is the description of the operation of the shift register in this embodiment. By using any of the semiconductor devices in Embodiments 1 to 4, the shift register in this embodiment can obtain advantages similar to those of the semiconductor device.

Note that the relation between the signal GCK and the signal GCKB can be imbalanced. For example, as illustrated in a timing chart of FIG. 28A, a period during which the signals GCK and GCKB are at the H level can be shorter than a period during which these signals are at the L level. Accordingly, even when delay, distortion, or the like of the signals GOUT_1 to GOUT_N occurs, a period during which these signals are simultaneously set at the H level can be prevented. Thus, when the shift register in this embodiment is used in a display device, a plurality of rows can be prevented from being selected at one time. Note that this embodiment is not limited thereto, and it is possible to make a period during which the signal GCK and/or the signal GCKB are/is at the H level longer than a period during which the signal GCK and/or the signal GCKB are/is at the L level.

Note that a multi-phase clock signal can be input to the shift register. For example, as illustrated in a timing chart of FIG. 28B, an M-phase clock signal (M is a natural number) can be used. In that case, as for the signals GOUT_1 to GOUT_N, a period during which the signal is set at the H level at a given stage can overlap with a period during which the signal is set at the H level at the previous and next stages. Accordingly, when this embodiment is used for a display device, a plurality of rows are selected at the same time. Thus, a video signal to a pixel in another row can be used as a precharge voltage.

Figure 28A:
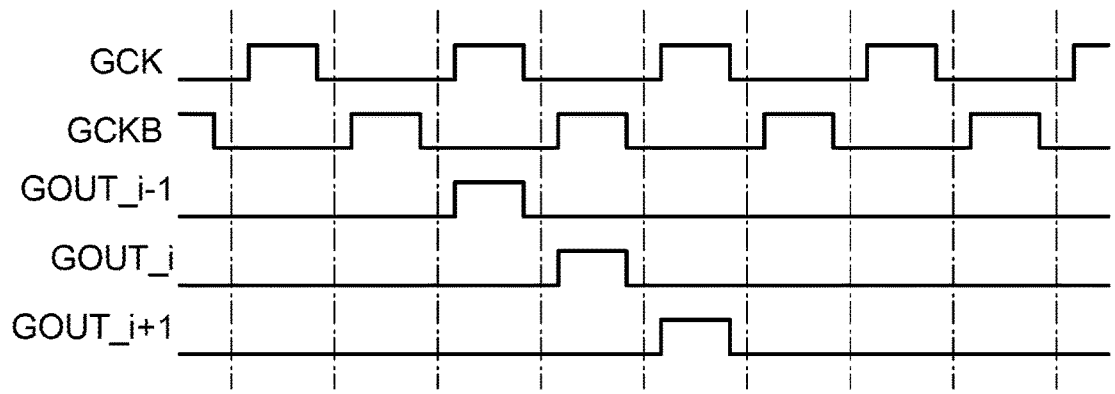
FIGS. 28A and 28B are timing charts each illustrating operation of a shift register.
Figure 28B:
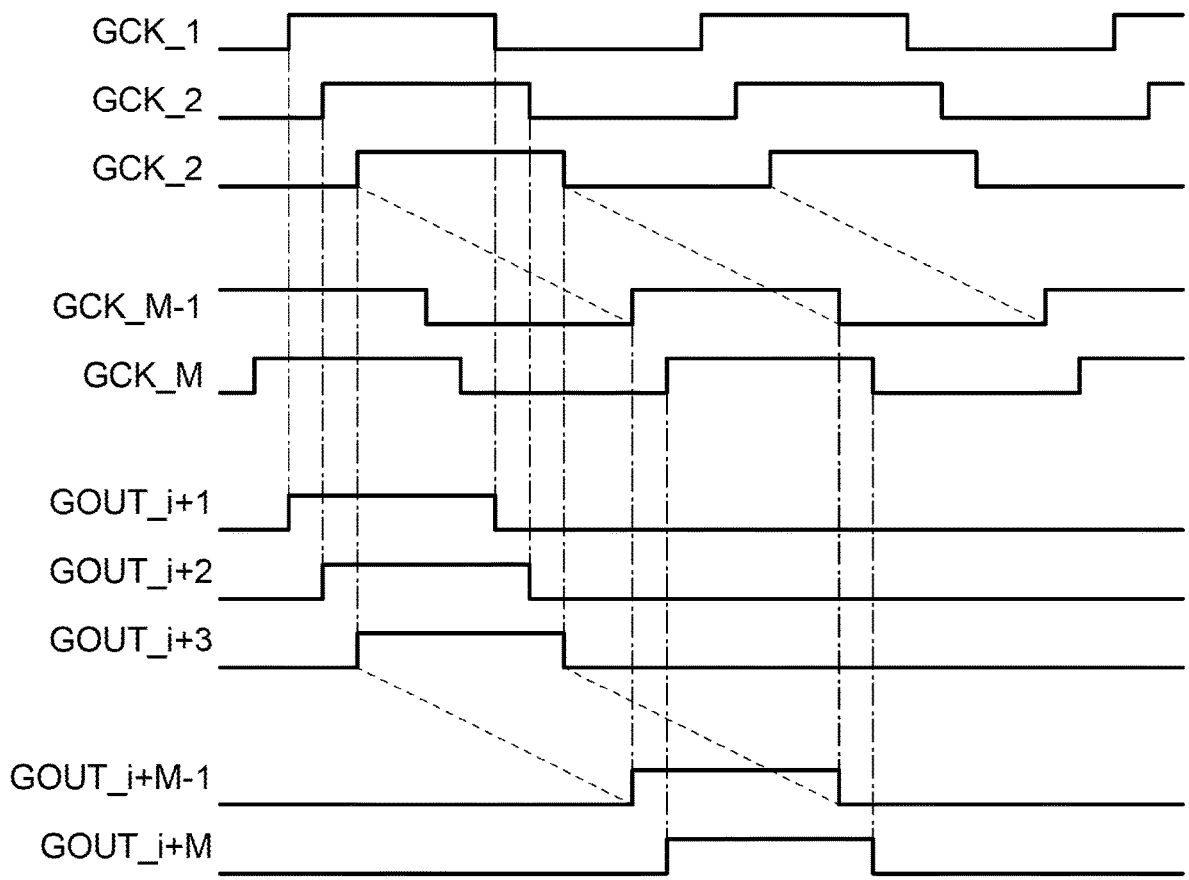

Note that in FIG. 28B, it is preferable that M≤8. It is more preferable that M≤6. It is further preferable that M≤4. This is because when the shift register is used in a scan line driver circuit in a display device, a plurality of kinds of video signals are written into a pixel if M is too large. This is also because the display quality is sometimes degraded since a period during which a wrong video signal is input to the pixel becomes longer.

Note that as in FIG. 28B, a multi-phase clock signal can be used in the timing chart of FIG. 28A.

Note that another wiring (e.g., the wiring 512, the wiring 512_1, the wiring 512_2, the wiring 513, the wiring 513_1, the wiring 513_2, the wiring 514, or the wiring 515) can also be used as the wiring 516 so that the wiring 516 can be eliminated. In that case, the wiring 516 is eliminated and in the flip flop 501_N, the wiring 512, the wiring 512_1, the wiring 512_2, the wiring 513, the wiring 513_1, the wiring 513_2, the wiring 514, or the wiring 515 can also serve as the wiring 516. As another example, the wiring 516 can be eliminated. In that case, it is possible to eliminate the transistors 302 and 303 in the flip flop 501_N.

Further, a wiring can be additionally provided. For example, when a flip flop has a structure where the voltage V2 is necessary as in FIG. 23A, an additional wiring can be provided. Moreover, the voltage V2 can be applied to the wiring. Note that this embodiment is not limited thereto, and it is possible to additionally provide a variety of wirings or omit the wiring depending on the structure of the flip flop.

Figure 29:
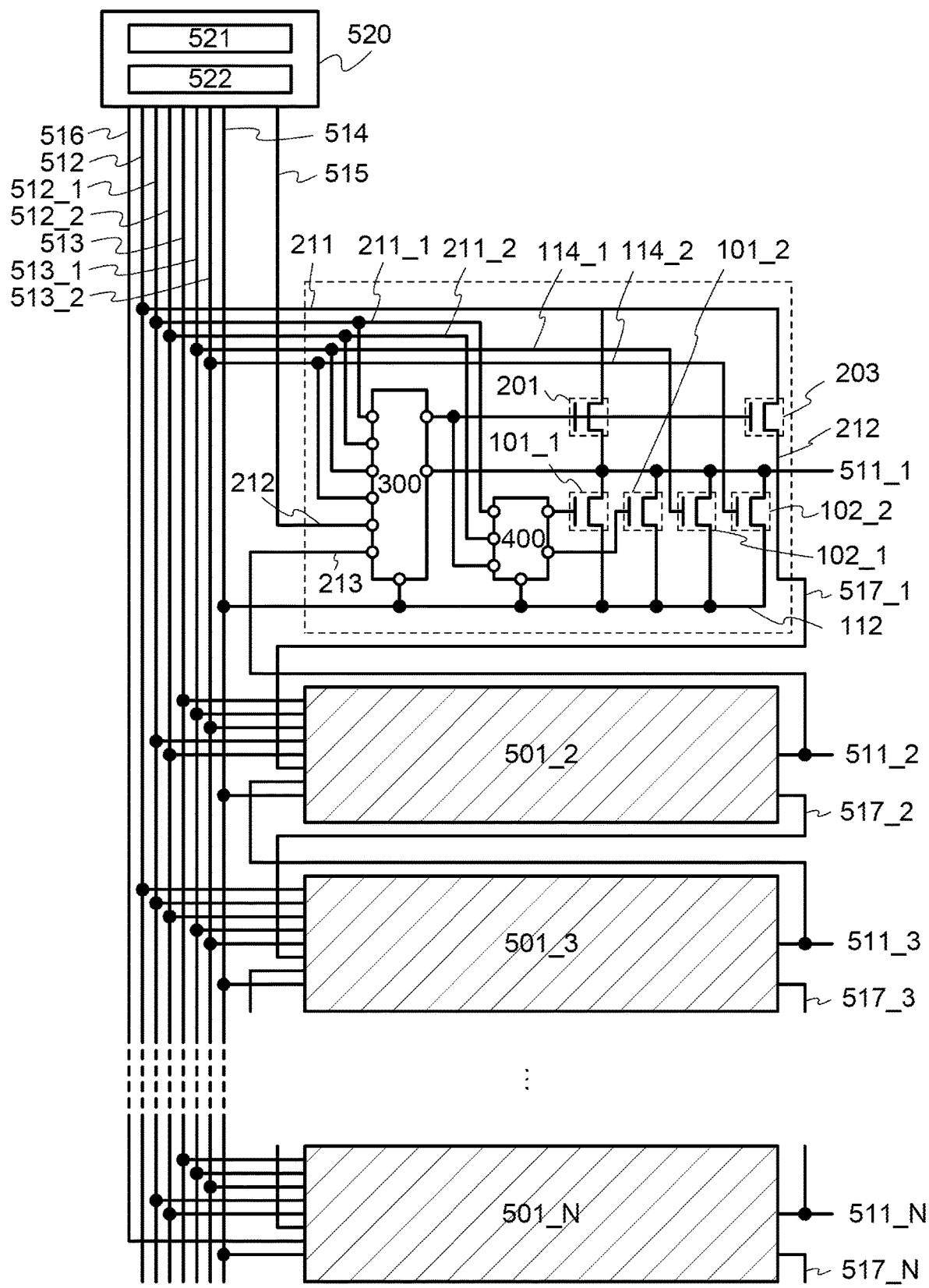
FIG. 29 is a schematic diagram illustrating operation of a shift register.

Note that as illustrated in FIG. 29, it is possible to obtain a plurality of output signals. As an example of FIG. 29, the semiconductor device in FIG. 17B is used for each of the flip flops 501_1 to 501_N. In the flip flop 501_i, the wiring 111, the wiring 211, the wiring 211_1, the wiring 211_2, the wiring 114_1, the wiring 114_2, the wiring 112, the wiring 212, the wiring 213, and the wiring 212 are connected to the wiring 511_i, the wiring 512, the wiring 512_1, the wiring 512_2, the wiring 513_1, the wiring 513_2, the wiring 514, a wiring 517_i−1, the wiring 511_i+1, and a wiring 517_i, respectively. Accordingly, even when a load such as a pixel or a gate line is connected to the wirings 511_1 to 511_N, a transfer signal for driving a flip flop of the next stage is not distorted or delayed. Thus, the adverse effect of delay on the shift register can be reduced. Note that this embodiment is not limited thereto, and the wiring 212 can be connected to the wiring 511_i−1. Alternatively, the wiring 213 can be connected to a wiring 517_i+1.

Embodiment 6

In this embodiment, an example of a display device will be described.

First, an example of a system block of a liquid crystal display device is described with reference to FIG. 30A. The liquid crystal display device includes a circuit 5361, a circuit 5362, a circuit 5363_1, a circuit 5363_2, a pixel portion 5364, a circuit 5365, and a lighting device 5366. A plurality of wirings 5371 which are extended from the circuit 5362 and a plurality of wirings 5372 which are extended from the circuits 5363_1 and 5363_2 are provided in the pixel portion 5364. Moreover, pixels 5367 which include display elements such as liquid crystal elements are provided in matrix in respective regions where the plurality of wirings 5371 and the plurality of wirings 5372 intersect with each other.

The circuit 5361 has a function of supplying a signal, voltage, current, or the like to the circuit 5362, the circuit 5363_1, the circuit 5363_2, and the circuit 5365 in response to a video signal 5360 and can function as a controller, a control circuit, a timing generator, a power supply circuit, a regulator, or the like. In this embodiment, for example, the circuit 5361 supplies a signal line driver circuit start signal (SSP), a signal line driver circuit clock signal (SCK), a signal line driver circuit inverted clock signal (SCKB), video signal data (DATA), or a latch signal (LAT) to the circuit 5362. Alternatively, as an example, the circuit 5361 supplies a scan line driver circuit start signal (GSP), a scan line driver circuit clock signal (GCK), or a scan line driver circuit inverted clock signal (GCKB) to the circuit 5363_1 and the circuit 5363_2. Further alternatively, the circuit 5361 supplies a backlight control signal (BLC) to the circuit 5365. Note that this embodiment is not limited thereto, and the circuit 5361 can supply various other signals, voltages, currents, or the like to the circuit 5362, the circuit 5363_1, the circuit 5363_2, and the circuit 5365.

The circuit 5362 has a function of outputting video signals to the plurality of wirings 5371 in response to a signal supplied from the circuit 5361 (e.g., SSP, SCK, SCKB, DATA, or LAT), and can function as a signal line driver circuit. The circuit 5363_1 and the circuit 5363_2 each have a function of outputting scan signals to the plurality of wirings 5372 in response to a signal supplied from the circuit 5361 (e.g., GSP, GCK, or GCKB), and can function as a scan line driver circuit. The circuit 5365 has a function of controlling the luminance (or the average luminance) of the lighting device 5366 by controlling the amount of electric power supplied to the lighting device 5366, time to supply the electric power to the lighting device 5366, or the like in accordance with the signal (BLC) supplied from the circuit 5361. The circuit 5365 can function as a power supply circuit.

Note that when video signals are input to the plurality of wirings 5371, the plurality of wirings 5371 can function as signal lines, video signal lines, source lines, or the like. When scan signals are input to the plurality of wirings 5372, the plurality of wirings 5372 can function as signal lines, scan lines, gate lines, or the like. Note that this embodiment is not limited thereto.

Note that when the same signal is input to the circuit 5363_1 and the circuit 5363_2 from the circuit 5361, scan signals output from the circuit 5363_1 to the plurality of wirings 5372 and scan signals output from the circuit 5363_2 to the plurality of wirings 5372 have approximately the same timings in many cases. Accordingly, load caused by driving of the circuits 5363_1 and 5363_2 can be reduced. Thus, the display device can be made larger. Alternatively, the display device can have higher definition. Alternatively, since the channel width of transistors included in the circuits 5363_1 and 5363_2 can be reduced, a display device with a narrower frame can be obtained. Note that this embodiment is not limited thereto, and the circuit 5361 can supply different signals to the circuit 5363_1 and the circuit 5363_2.

Note that one of the circuit 5363_1 and the circuit 5363_2 can be eliminated.

Note that a wiring such as a capacitor line, a power supply line, or a scan line can be additionally provided in the pixel portion 5364. Then, the circuit 5361 can output a signal, a voltage, or the like to such a wiring. Further, a circuit similar to the circuit 5363_1 or the circuit 5363_2 can be additionally provided. The additionally provided circuit can output a signal such as a scan signal to the additionally provided wiring.

Note that the pixel 5367 can include a light-emitting element such as an EL element as a display element. In that case, as illustrated in FIG. 30B, since the display element can emit light, the circuit 5365 and the lighting device 5366 can be eliminated. Moreover, in order to supply electric power to the display element, a plurality of wirings 5373 which can function as power supply lines can be provided in the pixel portion 5364. The circuit 5361 can apply a power supply voltage called voltage (ANO) to the wirings 5373. The wirings 5373 can be separately connected to the pixels in accordance with color elements or can be connected to all the pixels.

Note that FIG. 30B illustrates an example in which the circuit 5361 supplies different signals to the circuit 5363_1 and the circuit 5363_2. The circuit 5361 supplies a signal such as a scan line driver circuit start signal (GSP1), a scan line driver circuit clock signal (GCK1), or a scan line driver circuit inverted clock signal (GCKB1) to the circuit 5363_1. In addition, the circuit 5361 supplies a signal such as a scan line driver circuit start signal (GSP2), a scan line driver circuit clock signal (GCK2), or a scan line driver circuit inverted clock signal (GCKB2) to the circuit 5363_2. In that case, the circuit 5363_1 can scan only wirings in odd-numbered rows of the plurality of wirings 5372 and the circuit 5363_2 can scan only wirings in even-numbered rows of the plurality of wirings 5372. Accordingly, the driving frequency of the circuit 5363_1 and the circuit 5363_2 can be lowered, whereby power consumption can be reduced. Alternatively, the area in which a flip-flop of one stage can be laid out can be made larger. Thus, a display device can have higher definition. Alternatively, the size of a display device can be increased. Note that this embodiment is not limited thereto, and the circuit 5361 can output the same signal to the circuit 5363_1 and the circuit 5363_2 as in FIG. 30A.

Figure 30A:
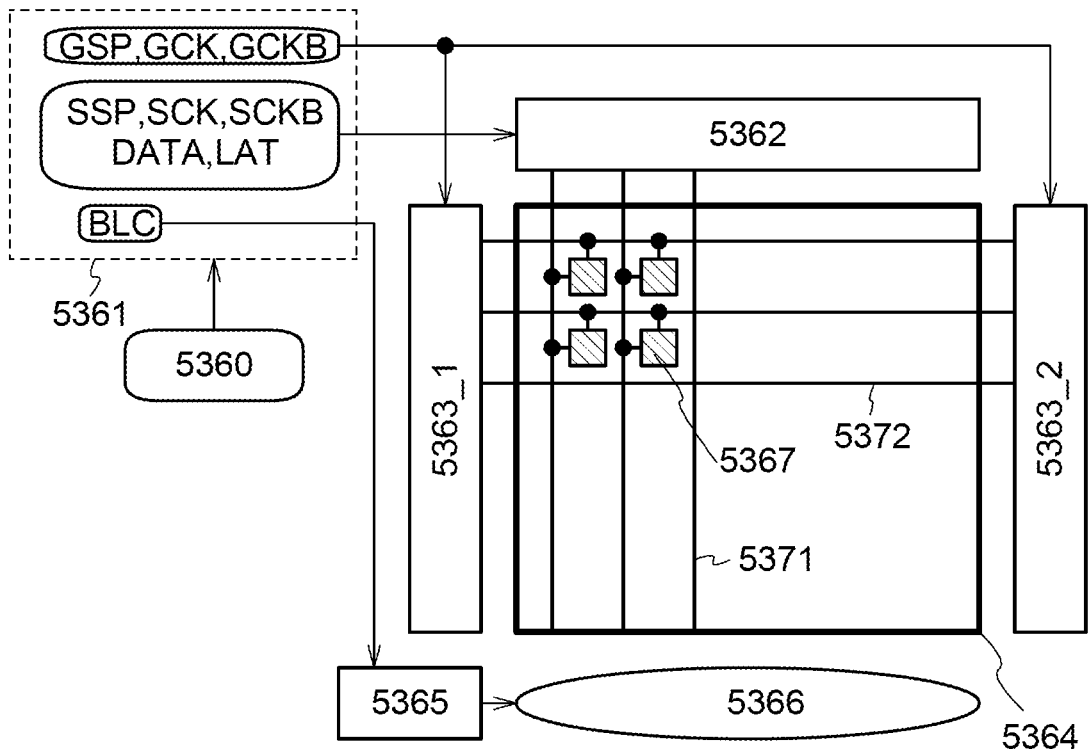
FIGS. 30A and 30B are block diagrams each illustrating a display device.
Figure 30B:
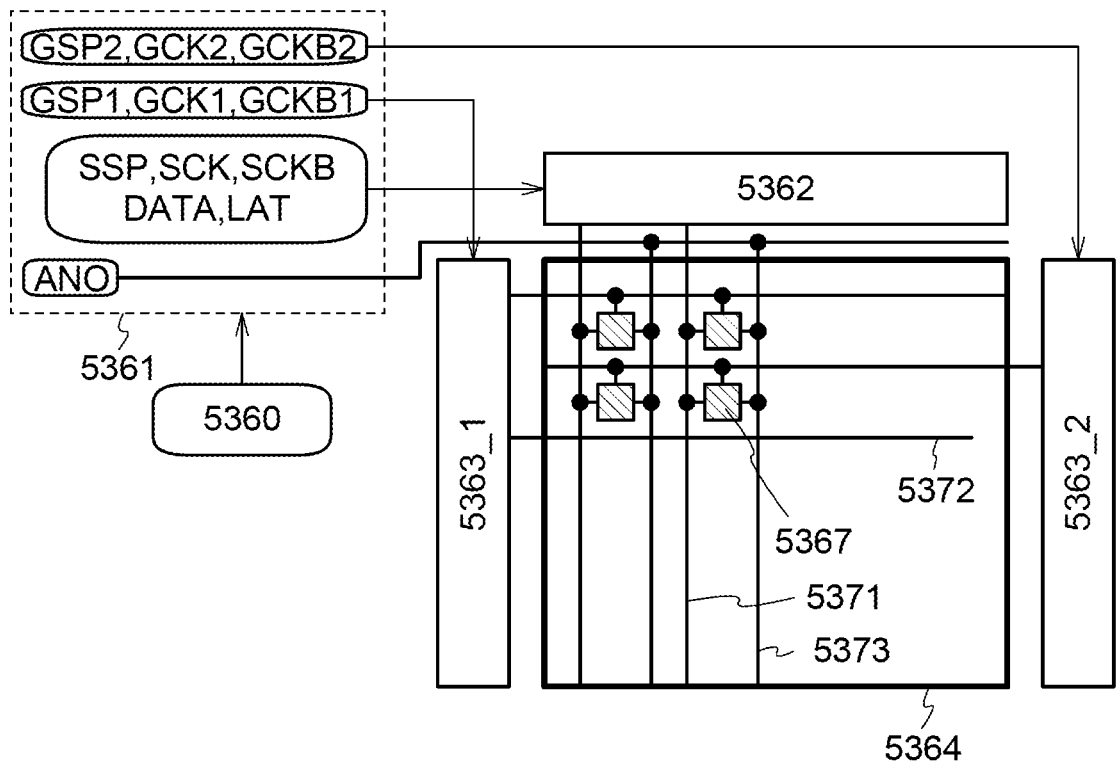

Note that as in FIG. 30B, the circuit 5361 can supply different signals to the circuit 5363_1 and the circuit 5363_2 in FIG. 30A.

The above is the description of one example of the system block of the display device.

Next, example of structures of the display device will be described with reference to FIGS. 31A to 31E.

Figure 31A:
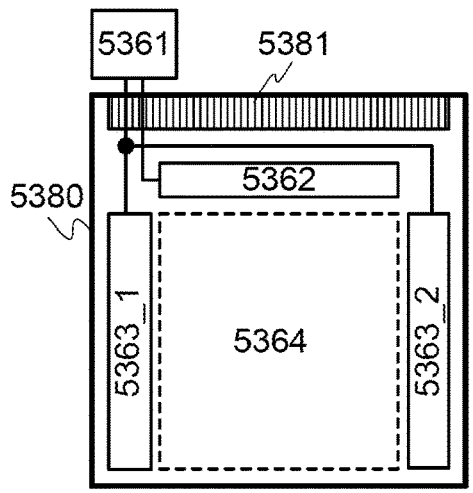
FIGS. 31A to 31E are block diagrams each illustrating a display device.

In FIG. 31A, circuits which have a function of outputting signals to the pixel portion 5364 (e.g., the circuit 5362, the circuit 5363_1, and the circuit 5363_2) are formed over a substrate 5380 where the pixel portion 5364 is also formed. In addition, the circuit 5361 is formed over a substrate which is different from the substrate where the pixel portion 5364 is formed. In this manner, since the number of external components is reduced, reduction in cost can be achieved. Alternatively, since the number of signals or voltages input to the substrate 5380 is reduced, the number of connections between the substrate 5380 and the external component can be reduced. Accordingly, improvement in reliability or increase in yield can be achieved.

Note that in the case where the circuit is formed over a substrate which is different from the substrate where the pixel portion 5364 is formed, the substrate can be mounted on a flexible printed circuit (FPC) by tape automated bonding (TAB). Alternatively, the substrate can be mounted on the same substrate 5380 as the pixel portion 5364 by chip on glass (COG).

In the case where the circuit is formed over a different substrate from the pixel portion 5364, a transistor formed using a single crystal semiconductor can be formed on the substrate. Therefore, the circuit formed over the substrate can have advantages such as improvement in driving frequency, improvement in driving voltage, or reduction of variation in output signals.

Note that a signal, voltage, current, or the like is input from an external circuit through an input terminal 5381 in many cases.

Figure 31B:
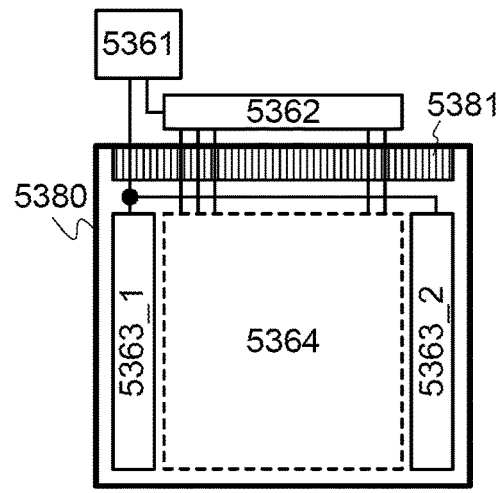

In FIG. 31B, circuits with low driving frequency (e.g., the circuit 5363_1 and the circuit 5363_2) are formed over the substrate 5380 where the pixel portion 5364 is formed. In addition, the circuit 5361 and the circuit 5362 are formed over a substrate which is different from the substrate where the pixel portion 5364 is formed. In this manner, the circuit formed over the substrate 5380 can be constituted by transistors with low mobility. Thus, a non-single-crystal semiconductor, an amorphous semiconductor, a microcrystalline semiconductor, an organic semiconductor, an oxide semiconductor, or the like can be used for a semiconductor layer of the transistor. Accordingly, increase in the size of the display device, reduction in the number of steps, reduction in cost, improvement in yield, or the like can be achieved.

Figure 31C:
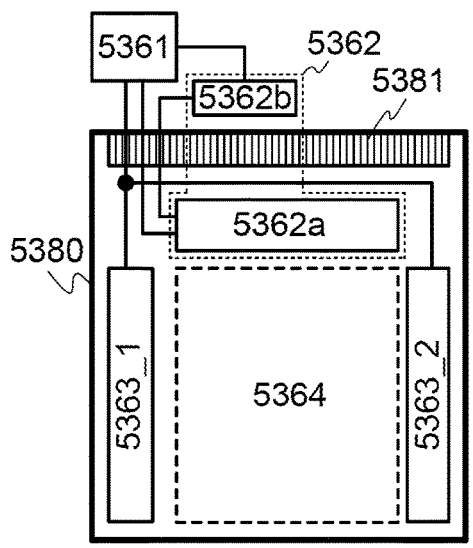

Note that as illustrated in FIG. 31C, part of the circuit 5362 (a circuit 5362a) can be formed over the substrate 5380 where the pixel portion 5364 is formed, and the other part of the circuit 5362 (a circuit 5362b) can be formed over a substrate which is different from the substrate where the pixel portion 5364 is formed. The circuit 5362a often includes a circuit which can be formed using a transistor with low mobility (e.g., a shift register, a selector, or a switch). The circuit 5362b often includes a circuit which is preferably formed using a transistor with high mobility and few variations in characteristics (e.g., a shift register, a latch circuit, a buffer circuit, a DA converter circuit, or an AD converter circuit). Accordingly, as in FIG. 31B, a non-single-crystal semiconductor, an amorphous semiconductor, a microcrystalline semiconductor, an organic semiconductor, an oxide semiconductor, or the like can be used for a semiconductor layer of the transistor. Further, the number of external components can be reduced.

Figure 31D:
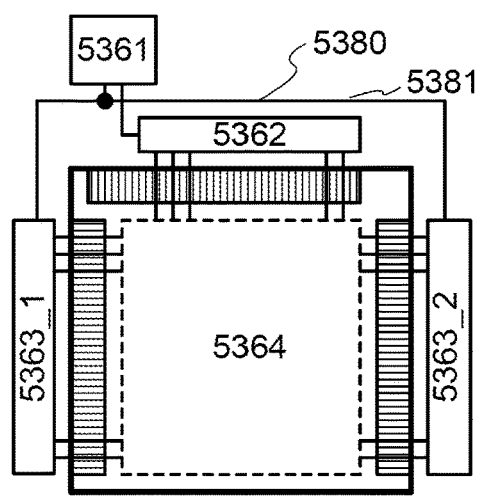

In FIG. 31D, circuits which have a function of outputting signals to the pixel portion 5364 (e.g., the circuit 5362, the circuit 5363_1, and the circuit 5363_2) and a circuit which has a function of controlling these circuits (e.g., the circuit 5361) are formed over a substrate which is different from the substrate where the pixel portion 5364 is formed. In this manner, since the pixel portion and the peripheral circuits can be formed over different substrates, improvement in yield can be achieved.

Note that in FIGS. 31A to 31C, as in FIG. 31D, the circuit 5363_1 and the circuit 5363_2 can be formed over a substrate which is different from the substrate where the pixel portion 5364 is formed.

Figure 31E:
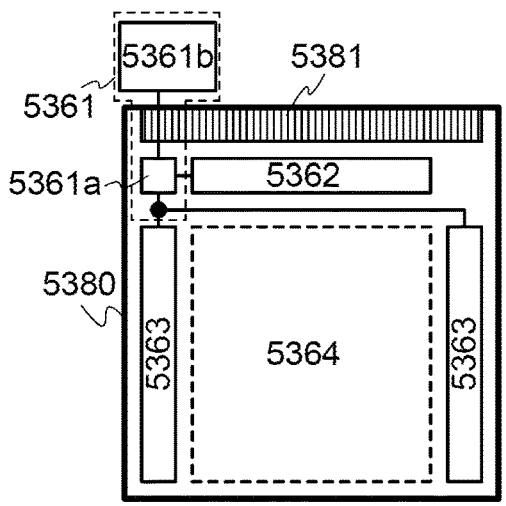

In FIG. 31E, part of the circuit 5361 (a circuit 5361a) is formed over the substrate 5380 over which the pixel portion 5364 is formed, and the other part of the circuit 5361 (a circuit 5361b) is formed over a substrate which is different from the substrate where the pixel portion 5364 is formed. The circuit 5361a often includes a circuit which can be formed using a transistor with low mobility (e.g., a switch, a selector, or a level shift circuit). Moreover, the circuit 5361b often includes a circuit which is preferably formed using a transistor with high mobility and few variations (e.g., a shift register, a timing generator, an oscillator, a regulator, or an analog buffer).

Note that also in FIGS. 31A to 31D, the circuit 5361a can be formed over the same substrate as the pixel portion 5364, and the circuit 5361b can be formed over a substrate which is different from the substrate where the pixel portion 5364 is formed.

Here, for the circuits 5363_1 and 5363_2, any of the semiconductor devices or shift registers in Embodiments 1 to 5 can be used. In that case, the circuits 5363_1 and 5363_2 and the pixel portion are formed over the same substrate, whereby all the transistors formed over the substrate can be n-channel transistors or p-channel transistors. Accordingly, reduction in the number of steps, improvement in yield, improvement in reliability, or reduction in cost can be realized. In particular, when all the transistors are n-channel transistors, a non-single-crystal semiconductor, an amorphous semiconductor, a microcrystalline semiconductor, an organic semiconductor, an oxide semiconductor, or the like can be used for a semiconductor layer of the transistor. Thus, increase in size of the display device, reduction in cost, increase in yield, or the like can be realized.

In the semiconductor device or the shift register in Embodiments 1 to 5, the channel width of the transistor can be reduced. Accordingly, the layout area can be reduced, so that the frame can be reduced. Alternatively, since the layout area can be reduced, the resolution can be increased.

Alternatively, in the semiconductor device or the shift register in Embodiments 1 to 5, parasitic capacitance can be reduced. Accordingly, power consumption can be reduced. The current supply capability of an external circuit can be decreased, or the size of an external circuit or the size of a display device including the external circuit can be reduced.

Note that in a transistor in which a non-single-crystal semiconductor, an amorphous semiconductor, a microcrystalline semiconductor, an organic semiconductor, an oxide semiconductor, or the like is used for a semiconductor layer, degradation of characteristics, such as increase in threshold voltage or reduction in mobility, often occurs. However, in the semiconductor device or the shift register in Embodiments 1 to 5, degradation of characteristics of a transistor can be suppressed, so that the lifetime of a display device can be increased.

Note that for part of the circuits 5362, any of the semiconductor devices or shift registers in Embodiments 1 to 5 can be used. For example, the circuit 5362a can include the semiconductor device or the shift register in Embodiments 1 to 4.

Embodiment 7

In this embodiment, an example of a signal line driver circuit will be described. Note that the signal line driver circuit can be referred to as a semiconductor device or a signal generation circuit.

An example of the signal line driver circuit is described with reference to FIG. 32A. The signal line driver circuit includes a plurality of circuits 602_1 to 602_N (N is a natural number), a circuit 600, and a circuit 601. The circuits 602_1 to 602_N each include a plurality of transistors 603_1 to 603_k (k is a natural number). The transistors 603_1 to 603_k are n-channel transistors. However, this embodiment is not limited to this. For example, the transistors 603_1 to 603_k can be p-channel transistors or CMOS switches.

A connection relation of the signal line driver circuit will be described by using the circuit 602_1 as an example. First terminals of the transistors 603_1 to 603_k are connected to a wiring 605_1. Second terminals of the transistors 603_1 to 603_k are connected to wirings S1 to Sk, respectively. Gates of the transistors 603_1 to 603_k are connected to wirings 604_1 to 604_k, respectively. For example, the first terminal of the transistor 603_1 is connected to the wiring 605_1, the second terminal of the transistor 603_1 is connected to the wiring S1, and the gate of the transistor 603_1 is connected to the wiring 604_1.

The circuit 600 has a function of supplying a signal to the circuits 602_1 to 602_N through the wirings 604_1 to 604_A and can function as a shift register, a decoder, or the like. The signal is often a digital signal and can function as a selection signal. Moreover, the wirings 604_1 to 604k can function as signal lines.

The circuit 601 has a function of outputting a signal to the circuits 602_1 to 602_N and can function as a video signal generation circuit or the like. For example, the circuit 601 supplies the signal to the circuit 602_1 through the wiring 605_1. At the same time, the circuit 601 supplies the signal to the circuit 602_2 through the wiring 605_2. The signal is often an analog signal and can function as a video signal. Moreover, the wirings 605_1 to 605_N can function as signal lines.

The circuits 602_1 to 602_N each have a function of selecting a wiring to which an output signal from the circuit 601 is output, and can function as a selector circuit. For example, the circuit 602_1 has a function of selecting one of the wirings S1 to Sk to output a signal output from the circuit 601 to the wiring 605_1.

The transistors 603_1 to 603_k each have a function of controlling a conduction state between the wiring 605_1 and the wirings S1 to Sk in accordance with the output signal from the circuit 600, and function as switches.

Figure 32A:
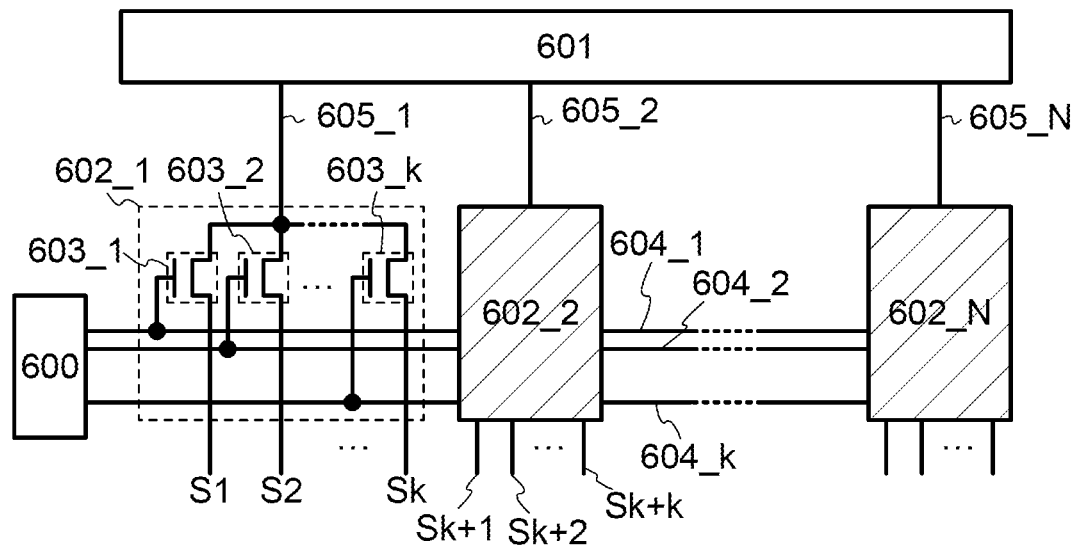
FIG. 32A is a circuit diagram of a semiconductor device.
Figure 32B:
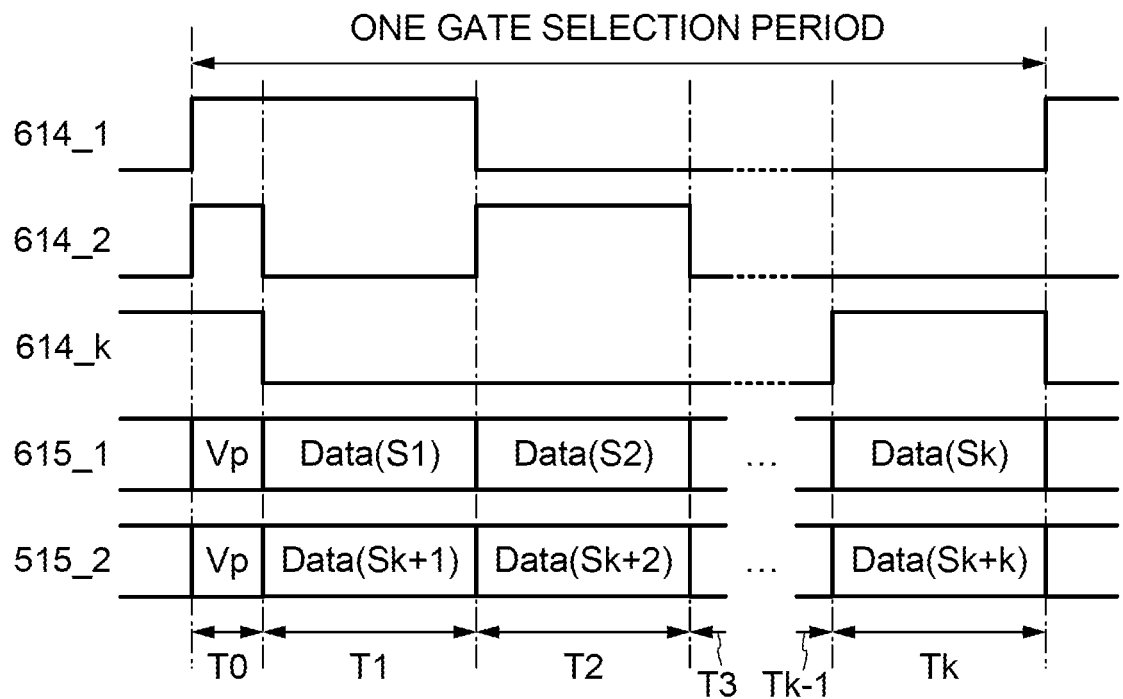
FIG. 32B is a timing chart illustrating operation of the semiconductor device.

Next, operation of the signal line driver circuit in FIG. 32A is described with reference to a timing chart in FIG. 32B. FIG. 32B illustrates examples of a signal 614_1 input to the wiring 604_1, a signal 614_2 input to the wiring 604_2, a signal 614_k input to the wiring 604_k, a signal 615_1 input to the wiring 605_1, and a signal 615_2 input to the wiring 605_2.

Note that one operation period of the signal line driver circuit corresponds to one gate selection period in a display device. One gate selection period is a period during which a pixel which belongs to one row is selected and a video signal can be written to the pixel.

Note that one gate selection period is divided into a period T0 and a period T1 to a period Tk. The period T0 is a period for applying voltages for precharge to pixels which belong to a selected row at the same time, and can serve as a precharge period. Each of the periods T1 to Tk is a period for writing video signals to pixels which belong to the selected row, and can serve as a writing period.

For simplicity, operation of the signal line driver circuit is described by using operation of the circuit 602_1 as an example.

First, in the period T0, the circuit 600 outputs an H-level signal to the wirings 604_1 to 604_k. Accordingly, the transistors 603_1 to 603_k are turned on, whereby the wiring 605_1 and the wirings S1 to Sk are brought into conduction. At that time, the circuit 601 applies a precharge voltage Vp to the wiring 605_1, so that the precharge voltage Vp is output to the wirings S1 to Sk through the transistors 603_1 to 603_k, respectively. Then, the precharge voltage Vp is written to the pixels which belong to a selected row, so that the pixels which belong to the selected row are precharged.

Next, in the period T1, the circuit 600 outputs an H-level signal to the wiring 604_1. Accordingly, the transistor 603_1 is turned on, whereby the wiring 605_1 and the wiring S1 are brought into conduction. Moreover, the wiring 605_1 and the wirings S2 to Sk are brought out of conduction. At that time, if the circuit 601 outputs a signal Data(S1) to the wiring 605_1, the signal Data(S1) is output to the wiring S1 through the transistors 603_1. In this manner, the signal Data(S1) is written to, of the pixels connected to the wiring S1, the pixels which belong to the selected row.

Next, in the period T2, the circuit 600 outputs an H-level signal to the wiring 604_2. Accordingly, the transistor 603_2 is turned on, whereby the wiring 605_2 and the wiring S2 are brought into conduction. Moreover, the wiring 605_1 and the wirings S1 are brought out of conduction, and the wiring 605_1 and the wirings S3 to Sk remain in a non-conduction state. At that time, if the circuit 601 outputs a signal Data(S2) to the wiring 605_1, the signal Data(S2) is output to the wiring S2 through the transistor 603_2. In this manner, the signal Data(S2) is written to, of the pixels connected to the wiring S2, the pixels which belong to the selected row.

After that, the circuit 600 sequentially outputs H-level signals to the wirings 604_1 to 604_k until the end of the period Tk, so that the circuit 600 sequentially outputs the H-level signals to the wirings 604_3 to 604_k from the period T3 to the period Tk, as in the period T1 and the period T2. Thus, since the transistors 603_3 to 603_k are sequentially turned on, the transistors 603_1 to 603_k are sequentially turned on. Accordingly, signals output from the circuit 601 are sequentially output to the wirings S1 to Sk. In this manner, the signals can be sequentially written to the pixels which belong to the selected row.

The above is the description of the example of the signal line driver circuit. Since the signal line driver circuit in this embodiment includes the circuit functioning as a selector, the number of signals or the number of wirings can be reduced. Alternatively, since a voltage for precharging is written to a pixel before a video signal is written to the pixel (during the period T0), a writing time of the video signal can be shortened. Accordingly, increase in the size of a display device and higher resolution of the display device can be achieved. However, this embodiment is not limited to this, and the period T0 can be eliminated so that the pixel is not precharged.

Note that if k is too large a number, a writing time to the pixel is shortened, whereby writing of a video signal to the pixel is not completed in the writing time in some cases. Accordingly, it is preferable that k≤6. It is more preferable that k≤3. It is further preferable that k=2.

In specific, in the case where a color element of a pixel is divided into n (n is a natural number), it is possible to set k=n. For example, in the case where a color element of a pixel is divided into red (R), green (G), and blue (B), it is possible to set k=3. In that case, one gate selection period is divided into a period T0, a period T1, a period T2, and a period T3. A video signal can be written to the pixel of red (R), the pixel of green (G), and the pixel of blue (B) in the period T1, the period T2, and the period T3, respectively. However, this embodiment is not limited thereto, and the order of the period T1, the period T2, and the period T3 can be set as appropriate.

In specific, in the case where a pixel is divided into n sub-pixels (also referred to as subpixels) (n is a natural number), it is possible to set k=n. For example, in the case where the pixel is divided into two sub-pixels, it is possible to set k=2. In that case, one gate selection period is divided into the period T0, the period T1, and the period T2. A video signal can be written to one of the two sub-pixels in the period T1, and a video signal can be written to the other of the two sub-pixels in the period T2.

Note that since the driving frequency of the circuit 600 and the circuits 602_1 to 602_N is low in many cases, the circuit 600 and the circuits 602_1 to 602_N can be formed over the same substrate as a pixel portion. Accordingly, the number of connections between the substrate over which the pixel portion is formed and an external circuit can be reduced; thus, increase in yield, improvement in reliability, or the like can be achieved. Further, as illustrated in FIG. 31C, by also forming a scan line driver circuit over the same substrate as the pixel portion, the number of connections between the substrate over which the pixel portion is formed and the external circuit can be further reduced.

Note that any of the semiconductor devices or shift registers described in Embodiments 1 to 4 can be used as the circuit 600. In that case, all the transistors in the circuit 600 can be n-channel transistors or p-channel transistors. Accordingly, reduction in the number of steps, increase in yield, or reduction in cost can be achieved.

Note that not only the transistors included in the circuit 600 but also all the transistors in the circuits 602_1 to 602_N can be n-channel transistors or p-channel transistors. Accordingly, when the circuit 600 and the circuits 602_1 to 602_N are formed over the same substrate as the pixel portion, reduction in the number of steps, increase in yield, or reduction in cost can be achieved. In specific, by using only n-channel transistors as the transistors in the circuits 600 and 602_1 to 602_N, a non-single-crystal semiconductor, an amorphous semiconductor, a microcrystalline semiconductor, an organic semiconductor, an oxide semiconductor, or the like can be used for semiconductor layers of the transistors. This is because the driving frequency of the circuit 600 and the circuits 602_1 to 602_N is low in many cases.

Embodiment 8

In this embodiment, a structure and operation of a pixel which can be applied to a liquid crystal display device will be described.

Figure 33A:
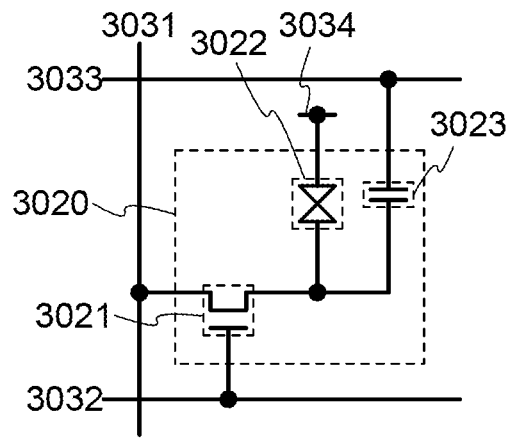
FIG. 33A is a circuit diagram of a pixel.

FIG. 33A illustrates an example of a pixel. A pixel 3020 includes a transistor 3021, a liquid crystal element 3022, and a capacitor 3023. A first terminal of the transistor 3021 is connected to a wiring 3031. A second terminal of the transistor 3021 is connected to one electrode of the liquid crystal element 3022 and one electrode of the capacitor 3023. A gate of the transistor 3021 is connected to a wiring 3032. The other electrode of the liquid crystal element 3022 is connected to an electrode 3034. The other electrode of the capacitor 3023 is connected to a wiring 3033.

A video signal can be input to the wiring 3031, for example. A scan signal, a selection signal, or a gate signal can be input to the wiring 3032, for example. A constant voltage can be applied to the wiring 3033, for example. A constant voltage can be applied to the wiring 3034, for example. Note that this embodiment is not limited to this example. A writing time of a video signal can be shortened by supply of a precharge voltage to the wiring 3031. Alternatively, voltage applied to the liquid crystal element 3022 can be controlled by input of a signal to the wiring 3033. Alternatively, frame inversion driving can be achieved by input of a signal to the electrode 3034.

Note that the wiring 3031 can function as a signal line, a video signal line, or a source line. The wiring 3032 can function as a signal line, a scan line, or a gate line. The wiring 3033 can function as a power supply line or a capacitor line. The electrode 3034 can function as a common electrode or a counter electrode. The electrode 3034 can function as a common electrode or a counter electrode. However, this embodiment is not limited to this example. In the case where voltage is supplied to the wiring 3031 and the wiring 3032, these wirings can function as power supply lines. Alternatively, in the case where a signal is input to the wiring 3033, the wiring 3033 can function as a signal line.

The transistor 3021 has a function of controlling timing when a video signal is written to a pixel by controlling the conduction state of the wiring 3031 and one electrode of the liquid crystal element 3022, and can function as a switch. The capacitor 3023 has a function of keeping voltage applied to the liquid crystal element 3022 as a stable value by storing the potential difference between one electrode of the liquid crystal element 3022 and the wiring 3033, and functions as a storage capacitor. Note that this embodiment is not limited to this example.

Figure 33B:
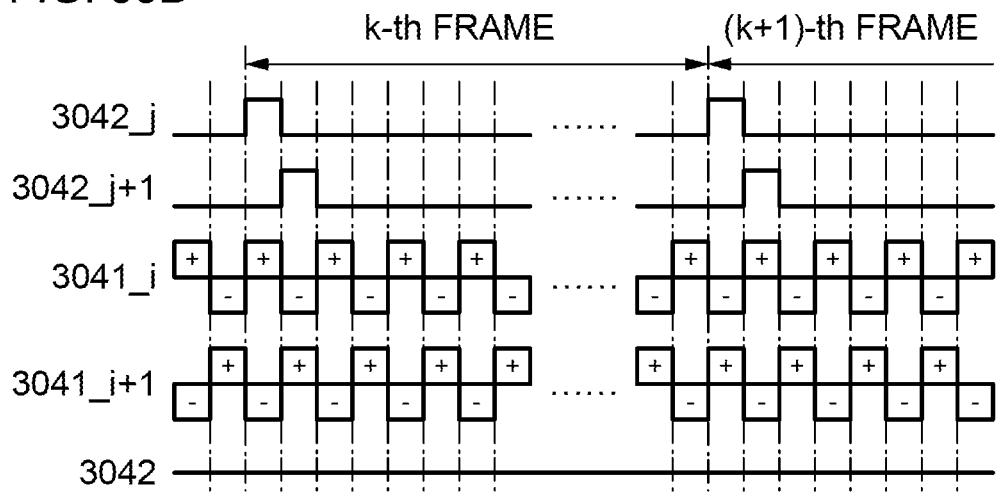
FIGS. 33B and 33C are timing charts each illustrating operation of the pixel.

FIG. 33B shows an example of a timing chart for illustrating operation of the pixel in FIG. 33A. FIG. 33B illustrates a signal 3042_j (j is a natural number), a signal 3042_j+1, a signal 3041_i (i is a natural number), a signal 3041_i+1, and a voltage 3042. In addition, FIG. 33B illustrates a k-th (k is a natural number) frame and a (k+1)-th frame. Note that the signal 3042_j, the signal 3042_j+1, the signal 3041_i, the signal 3041_i+1, and the voltage 3042 are examples of a signal input to the wiring 3032 in a j-th row, a signal input to the wiring 3032 in a (j+1)th row, a signal input to the wiring 3031 in an i-th column, a signal input to the wiring 3031 in an (i+1)th column, and a voltage supplied to the wiring 3032, respectively.

Operation of the pixel 3020 in the j-th row and the i-th column is described. When the signal 3042_j is set at the H level, the transistor 3021 is turned on. Accordingly, since the wiring 3031 in the i-th column and one electrode of the liquid crystal element 3022 are brought into conduction, the signal 3041_j is input to one electrode of the liquid crystal element 3022 through the transistor 3021. Then, the capacitor 3023 keeps the potential difference between one electrode of the liquid crystal element 3022 and the wiring 3033. Thus, after that, a voltage applied to the liquid crystal element 3022 is constant until the signal 3022_j is set at the H level again. Then, the liquid crystal element 3022 expresses gray levels corresponding to the applied voltage.

Note that FIG. 33B illustrates an example of the case where a positive signal and a negative signal are alternately input to the wiring 3031 every one selection period. The positive signal is a signal whose potential is higher than a reference value (e.g., the potential of the electrode 3034). The negative signal is a signal whose potential is lower than a reference value (e.g., the potential of the electrode 3034). However, this embodiment is not limited to this example, and signals with the same polarity can be input to the wiring 3031 in one frame period.

Note that FIG. 33B illustrates an example of the case where the polarity of the signal 3041_i and the polarity of the signal 3041_i+1 are different from each other. However, this embodiment is not limited to this example. The polarity of the signal 3041_i and the polarity of the signal 3041_i+1 can be the same.

Figure 33C:
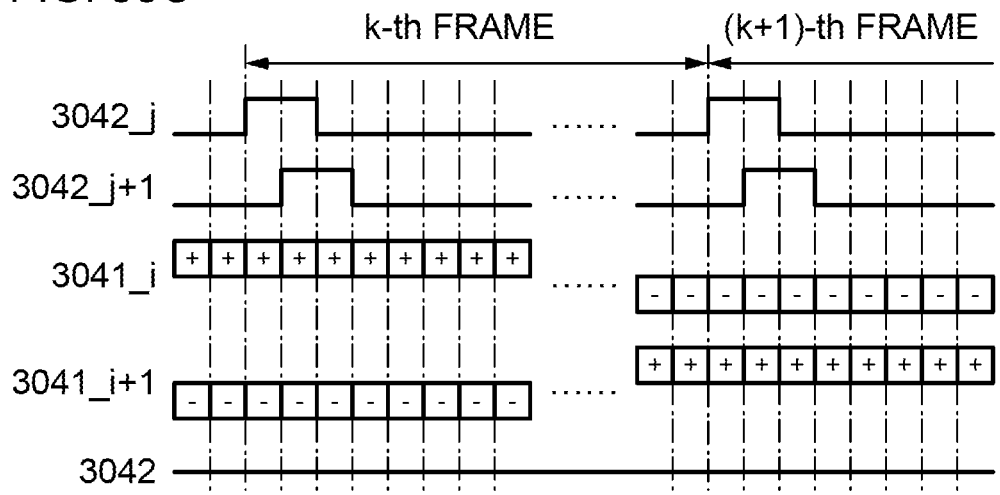

Note that FIG. 33B illustrates an example of the case where a period in which the signal 3042_j is at the H level and a period in which the signal 3042_j+1 is at the H level do not overlap with each other. However, this embodiment is not limited to this example. As illustrated in FIG. 33C, the period in which the signal 3042_j is at the H level and the period in which the signal 3042_j+1 is at the H level can overlap with each other. In that case, signals of the same polarity are preferably supplied to the wiring 3031 in one frame period. In this manner, pixels in a (j+1)th row can be precharged by using the signal 3041_j written to pixels in the j-th row. Accordingly, a writing time of a video signal to a pixel can be shortened. Therefore, a high-definition display device can be obtained. Alternatively, a display portion of the display device can be made large. Alternatively, since the signals of the same polarity are input to the wiring 3031 in one frame period, power consumption can be reduced.

Figure 34A:
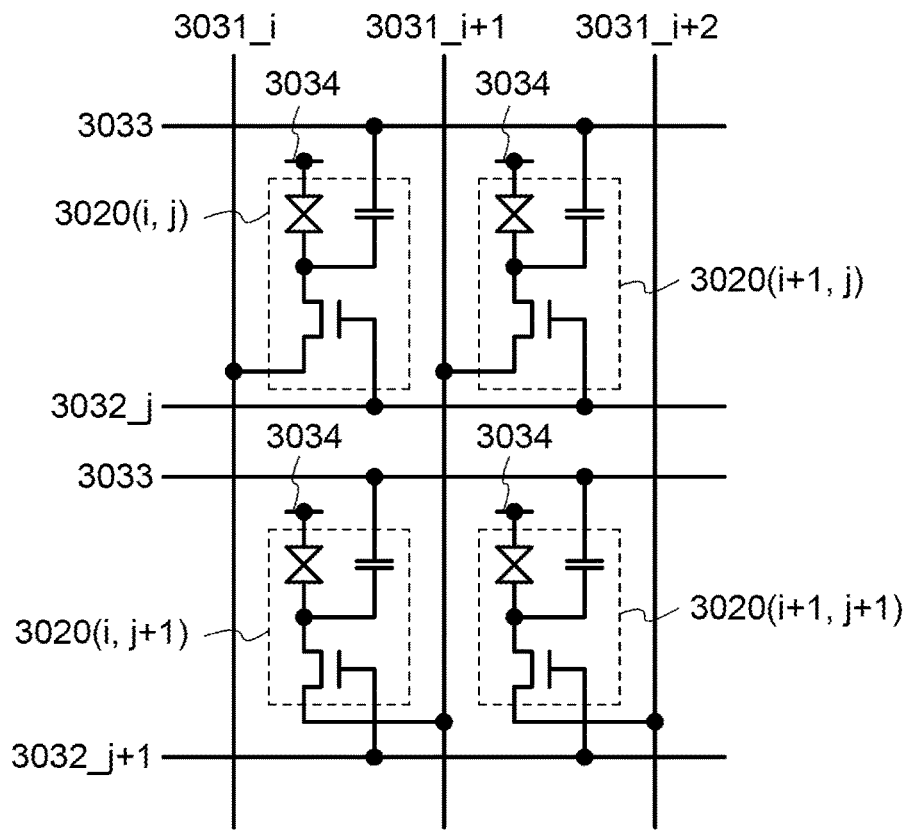
FIGS. 34A to 34C are circuit diagrams each illustrating a pixel.

Note that by a combination of a pixel structure in FIG. 34A and the timing chart in FIG. 33C, dot inversion driving can be achieved. In the pixel structure in FIG. 34A, a pixel 3020(i, j) is connected to a wiring 3031_i. On the other hand, a pixel 3020(i, j+1) is connected to a wiring 3031_i+1. In other words, pixels in the i-th column are alternately connected to the wiring 3031_i and the wiring 3031_i+1 row-by-row. In this manner, since a positive signal and a negative signal are alternately written to the pixels in the i-th column row-by-row, dot inversion driving can be achieved. However, this embodiment is not limited to this example. The pixels, which are in the i-th column, of every plural rows (e.g., two rows or three rows) can be alternately connected to the wiring 3031_i and the wiring 3031_i+1.

Figure 34B:
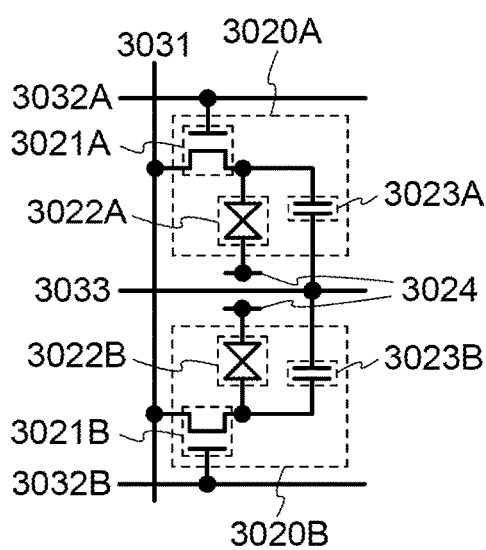
Figure 34C:
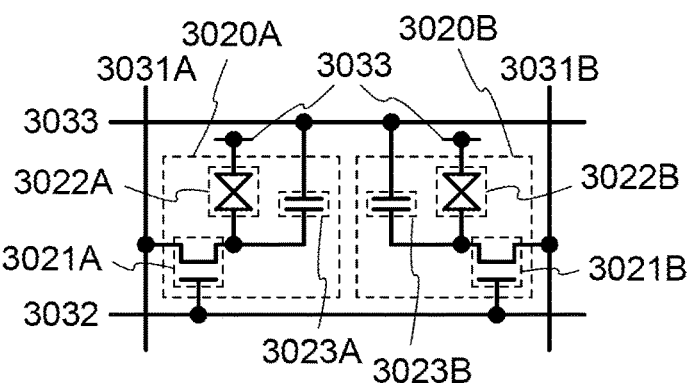

Note that a sub-pixel structure can be used as the pixel structure. FIGS. 34B and 34C each illustrate a structure of the case where a pixel is divided into two sub-pixels. FIG. 34B shows a sub-pixels structure called 1S+2G, and FIG. 34C shows a sub-pixel structure called 2S+1G. A sub-pixel 3020A and a sub-pixel 3020B correspond to the pixel 3020. A transistor 3021A and a transistor 3021B correspond to the transistor 3021. A liquid crystal element 3022A and a liquid crystal element 3022B correspond to the liquid crystal element 3022. A capacitor 3023A and a capacitor 3023B correspond to the capacitor 3023. A wiring 3031A and a wiring 3031B correspond to the wiring 3031. A wiring 3032A and a wiring 3032B correspond to the wiring 3032.

Here, by a combination of the pixel in this embodiment and any of the semiconductor devices, shift registers, display devices, and signal line driver circuits which are described in Embodiments 1 to 7, a variety of advantages can be obtained. For example, in the case where a sub-pixel structure is employed for the pixel, the number of signals required for driving a display device is increased. Therefore, the number of gate lines or source lines is increased. As a result, the number of connections between a substrate over which a pixel portion is formed and an external circuit is greatly increased in some cases. However, even if the number of gate lines is increased, the scan line driver circuit can be formed over a substrate over which the pixel portion is formed, as described in Embodiment 6. Accordingly, the pixel with the sub-pixel structure can be used without greatly increasing the number of connections between the substrate over which the pixel portion is formed and the external circuit. Alternatively, even if the number of source lines is increased, the use of the signal line driver circuit in Embodiment 6 can reduce the number of source lines. Accordingly, the pixel with the sub-pixel structure can be used without greatly increasing the number of connections between the substrate over which the pixel portion is formed and the external circuit.

Alternatively, in the case where a signal is input to a capacitor line, the number of connections between the substrate over which the pixel portion is formed and the external circuit is greatly increased in some cases. For that case, a signal can be supplied to the capacitor line by using any of the semiconductor device and the shift register in Embodiments 1 to 5. In addition, the semiconductor device or the shift register in Embodiments 1 to 5 can be formed over the substrate over which the pixel portion is formed. Accordingly, a signal can be input to the capacitor line without greatly increasing the number of connections between the substrate over which the pixel portion is formed and the external circuit.

Alternatively, in the case where alternate-current driving is employed, a time for writing a video signal to the pixel is short. As a result, shortage of the time for writing the video signal to the pixel is caused in some cases. Similarly, in the case where the pixel with the sub-pixel structure is used, the time for writing the video signal to the pixel is short. Thus, shortage of the time for writing the video signal to the pixel is caused in some cases. For that case, the video signal can be written to the pixel by using the signal line driver circuit in Embodiment 7. In that case, since voltage for precharge is written to the pixel before the video signal is written to the pixel, the video signal can be written to the pixel in a short time. Alternatively, when a period in which one row is selected overlaps with a period in which a different row is selected as illustrated in FIG. 28B, a video signal for the different row can be used as the voltage for precharge.

Embodiment 9

In this embodiment, an example of a cross-sectional structure of a display device will be described with reference to FIGS. 35A to 35C.

Figure 35A:
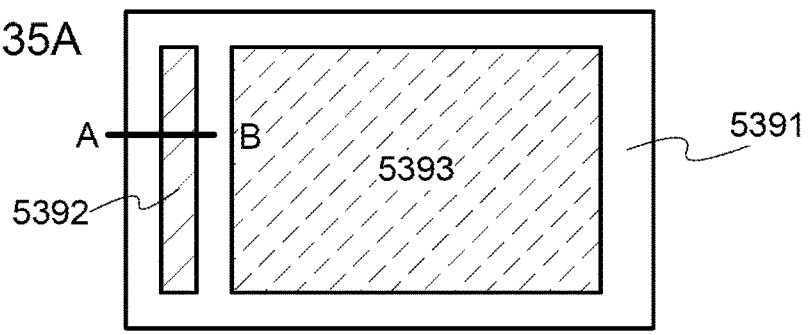
FIG. 35A is a top view and FIGS. 35B and 35C are cross-sectional views of a display device.

FIG. 35A illustrates an example of a top view of a display device. A driver circuit 5392 and a pixel portion 5393 are formed over a substrate 5391. An example of the driver circuit 5392 is a scan line driver circuit or a signal line driver circuit.

Figure 35B:
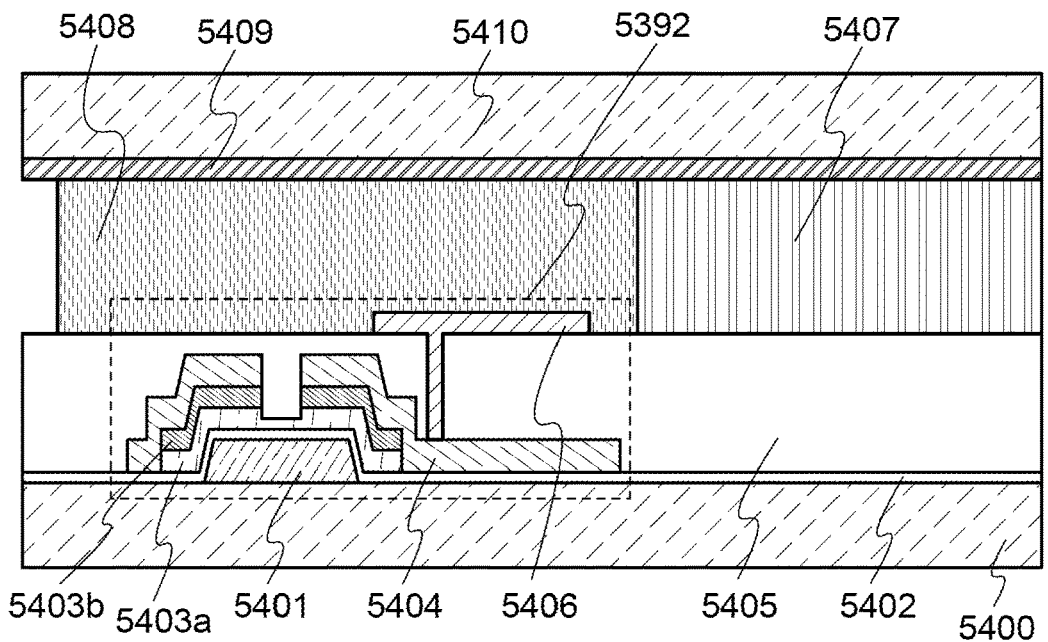

FIG. 35B illustrates an example of the A-B cross section of FIG. 35A. FIG. 35B illustrates a substrate 5400, a conductive layer 5401 formed over the substrate 5400, an insulating layer 5402 formed so as to cover the conductive layer 5401, a semiconductor layer 5403*a* formed over the conductive layer 5401 and the insulating layer 5402, a semiconductor layer 5403*b* formed over the semiconductor layer 5403*a*, a conductive layer 5404 formed over the semiconductor layer 5403*b* and the insulating layer 5402, an insulating layer 5405 formed over the insulating layer 5402 and the conductive layer 5404 and having an opening portion, a conductive layer 5406 formed over the insulating layer 5405 and in the opening portion in the insulating layer 5405, an insulating layer 5408 provided over the insulating layer 5405 and the conductive layer 5406, a liquid crystal layer 5407 formed over the insulating layer 5405, a conductive layer 5409 formed over the liquid crystal layer 5407 and the insulating layer 5405, and a substrate 5410 provided over the conductive layer 5409.

The conductive layer 5401 can function as a gate electrode. The insulating layer 5402 can function as a gate insulating film. The conductive layer 5404 can function as a wiring, an electrode of a transistor, an electrode of a capacitor, or the like. The insulating layer 5405 can function as an interlayer film or a planarization film. The conductive layer 5406 can function as a wiring, a pixel electrode, or a reflective electrode. The insulating layer 5408 can function as a sealing material. The conductive layer 5409 can function as a counter electrode or a common electrode.

Here, parasitic capacitance is sometimes generated between the driver circuit 5392 and the conductive layer 5409. Thus, an output signal from the driver circuit 5392 or a potential of each node is distorted or delayed, or power consumption is increased. However, when the insulating layer 5408 which can serve as the sealing material is formed over the driver circuit 5392 as illustrated in FIG. 35B, parasitic capacitance generated between the driver circuit 5392 and the conductive layer 5409 can be reduced. This is because the dielectric constant of the sealing material is often lower than that of the liquid crystal layer. Accordingly, distortion or delay of the output signal from the driver circuit 5392 or distortion or delay of the potential of each node can be reduced. Alternatively, power consumption of the driver circuit 5392 can be reduced.

Figure 35C:
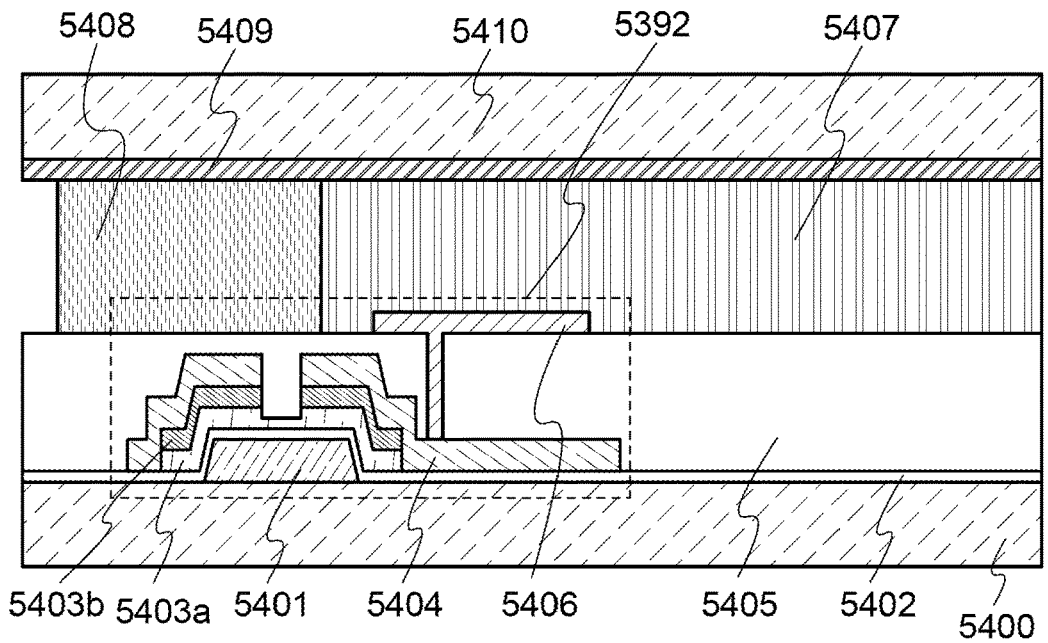

Note that as illustrated in FIG. 35C, the insulating layer 5408 which can function as the sealing material can be formed over part of the driver circuit 5392. In such a case also, parasitic capacitance generated between the driver circuit 5392 and the conductive layer 5409 can be reduced; thus, distortion or delay of the output signal from the driver circuit 5392 or distortion or delay of the potential of each node can be reduced. Note that this embodiment is not limited thereto, and it is possible not to form the insulating layer 5408, which can function as the sealing material, over the driver circuit 5392.

Note that a display element is not limited to a liquid crystal element, and a variety of display elements such as an EL element or an electrophoretic element can be used.

As above, this embodiment describes one example of the cross-sectional structure of the display device. Such a structure can be combined with the semiconductor device or the shift register in Embodiments 1 to 5. For example, when a non-single-crystal semiconductor, an amorphous semiconductor, a microcrystalline semiconductor, an organic semiconductor, an oxide semiconductor, or the like is used for a semiconductor layer of a transistor, the channel width of the transistor is often increased. However, by reducing parasitic capacitance of the driver circuit as in this embodiment, the channel width of the transistor can be reduced. Accordingly, the layout area can be reduced, so that the frame of the display device can be reduced. Alternatively, the resolution of the display device can be increased.

Embodiment 10

In this embodiment, examples of structures of transistors will be described with reference to FIGS. 36A to 36C.

Figure 36A:
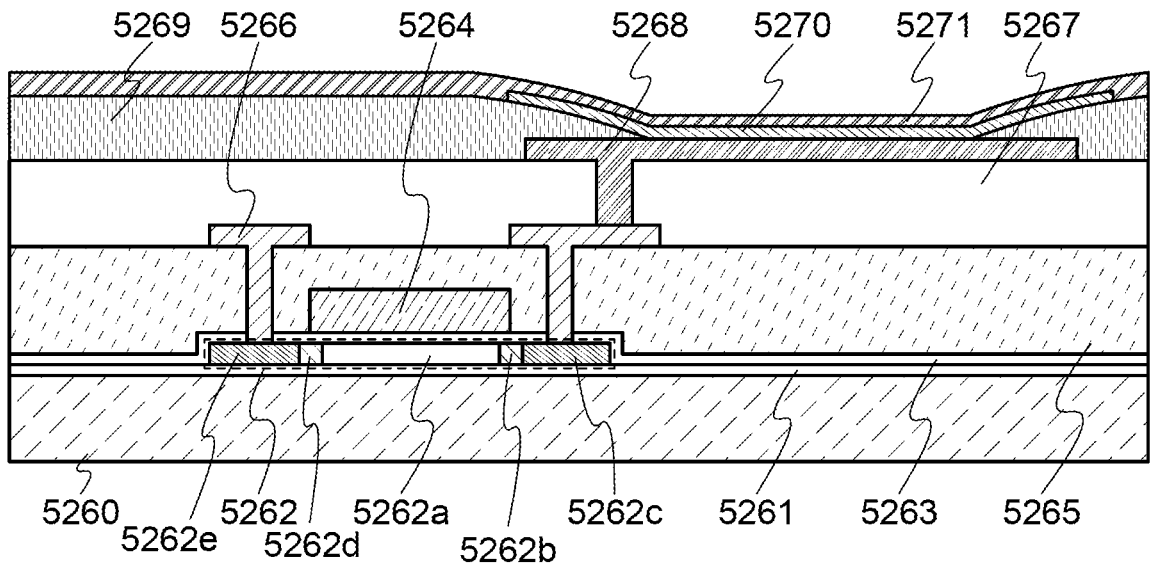
FIGS. 36A to 36C are cross-sectional views each illustrating a transistor.

FIG. 36A illustrates an example of a structure of a top-gate transistor. FIG. 36B illustrates an example of a structure of a bottom-gate transistor. FIG. 36C illustrates an example of a structure of a transistor formed using a semiconductor substrate.

FIG. 36A illustrates a substrate 5260; an insulating layer 5261 formed over the substrate 5260; a semiconductor layer 5262 which is formed over the insulating layer 5261 and includes a region 5262*a*, a region 5262*b*, a region 5262*c*, a region 5262*d*, and a region 5262*e*; an insulating layer 5263 formed so as to cover the semiconductor layer 5262; a conductive layer 5264 formed over the semiconductor layer 5262 and the insulating layer 5263; an insulating layer 5265 which is formed over the insulating layer 5263 and the conductive layer 5264 and is provided with opening portions; a conductive layer 5266 which is formed over the insulating layer 5265 and in the opening portions formed in the insulating layer 5265; an insulating layer 5267 which is formed over the conductive layer 5266 and the insulating layer 5265 and is provided with an opening portion; a conductive layer 5268 which is formed over the insulating layer 5267 and in the opening portion formed in the insulating layer 5267; an insulating layer 5269 which is formed over the insulating layer 5267 and the conductive layer 5268 and is provided with an opening portion; a light-emitting layer 5270 formed over the insulating layer 5269 and in the opening portion formed in the insulating layer 5269; and a conductive layer 5271 formed over the insulating layer 5269 and the light-emitting layer 5270.

Figure 36B:
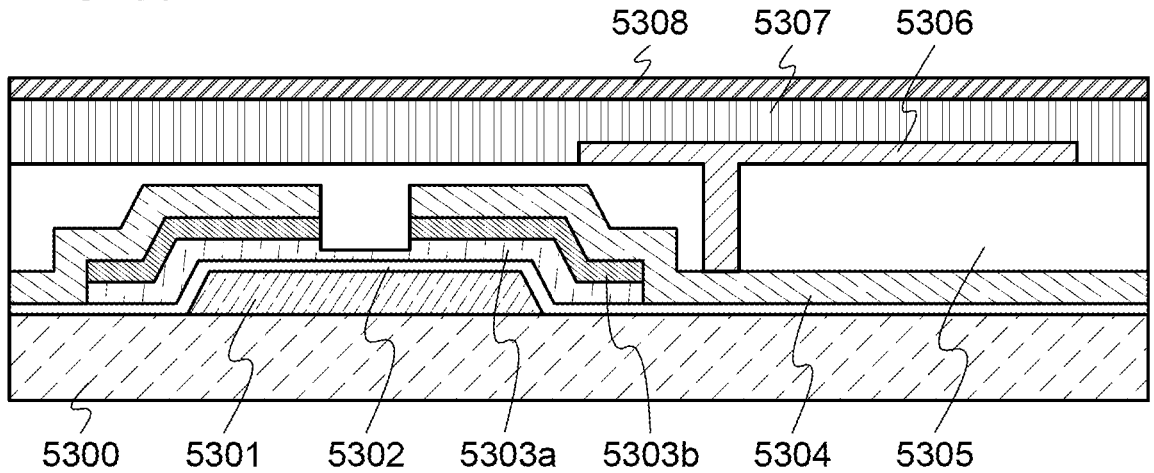

FIG. 36B illustrates a substrate 5300; a conductive layer 5301 formed over the substrate 5300; an insulating layer 5302 formed so as to cover the conductive layer 5301; a semiconductor layer 5303*a* formed over the conductive layer 5301 and the insulating layer 5302; a semiconductor layer 5303*b* formed over the semiconductor layer 5303*a*; a conductive layer 5304 formed over the semiconductor layer 5303*b* and the insulating layer 5302; an insulating layer 5305 which is formed over the insulating layer 5302 and the conductive layer 5304 and is provided with an opening portion; a conductive layer 5306 formed over the insulating layer 5305 and in the opening portion formed in the insulating layer 5305; a liquid crystal layer 5307 provided over the insulating layer 5305 and the conductive layer 5306; and a conductive layer 5308 formed over the liquid crystal layer 5307.

Figure 36C:
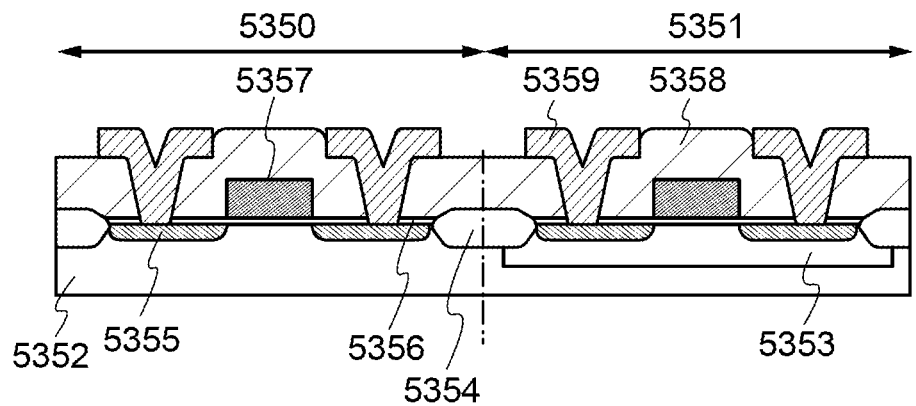

FIG. 36C illustrates a semiconductor substrate 5352 including a region 5353 and a region 5355; an insulating layer 5356 formed on the semiconductor substrate 5352; an insulating layer 5354 formed on the semiconductor substrate 5352; a conductive layer 5357 formed over the insulating layer 5356; an insulating layer 5358 which is formed over the insulating layer 5354, the insulating layer 5356, and the conductive layer 5357 and is provided with opening portions; and a conductive layer 5359 formed over the insulating layer 5358 and in the opening portions formed in the insulating layer 5358. Accordingly, a transistor is formed in each of a region 5350 and a region 5351.

The insulating layer 5261 can function as a base film. The insulating layer 5354 functions as an element isolation layer (e.g., a field oxide film). Each of the insulating layer 5263, the insulating layer 5302, and the insulating layer 5356 can function as a gate insulating film. Each of the conductive layer 5264, the conductive layer 5301, and the conductive layer 5357 can function as a gate electrode. Each of the insulating layer 5265, the insulating layer 5267, the insulating layer 5305, and the insulating layer 5358 can function as an interlayer film or a planarization film. Each of the conductive layer 5266, the conductive layer 5304, and the conductive layer 5359 can function as a wiring, an electrode of a transistor, an electrode of a capacitor, or the like. Each of the conductive layer 5268 and the conductive layer 5306 can function as a pixel electrode, a reflective electrode, or the like. The insulating layer 5269 can function as a bank. Each of the conductive layer 5271 and the conductive layer 5308 can function as a counter electrode, a common electrode, or the like.

As each of the substrate 5260 and the substrate 5300, a glass substrate, a quartz substrate, a silicon substrate (or a single crystal substrate), an SOI substrate, a plastic substrate, a metal substrate, a stainless steel substrate, a substrate including a stainless steel foil, a tungsten substrate, a substrate including a tungsten foil, or a flexible substrate can be used, for example. Examples of the glass substrate are barium borosilicate glass and aluminoborosilicate glass. Examples of the flexible substrate are flexible synthetic resins such as plastics typified by polyethylene terephthalate (PET), polyethylene naphthalate (PEN), and polyethersulfone (PES), and acrylic. In addition, an attachment film (formed using polypropylene, polyester, vinyl, polyvinyl fluoride, polyvinyl chloride, or the like), paper including a fibrous material, a base material film (polyester, polyamide, polyimide, an inorganic vapor deposition film, paper, or the like), or the like can be used.

As the semiconductor substrate 5352, a single crystal silicon substrate having n-type or p-type conductivity can be used, for example. Note that this embodiment is not limited to this, and a substrate which is similar to the substrate 5260 can be used. As an example, the region 5353 is a region where an impurity is added to the semiconductor substrate 5352, and functions as a well. For example, in the case where the semiconductor substrate 5352 has p-type conductivity, the region 5353 has n-type conductivity and functions as an n-well. On the other hand, in the case where the semiconductor substrate 5352 has n-type conductivity, the region 5353 has p-type conductivity and functions as a p-well. As an example, the region 5355 is a region where an impurity is added to the semiconductor substrate 5352, and functions as a source region or a drain region. Note that an LDD region can be formed in the semiconductor substrate 5352.

For the insulating layer 5261, a single-layer structure or a layered structure of an insulating film containing oxygen or nitrogen, such as silicon oxide ($SiO_x$), silicon nitride ($SiN_x$), silicon oxynitride ($SiO_xN_y$) (x>y), or silicon nitride oxide ($SiN_xO_y$) (x>y) can be used, for example. In the case where the insulating layer 5261 has a two-layer structure, a silicon nitride film and a silicon oxide film can be formed as a first insulating film and a second insulating film, respectively, for example. In the case where the insulating layer 5261 has a three-layer structure, a silicon oxide film, a silicon nitride film, and a silicon oxide film can be formed as a first insulating film, a second insulating film, and a third insulating film, respectively, for example.

For the semiconductor layer 5262, the semiconductor layer 5303a, and the semiconductor layer 5303b, a non-single-crystal semiconductor (e.g., an amorphous semiconductor, a polycrystalline semiconductor, or a microcrystalline semiconductor), a single crystal semiconductor, a compound semiconductor or an oxide semiconductor (e.g., ZnO, InGaZnO, SiGe, GaAs, IZO, ITO, SnO, TiO, or AlZnSnO (AZTO)), an organic semiconductor, or a carbon nanotube can be used, for example.

For example, the region 5262a is an intrinsic region where an impurity is not added to the semiconductor layer 5262, and functions as a channel region. However, a slight amount of impurities can be added to the region 5262a. The concentration of the impurity added to the region 5262a is preferably lower than the concentration of an impurity added to the region 5262b, the region 5262c, the region 5262d, or the region 5262e. Each of the region 5262b and the region 5262d is a region to which an impurity is added at low concentration, and functions as an LDD (lightly doped drain) region. Note that the region 5262b and the region 5262d can be eliminated. Each of the region 5262c and the region 5262e is a region to which an impurity is added at high concentration, and functions as a source region or a drain region.

Note that the semiconductor layer 5303b is a semiconductor layer to which phosphorus or the like is added as an impurity element, and has n-type conductivity.

Note that when an oxide semiconductor or a compound semiconductor is used for the semiconductor layer 5303a, the semiconductor layer 5303b can be eliminated.

For each of the insulating layer 5263, the insulating layer 5302, and the insulating layer 5356, a single-layer structure or a layered structure of an insulating film containing oxygen or nitrogen, such as silicon oxide ($SiO_x$), silicon nitride ($SiN_x$), silicon oxynitride ($SiO_xN_y$) (x>y), or silicon nitride oxide ($SiN_xO_y$) (x>y) can be used, for example.

As each of the conductive layer 5264, the conductive layer 5266, the conductive layer 5268, the conductive layer 5271, the conductive layer 5301, the conductive layer 5304, the conductive layer 5306, the conductive layer 5308, the conductive layer 5357, and the conductive layer 5359, a conductive film having a single-layer structure or a layered structure can be used, for example. For the conductive film, a single-layer film containing one element selected from the group consisting of aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), manganese (Mn), cobalt (Co), niobium (Nb), silicon (Si), iron (Fe), palladium (Pd), carbon (C), scandium (Sc), zinc (Zn), phosphorus (P), boron (B), arsenic (As), gallium (Ga), indium (In), tin (Sn), oxygen (O), zirconium (Zr), and cerium (Ce); or a compound containing one or more elements selected from the above group can be used, for example. Examples of the compound are an alloy containing one or more elements selected from the above group (e.g., an alloy material such as indium tin oxide (ITO), indium zinc oxide (IZO), indium tin oxide containing silicon oxide (ITSO), zinc oxide (ZnO), tin oxide (SnO), cadmium tin oxide (CTO), aluminum-neodymium (Al—Nd), aluminum-tungsten (Al—Ta), aluminum-zirconium (Al—Zr), aluminum-titanium (Al—Ti), aluminum-cerium (Al—Ce), magnesium-silver (Mg—Ag), molybdenum-niobium (Mo—Nb), molybdenum-tungsten (Mo—W), or molybdenum-tantalum (Mo—Ta)); a compound containing nitrogen and one or more elements selected from the above group (e.g., a nitride film containing titanium nitride, tantalum nitride, or molybdenum nitride); and a compound containing silicon and one or more elements selected from the above group (e.g., a silicide film containing tungsten silicide, titanium silicide, nickel silicide, aluminum silicon, or molybdenum silicon). Alternatively, a nanotube material such as a carbon nanotube, an organic nanotube, an inorganic nanotube, or a metal nanotube can be used.

Note that silicon (Si) can contain an n-type impurity (e.g., phosphorus) or a p-type impurity (e.g., boron). When silicon contains the impurity, increase in conductivity and/or a function similar to a general conductor can be realized. Accordingly, such silicon can be utilized easily as a wiring, an electrode, or the like.

Note that as silicon, silicon with various levels of crystallinity, such as single crystal silicon, polycrystalline silicon (polysilicon), or microcrystalline (microcrystal) silicon; or silicon without crystallinity, such as amorphous silicon, can be used. By using single crystal silicon or polycrystalline silicon as silicon, the resistance of a wiring, an electrode, a conductive layer, a conductive film, a terminal, or the like can be reduced. By using amorphous silicon or microcrystalline silicon as silicon, a wiring or the like can be formed through a simple process.

Note that when a semiconductor material such as silicon is used for the conductive layer, the semiconductor material such as silicon can be formed at the same time as a semiconductor layer of a transistor.

Aluminum and silver have high conductivity, so that signal delay can be reduced. Moreover, since aluminum and silver can be easily etched, they are easily patterned and can be minutely processed.

Copper has high conductivity, so that signal delay can be reduced. When copper is used for the conductive layer, a layered structure is preferably employed in order to improve adhesion.

Molybdenum and titanium are preferable because of the following reasons: molybdenum and titanium are not likely to cause defects even if they are in contact with an oxide semiconductor (e.g., ITO or IZO) or silicon; and molybdenum and titanium are easily etched and have high heat resistance. Accordingly, molybdenum or titanium is preferably used for a conductive layer which is in contact with an oxide semiconductor or silicon.

Tungsten is preferable because it has advantages such as high heat resistance.

Neodymium is preferable because it has advantages such as high heat resistance. In particular, when an alloy material of neodymium and aluminum is used for the conductive layer, aluminum hardly causes hillocks. Note that this embodiment is not limited thereto, and hillocks are hardly generated in aluminum when an alloy material of aluminum and tantalum, zirconium, titanium, or cerium is used. In particular, an alloy material of aluminum and cerium can drastically reduce arcing.

Since ITO, IZO, ITSO, ZnO, Si, SnO, CTO, a carbon nanotube, or the like has light-transmitting properties, such a material can be used for a portion through which light passes, such as a pixel electrode, a counter electrode, or a common electrode. In particular, IZO is preferable because it is easily etched and processed. In etching IZO, residues are hardly left. Accordingly, when IZO is used for a pixel electrode, defects (e.g., short circuit or orientation disorder) of a liquid crystal element or a light-emitting element can be reduced.

Note that a conductive layer can have a single-layer structure or a multi-layer structure. When a single-layer structure is employed, a process for manufacturing a wiring, an electrode, a conductive layer, a conductive film, a terminal, or the like can be simplified, the number of days for a process can be reduced, and costs can be reduced. On the other hand, when a multi-layer structure is employed, a wiring, an electrode, or the like with high quality can be formed while an advantage of each material is utilized and a disadvantage thereof is reduced. For example, when a low-resistant material (e.g., aluminum) is included in a multi-layer structure, reduction in resistance of a wiring can be realized. As another example, when a layered structure is employed in which a low heat-resistant material is sandwiched between high heat-resistant materials, heat resistance of a wiring, an electrode, or the like can be increased while advantages of the low heat-resistance material are utilized. As an example of such a layered structure, it is preferable to employ a layered structure in which a layer containing aluminum is sandwiched between layers containing molybdenum, titanium, neodymium, or the like.

When wirings, electrodes, or the like are in direct contact with each other, they adversely affect each other in some cases. For example, in some cases, one wiring or one electrode is mixed into a material of another wiring or another electrode and changes its properties, whereby an intended function cannot be obtained. As another example, when a high-resistant portion is formed, a problem may occur so that the portion cannot be normally formed. In such cases, a material whose properties are changed by reaction with a different material can be sandwiched between or covered with materials which do not easily react with the different material. For example, when ITO and aluminum are connected to each other, an alloy of neodymium, titanium, molybdenum, or the like can be sandwiched between ITO and aluminum. For example, when silicon and aluminum are connected to each other, an alloy of neodymium, titanium, or molybdenum can be sandwiched between silicon and aluminum. Note that such a material can be used for a wiring, an electrode, a conductive layer, a conductive film, a terminal, a via, a plug, or the like.

For each of the insulating layer 5265, the insulating layer 5267, the insulating layer 5269, the insulating layer 5305, and the insulating layer 5358, an insulating film having a single-layer structure or a layered structure can be used, for example. As the insulating film, a film containing oxygen or nitrogen, such as silicon oxide ($SiO_x$), silicon nitride ($SiN_x$), silicon oxynitride ($SiO_xN_y$) (x>y), or silicon nitride oxide ($SiN_xO_y$) (x>y); a film containing carbon such as diamond-like carbon (DLC); an organic material such as a siloxane resin, epoxy, polyimide, polyamide, polyvinyl phenol, benzocyclobutene, or acrylic; or the like can be used, for example.

For the light-emitting layer 5270, an organic EL element or an inorganic EL element can be used, for example. As an example, the organic EL element can have a single-layer structure or a layered structure of a hole injection layer formed using a hole injection material, a hole transport layer formed using a hole transport material, a light-emitting layer formed using a light-emitting material, an electron transport layer formed using an electron transport material, an electron injection layer formed using an electron injection material, or a layer in which a plurality of these materials are mixed.

The following liquid crystal can be used for the liquid crystal layer 5307: nematic liquid crystal, cholesteric liquid crystal, smectic liquid crystal, discotic liquid crystal, thermotropic liquid crystal, lyotropic liquid crystal, low molecular liquid crystal, high molecular liquid crystal, polymer dispersed liquid crystal (PDLC), ferroelectric liquid crystal, anti-ferroelectric liquid crystal, main chain type liquid crystal, side chain type polymer liquid crystal, plasma addressed liquid crystal (PALC), and banana-shaped liquid crystal. Moreover, the following methods can be used for driving the liquid crystal, for example: a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an OCB (optically compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a guest-host mode, and a blue phase mode.

Note that an insulating layer which functions as an alignment film, an insulating layer which functions as a protrusion portion, or the like can be formed over the insulating layer 5305 and the conductive layer 5306.

Note that a color filter, a black matrix, an insulating layer which functions as a protrusion portion, or the like can be formed over the conductive layer 5308. An insulating layer which functions as an alignment film can be formed below the conductive layer 5308.

Note that in the cross-sectional structure in FIG. 36A, the insulating layer 5269, the light-emitting layer 5270, and the conductive layer 5271 can be eliminated, and the liquid crystal layer 5307 and the conductive layer 5308 which are illustrated in FIG. 36B can be formed over the insulating layer 5267 and the conductive layer 5268.

Note that in the cross-sectional structure in FIG. 36B, the liquid crystal layer 5307 and the conductive layer 5308 can be eliminated, and the insulating layer 5269, the light-emitting layer 5270, and the conductive layer 5271 which are illustrated in FIG. 36A can be formed over the insulating layer 5305 and the conductive layer 5306.

Note that in the cross-sectional structure in FIG. 36C, the insulating layer 5269, the light-emitting layer 5270, and the conductive layer 5271 which are illustrated in FIG. 36A can be formed over the insulating layer 5358 and the conductive layer 5359. Alternatively, the liquid crystal layer 5307 and the conductive layer 5308 which are illustrated in FIG. 36B can be formed over the insulating layer 5358 and the conductive layer 5359.

The transistor in this embodiment can be applied to Embodiments 1 to 9. Specifically, in the case where a non-single-crystal semiconductor, an amorphous semiconductor, a microcrystalline semiconductor, an organic semiconductor, an oxide semiconductor, or the like is used for the semiconductor layer in FIG. 36B, the transistor might deteriorate. However, this embodiment is useful since degradation of the transistor can be suppressed in any of the semiconductor devices, shift registers, or display devices in Embodiments 1 to 9.

Embodiment 11

In this embodiment, a layout view (hereinafter also referred to as a top view) of a shift register will be described. In this embodiment, as an example, a layout view of the shift register described in Embodiment 5 will be described. Note that a content described in this embodiment can be applied to any of the semiconductor devices, shift registers, or display devices in Embodiments 1 to 10 in addition to the shift register in Embodiment 5. Note that the layout view in this embodiment is one example and does not limit this embodiment.

Figure 37:
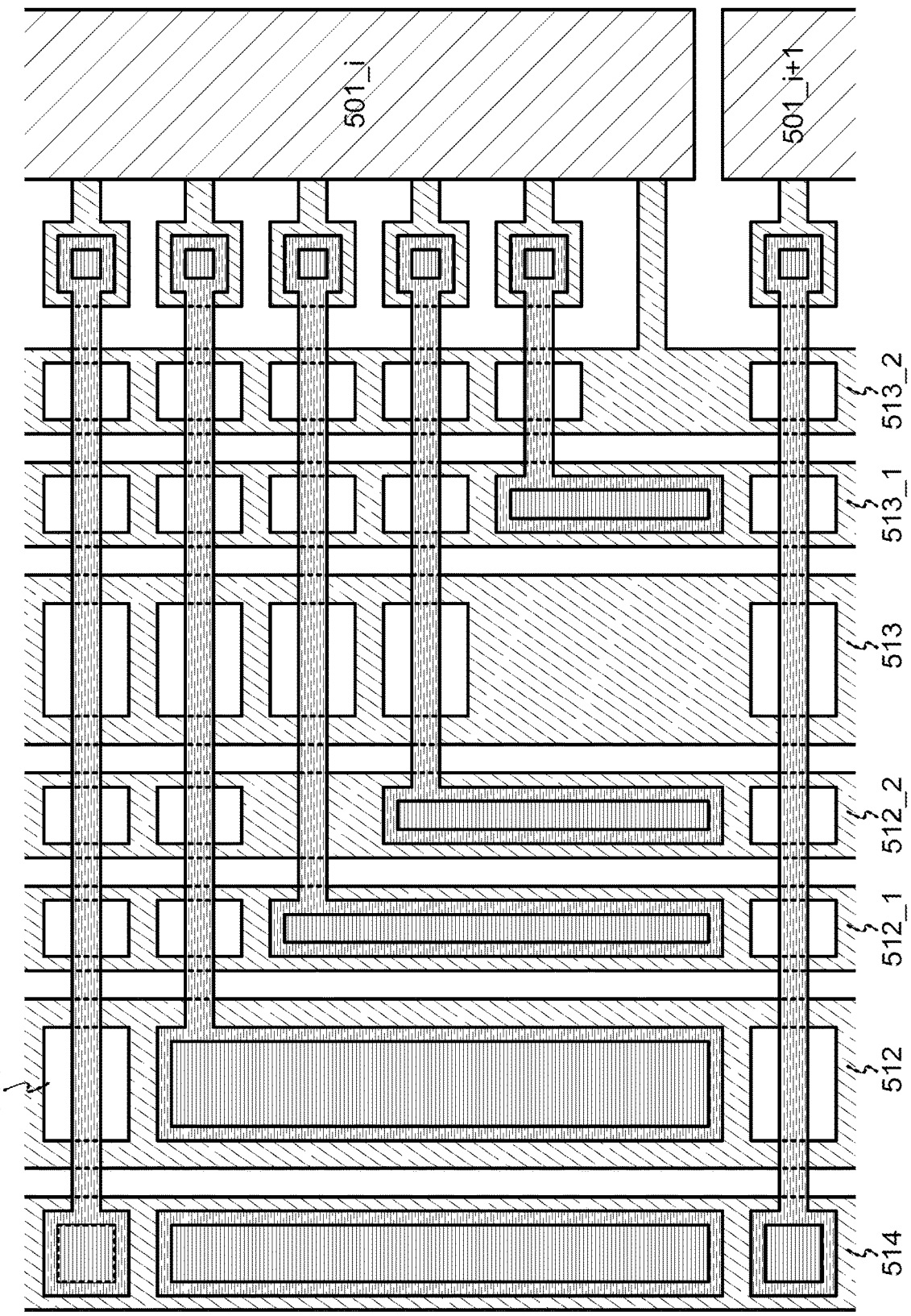
FIG. 37 is a layout view of a shift register.

The layout view in this embodiment is described with reference to FIG. 37 and FIG. 38. FIG. 37 illustrates an example of a layout view of part of a shift register. FIG. 38 illustrates an example of a layout view of the semiconductor device in FIG. 7A.

A transistor, a wiring, and the like illustrated in FIG. 37 and FIG. 38 include a conductive layer 701, a semiconductor layer 702, a conductive layer 703, a conductive layer 704, and a contact hole 705. Note that this embodiment is not limited thereto. A different conductive layer, insulating film, or contact hole can be additionally formed. For example, a contact hole which connects the conductive layer 701 to the conductive layer 703 can be additionally provided.

The conductive layer 701 can include a portion which functions as a gate electrode or a wiring. The semiconductor layer 702 can include a portion which functions as a semiconductor layer of the transistor. The conductive layer 703 can include a portion which functions as a wiring or a source or drain. The conductive layer 704 can include a portion which functions as a transparent electrode, a pixel electrode, or a wiring. The contact hole 705 has a function of connecting the conductive layer 701 and the conductive layer 704 or a function of connecting the conductive layer 703 and the conductive layer 704.

In the example in FIG. 37, the wiring has an opening portion 711. Since the wiring has the opening portion in this manner, parasitic capacitance can be reduced. Alternatively, breakdown of the transistor due to electrostatic discharge can be suppressed. Note that this embodiment is not limited to this, and it is possible not to provide an opening portion in the wiring.

In the example in FIG. 37, by providing opening portions in an intersection portion of the wirings and a peripheral portion thereof, the cross-over capacitance of the wirings can be reduced. Accordingly, reduction in noise or reduction in delay or distortion of a signal can be achieved.

In the example in FIG. 37, the conductive layer 704 is formed over part of the conductive layer 703 included in the wiring. Moreover, the conductive layer 704 is connected to the conductive layer 703 through the contact hole 705. Since wiring resistance can be reduced in this manner, voltage drop can be suppressed or delay or distortion of a signal can be reduced. Note that this embodiment is not limited to this, and the conductive layer 704 and the contact hole 705 can be eliminated.

In the example in FIG. 37, the width of the wiring 512 is preferably larger that of the wirings 512_1 and 512_2. This is because a larger amount of current is generated in the wiring 512. For a similar reason, the width of the wiring 513 is preferably larger that of the wirings 513_1 and 513_2. Note that this embodiment is not limited thereto.

In the example of FIG. 38, in the transistor 101_1, the transistor 101_2, the transistor 102_1, the transistor 102_2, and/or the transistor 201, the area where the conductive layers 701 and 703 serving as the second terminal overlap with each other is preferably smaller than the area where the conductive layers 701 and 703 serving as the first terminal overlap with each other. Accordingly, noise of the gate of the transistor 201 or the wiring 111 can be reduced. Alternatively, concentration of electric fields on the second terminal can be suppressed, so that deterioration or breakdown of the transistor can be suppressed.

Note that the semiconductor layer 702 can be provided in a portion where the conductive layer 701 and the conductive layer 703 overlap with each other. Accordingly, the parasitic capacitance between the conductive layer 701 and the conductive layer 703 can be reduced, whereby reduction in noise can be achieved. For a similar reason, the semiconductor layer 702 or the conductive layer 703 can be provided in a portion where the conductive layer 701 and the conductive layer 704 overlap with each other.

Note that the conductive layer 704 can be formed over part of the conductive layer 701 and can be connected to the conductive layer 701 through the contact hole 705. Accordingly, wiring resistance can be reduced. Alternatively, the conductive layers 703 and 704 can be formed over part of the conductive layer 701, so that the conductive layer 701 can be connected to the conductive layer 704 through the contact hole 705 and the conductive layer 703 can be connected to the conductive layer 704 through the different contact hole 705. In this manner, the wiring resistance can be further reduced.

Note that the conductive layer 704 can be formed over part of the conductive layer 703, so that the conductive layer 703 can be connected to the conductive layer 704 through the contact hole 705. In this manner, wiring resistance can be reduced.

Note that the conductive layer 701 or the conductive layer 703 can be formed below part of the conductive layer 704, so that the conductive layer 704 can be connected to the conductive layer 701 or the conductive layer 703 through the contact hole 705. In this manner, wiring resistance can be reduced.

Note that as has been described above, the parasitic capacitance between the gate and the second terminal of the transistor 201 can be higher than the parasitic capacitance between the gate and the first terminal of the transistor 201. As illustrated in FIG. 38, the width of the conductive layer 703 which can function as the first terminal of the transistor 201 is referred to as width 731, and the width of the conductive layer 703 which can function as the second terminal of the transistor 201 is referred to as width 732. The width 731 can be larger than the width 732. Accordingly, the parasitic capacitance between the gate and the second terminal of the transistor 201 can be higher than the parasitic capacitance between the gate and the first terminal of the transistor 201. However, this embodiment is not limited to this.

Embodiment 12

In this embodiment, an example of steps for manufacturing a transistor and a capacitor will be described. In particular, manufacturing steps in which an oxide semiconductor is used for a semiconductor layer will be described. As an oxide semiconductor layer, a layer represented by $InMO_3(ZnO)_m$ (m>0) can be used. Note that M represents one or more of metal elements selected from Ga, Fe, Ni, Mn, and Co. As an example, only Ga may be contained as M, or any of the above metal elements in addition to Ga, for example, Ga and Ni or Ga and Fe may be contained as M. Note that the oxide semiconductor may contain a transition metal element such as Fe or Ni or oxide of the transition metal element as an impurity element in addition to the metal element contained as M. Such a thin film can be referred to as an In—Ga—Zn—O-based non-single-crystal film. As the oxide semiconductor, ZnO can be used. Note that the concentration of mobile ions in the oxide semiconductor layer, typically sodium, is preferably $5 \times 10^{18}/cm^3$ or less, more preferably $1 \times 10^{18}/cm^3$ or less so as to suppress change in electric characteristics of a transistor. Note that this embodiment is not limited thereto, and various other oxide semiconductor materials can be used for a semiconductor layer. Alternatively, for the semiconductor layer, a single crystal semiconductor, a polycrystalline semiconductor, a microcrystalline (microcrystal or nanocrystal) semiconductor, an amorphous semiconductor, or various non-single-crystal semiconductors can be used.

Figure 46A:
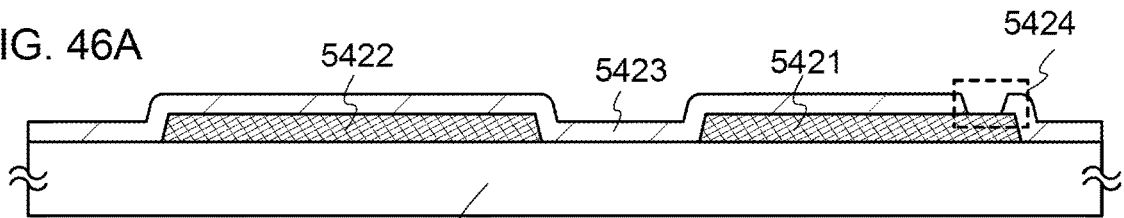
FIGS. 46A to 46E are cross-sectional views illustrating steps for manufacturing a transistor.
Figure 46B:
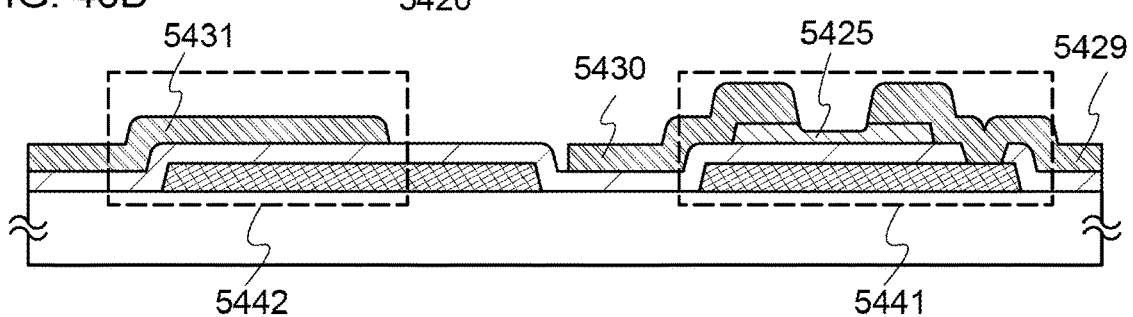
Figure 46C:
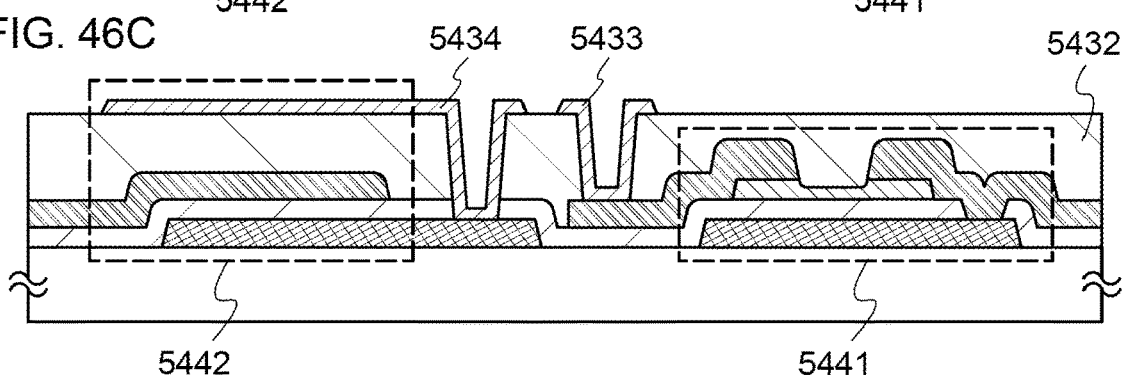

An example of steps for manufacturing a transistor and a capacitor is described with reference to FIGS. 46A to 46C. FIGS. 46A to 46C illustrate an example of steps for manufacturing a transistor 5441 and a capacitor 5442. The transistor 5441 is an example of an inverted staggered thin film transistor, in which a wiring is provided over an oxide semiconductor layer with a source electrode or a drain electrode therebetween.

First, a first conductive layer is formed over the entire surface of a substrate 5420 by a sputtering method. Next, the first conductive layer is selectively etched by using a resist mask formed through a photolithography process using a first photomask, so that a conductive layer 5421 and a conductive layer 5422 are formed. The conductive layer 5421 can function as a gate electrode. The conductive layer 5422 can function as one electrode of the capacitor. Note that this embodiment is not limited thereto, and each of the conductive layers 5421 and 5422 can include a portion functioning as a wiring, a gate electrode, or an electrode of the capacitor. After that, the resist mask is removed.

Next, an insulating layer 5423 is formed over the entire surface by a plasma CVD method or a sputtering method. The insulating layer 5423 can function as a gate insulating layer and is formed so as to cover the conductive layers 5421 and 5422. Note that the thickness of the insulating layer 5423 is often in the range of 50 to 250 nm.

When a silicon oxide layer is used as the insulating layer 5423, the silicon oxide layer can be formed by a CVD method using an organosilane gas. As the organosilane gas, yttrium oxide $(Y_2O_3)$ or the following silicon-containing compound can be used: tetraethyl orthosilicate (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$).

Then, the insulating layer 5423 is selectively etched by using a resist mask formed through a photolithography process using a second photomask, so that a contact hole 5424 which reaches the conductive layer 5421 is formed. After that, the resist mask is removed. Note that this embodiment is not limited thereto, and the contact hole 5424 can be eliminated. Alternatively, the contact hole 5424 can be formed after an oxide semiconductor layer is formed. A cross-sectional view of the steps so far corresponds to FIG. 46A.

Next, an oxide semiconductor layer is formed over the entire surface by a sputtering method. Note that this embodiment is not limited thereto, and it is possible to form the oxide semiconductor layer by a sputtering method and to form an $n^+$ layer thereover. Note that the thickness of the oxide semiconductor layer is often in the range of 5 to 200 nm.

Before the oxide semiconductor layer is formed by a sputtering method, reverse sputtering in which plasma is generated by introduction of an argon gas is preferably performed. By the reverse sputtering, dust attached to a surface of the insulating layer 5423 and a bottom surface of the contact hole 5424 can be removed. The reverse sputtering is a method in which voltage is applied to a substrate, not to a target side, in an argon atmosphere by using an RF power supply and plasma is generated so that a substrate surface is modified. Note that this embodiment is not limited thereto, and nitrogen, helium, or the like can be used instead of the argon atmosphere. Alternatively, the reverse sputtering can be performed in an atmosphere where oxygen, hydrogen, $N_2O$, or the like is added to the argon atmosphere or in an atmosphere where $Cl_2$, $CF_4$, or the like is added to the argon atmosphere. Note that by the reverse sputtering, the thickness of the insulating layer 5423 is reduced from the surface by preferably approximately 2 nm to 10 nm. Formation of the oxide semiconductor layer without exposure to air after such plasma treatment is effective in preventing dust or moisture from being attached to the interface between the gate insulating layer and the oxide semiconductor layer.

Then, the oxide semiconductor layer is selectively etched using a third photomask. After that, a resist mask is removed.

Next, a second conductive layer is formed over the entire surface by a sputtering method. Then, the second conductive layer is selectively etched by using a resist mask formed through a photolithography process using a fourth photomask, so that a conductive layer 5429, a conductive layer 5430, and a conductive layer 5431 are formed. The conductive layer 5429 is connected to the conductive layer 5421 through the contact hole 5424. The conductive layers 5429 and 5430 can function as the source electrode and the drain electrode. The conductive layer 5431 can function as the other electrode of the capacitor. Note that this embodiment is not limited thereto, and each of the conductive layers 5429, 5430, and 5431 can include a portion functioning as a wiring, the source or drain electrode, or the electrode of the capacitor.

Note that if heat treatment (e.g., at 200° C. to 600° C.) is performed in a subsequent step, the second conductive layer preferably has heat resistance high enough to withstand the heat treatment. Accordingly, for the second conductive layer, Al and a heat-resistant conductive material (e.g., an element such as Ti, Ta, W, Mo, Cr, Nd, Sc, Zr, or Ce; an alloy in which these elements are combined; or nitride containing any of these elements) are preferably used in combination. Note that this embodiment is not limited thereto, and by employing a layered structure, the second conductive layer can have heat resistance. For example, it is possible to provide a film of a heat-resistant conductive material such as Ti or Mo above and below an Al film.

Before the second conductive layer is formed by a sputtering method, reverse sputtering in which plasma is generated by introduction of an argon gas is preferably performed so that dust attached to the surface of the insulating layer 5423, a surface of the oxide semiconductor layer, and the bottom surface of the contact hole 5424 is removed. Note that this embodiment is not limited thereto, and nitrogen, helium, or the like can be used instead of the argon atmosphere. Alternatively, the reverse sputtering can be performed in an atmosphere where oxygen, hydrogen, $N_2O$, or the like is added to the argon atmosphere or in an atmosphere where $Cl_2$, $CF_4$, or the like is added to the argon atmosphere.

Note that at the time of etching the second conductive layer, part of the oxide semiconductor layer is also etched, so that an oxide semiconductor layer 5425 is formed. By this etching, part of the oxide semiconductor layer 5425, which overlaps with the conductive layer 5421, or part of the oxide semiconductor layer 5425, over which the second conductive layer is not formed, is etched to be thinned in many cases. Note that this embodiment is not limited thereto, and it is possible not to etch the oxide semiconductor layer. However, in the case where the $n^+$ layer is formed over the oxide semiconductor layer, the oxide semiconductor layer is often etched. After that, the resist mask is removed. The transistor 5441 and the capacitor 5442 are completed when this etching is finished. A cross-sectional view of the steps so far corresponds to FIG. 46B.

Here, when the reverse sputtering is performed before the second conductive layer is formed by a sputtering method, the thickness of an exposed portion of the insulating layer 5423 is reduced by preferably approximately 2 nm to 10 nm in some cases. Accordingly, a recessed portion is sometimes formed in the insulating layer 5423. Alternatively, by performing the reverse sputtering after the second conductive layer is etched to form the conductive layers 5429, 5430, and 5431, end portions of the conductive layers 5429, 5430, and 5431 are curved in some cases as illustrated in FIG. 46B.

Next, heat treatment is performed at 200° C. to 600° C. in an air atmosphere or a nitrogen atmosphere. Through this heat treatment, rearrangement at the atomic level occurs in the In—Ga—Zr—O-based non-single-crystal layer. This heat treatment (including optical annealing) is important because strain energy which inhibits carrier movement is released by the heat treatment. Note that there is no particular limitation on the timing at which the heat treatment is performed, and the heat treatment can be performed at any time after the oxide semiconductor layer is formed.

Then, an insulating layer 5432 is formed over the entire surface. The insulating layer 5432 can have a single-layer structure or a layered structure. For example, when an organic insulating layer is used as the insulating layer 5432, the organic insulating layer is formed in such a manner that a composition which is a material for the organic insulating layer is applied and subjected to heat treatment at 200° C. to 600° C. in an air atmosphere or a nitrogen atmosphere. By forming the organic insulating layer in contact with the oxide semiconductor layer in such a manner, a thin film transistor with highly reliable electric characteristics can be manufactured. Note that when organic insulating layer is used as the insulating layer 5432, a silicon nitride film or a silicon oxide film can be provided below the organic insulating layer.

FIG. 46C illustrates a mode in which the insulating layer 5432 is formed using a non-photosensitive resin, so that an end portion of the insulating layer 5432 is angular in the cross section of a region where the contact hole is formed. However, when the insulating layer 5432 is formed using a photosensitive resin, the end portion of the insulating layer 5432 can be curved in the cross section of the region where the contact hole is formed. Thus, the coverage of the insulating layer 5432 with a third conductive layer or a pixel electrode which is formed later is increased.

Note that instead of application of the composition, the following method can be used depending on the material: dip coating, spray coating, an ink-jet method, a printing method, a doctor knife, a roll coater, a curtain coater, a knife coater, or the like.

Note that without performing the heat treatment after the oxide semiconductor layer is formed, the heat treatment for the composition, which is the material for the organic insulating layer, can also serve to heat the oxide semiconductor layer.

The insulating layer 5432 can be formed to a thickness of 200 nm to 5 μm, preferably 300 nm to 1 μm.

Next, the third conductive layer is formed over the entire surface. Then, the third conductive layer is selectively etched by using a resist mask formed through a photolithography process using a fifth photomask, so that a conductive layer 5433 and a conductive layer 5434 are formed. A cross-sectional view of the steps so far corresponds to FIG. 46C. Each of the conductive layers 5433 and 5434 can function as a wiring, a pixel electrode, a reflective electrode, a transparent electrode, or the electrode of the capacitor. In particular, since the conductive layer 5434 is connected to the conductive layer 5422, it can function as the electrode of the capacitor 5442. Note that this embodiment is not limited thereto, and the conductive layers 5433 and 5434 can have a function of connecting the first conductive layer and the second conductive layer. For example, by connecting the conductive layers 5433 and 5434 to each other, the conductive layer 5422 and the conductive layer 5430 can be connected through the third conductive layer (the conductive layers 5433 and 5434).

Since the capacitor 5442 has a structure where the conductive layer 5431 is sandwiched between the conductive layers 5422 and 5434, the capacitance value of the capacitor 5442 can be increased. Note that this embodiment is not limited thereto, and one of the conductive layers 5422 and 5434 can be eliminated.

Note that after the resist mask is removed by wet etching, it is possible to perform heat treatment at 200° C. to 600° C. in an air atmosphere or a nitrogen atmosphere.

Through the above steps, the transistor 5441 and the capacitor 5442 can be manufactured.

Figure 46D:
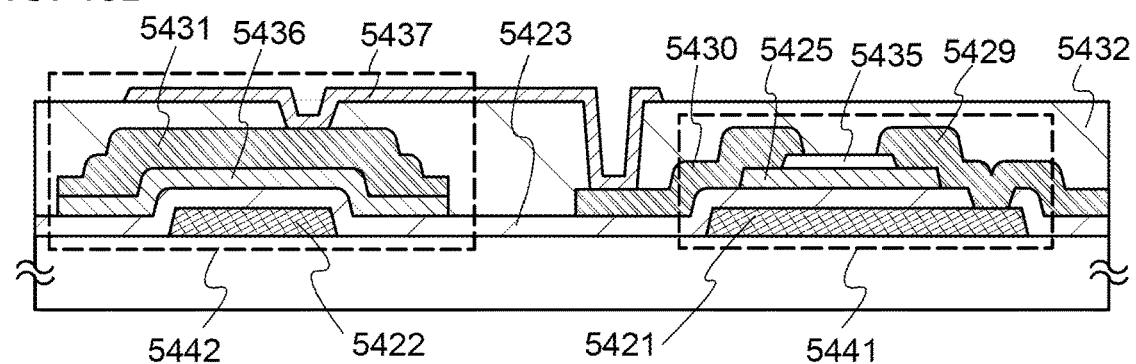

Note that as illustrated in FIG. 46D, an insulating layer 5435 can be formed over the oxide semiconductor layer 5425. The insulating layer 5435 has a function of preventing the oxide semiconductor layer from being etched when the second conductive layer is patterned, and functions as a channel stop film. Accordingly, the thickness of the oxide semiconductor layer can be reduced, so that reduction in driving voltage, reduction in off-state current, increase in the on/off ratio of drain current, improvement in subthreshold swing (S value), or the like of the transistor can be achieved. The insulating layer 5435 can be formed in such a manner that an oxide semiconductor layer and an insulating layer are successively formed over the entire surface, and then, the insulating layer is selectively patterned using a resist mask formed through a photolithography process using a photomask. After that, the second conductive layer is formed over the entire surface, and the oxide semiconductor layer is patterned at the same time as the second conductive layer. That is, the oxide semiconductor layer and the second conductive layer can be patterned using the same mask (reticle). In that case, the oxide semiconductor layer is always placed below the second conductive layer. In such a manner, the insulating layer 5435 can be formed without increase in the number of steps. The oxide semiconductor layer is often formed below the second conductive layer in such a manufacturing process. However, this embodiment is not limited thereto. The insulating layer 5435 can be formed in such a manner that after an oxide semiconductor layer is patterned, an insulating layer is formed over the entire surface and is patterned.

In FIG. 46D, the capacitor 5442 has a structure where the insulating layer 5423 and an oxide semiconductor layer 5436 are sandwiched between the conductive layers 5422 and 5431. Note that the oxide semiconductor layer 5436 can be eliminated. Moreover, the conductive layers 5430 and 5431 are connected through a conductive layer 5437 which is formed by patterning the third conductive layer. Such a structure can be used for a pixel of a liquid crystal display device, for example. For example, the transistor 5441 can function as a switching transistor, and the capacitor 5442 can function as a storage capacitor. Moreover, the conductive layers 5421, 5422, 5429, and 5437 can function as a gate line, a capacitor line, a source line, and a pixel electrode, respectively. Note that this embodiment is not limited thereto. In addition, as in FIG. 46D, the conductive layer 5430 and the conductive layer 5431 can be connected through the third conductive layer in FIG. 46C.

Figure 46E:
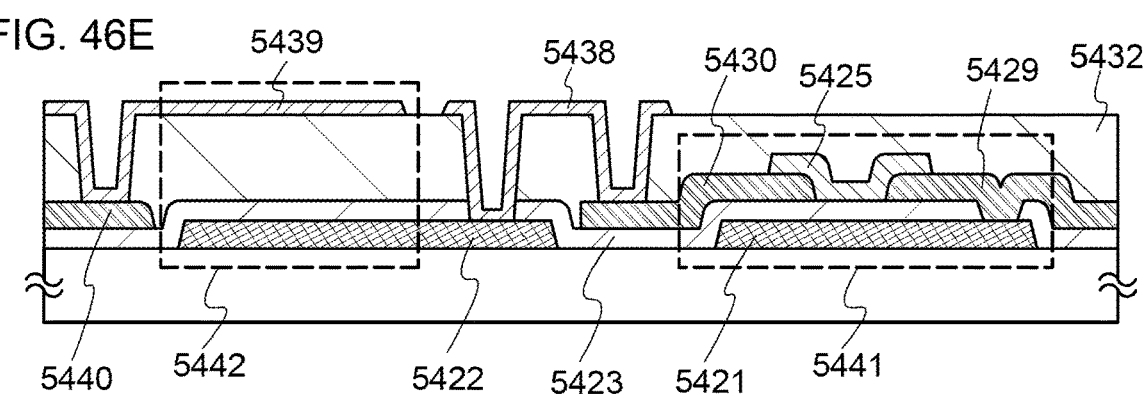

Note that as illustrated in FIG. 46E, the oxide semiconductor layer 5425 can be formed after the second conductive layer is patterned. Accordingly, the oxide semiconductor layer is not yet formed when the second conductive layer is patterned, so that the oxide semiconductor layer is not etched. Thus, the thickness of the oxide semiconductor layer can be reduced, so that reduction in driving voltage, reduction in off-state current, increase in the on/off ratio of drain current, improvement in S value, or the like of the transistor can be achieved. Note that the oxide semiconductor layer 5425 can be formed in such a manner that after the second conductive layer is patterned, an oxide semiconductor layer is formed over the entire surface and selectively patterned using a resist mask formed through a photolithography process using a photomask.

In FIG. 46E, the capacitor has a structure where the insulating layers 5423 and 5432 are sandwiched between the conductive layer 5422 and a conductive layer 5439 which is formed by patterning the third conductive layer. Moreover, the conductive layers 5422 and 5430 are connected through a conductive layer 5438 which is formed by patterning the third conductive layer. Further, the conductive layer 5439 is connected to a conductive layer 5440 which is formed by patterning the second conductive layer. In addition, as in FIG. 46E, the conductive layers 5430 and 5422 can be connected through the conductive layer 5438 in FIGS. 46C and 46D.

A complete depletion state can be obtained by making the thickness of the oxide semiconductor layer (or a channel layer) smaller than that of a depletion layer formed in the case where the transistor is off. Accordingly, the off-state current can be reduced. In order to realize this, the thickness of the oxide semiconductor layer is preferably 20 nm or less, more preferably 10 nm or less, and further preferably 6 nm or less.

Note that in order to realize reduction in operation voltage, reduction in off-state current, increase in the on/off ratio of drain current, improvement in S value, or the like of the transistor, the thickness of the oxide semiconductor layer is preferably the smallest among those of the layers included in the transistor. For example, the thickness of the oxide semiconductor layer is preferably smaller than that of the insulating layer 5423. More preferably, the thickness of the oxide semiconductor layer is half or less, further preferably ⅕ or less, and still preferably ¹/₁₀ or less than the thickness of the insulating layer 5423. Note that this embodiment is not limited thereto, and the thickness of the oxide semiconductor layer can be larger than that of the insulating layer 5423 in order to improve the reliability. Since the thickness of the oxide semiconductor layer is preferably larger particularly in the case where the oxide semiconductor layer is etched as in FIG. 46C, it is possible to make the thickness of the oxide semiconductor layer larger than that of the insulating layer 5423.

Note that in order to increase the withstand voltage of the transistor, the thickness of the insulating layer 5423 is preferably larger, more preferably 5/4 or more, and further preferably 4/3 or more than the thickness of the first conductive layer. Note that this embodiment is not limited thereto, and the thickness of the insulating layer 5423 can be smaller than that of the first conductive layer in order to increase the mobility of the transistor.

Note that for the substrate, the insulating film, the conductive film, and the semiconductor layer in this embodiment, materials described in other embodiments (e.g., Embodiment 10) or materials similar to those described in this specification can be used.

When the transistor in this embodiment is used in any of the semiconductor devices, shift registers, or display devices in Embodiments 1 to 9, the size of a display portion can be increased. Alternatively, the resolution of the display portion can be increased.

Embodiment 13

In this embodiment, examples of electronic devices will be described.

FIGS. 39A to 39H and FIGS. 40A to 40D illustrate electronic devices. These electronic devices can each include a housing 5000, a display portion 5001, a speaker 5003, an LED lamp 5004, an operation key 5005 (including an operation switch and a power supply switch in its category), a connecting terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone 5008, and the like.

Figure 39A:
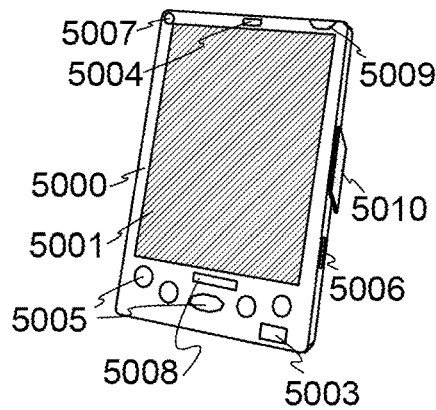
FIGS. 39A to 39H each illustrate an electronic device.
Figure 39B:
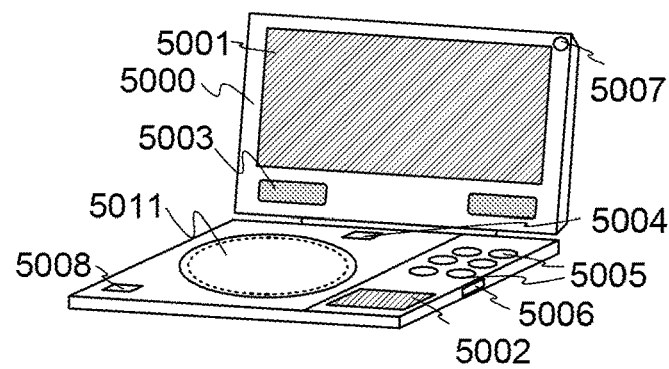
Figure 39C:
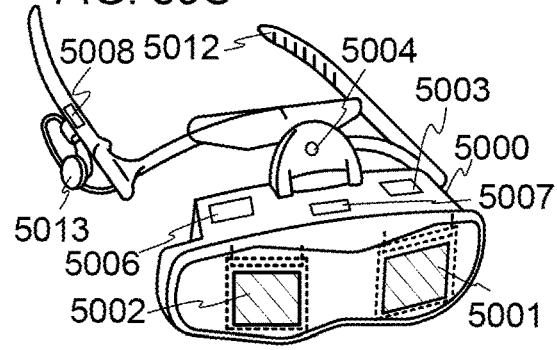
Figure 39D:
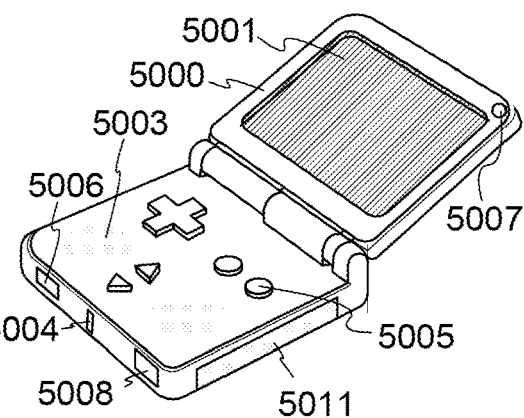
Figure 39E:
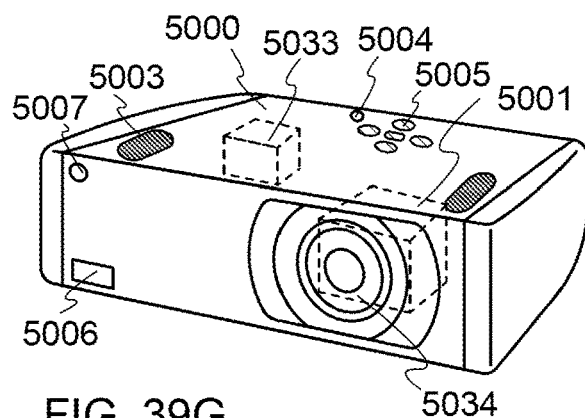
Figure 39F:
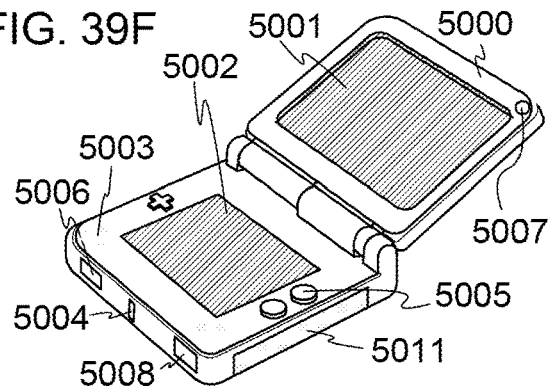
Figure 39G:
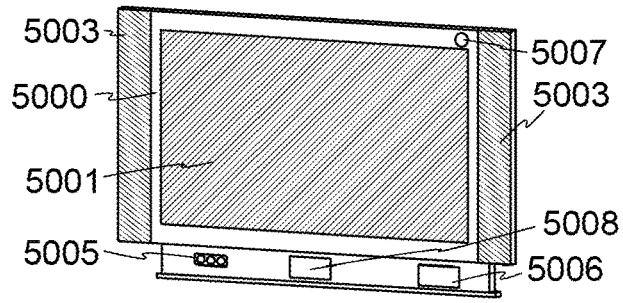
Figure 39H:
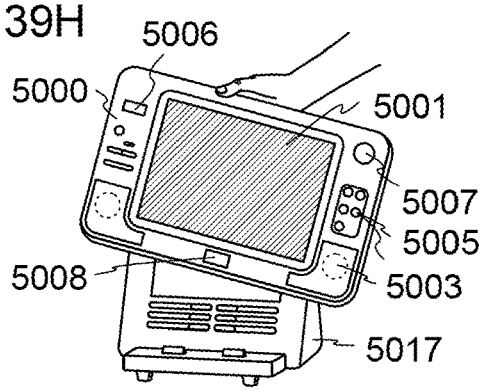
Figure 40A:
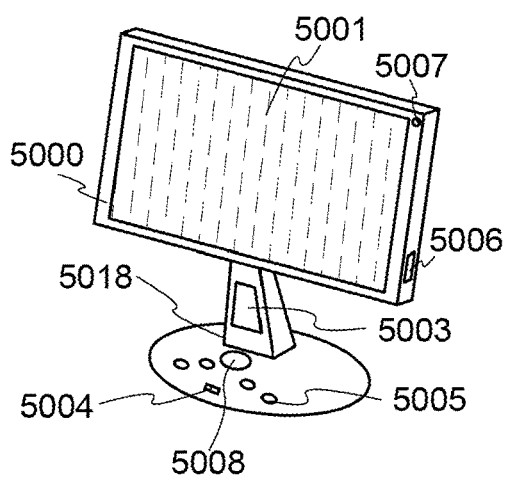
FIGS. 40A to 40H each illustrate an electronic device.
Figure 40B:
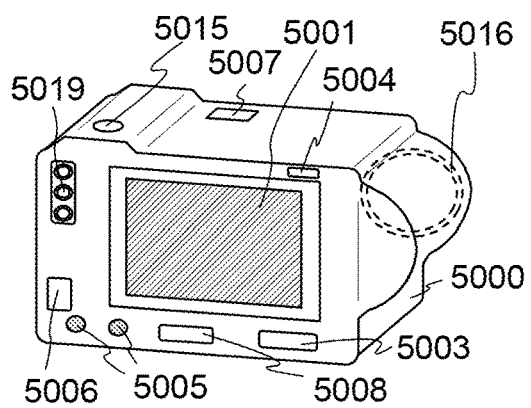
Figure 40C:
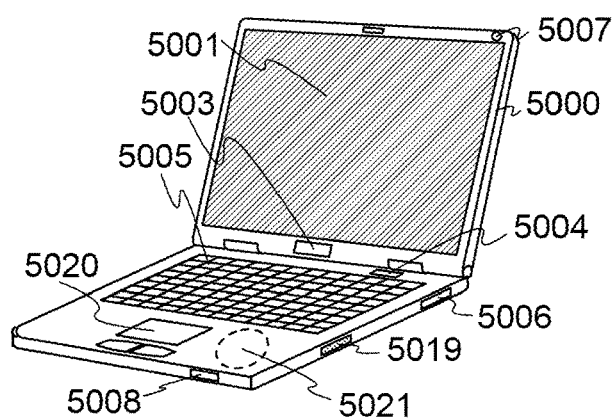
Figure 40D:
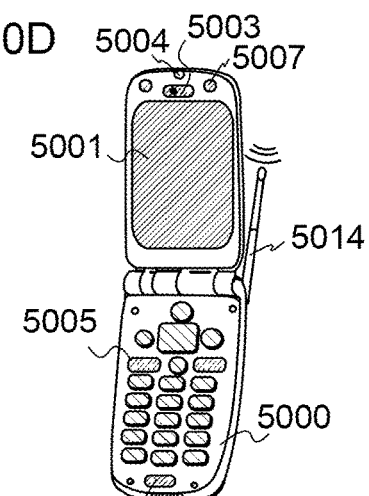

FIG. 39A illustrates a mobile computer which can include a switch 5009, an infrared port 5010, and the like in addition to the above objects. FIG. 39B illustrates a portable image reproducing device (e.g., a DVD reproducing device) provided with a memory medium, and the image reproducing device can include a second display portion 5002, a memory medium reading portion 5011, and the like in addition to the above objects. FIG. 39C illustrates a goggle-type display which can include the second display portion 5002, a supporting portion 5012, an earphone 5013, and the like in addition to the above objects. FIG. 39D illustrates a portable game machine which can include the memory medium reading portion 5011 and the like in addition to the above objects. FIG. 39E illustrates a projector which can include a light source 5033, a projecting lens 5034, and the like in addition to the above objects. FIG. 39F illustrates a portable game machine which can include the second display portion 5002, the memory medium reading portion 5011, and the like in addition to the above objects. FIG. 39G illustrates a television receiver which can include a tuner, an image processing portion, and the like in addition to the above objects. FIG. 39H illustrates a portable television receiver which can include a charger 5017 that can transmit and receive signals and the like in addition to the above objects. FIG. 40A illustrates a display which can include a supporting board 5018 and the like in addition to the above objects. FIG. 40B illustrates a camera which can include an external connecting port 5019, a shutter button 5015, an image receiver portion 5016, and the like in addition to the above objects. FIG. 40C illustrates a computer which can include a pointing device 5020, the external connecting port 5019, a reader/writer 5021, and the like in addition to the above objects. FIG. 40D illustrates a mobile phone which can include an antenna 5014, a tuner of one-segment partial reception service for mobile phones and mobile terminals ("1seg"), and the like in addition to the above objects.

The electronic devices illustrated in FIGS. 39A to 39H and FIGS. 40A to 40D can have a variety of functions, for example, a function of displaying various kinds of information (a still image, a moving image, a text image, and the like) on a display portion, a touch panel function, a function of displaying a calendar, date, time, and the like, a function of controlling processing with various kinds of software (programs), a wireless communication function, a function of being connected to a variety of computer networks with a wireless communication function, a function of transmitting and receiving various kinds of data with a wireless communication function, and a function of reading program or data stored in a memory medium and displaying the program or data on a display portion. Further, the electronic device including a plurality of display portions can have a function of displaying image information mainly on one display portion while displaying text information on another display portion, a function of displaying a three-dimensional image by displaying images where parallax is considered on a plurality of display portions, or the like. Furthermore, the electronic device including an image receiver portion can have a function of shooting a still image, a function of shooting a moving image, a function of automatically or manually correcting a shot image, a function of storing a shot image in a memory medium (an external memory medium or a memory medium incorporated in the camera), a function of displaying a shot image on the display portion, or the like. Note that functions which can be provided for the electronic devices illustrated in FIGS. 39A to 39H and FIGS. 40A to 40D are not limited thereto, and the electronic devices can have a variety of functions.

The electronic devices described in this embodiment each include the display portion for displaying some sort of information. By combining the electronic device in this embodiment with any of the semiconductor devices, shift registers, or display devices in Embodiments 1 to 9, it is possible to achieve improvement in reliability, improvement in yield, reduction in cost, increase in size of the display portion, higher definition of the display portion, or the like.

Next, application examples of the semiconductor device will be described.

Figure 40E:
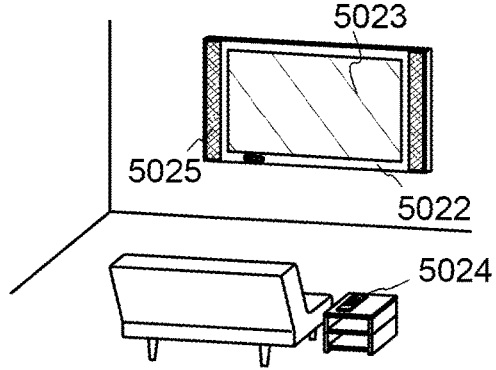

FIG. 40E illustrates an example in which the semiconductor device is provided so as to be integrated with a building. FIG. 40E illustrates a housing 5022, a display portion 5023, a remote controller device 5024 which is an operation portion, a speaker 5025, and the like. The semiconductor device is integrated with the building as a hung-on-wall type and can be provided without a large space.

Figure 40F:
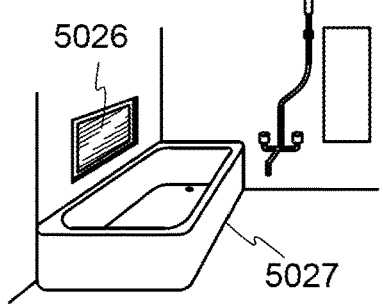

FIG. 40F illustrates another example in which the semiconductor device is provided so as to be integrated with a building. A display panel 5026 is integrated with a prefabricated bath 5027, so that a person who takes a bath can watch the display panel 5026.

Note that although this embodiment gives the wall and the prefabricated bath as examples of the building, this embodiment is not limited thereto and the semiconductor device can be provided in a variety of buildings.

Next, examples in which the semiconductor device is provided so as to be integrated with a moving body will be described.

Figure 40G:
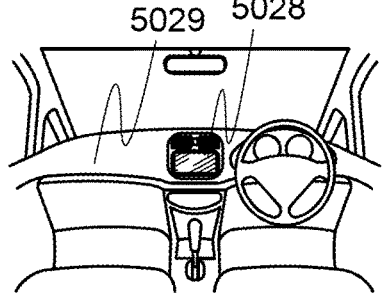

FIG. 40G illustrates an example in which the semiconductor device is provided in a vehicle. A display panel 5028 is provided in a body 5029 of the vehicle and can display information input from the operation of the body or the outside of the body on demand. Note that the display panel 5028 may have a navigation function.

Figure 40H:
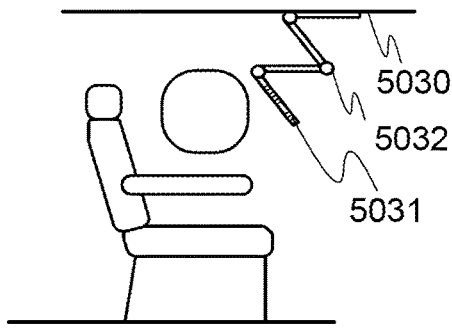

FIG. 40H illustrates an example in which the semiconductor device is provided so as to be integrated with a passenger airplane. FIG. 40H illustrates a usage pattern when a display panel 5031 is provided on a ceiling 5030 above a seat in the passenger airplane. The display panel 5031 is integrated with the ceiling 5030 through a hinge portion 5032, and a passenger can watch the display panel 5031 by extending and contracting the hinge portion 5032. The display panel 5031 has a function of displaying information when operated by the passenger.

Note that although this embodiment gives the body of the vehicle and the body of the plane as examples of the moving body, this embodiment is not limited thereto. The semiconductor device can be provided to a variety of moving bodies such as a two-wheeled motor vehicle, a four-wheeled vehicle (including a car, bus, and the like), a train (including a monorail, a railway, and the like), and a ship.

This application is based on Japanese Patent Application serial No. 2009-011634 filed with Japan Patent Office on Jan. 22, 2009, the entire contents of which are hereby incorporated by reference.

What is claimed is:

1. A semiconductor device comprising:
  a first conductive layer, a second conductive layer, a third conductive layer, a fourth conductive layer, a fifth conductive layer, a sixth conductive layer, a seventh conductive layer, an eighth conductive layer, and a circuit,
  wherein the first conductive layer includes a first opening, the second conductive layer includes a second opening, the third conductive layer includes a third opening, the fourth conductive layer includes a fourth opening, the fifth conductive layer includes a fifth opening, the sixth conductive layer includes a sixth opening,
  wherein each of the first conductive layer, the second conductive layer, the third conductive layer, the fourth conductive layer, the fifth conductive layer and the sixth conductive layer includes a region extending in a first direction,
  wherein the seventh conductive layer includes a region extending in a direction crossing the first direction,
  wherein the eighth conductive layer includes a region extending in a direction crossing the first direction,
  wherein the seventh conductive layer is in contact with the first conductive layer,
  wherein the eighth conductive layer is in contact with the sixth conductive layer,
  wherein the seventh conductive layer includes a region overlapping with the second to sixth openings,
  wherein the circuit includes a first transistor and a second transistor,
  wherein the seventh conductive layer is in electrical contact with a scan line through the first transistor, and
  wherein the sixth conductive layer is in electrical contact with the second transistor through the eighth conductive layer.

2. The semiconductor device according to claim 1, wherein the circuit is a flip flop.

3. The semiconductor device according to claim 1, wherein each of the first transistor and the second transistor includes an oxide semiconductor layer in a channel portion.

4. The semiconductor device according to claim 1, wherein the semiconductor device is one selected from the group consisting of a computer, an image reproducing device, a goggle-type display, a game machine, a projector, a television, a camera, and a phone.

5. A semiconductor device comprising:
  a first conductive layer, a second conductive layer, a third conductive layer, a fourth conductive layer, a fifth conductive layer, a sixth conductive layer, a seventh conductive layer, an eighth conductive layer, and a circuit,
  wherein the first conductive layer includes a first opening, the second conductive layer includes a second opening, the third conductive layer includes a third opening, the fourth conductive layer includes a fourth opening, the fifth conductive layer includes a fifth opening, the sixth conductive layer includes a sixth opening,
  wherein each of the first conductive layer, the second conductive layer, the third conductive layer, the fourth conductive layer, the fifth conductive layer and the sixth conductive layer includes a region extending in a first direction,
  wherein the seventh conductive layer includes a region extending in a direction crossing the first direction,
  wherein the eighth conductive layer includes a region extending in a direction crossing the first direction,
  wherein the seventh conductive layer includes a region overlapping with the first conductive layer, and is in contact with the first conductive layer,
  wherein the eighth conductive layer is in contact with the sixth conductive layer,
  wherein the seventh conductive layer includes a region overlapping with the second to sixth openings,
  wherein the circuit includes a first transistor and a second transistor,
  wherein the seventh conductive layer is in electrical contact with a scan line through the first transistor, and
  wherein the sixth conductive layer is in electrical contact with the second transistor through the eighth conductive layer.

6. The semiconductor device according to claim 5, wherein the circuit is a flip flop.

7. The semiconductor device according to claim 5, wherein each of the first transistor and the second transistor includes an oxide semiconductor layer in a channel portion.

8. The semiconductor device according to claim 5, wherein the semiconductor device is one selected from the group consisting of a computer, an image reproducing device, a goggle-type display, a game machine, a projector, a television, a camera, and a phone.

9. A semiconductor device comprising:
  a first conductive layer, a second conductive layer, a third conductive layer, a fourth conductive layer, a fifth conductive layer, a sixth conductive layer, a seventh conductive layer, an eighth conductive layer, and a circuit,
  wherein the first conductive layer includes a first opening, the second conductive layer includes a second opening, the third conductive layer includes a third opening, the fourth conductive layer includes a fourth opening, the fifth conductive layer includes a fifth opening, the sixth conductive layer includes a sixth opening,
  wherein each of the first conductive layer, the second conductive layer, the third conductive layer, the fourth conductive layer, the fifth conductive layer and the sixth conductive layer includes a region extending in a first direction,
  wherein the seventh conductive layer includes a region extending in a direction crossing the first direction,
  wherein the second conductive layer is next to the first conductive layer in plan view,
  wherein the eighth conductive layer includes a region extending in a direction crossing the first direction, wherein the seventh conductive layer includes a region overlapping with the first conductive layer, and is in contact with the first conductive layer, wherein the eighth conductive layer is in contact with the sixth conductive layer, wherein the seventh conductive layer includes a region overlapping with the second to sixth openings, wherein the circuit includes a first transistor and a second transistor, wherein the seventh conductive layer is in electrical contact with a scan line through the first transistor, and wherein the sixth conductive layer is in electrical contact with the second transistor through the eighth conductive layer.

10. The semiconductor device according to claim 9, wherein the circuit is a flip flop.

11. The semiconductor device according to claim 9, wherein each of the first transistor and the second transistor includes an oxide semiconductor layer in a channel portion.

12. The semiconductor device according to claim 9, wherein the semiconductor device is one selected from the group consisting of a computer, an image reproducing device, a goggle-type display, a game machine, a projector, a television, a camera, and a phone.

* * * * *